US012735439B2

(12) United States Patent
Kim et al.

(10) Patent No.: US 12,735,439 B2
(45) Date of Patent: Sep. 15, 2026

(54) ORGANIC OPTOELECTRONIC ELEMENT COMPOUND, ORGANIC OPTOELECTRONIC ELEMENT COMPOSITION, ORGANIC OPTOELECTRONIC ELEMENT, AND DISPLAY DEVICE

(71) Applicant: SAMSUNG SDI CO., LTD., Yongin-si (KR)

(72) Inventors: Byungku Kim, Suwon-si (KR); Jin Sook Kim, Suwon-si (KR); Seungin Park, Suwon-si (KR); Byoungkwan Lee, Suwon-si (KR); Sangshin Lee, Suwon-si (KR); Yoonman Lee, Suwon-si (KR); Kipo Jang, Suwon-si (KR); Hyunji Yoo, Suwon-si (KR); Sung-Hyun Jung, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 1016 days.

(21) Appl. No.: 17/916,626

(22) PCT Filed: Mar. 16, 2021

(86) PCT No.: PCT/KR2021/003239

§ 371 (c)(1), (2) Date: Oct. 3, 2022

(87) PCT Pub. No.: WO2021/215669

PCT Pub. Date: Oct. 28, 2021

(65) Prior Publication Data

US 2023/0167137 A1 Jun. 1, 2023

(30) Foreign Application Priority Data

Apr. 21, 2020 (KR) ........................ 10-2020-0048222

(51) Int. Cl.
*C07F 7/08* (2006.01)
*H10K 50/11* (2023.01)
(Continued)

(52) U.S. Cl.
CPC .......... *C07F 7/0816* (2013.01); *C07F 7/0814* (2013.01); *H10K 50/11* (2023.02);
(Continued)

(58) Field of Classification Search
None
See application file for complete search history.

(56) References Cited

U.S. PATENT DOCUMENTS 5,061,569 A 10/1991 Vanslyke et al.
2012/0112174 A1 5/2012 Lee et al.
(Continued)

FOREIGN PATENT DOCUMENTS

CN 107652189 A 2/2018
CN 113437228 A 9/2021
(Continued)

OTHER PUBLICATIONS

Machine English translation of Hyun et al. (KR 10-2020-0026083). Oct. 31, 2025.*
(Continued)

*Primary Examiner* — Jay Yang
(74) *Attorney, Agent, or Firm* — Lee IP Law, P.C.

(57) ABSTRACT

Disclosed are a compound for an organic optoelectronic device represented by Chemical Formula 1, a composition for an organic optoelectronic device including the same, an organic optoelectronic device, and a display device. Details of Chemical Formula 1 are as defined in the specification.

15 Claims, 1 Drawing Sheet

(51) Int. Cl.
*H10K 85/40* (2023.01)
*H10K 85/60* (2023.01)
*H10K 50/85* (2023.01)

(52) U.S. Cl.
CPC ........... *H10K 85/40* (2023.02); *H10K 85/621* (2023.02); *H10K 85/622* (2023.02); *H10K 85/636* (2023.02); *H10K 85/657* (2023.02); *H10K 85/6572* (2023.02); *H10K 85/6574* (2023.02); *H10K 85/6576* (2023.02); *H10K 50/85* (2023.02)

(56) References Cited

U.S. PATENT DOCUMENTS

| | | | |
|---|---|---|---|
| 2013/0207082 | A1 | 8/2013 | Cho et al. |
| 2016/0155961 | A1 | 6/2016 | Ueno et al. |
| 2021/0300951 | A1 | 9/2021 | Kim et al. |

FOREIGN PATENT DOCUMENTS

| | | | |
|---|---|---|---|
| JP | 1993-009471 | A | 1/1993 |
| JP | 1995-126615 | A | 5/1995 |
| JP | 1998-095973 | A | 4/1998 |
| KR | 10-2012-0009984 | A | 2/2012 |
| KR | 10-2013-0025190 | A | 3/2013 |
| KR | 10-1423173 | B1 | 7/2014 |
| KR | 10-1486561 | B1 | 1/2015 |
| KR | 10-2015-0019154 | A | 2/2015 |
| KR | 10-2016-0064948 | A | 6/2016 |
| KR | 10-2017-0056425 | A | 5/2017 |
| KR | 10-2019-0134364 | A | 12/2019 |
| KR | 10-2020-0026083 | A | 3/2020 |
| WO | WO 1995/009147 | A1 | 4/1995 |
| WO | WO 2006/108497 | A1 | 10/2006 |
| WO | WO 2010/136109 | A1 | 12/2010 |
| WO | WO 2012/011756 | A1 | 1/2012 |
| WO | WO 2020/045981 | A1 | 3/2020 |

OTHER PUBLICATIONS

Korean Notice of Allowance dated Oct. 24, 2024, of the corresponding Korean Patent Application No. 10-2020-0048222.
Chinese Office action dated Aug. 24, 2025.
International Search Report dated Jun. 21, 2021 for PCT/KR2021/003239.
Chinese Office action dated Dec. 19, 2024.

* cited by examiner

【Figure 1】
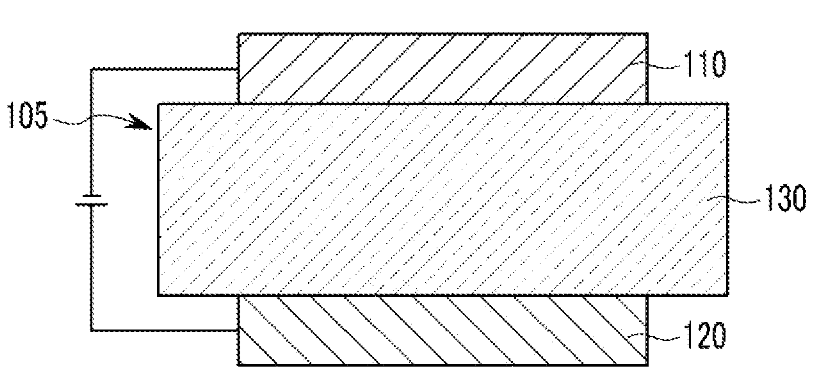
【Figure 2】
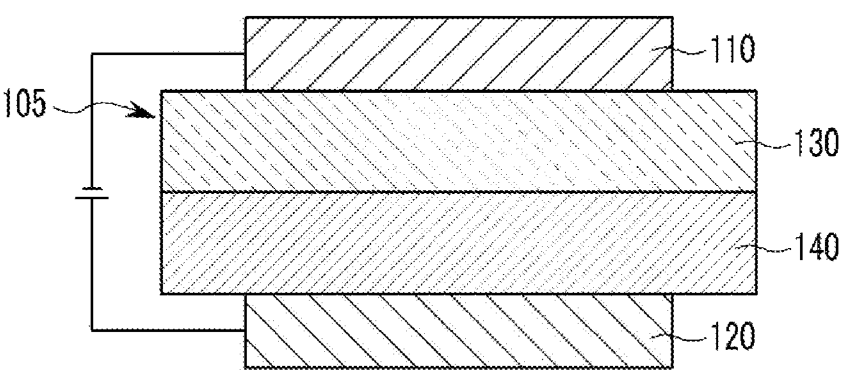

ORGANIC OPTOELECTRONIC ELEMENT COMPOUND, ORGANIC OPTOELECTRONIC ELEMENT COMPOSITION, ORGANIC OPTOELECTRONIC ELEMENT, AND DISPLAY DEVICE

CROSS-REFERENCE TO RELATED APPLICATIONS

This is the U.S. national phase application of PCT Application No. PCT/KR2021/003239, filed on Mar. 16, 2021, which is based on and claims priority to Korean Patent Application No. 10-2020-0048222, filed on Apr. 21, 2020, the entire contents of all of which are hereby incorporated by reference.

TECHNICAL FIELD

A compound for an organic optoelectronic device, a composition for an organic optoelectronic device, an organic optoelectronic device, and a display device are disclosed.

BACKGROUND ART

An organic optoelectronic device (organic optoelectronic diode) is a device capable of converting electrical energy and optical energy to each other.

Organic optoelectronic devices may be largely divided into two types according to a principle of operation. One is a photoelectric device that generates electrical energy by separating excitons formed by light energy into electrons and holes, and transferring the electrons and holes to different electrodes, respectively and the other is light emitting device that generates light energy from electrical energy by supplying voltage or current to the electrodes.

Examples of the organic optoelectronic device include an organic photoelectric device, an organic light emitting diode, an organic solar cell, and an organic photoconductor drum.

Among them, an organic light emitting diode (OLED) has recently drawn attention due to an increase in demand for flat panel displays. The organic light emitting diode is a device that converts electrical energy into light, and the performance of the organic light emitting diode is greatly influenced by an organic material between electrodes.

DISCLOSURE

Technical Problem

An embodiment provides a compound for an organic optoelectronic device capable of implementing a high efficiency and long life-span organic optoelectronic device.

Another embodiment provides a composition for an organic optoelectronic device including the compound.

Another embodiment provides an organic optoelectronic device including the compound.

Another embodiment provides a display device including the organic optoelectronic device.

Technical Solution

According to an embodiment, a compound for an organic optoelectronic device represented by Chemical Formula 1 is provided.

[Chemical Formula 1]

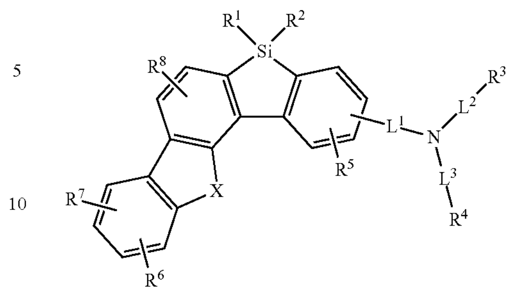

In Chemical Formula 1,

X is O or S, $L^1$ to $L^3$ are independently a single bond, a substituted or unsubstituted C6 to C30 arylene group, or a substituted or unsubstituted C2 to C30 heterocyclic group, $R^1$ and $R^2$ are independently a substituted or unsubstituted C1 to C30 alkyl group, or a substituted or unsubstituted C6 to C30 aryl group, $R^3$ and $R^4$ are independently a substituted or unsubstituted C6 to C30 aryl group, or a substituted or unsubstituted C2 to C30 heterocyclic group, and $R^5$ to $R^8$ are independently hydrogen, deuterium, a substituted or unsubstituted C1 to C30 alkyl group, or a substituted or unsubstituted C6 to C30 aryl group.

According to another embodiment, a composition for an organic optoelectronic device includes a first compound for an organic optoelectronic device, and a second compound for an organic optoelectronic device.

The first compound for an organic optoelectronic device is the aforementioned compound for an organic optoelectronic device and the second compound for an organic optoelectronic device may be represented by Chemical Formula 2.

[Chemical Formula 2]

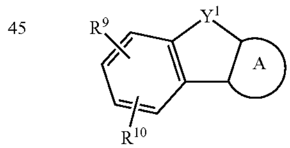

In Chemical Formula 2, $Y^1$ is O, S, N-$L^a$-$R^a$, $CR^bR^c$, or $SiR^dR^e$, $L^a$ is a single bond, or a substituted or unsubstituted C6 to C12 arylene group, $R^a$ is a substituted or unsubstituted C6 to C20 aryl group, or a substituted or unsubstituted C2 to C30 heterocyclic group, $R^b$, $R^C$, $R^d$ and $R^e$ are independently a substituted or unsubstituted C1 to C30 alkyl group, or a substituted or unsubstituted C6 to C30 aryl group, $R^9$ and $R^{10}$ are independently hydrogen, deuterium, a substituted or unsubstituted C6 to C20 aryl group, or a substituted or unsubstituted C2 to C30 heterocyclic group, and A is any one selected from the rings of Group I,

[Group I]

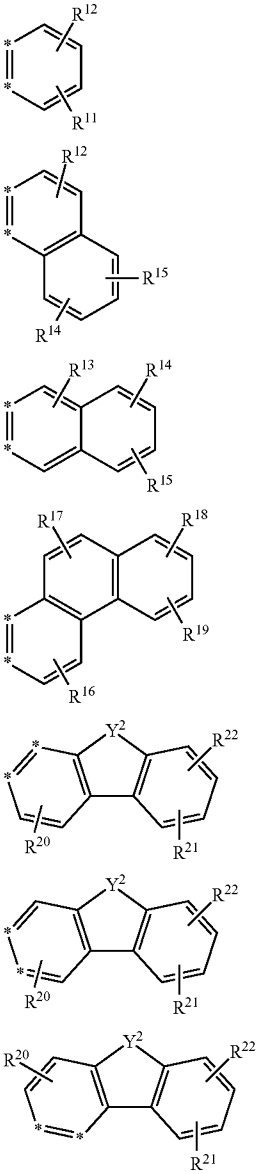

wherein, in Group 1,

* is a linking point, $Y^2$ is O or S, $R^{11}$ to $R^{22}$ are independently hydrogen, deuterium, a substituted or unsubstituted C6 to C20 aryl group, or a substituted or unsubstituted C2 to C30 heterocyclic group, and at least one of $R^a$ and $R^9$ to $R^{22}$ is a group represented by Chemical Formula a,

[Chemical Formula a]

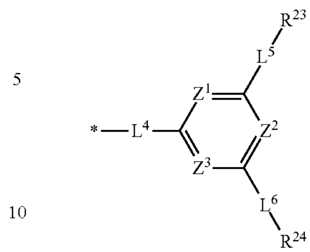

wherein, in Chemical Formula a, $Z^1$ to $Z^3$ are independently N or $CR^f$, $R^f$ is hydrogen, deuterium, a substituted or unsubstituted C1 to C30 alkyl group, or a substituted or unsubstituted C6 to C30 aryl group, at least two of $Z^1$ to $Z^3$ are N, $L^4$ to $L^6$ are independently a single bond, a substituted or unsubstituted C6 to C20 arylene group, or a substituted or unsubstituted C2 to C20 heterocyclic group, $R^{23}$ and $R^{24}$ are independently a substituted or unsubstituted C6 to C30 aryl group, or a substituted or unsubstituted C2 to C30 heterocyclic group, and

* is a linking point.

According to another embodiment, an organic optoelectronic device includes an anode and a cathode facing each other, and at least one organic layer between the anode and the cathode, wherein the organic layer includes the compound for an organic optoelectronic device.

According to another embodiment, a display device including the organic optoelectronic device is provided.

Advantageous Effects

High efficiency and long life-span organic optoelectronic devices may be implemented.

DESCRIPTION OF THE DRAWINGS

FIGS. 1 and 2 are cross-sectional views each illustrating an organic light emitting diode according to embodiments.

DESCRIPTION OF SYMBOLS

100, 200: organic light emitting diode
105: organic layer
110: cathode
120: anode
130: light emitting layer
140: hole auxiliary layer

BEST MODE

Hereinafter, embodiments of the present invention are described in detail. However, these embodiments are exemplary, the present invention is not limited thereto and the present invention is defined by the scope of claims.

As used herein, when a definition is not otherwise provided, "substituted" refers to replacement of at least one hydrogen of a substituent or a compound by deuterium, a halogen, a hydroxyl group, an amino group, a substituted or unsubstituted C1 to C30 amine group, a nitro group, a substituted or unsubstituted C1 to C40 silyl group, a C1 to C30 alkyl group, a C1 to C10 alkylsilyl group, a C6 to C30 arylsilyl group, a C3 to C30 cycloalkyl group, a C3 to C30 heterocycloalkyl group, a C6 to C30 aryl group, a C2 to C30 heteroaryl group, a C1 to C20 alkoxy group, a C1 to C10 trifluoroalkyl group, a cyano group, or a combination thereof.

In one example of the present invention, "substituted" refers to replacement of at least one hydrogen of a substituent or a compound by deuterium, a C1 to C30 alkyl group, a C1 to C10 alkylsilyl group, a C6 to C30 arylsilyl group, a C3 to C30 cycloalkyl group, a C3 to C30 heterocycloalkyl group, a C6 to C30 aryl group, a C2 to C30 heteroaryl group, or a cyano group. In addition, in specific examples of the present invention, "substituted" refers to replacement of at least one hydrogen of a substituent or a compound by deuterium, a C1 to C20 alkyl group, a C6 to C30 aryl group, or a cyano group. In addition, in specific examples of the present invention, "substituted" refers to replacement of at least one hydrogen of a substituent or a compound by deuterium, a C1 to C5 alkyl group, a C6 to C18 aryl group, or a cyano group. In addition, in specific examples of the present invention, "substituted" refers to replacement of at least one hydrogen of a substituent or a compound by deuterium, a cyano group, a methyl group, an ethyl group, a propanyl group, a butyl group, a phenyl group, a biphenyl group, a terphenyl group, or a naphthyl group.

As used herein, when a definition is not otherwise provided, "hetero" refers to one including one to three heteroatoms selected from N, O, S, P, and Si, and remaining carbons in one functional group.

As used herein, "aryl group" refers to a group including at least one hydrocarbon aromatic moiety, and may include a group in which all elements of the hydrocarbon aromatic moiety have p-orbitals which form conjugation, for example a phenyl group, a naphthyl group, and the like, a group in which two or more hydrocarbon aromatic moieties may be linked by a sigma bond, for example a biphenyl group, a terphenyl group, a quaterphenyl group, and the like, and a group in which two or more hydrocarbon aromatic moieties are fused directly or indirectly to provide a non-aromatic fused ring, for example, a fluorenyl group, and the like.

The aryl group may include a monocyclic, polycyclic or fused ring polycyclic (i.e., rings sharing adjacent pairs of carbon atoms) functional group.

As used herein, "heterocyclic group" is a generic concept of a heteroaryl group, and may include at least one heteroatom selected from N, O, S, P, and Si instead of carbon (C) in a cyclic compound such as an aryl group, a cycloalkyl group, a fused ring thereof, or a combination thereof. When the heterocyclic group is a fused ring, the entire ring or each ring of the heterocyclic group may include one or more heteroatoms.

For example, "heteroaryl group" refers to an aryl group including at least one heteroatom selected from N, O, S, P, and Si. Two or more heteroaryl groups are linked by a sigma bond directly, or when the heteroaryl group includes two or more rings, the two or more rings may be fused. When the heteroaryl group is a fused ring, each ring may include one to three heteroatoms.

More specifically, the substituted or unsubstituted C6 to C30 aryl group may be a substituted or unsubstituted phenyl group, a substituted or unsubstituted naphthyl group, a substituted or unsubstituted anthracenyl group, a substituted or unsubstituted phenanthrenyl group, a substituted or unsubstituted naphthacenyl group, a substituted or unsubstituted pyrenyl group, a substituted or unsubstituted biphenyl group, a substituted or unsubstituted p-terphenyl group, a substituted or unsubstituted m-terphenyl group, a substituted or unsubstituted o-terphenyl group, a substituted or unsubstituted chrysenyl group, a substituted or unsubstituted triphenylene group, a substituted or unsubstituted perylenyl group, a substituted or unsubstituted fluorenyl group, a substituted or unsubstituted indenyl group, a substituted or unsubstituted furanyl group, or a combination thereof, but is not limited thereto.

More specifically, the substituted or unsubstituted C2 to C30 heterocyclic group may be a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzthiazinyl group, a substituted or unsubstituted arcridinyl group, a substituted or unsubstituted phenazinyl group, a substituted or unsubstituted phenothiazinyl group, a substituted or unsubstituted phenoxazinyl group, a substituted or unsubstituted carbazolyl group, a substituted or unsubstituted dibenzofuranyl group, or a substituted or unsubstituted dibenzothiophenyl group, or a combination thereof, but are not limited thereto.

In the present specification, hole characteristics refer to an ability to donate an electron to form a hole when an electric field is applied and that a hole formed in the anode may be easily injected into the light emitting layer and transported in the light emitting layer due to conductive characteristics according to the highest occupied molecular orbital (HOMO) level.

In addition, electron characteristics refer to an ability to accept an electron when an electric field is applied and that electron formed in the cathode may be easily injected into the light emitting layer and transported in the light emitting layer due to conductive characteristics according to the lowest unoccupied molecular orbital (LUMO) level.

Hereinafter, a compound for an organic optoelectronic device according to an embodiment is described.

The compound for an organic optoelectronic device according to an embodiment is represented by Chemical Formula 1.

[Chemical Formula 1]

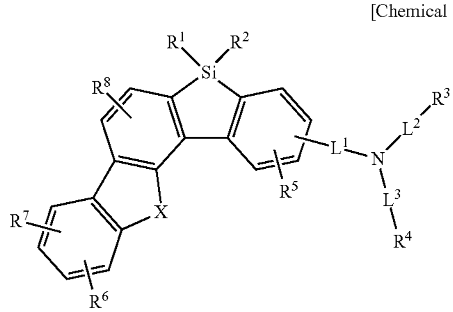

In Chemical Formula 1,

X is O or S, $L^1$ to $L^3$ are independently a single bond, a substituted or unsubstituted C6 to C30 arylene group, or a substituted or unsubstituted C2 to C30 heterocyclic group, $R^1$ and $R^2$ are independently a substituted or unsubstituted C1 to C30 alkyl group, or a substituted or unsubstituted C6 to C30 aryl group, $R^3$ and $R^4$ are independently a substituted or unsubstituted C6 to C30 aryl group, or a substituted or unsubstituted C2 to C30 heterocyclic group, and $R^5$ to $R^8$ are independently hydrogen, deuterium, a substituted or unsubstituted C1 to C30 alkyl group, or a substituted or unsubstituted C6 to C30 aryl group.

The compound represented by Chemical Formula 1 has a structure in which benzofuran (or benzothiophene) is further fused to dibenzosilole in a core, and the core is substituted with at least one substituted or unsubstituted amine group.

Dibenzosilole has fast hole transport characteristics, but due to a deep HOMO energy level, it is not possible to secure hole transport capability for charge balance. However, in the present invention, benzofuran (or benzothiophene) is further fused and thus the compound has a shallow HOMO level. Accordingly, an optimized hole transport capability may be secured, and by substituting it with an amine group, it may have T1 energy suitable for application as a host, and accordingly, characteristics of low driving and high efficiency of a device including the same may be realized.

In particular, as the dibenzosilole is fused at the 3 and 4 positions, hole mobility increases to accelerate a driving voltage, a balance of holes and electrons may be adjusted, and a glass transition temperature may be increased to implement excellent film characteristics during manufacture of a device.

As the amine group is substituted in the direction of the phenyl moiety of dibenzosilol in the core in which benzofuran (or benzothiophene) is further fused to dibenzosilole, a glass transition temperature may be increased, thereby further improving thermal stability, and film characteristics can be improved, thereby showing excellent device performance.

Chemical Formula 1 may be represented by, for example, any one of Chemical Formula 1-1 to Chemical Formula 1-4, depending on the position of substitution of a substituted or unsubstituted amine group.

[Chemical Formula 1-1]

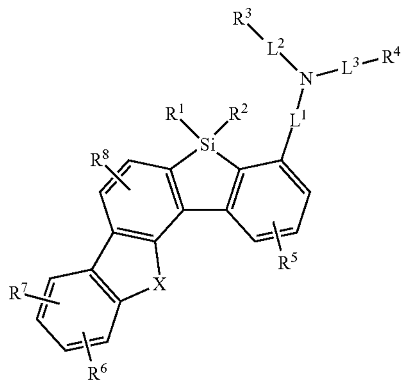

-continued

[Chemical Formula 1-2]

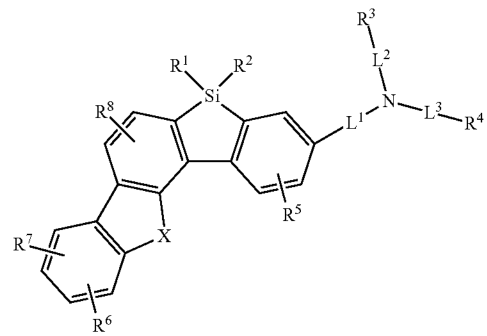

[Chemical Formula 1-3]

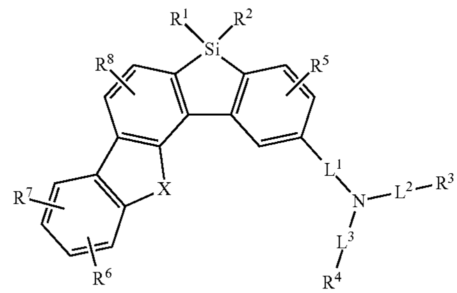

[Chemical Formula 1-4]

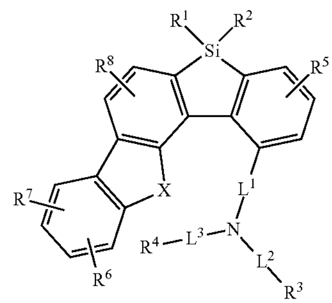

In Chemical Formula 1-1 to Chemical Formula 1-4,

X, $L^1$ to $L^3$, and $R^1$ to $R^8$ are the same as described above.

According to an embodiment, Chemical Formula 1 may be represented by Chemical Formula 1-2.

For example, $L^1$ of Chemical Formula 1 may be a single bond, and $L^2$ and $L^3$ may independently be a single bond, a substituted or unsubstituted phenylene group, or a substituted or unsubstituted biphenylene group.

As a specific example, $L^2$ and $L^3$ may independently be a single bond, a substituted or unsubstituted para-phenylene group, or a substituted or unsubstituted meta-phenylene group.

For example, $R^1$ and $R^2$ may independently be an unsubstituted methyl group, an unsubstituted ethyl group, a substituted or unsubstituted phenyl group, a substituted or unsubstituted naphthyl group, or a substituted or unsubstituted biphenyl group.

For example, $R^3$ and $R^4$ may independently be a substituted or unsubstituted phenyl group, a substituted or unsubstituted biphenyl group, a substituted or unsubstituted naphthyl group, a substituted or unsubstituted phenanthrenyl group, a substituted or unsubstituted chrysenyl group, a substituted or unsubstituted fluorenyl group, a substituted or unsubstituted carbazolyl group, a substituted or unsubstituted dibenzofuranyl group, a substituted or unsubstituted dibenzothiophenyl group, a substituted or unsubstituted dibenzosilolyl group, a substituted or unsubstituted benzonaphthofuranyl group, a substituted or unsubstituted benzonaphthothiophenyl group, or a substituted or unsubstituted benzoxazolyl group.

As a specific example, $R^3$ and $R^4$ may independently be a substituted or unsubstituted phenyl group, a substituted or unsubstituted biphenyl group, a substituted or unsubstituted naphthyl group, a substituted or unsubstituted dibenzofuranyl group, a substituted or unsubstituted dibenzothiophenyl group, a substituted or unsubstituted benzonaphthofuranyl group, or a substituted or unsubstituted benzonaphthothiophenyl group.

For example, $R^5$ to $R^8$ may independently be hydrogen, deuterium, a substituted or unsubstituted C1 to C10 alkyl group, or a substituted or unsubstituted C6 to C12 aryl group.

As a specific example, $R^5$ to $R^8$ may independently be hydrogen, deuterium, or a phenyl group.

For example, the compound for an organic optoelectronic device represented by Chemical Formula 1 may be one selected from compounds of Group 1, but is not limited thereto.

[Group 1]

A-1

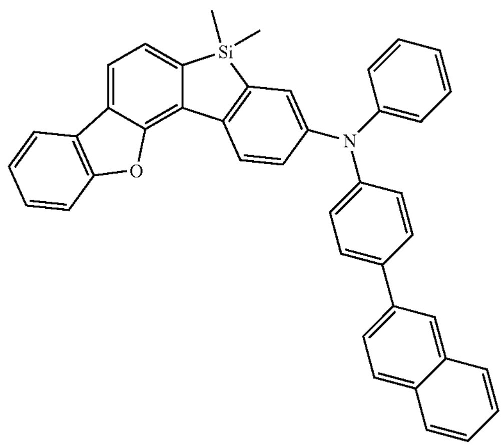

A-2

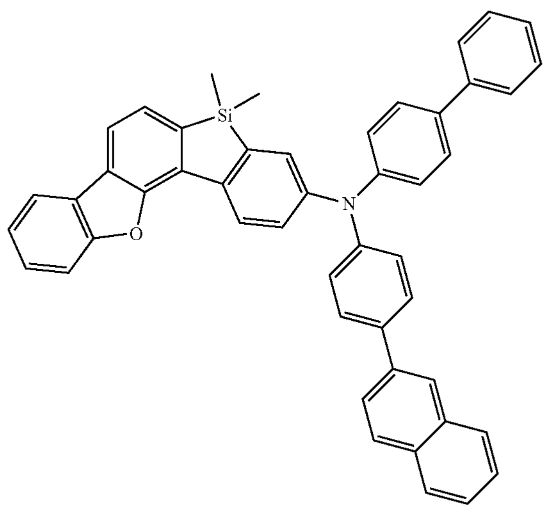

-continued

A-3

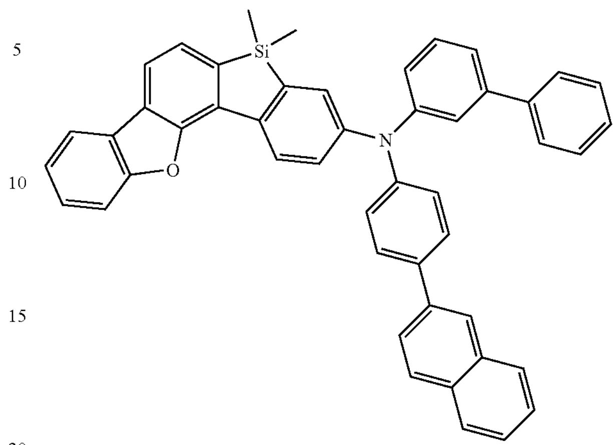

A-4

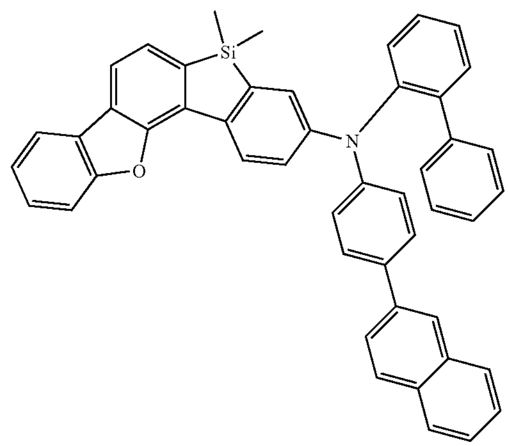

A-5

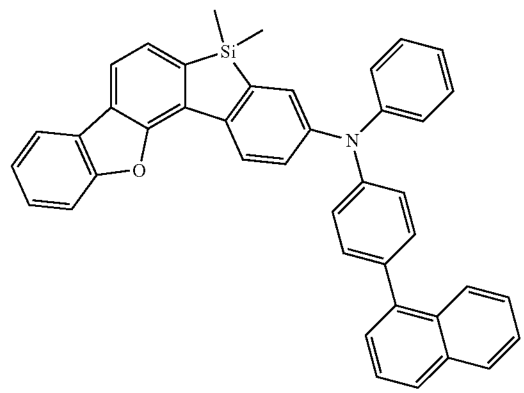

-continued
A-6
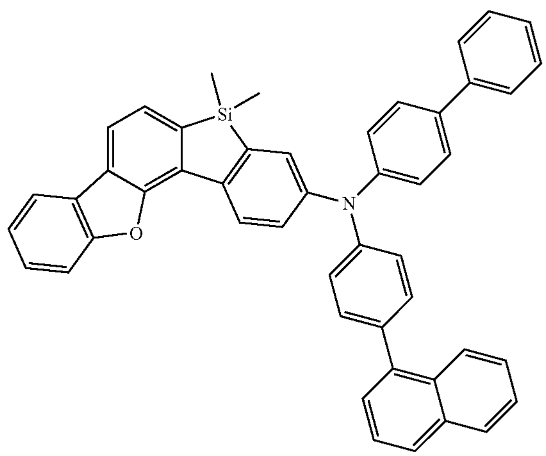
A-7
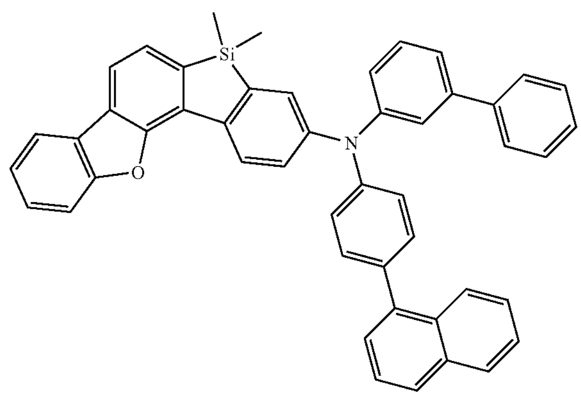
A-8
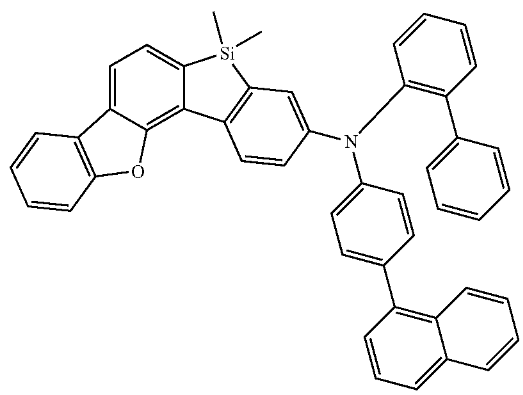
A-9
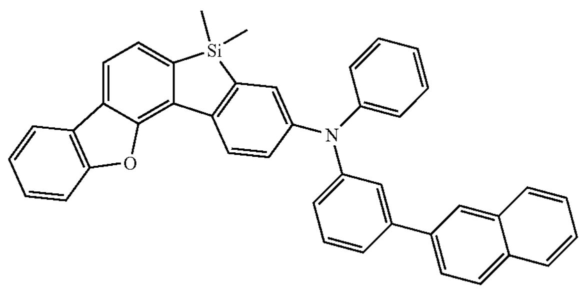
-continued
A-10
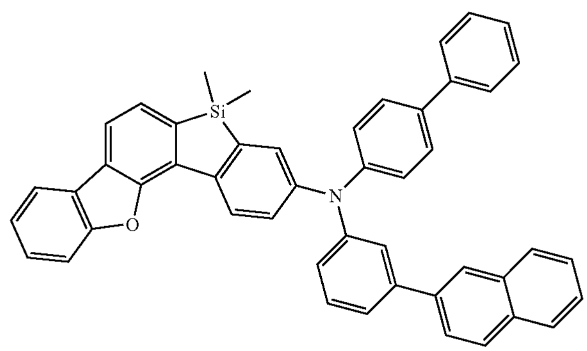
A-11
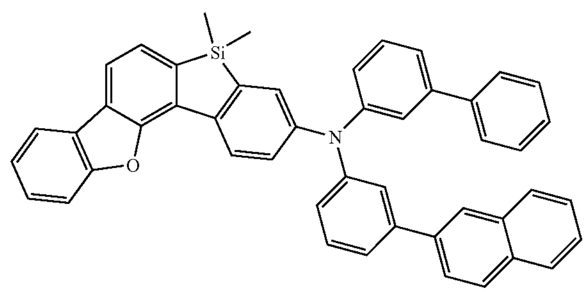
A-12
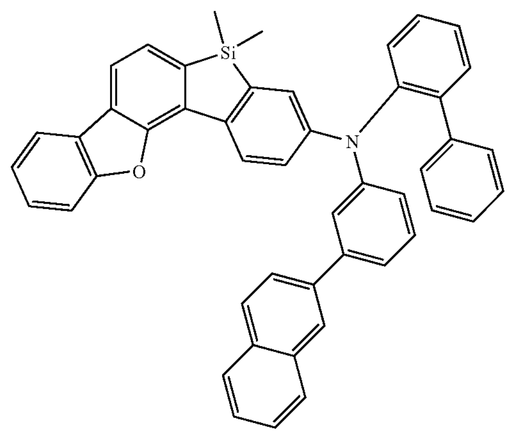
A-13
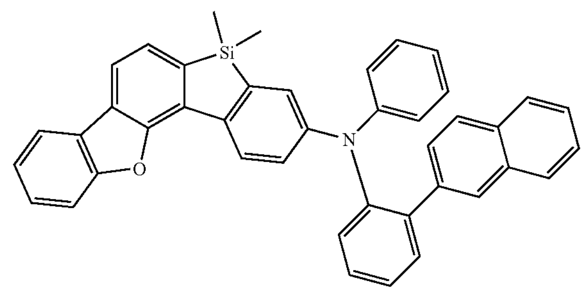

-continued
A-14
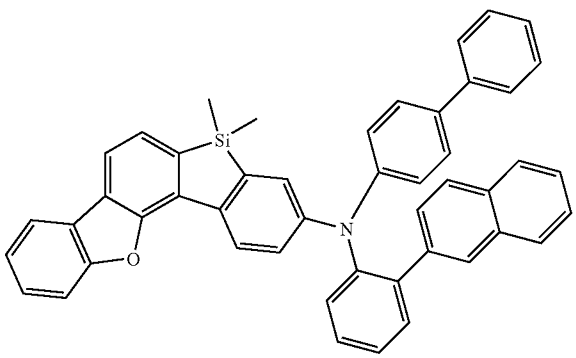
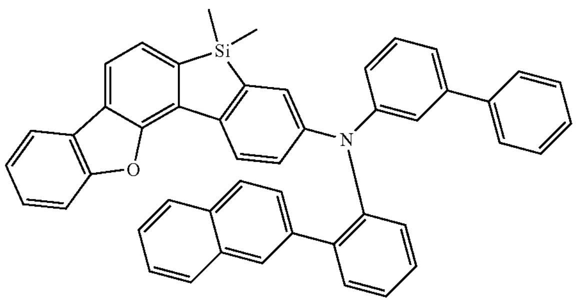
A-16
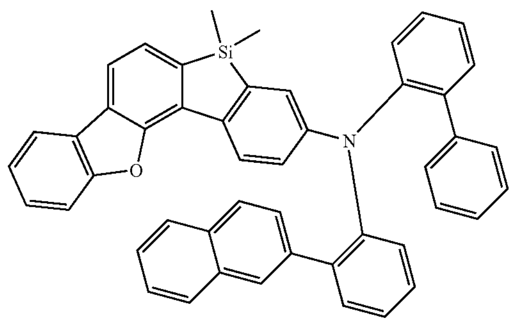
A-17
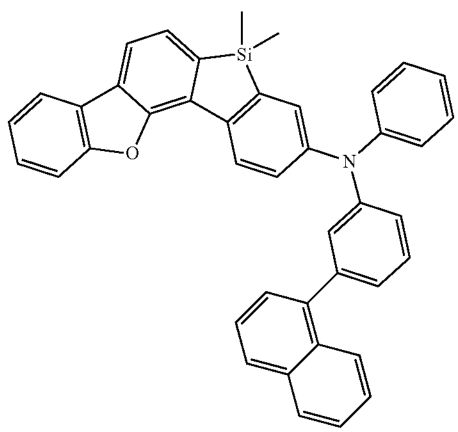
-continued
A-18
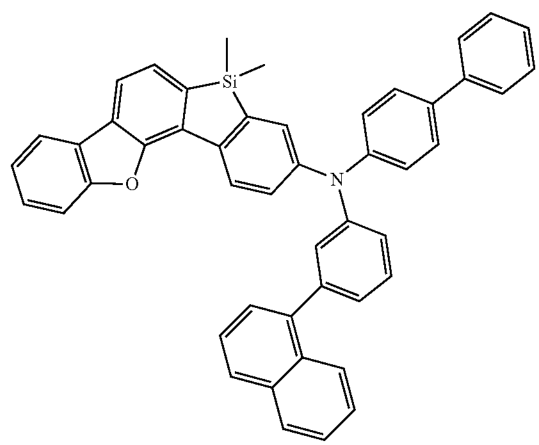
A-19
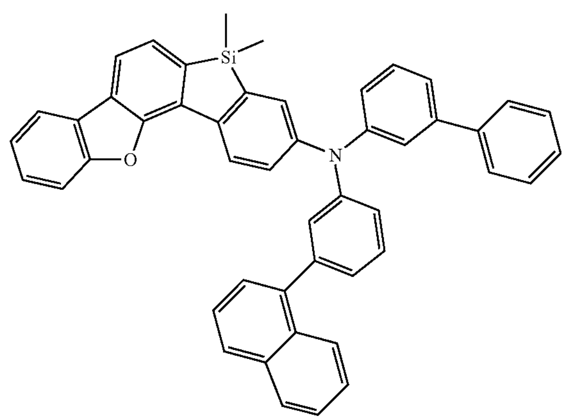
A-20
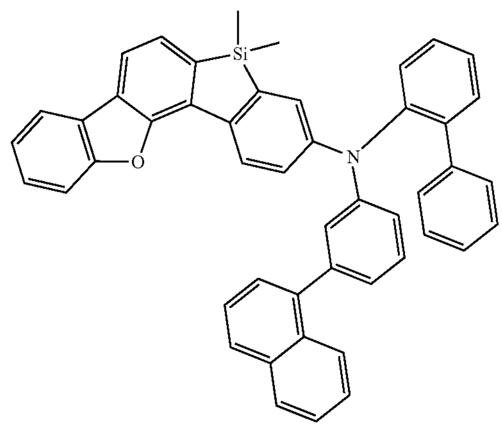

-continued
A-21
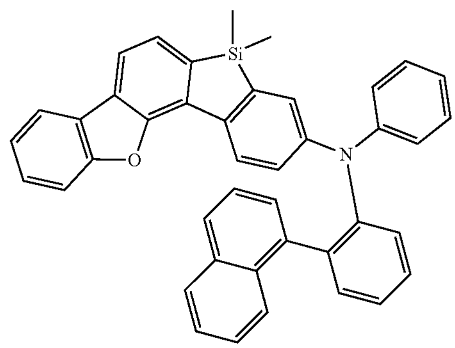
A-22
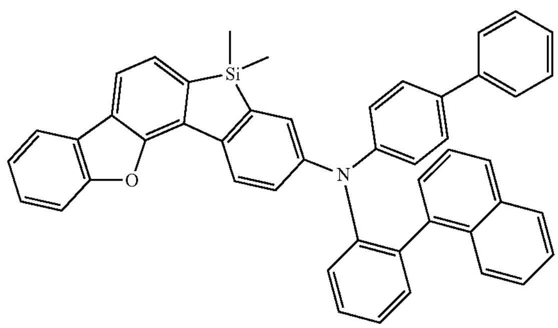
A-23
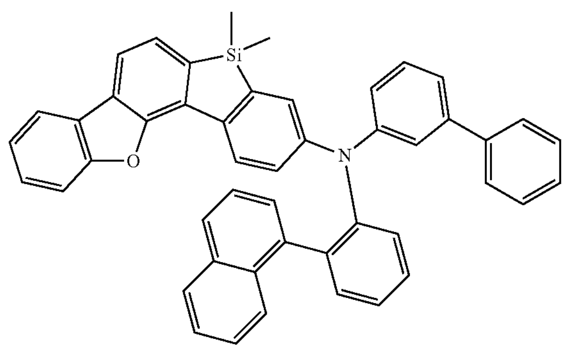
A-24
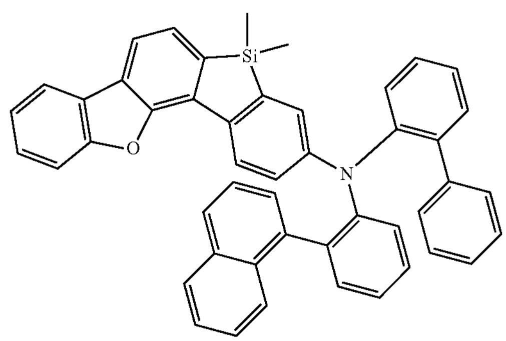
-continued
A-25
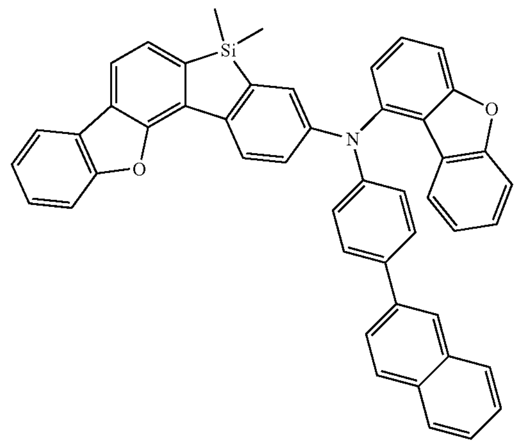
A-26
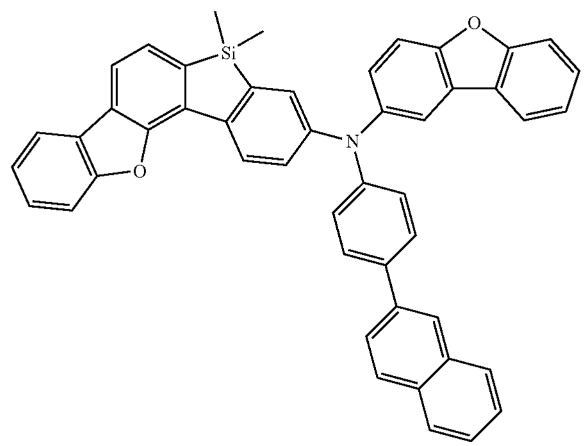
A-27
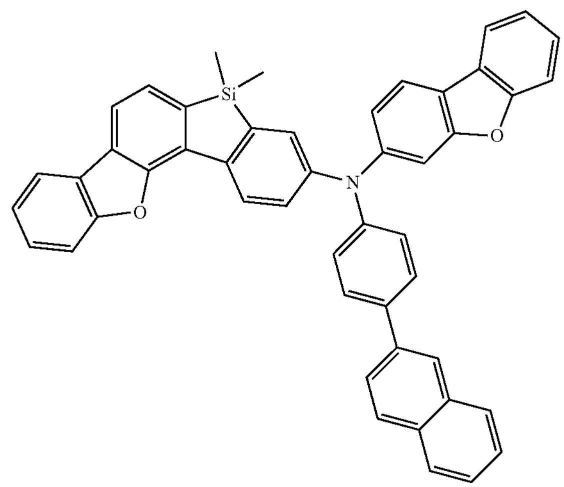

-continued
A-28
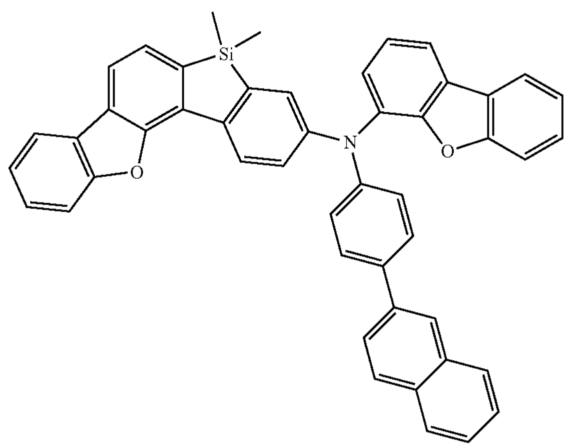
A-29
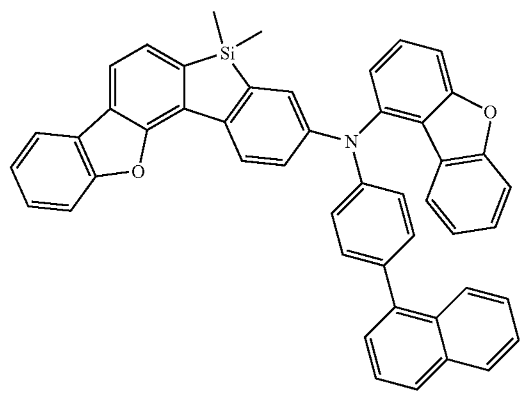
A-30
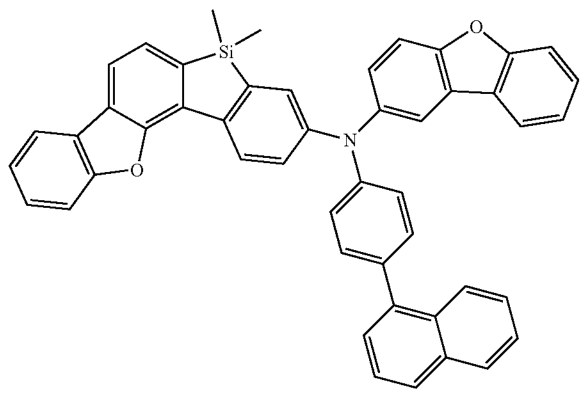
-continued
A-31
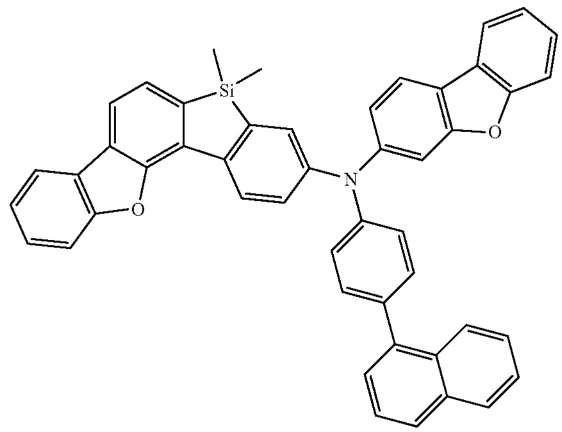
A-32
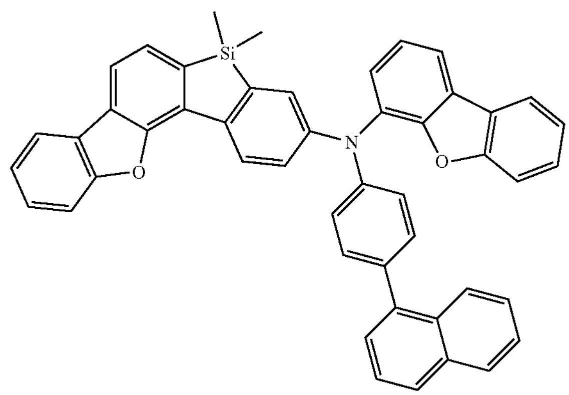
A-33
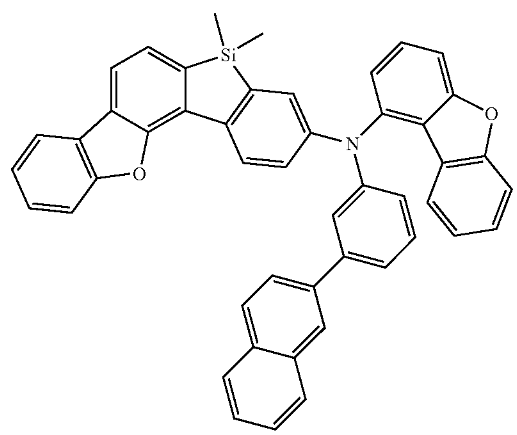

-continued
A-34
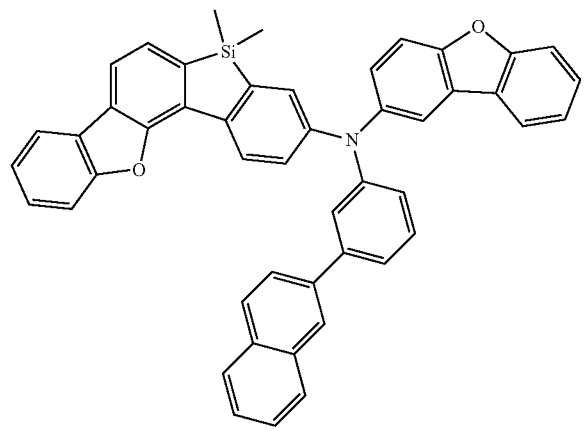
A-35
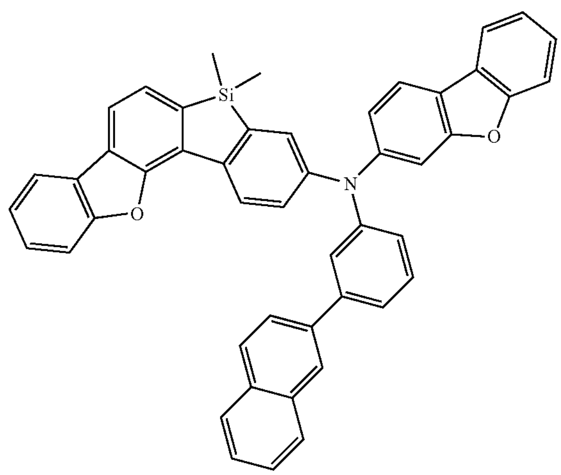
A-36
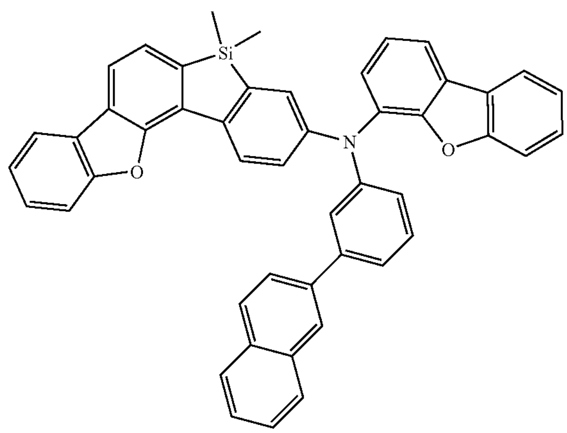
-continued
A-37
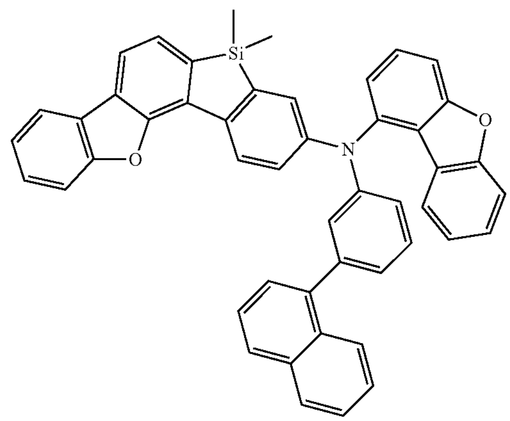
A-38
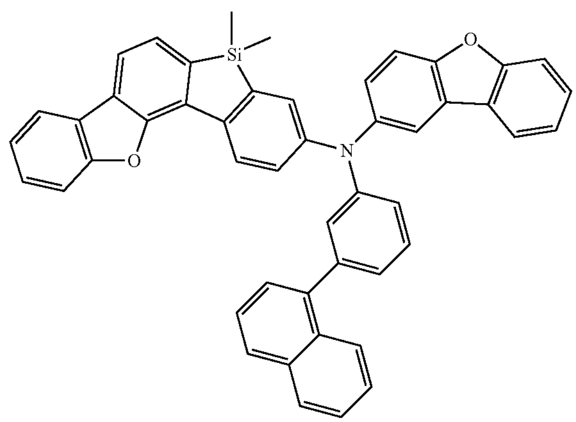
A-39
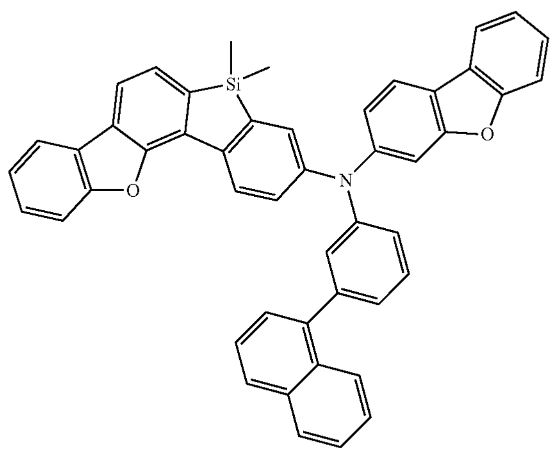

-continued
A-40
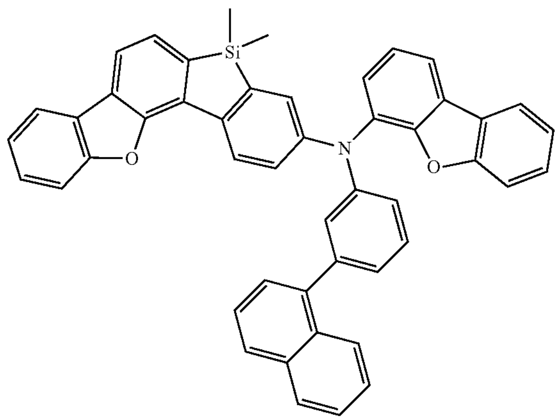
A-41
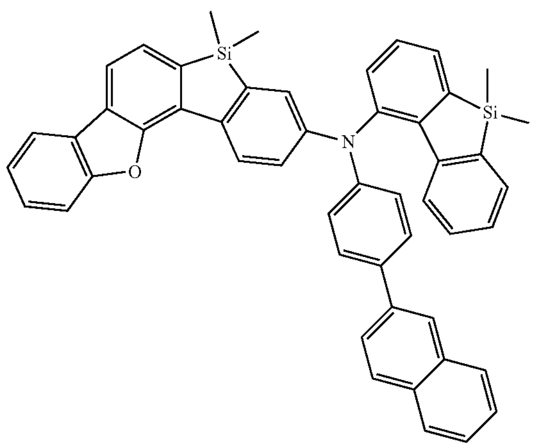
A-42
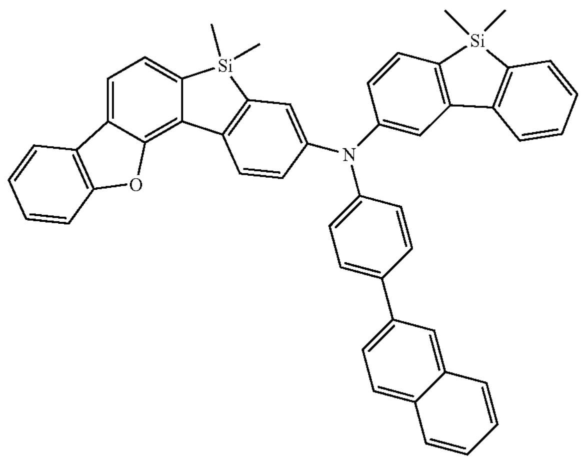
-continued
A-43
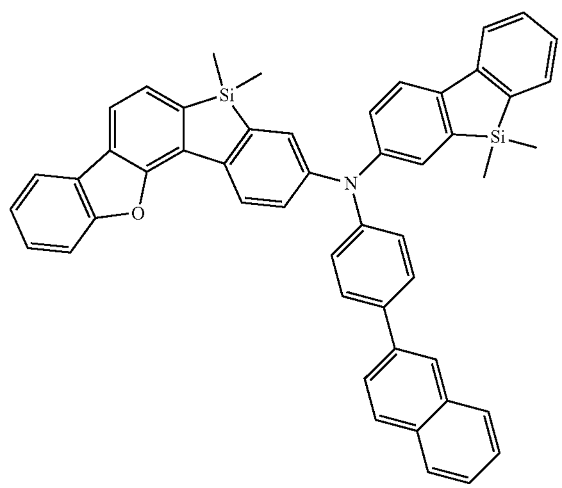
A-44
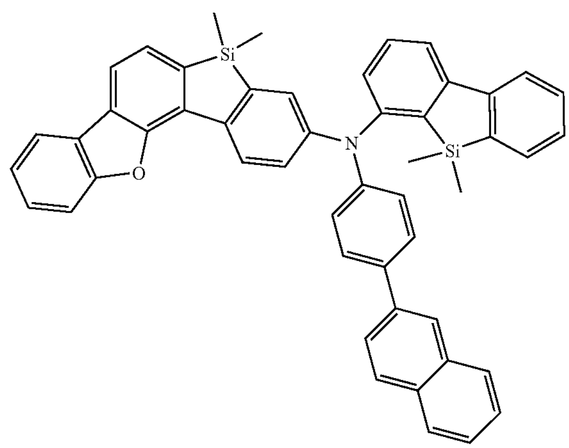
A-45
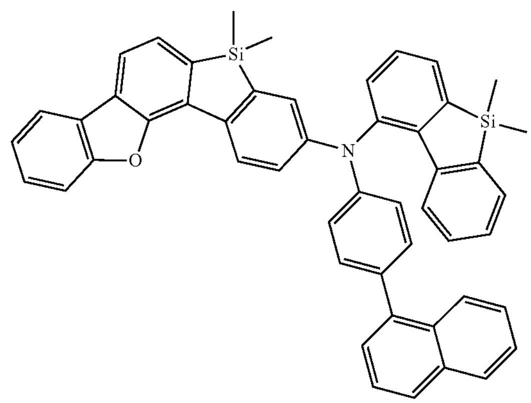

A-46
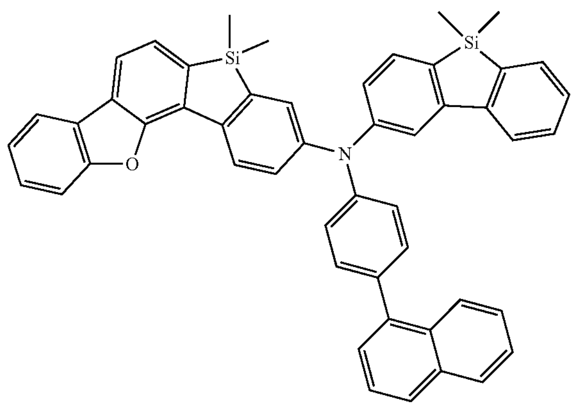
A-47
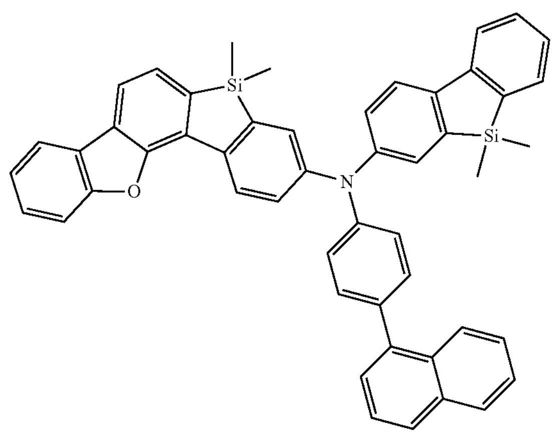
A-48
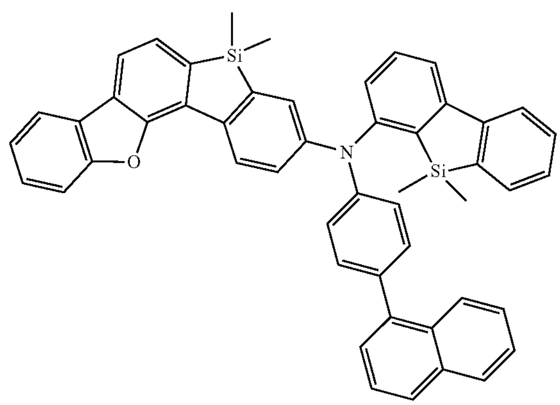
A-49
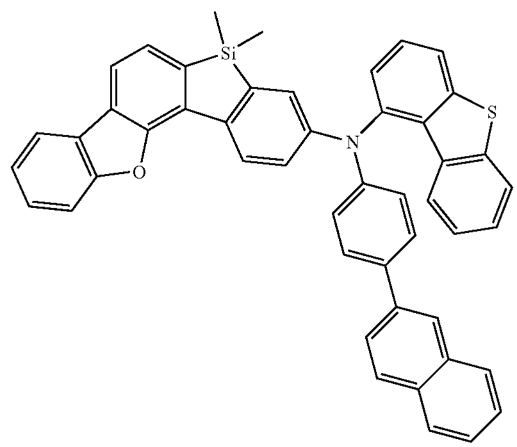
A-50
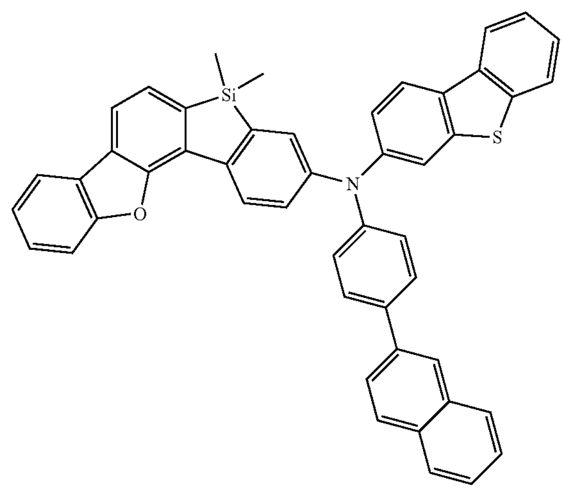
A-51

-continued
A-52
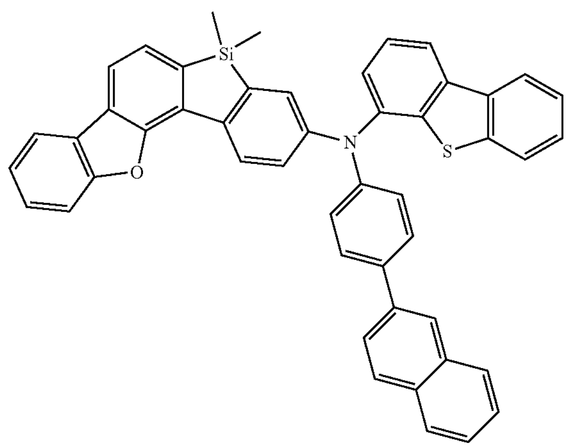
A-53
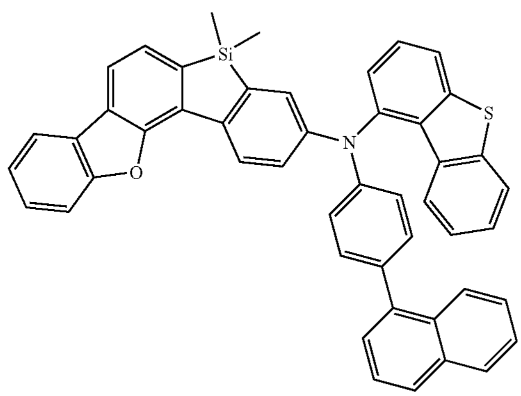
A-54
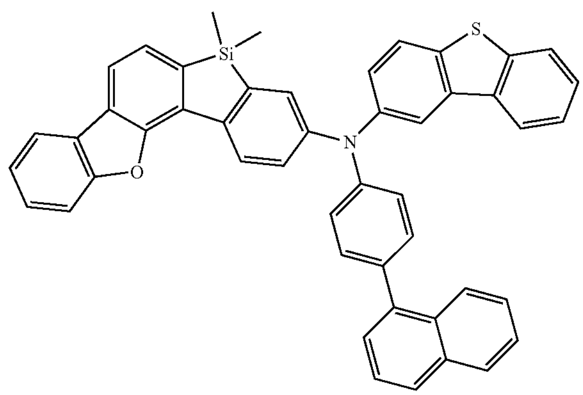
-continued
A-55
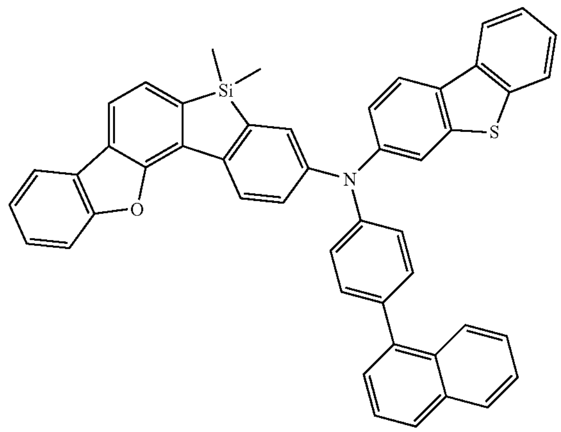
A-56
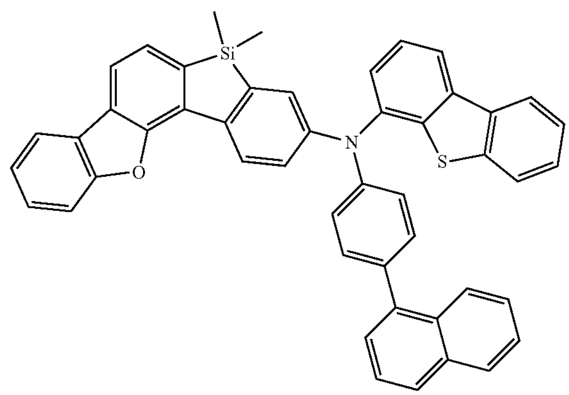
A-57
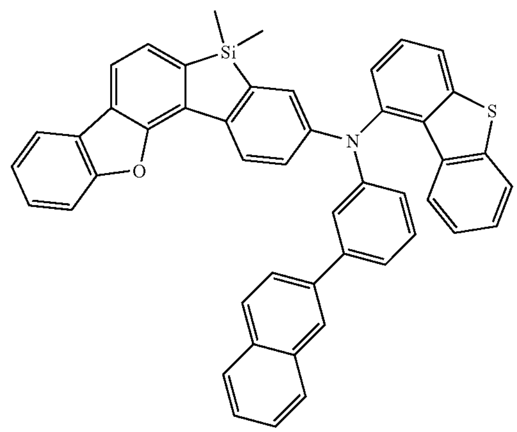

-continued
A-58
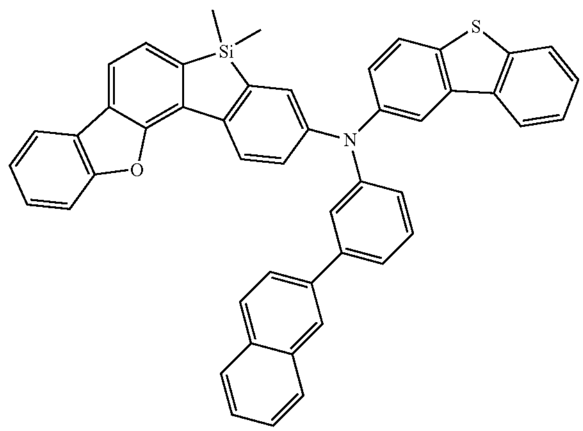
A-59
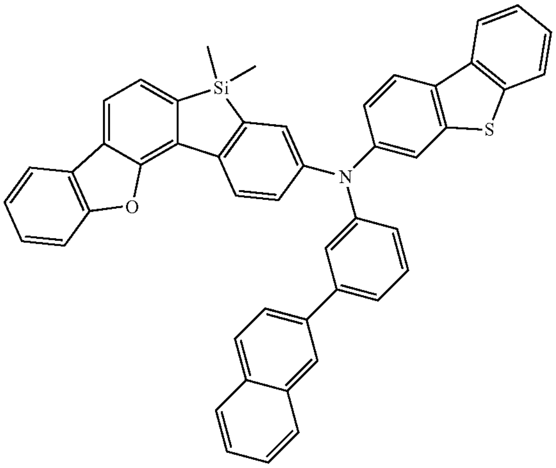
A-60
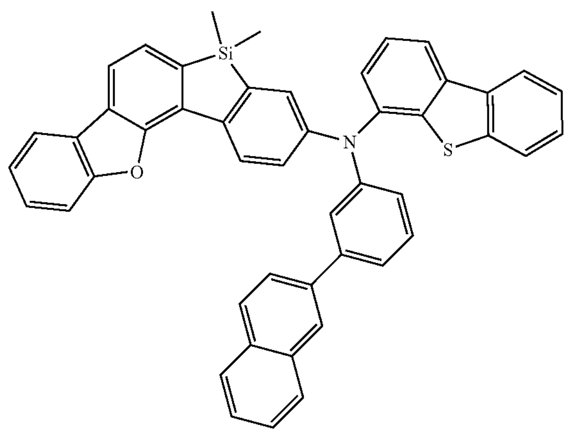
-continued
A-61
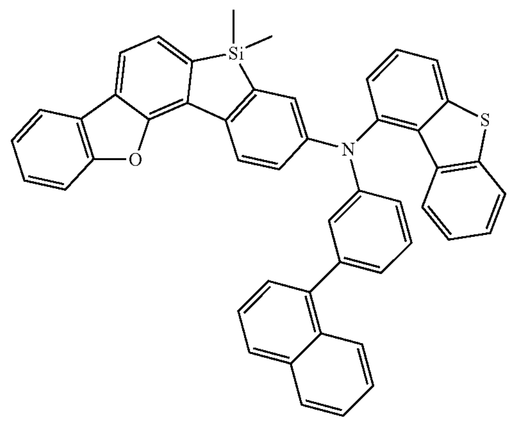
A-62
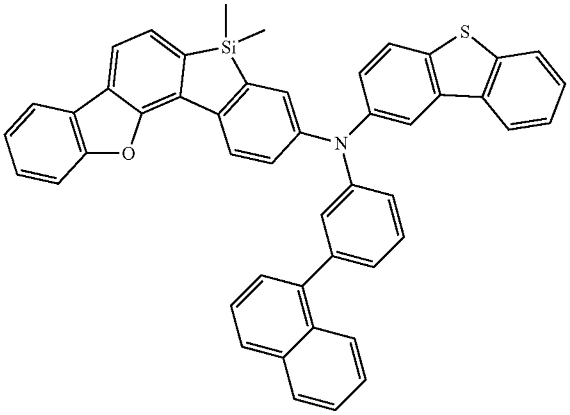
A-63
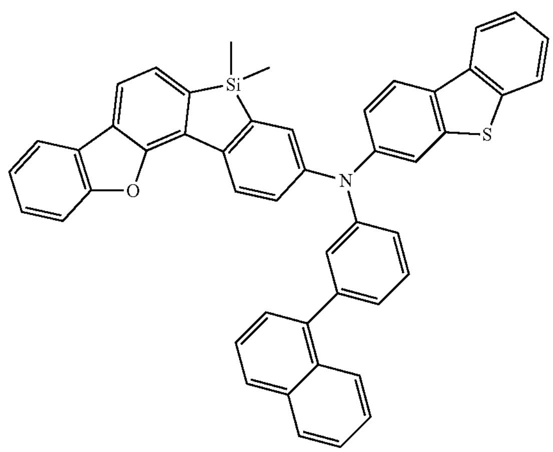

-continued
A-64
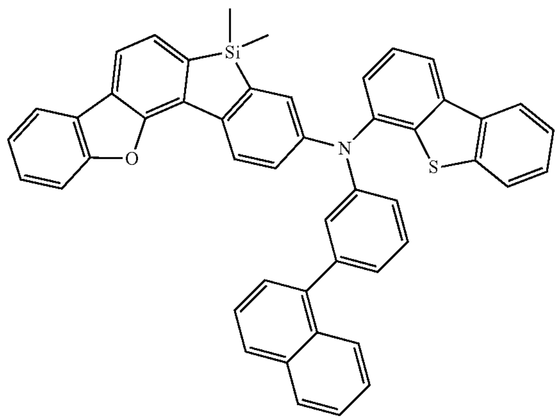
A-65
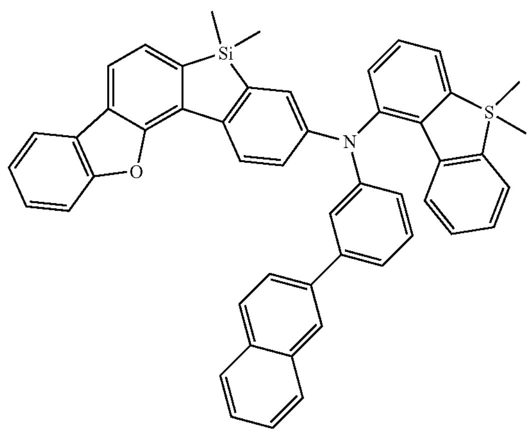
A-66
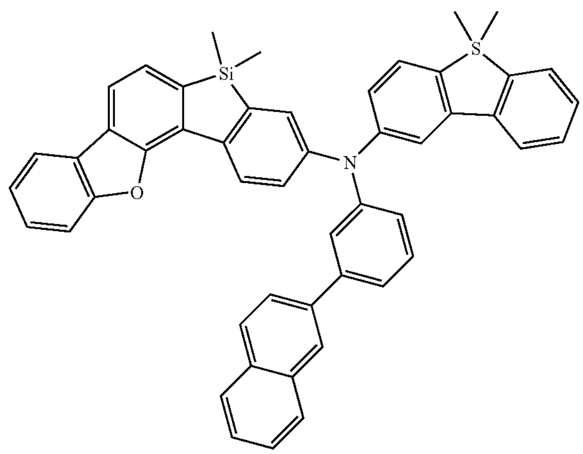
-continued
A-67
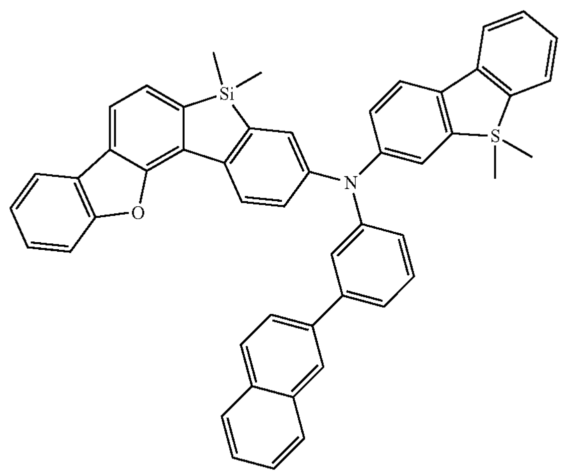
A-68
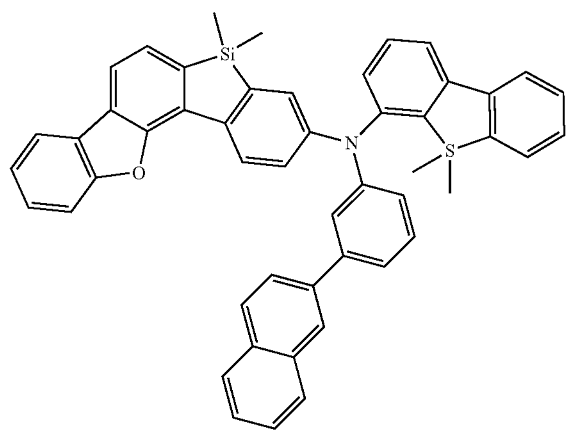
A-69
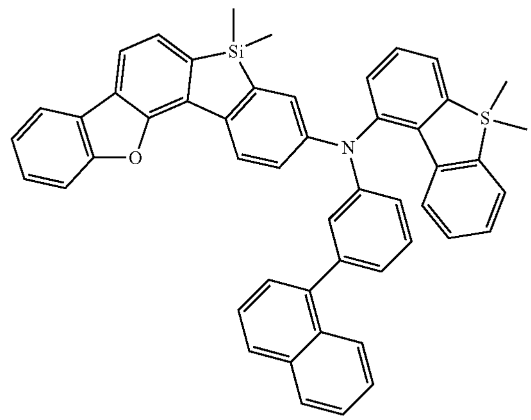

-continued
A-70
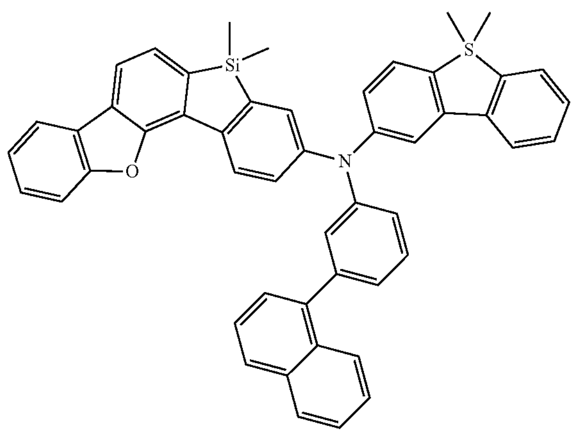
A-71
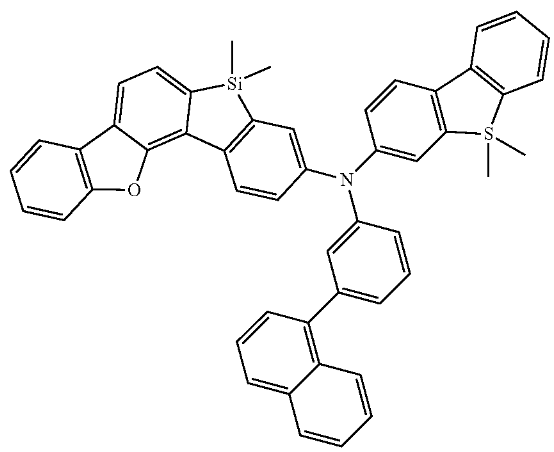
A-72
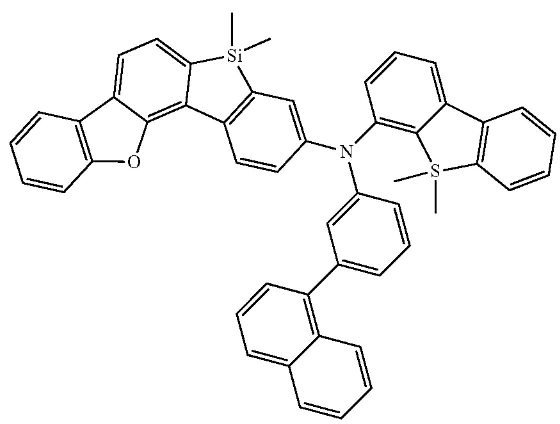
-continued
A-73
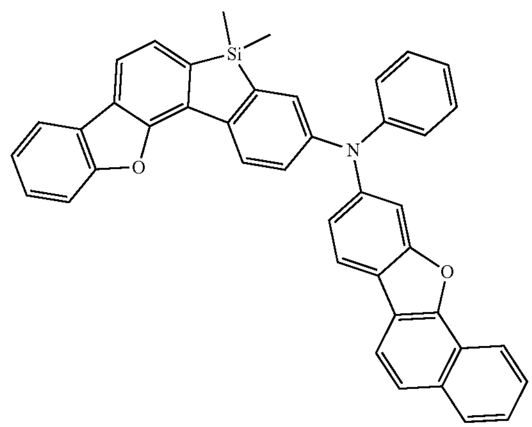
A-74
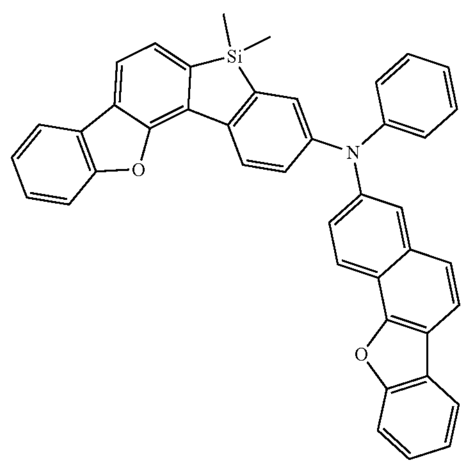
A-75
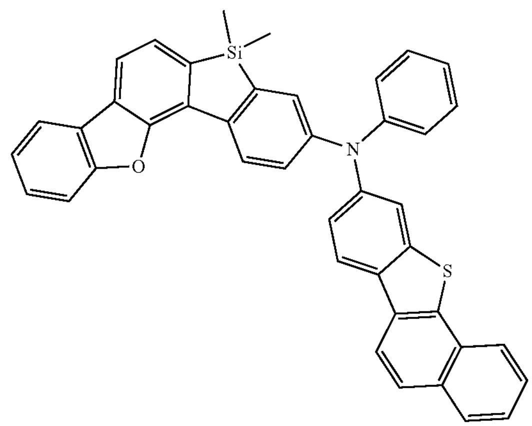

-continued
A-76
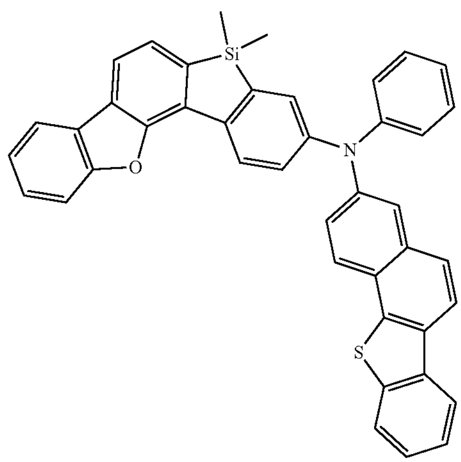
A-77
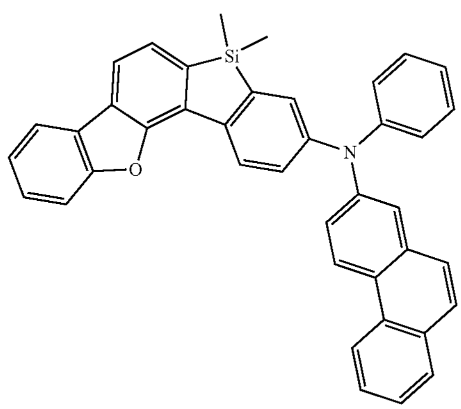
A-78
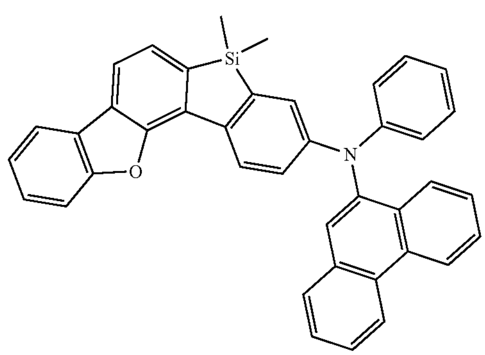
A-79
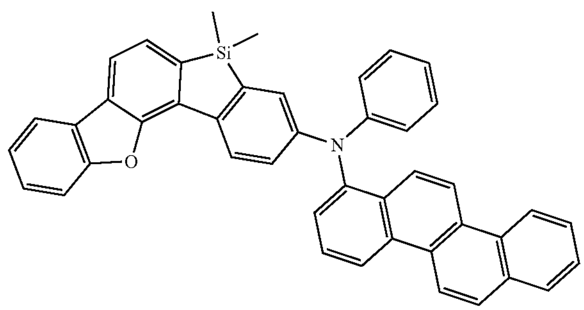
-continued
A-80
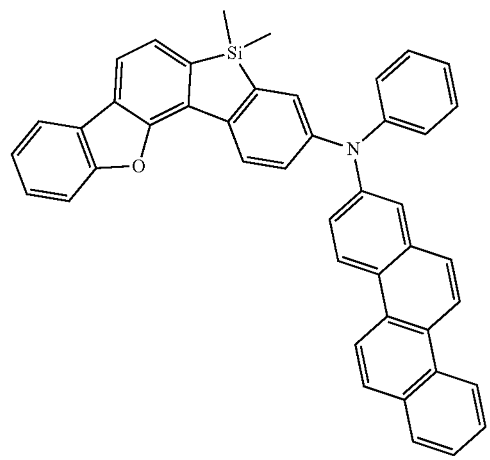
A-81
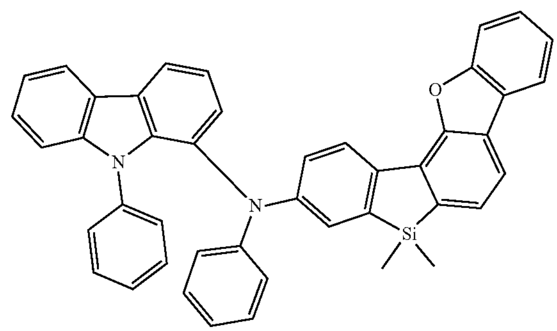
A-82
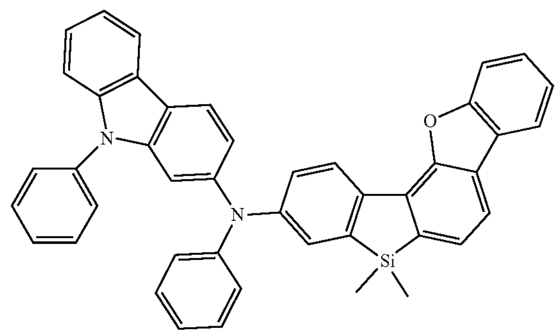
A-83
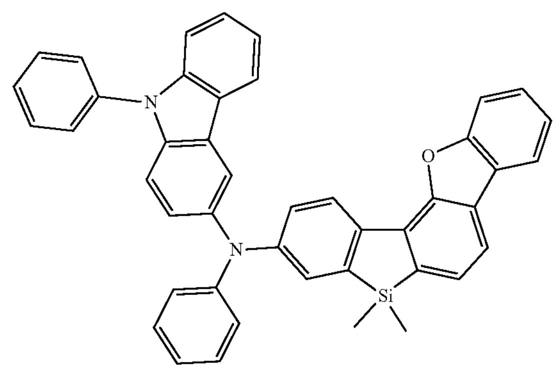

-continued
A-84
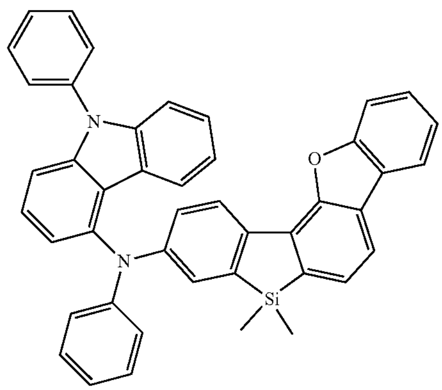
A-85
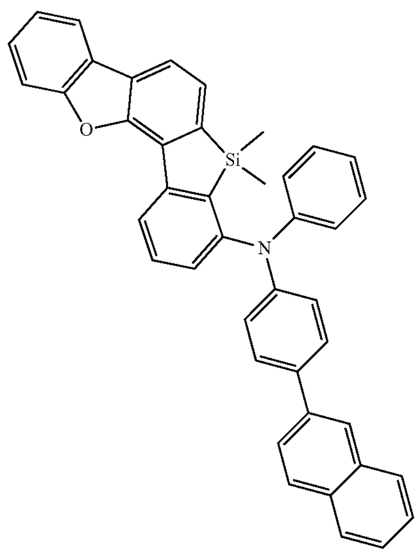
A-86
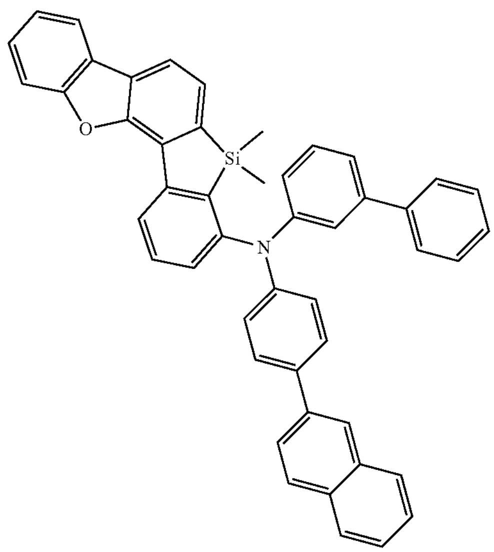
-continued
A-87
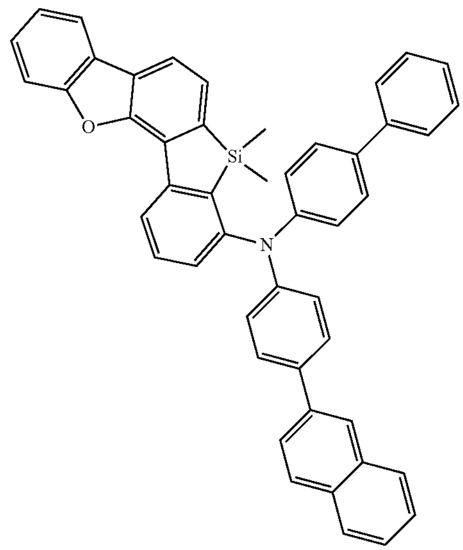
A-88
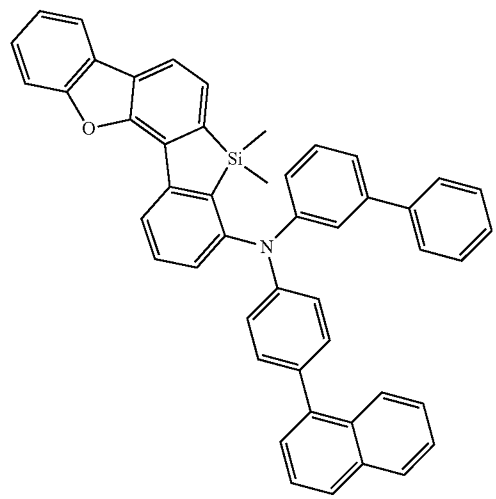
A-89
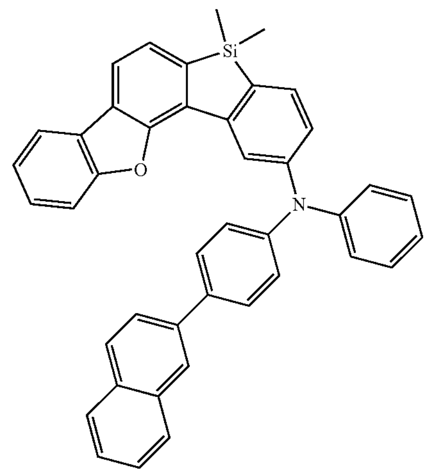

-continued
A-90
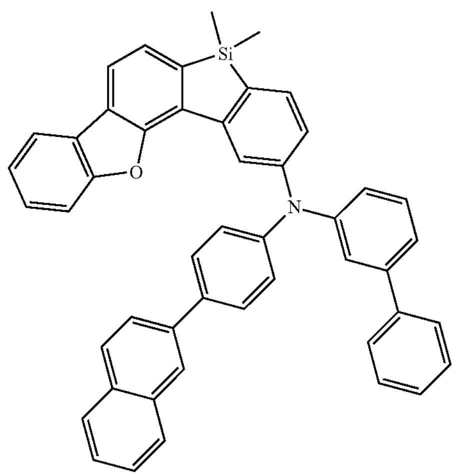
A-91
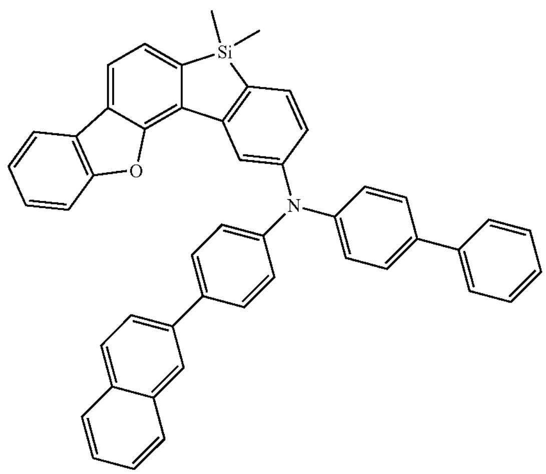
A-92
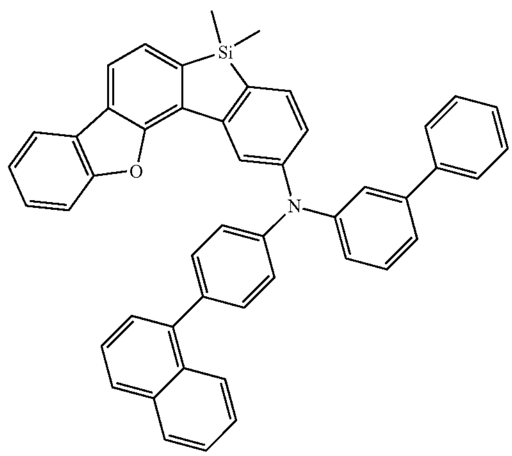
-continued
A-93
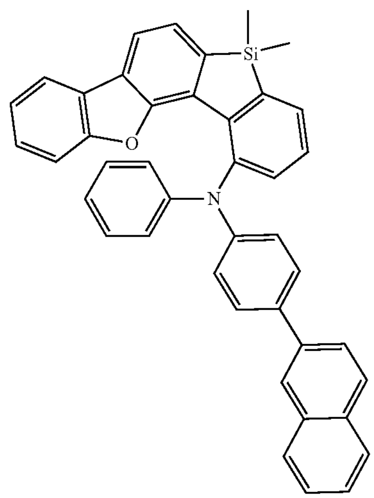
A-94
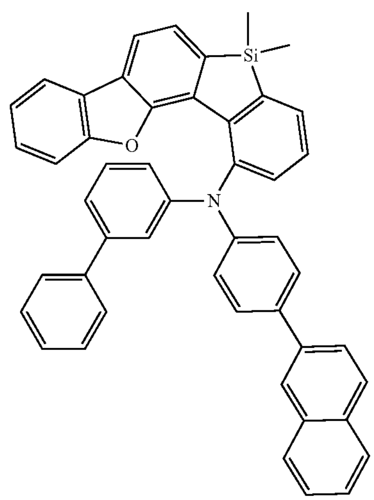
A-95
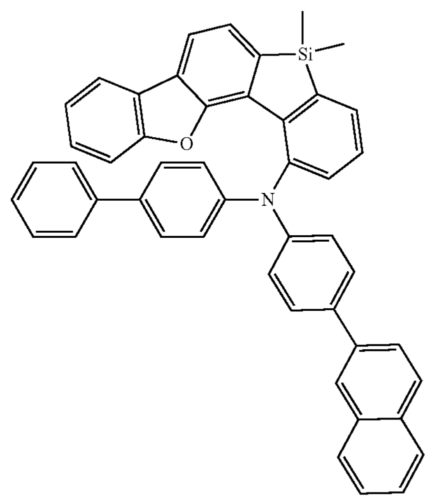

-continued
A-96
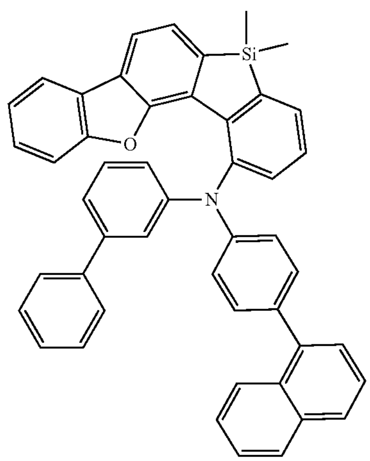
A-97
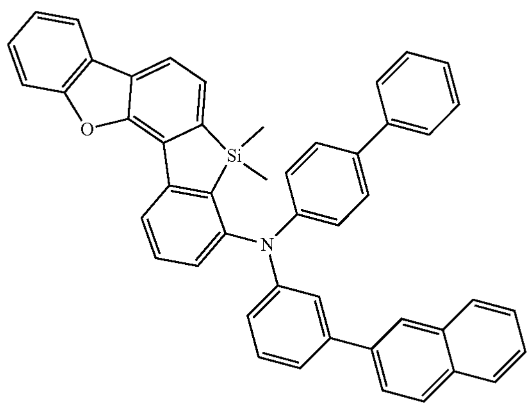
A-98
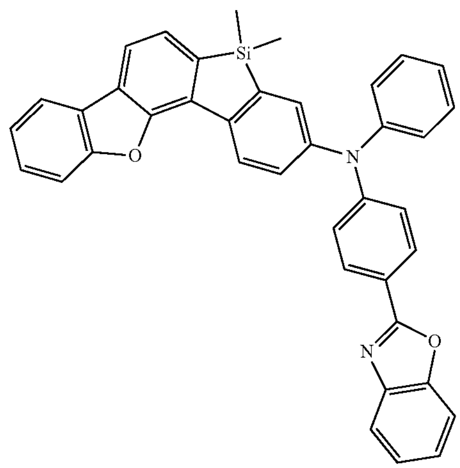
-continued
A-99
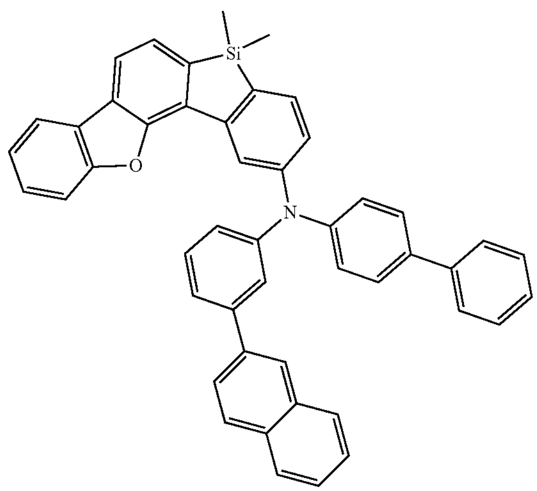
A-100
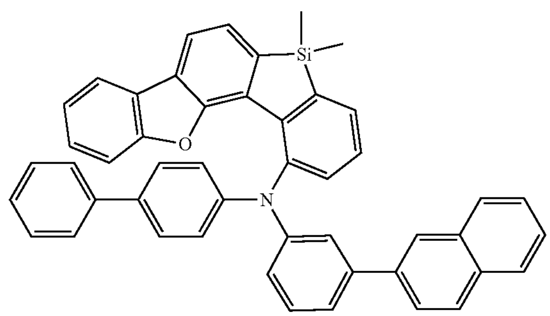
A-101
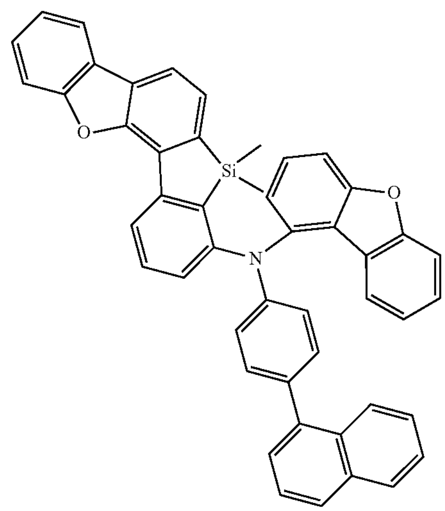

-continued
A-102
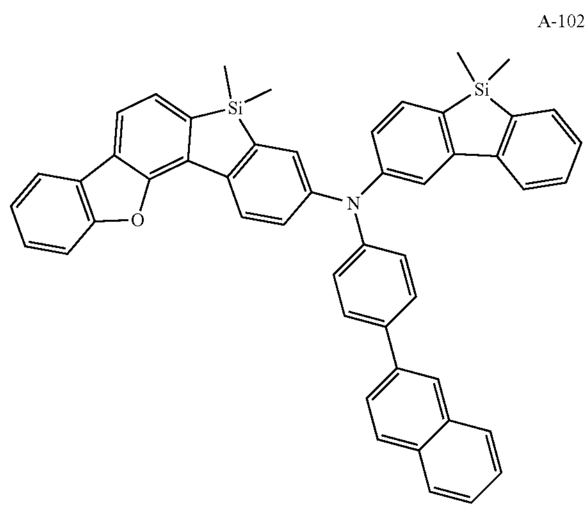
A-103
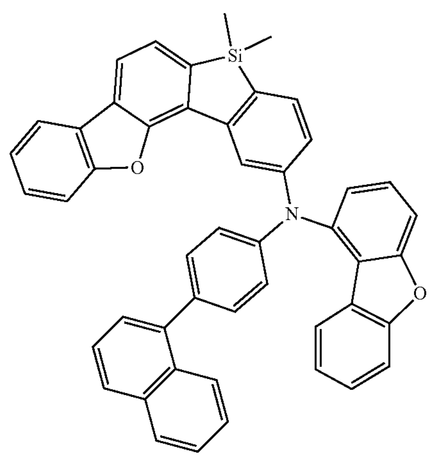
A-104
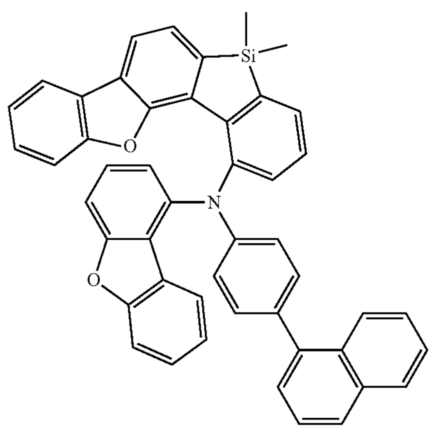
-continued
A-105
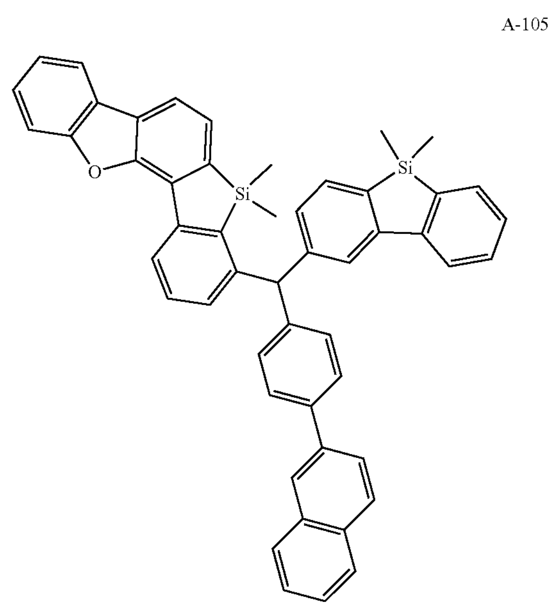
A-106
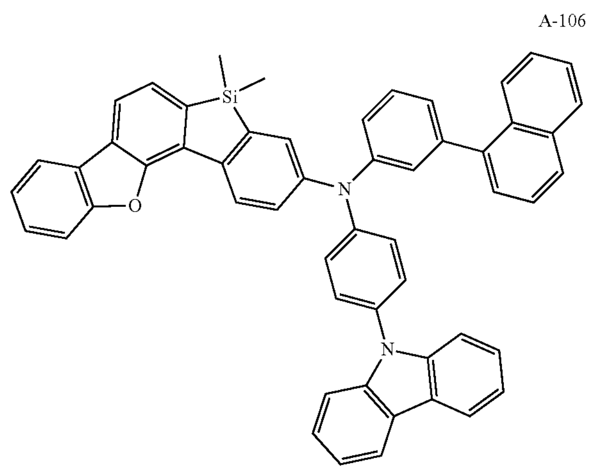
A-107
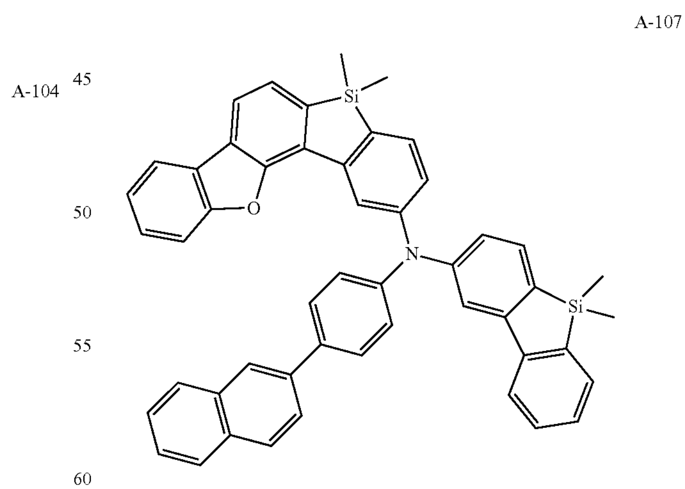

-continued
A-108
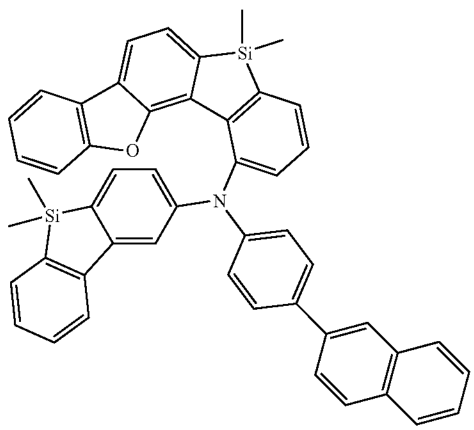
B-1
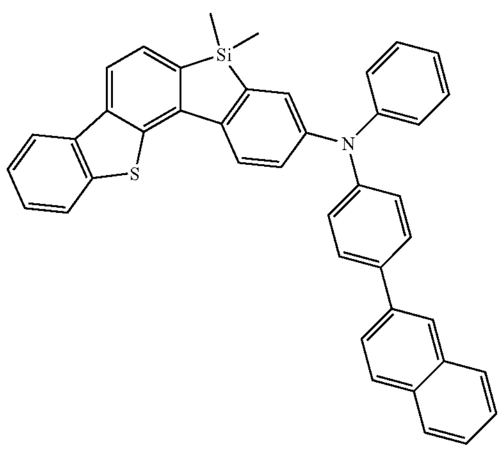
B-2
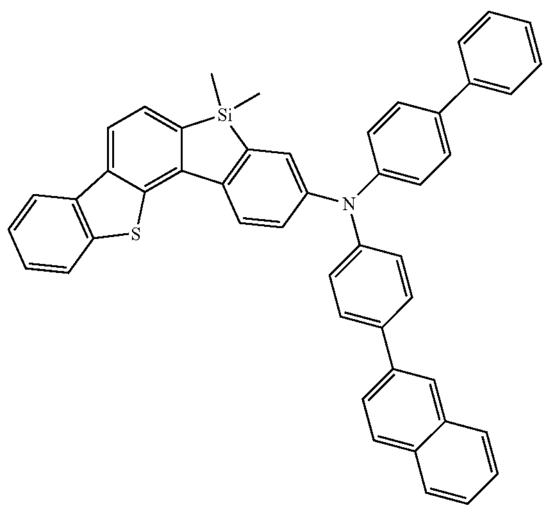
-continued
B-3
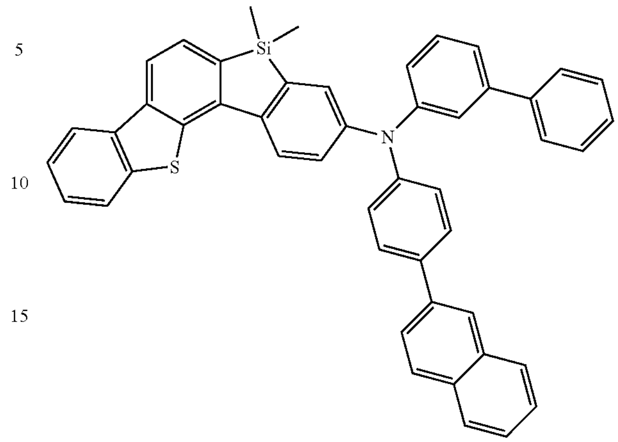
B-4
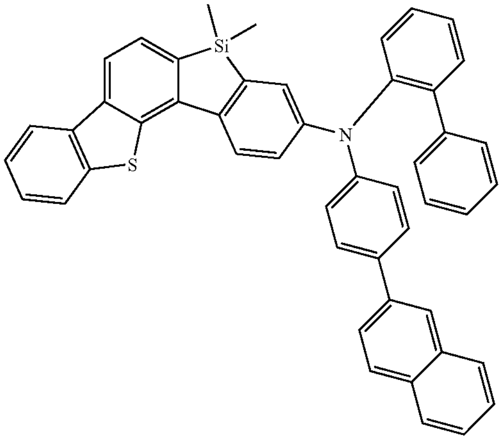
B-5
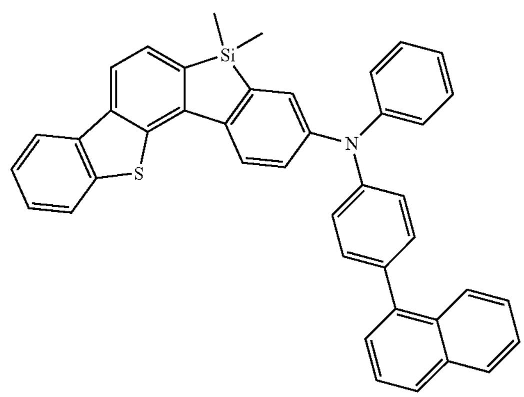

B-6
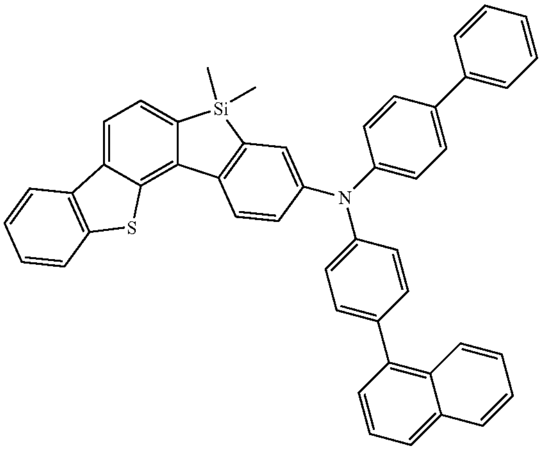
B-7
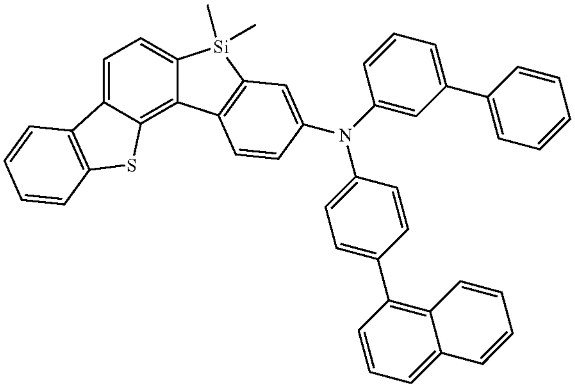
B-8
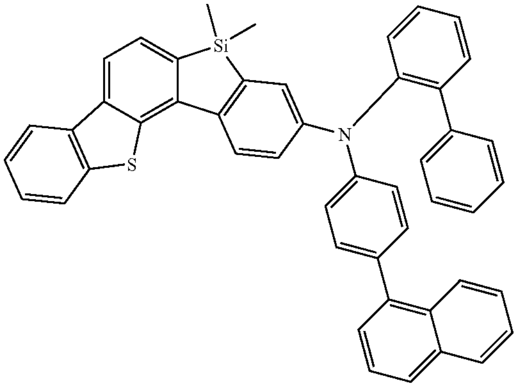
B-9
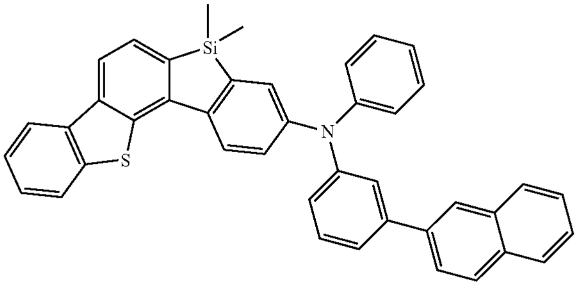
B-10
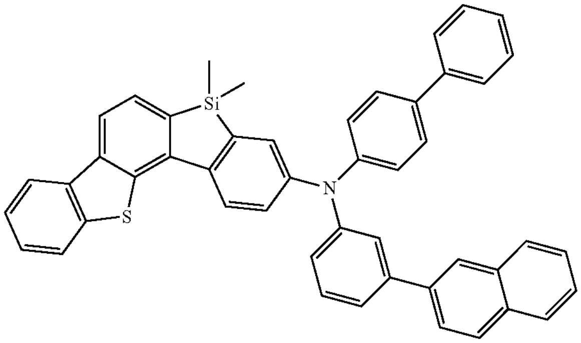
B-11
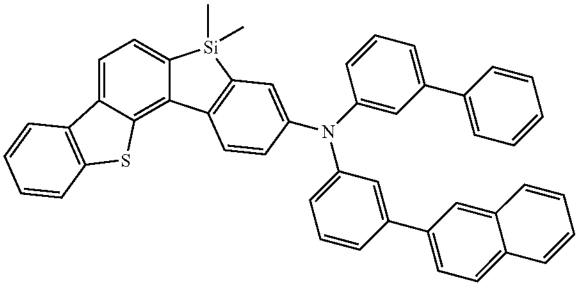
B-12
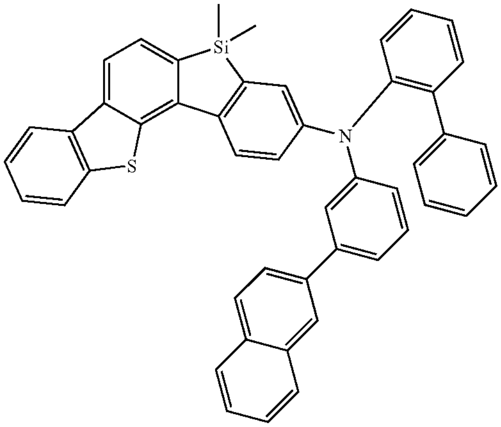
B-13
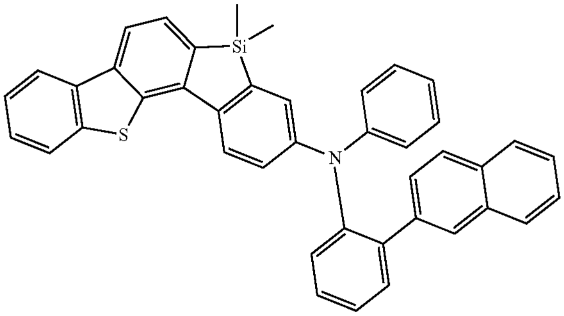

-continued
B-14
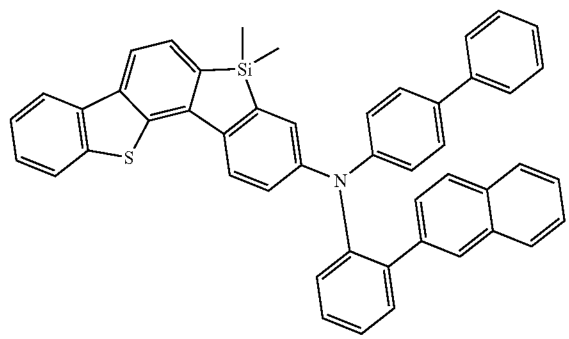
B-15
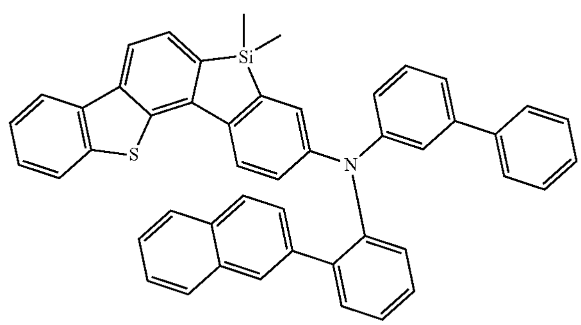
B-16
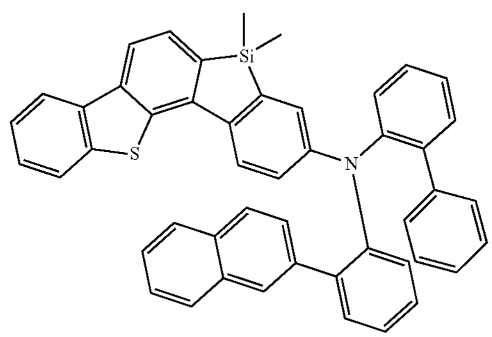
B-17
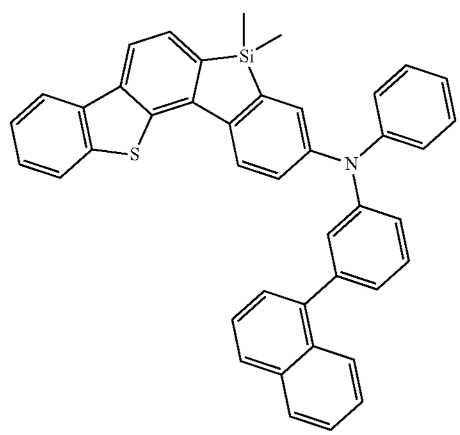
-continued
B-18
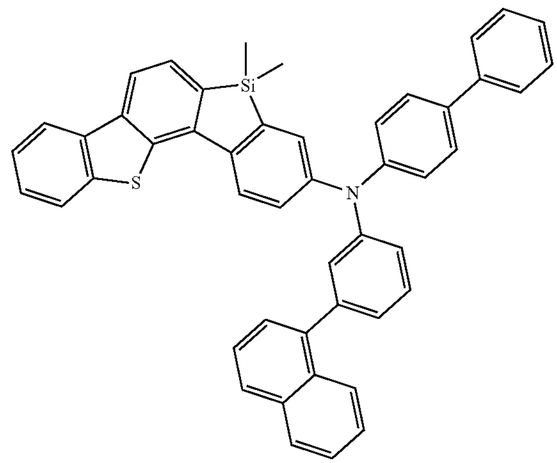
B-19
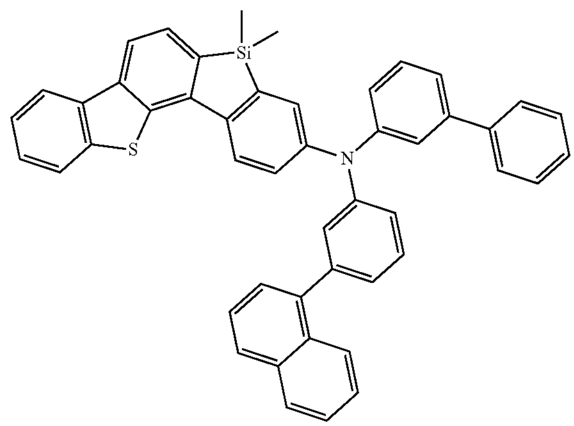
B-20
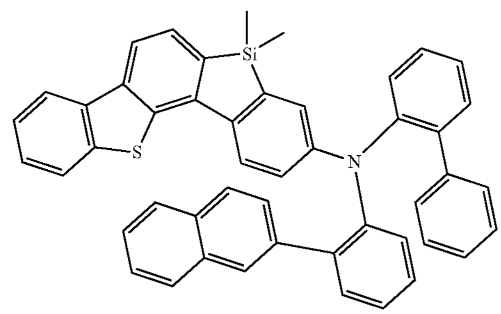
B-21
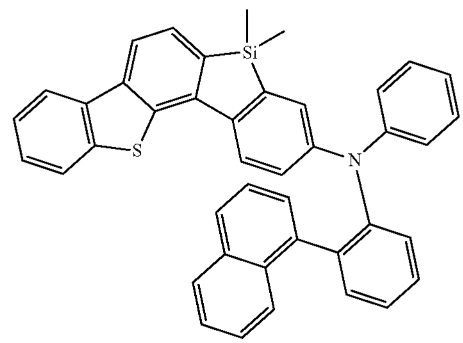

-continued
B-22
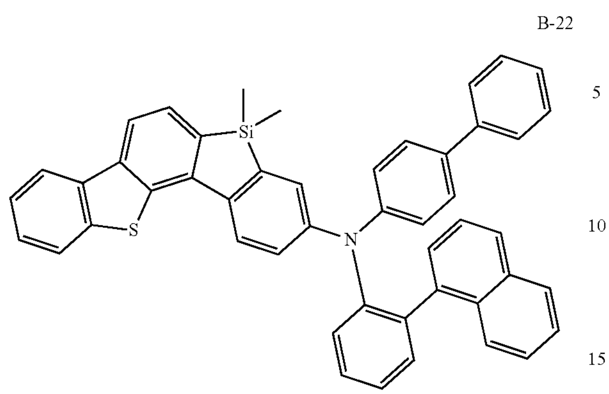
B-23
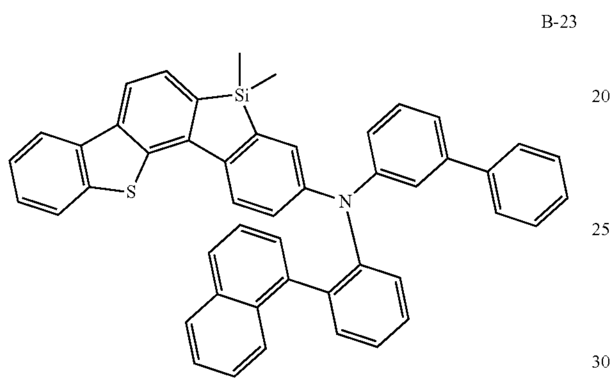
B-24
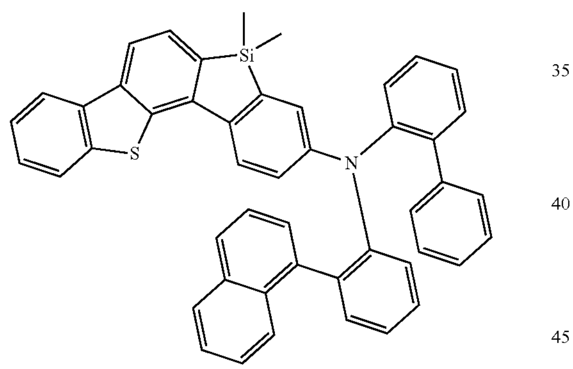
B-25
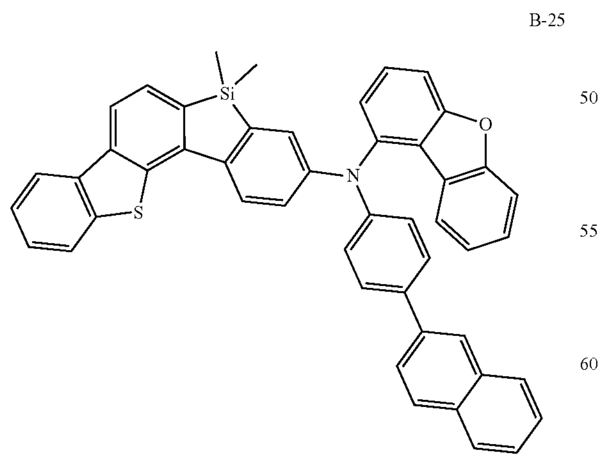
-continued
B-26
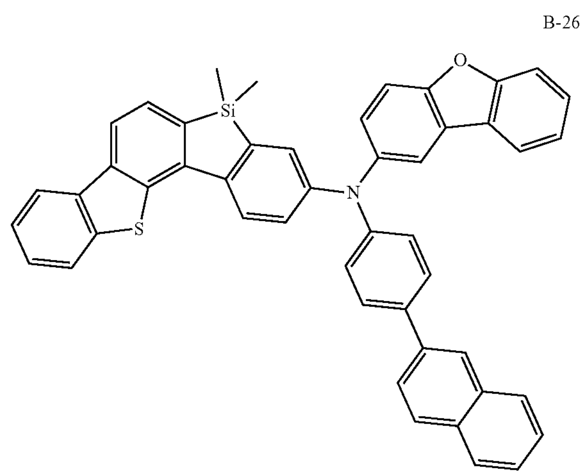
B-27
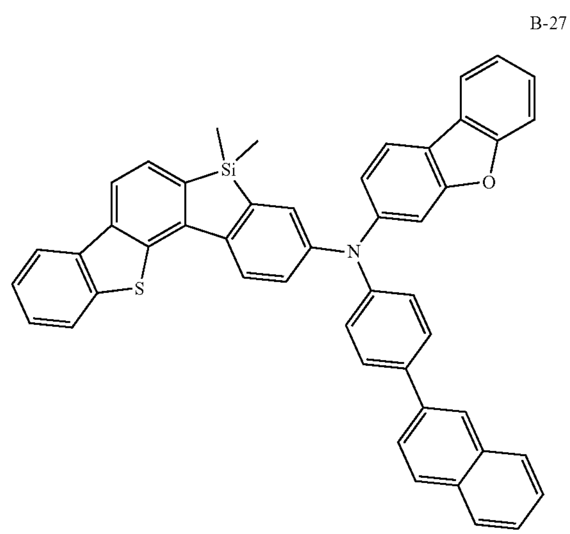
B-28
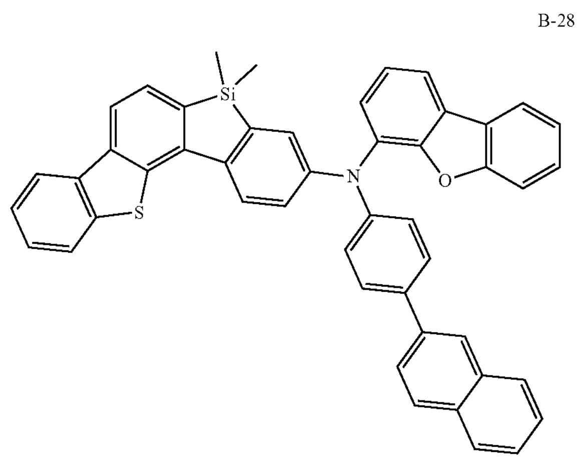

-continued
B-29
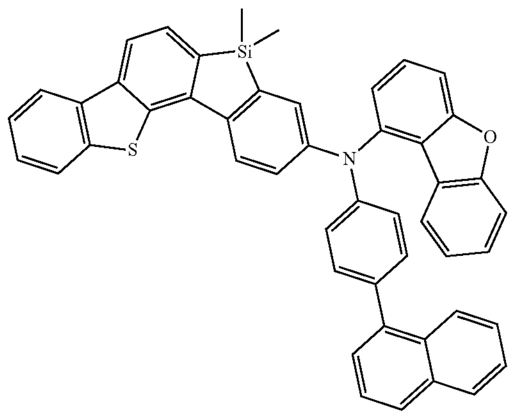
B-30
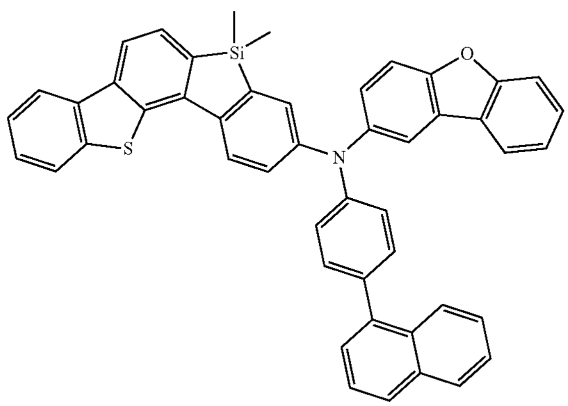
B-31
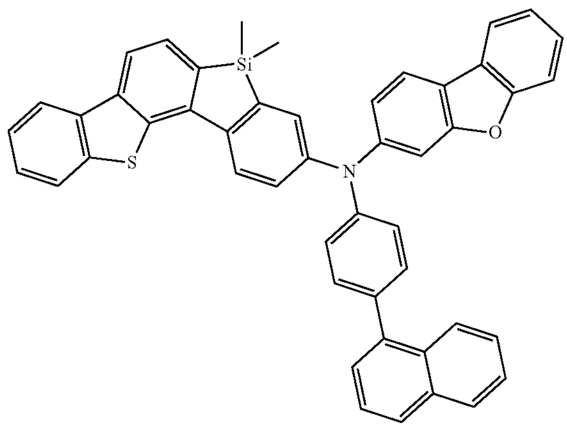
-continued
B-32
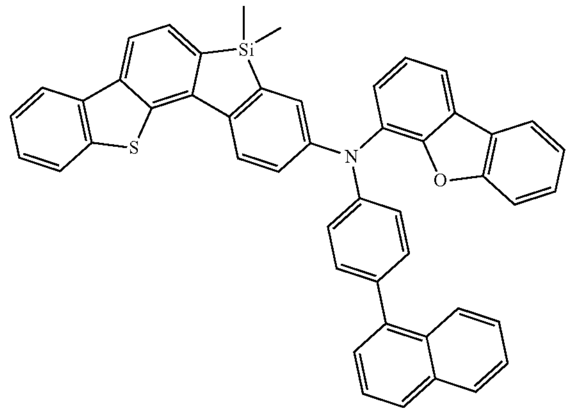
B-33
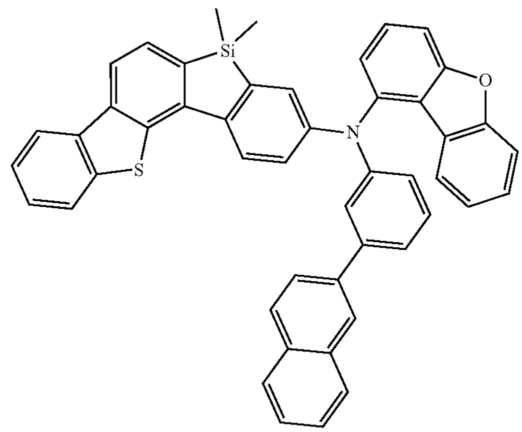
B-34
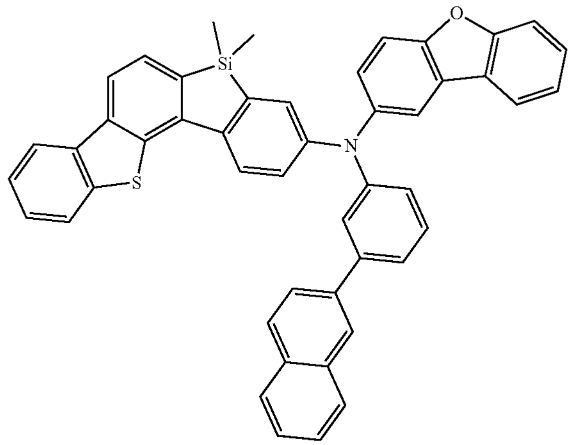

-continued
B-35
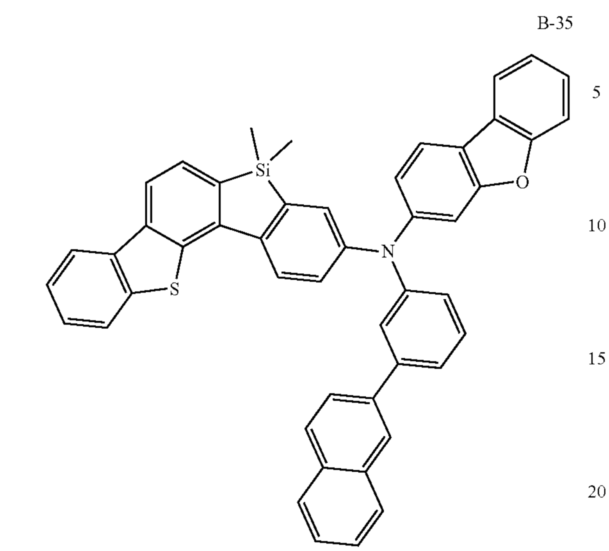
B-36
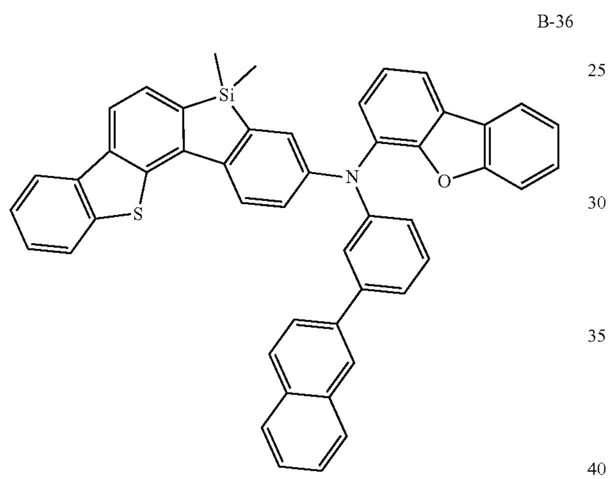
B-37
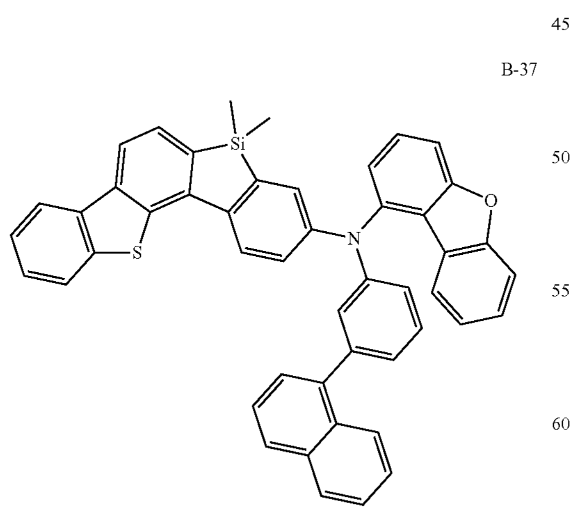
-continued
B-38
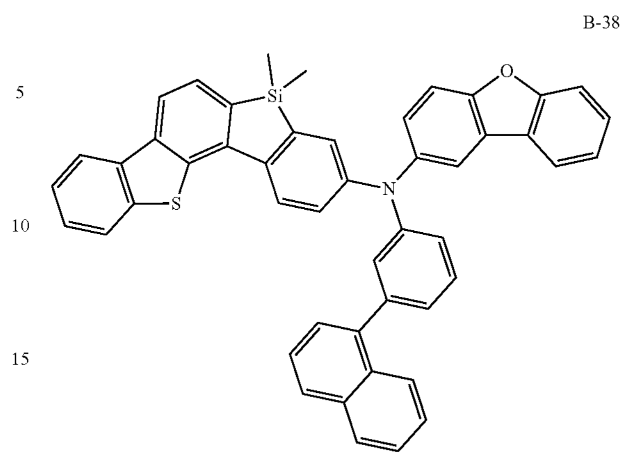
B-39
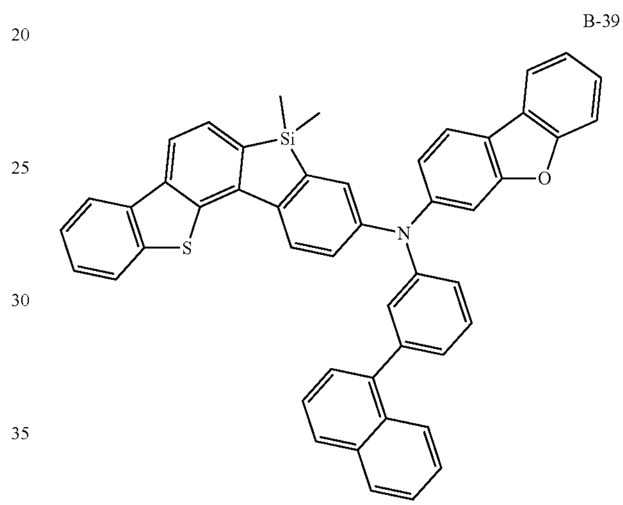
B-44
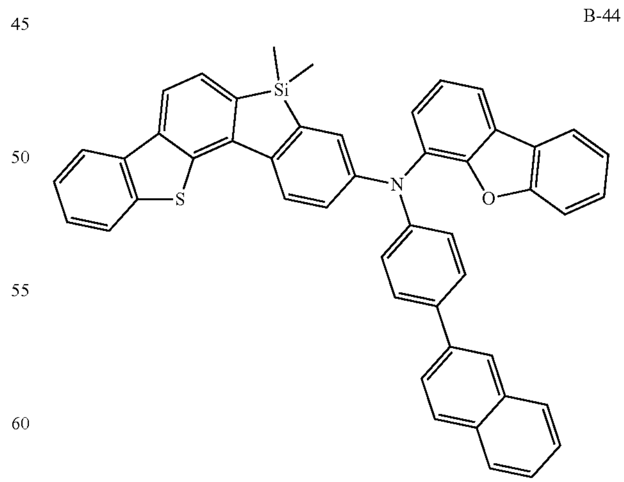

-continued
B-45
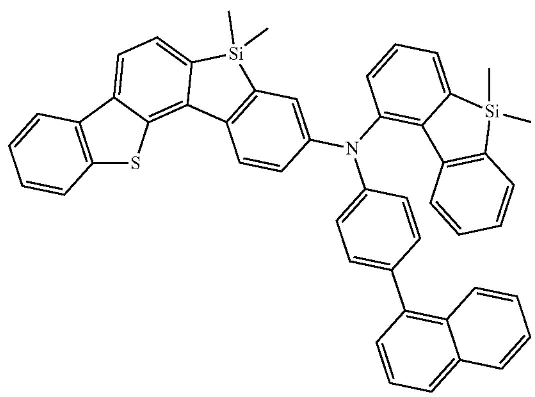
B-46
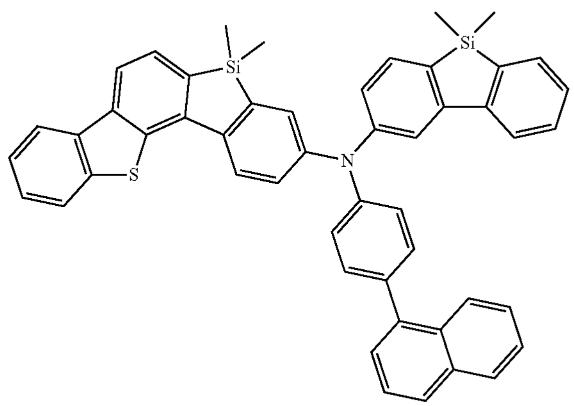
B-47
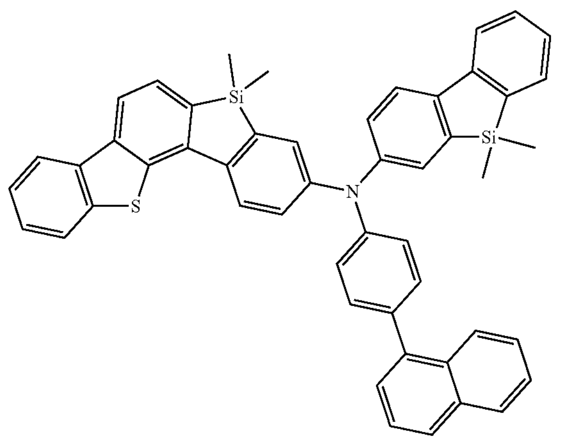
-continued
B-48
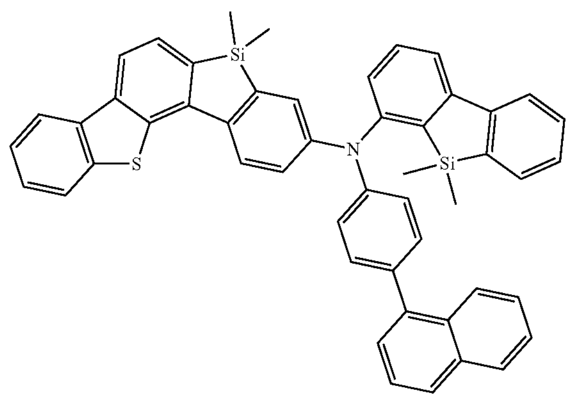
B-49
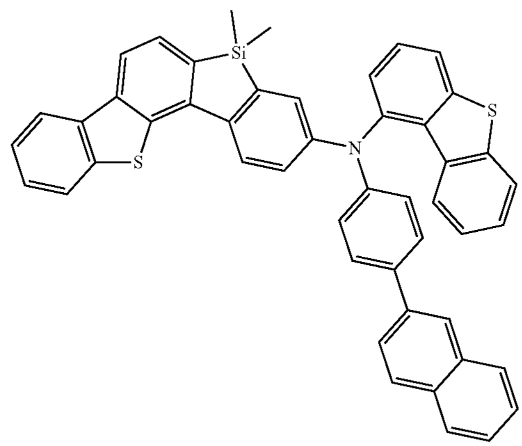
B-50
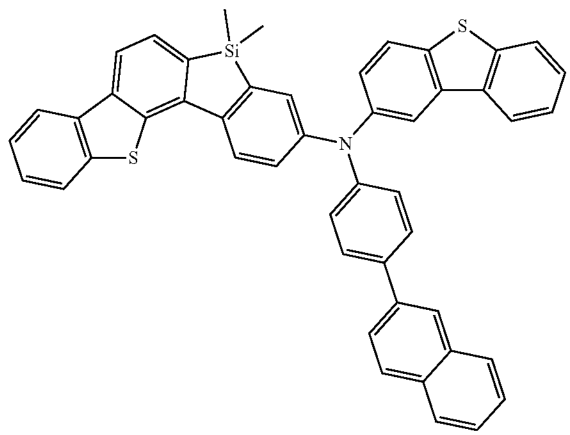

-continued
B-51
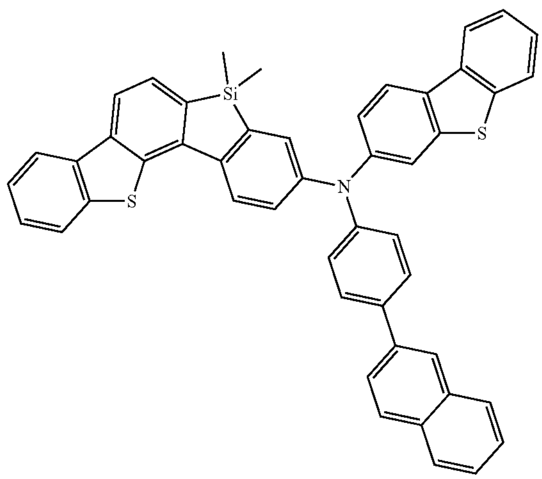
B-52
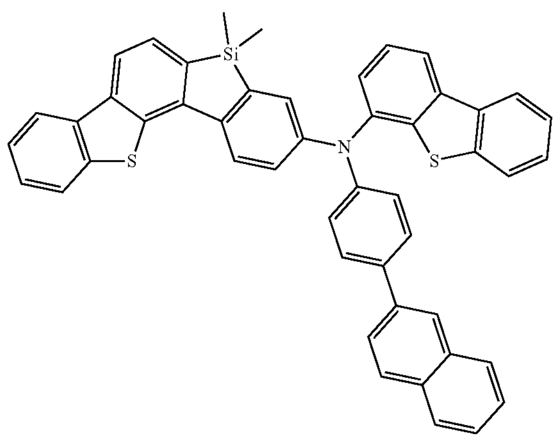
B-53
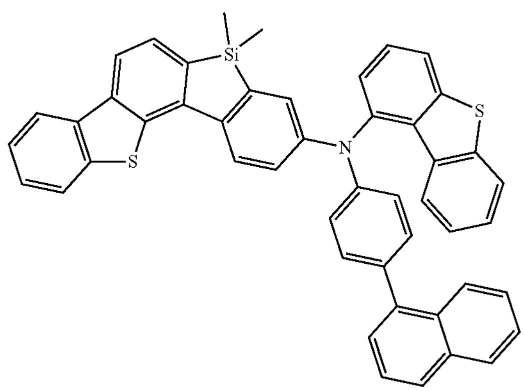
-continued
B-54
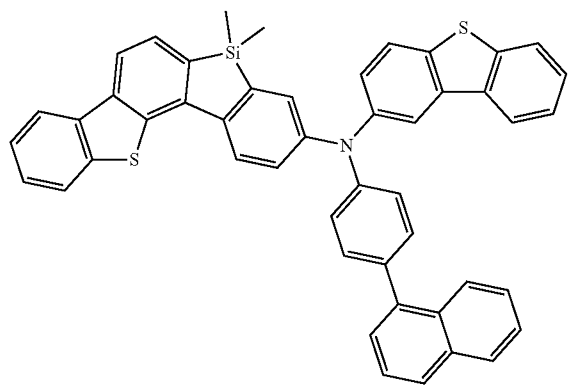
B-55
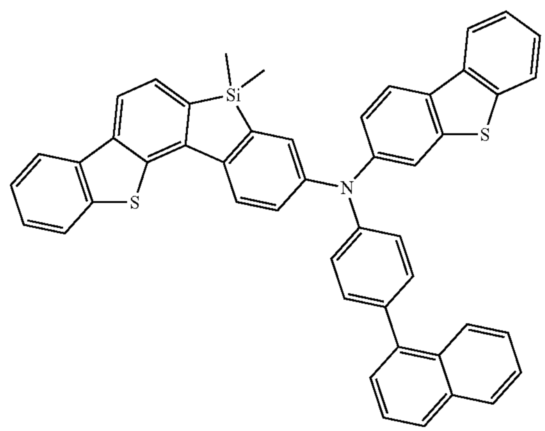
B-56
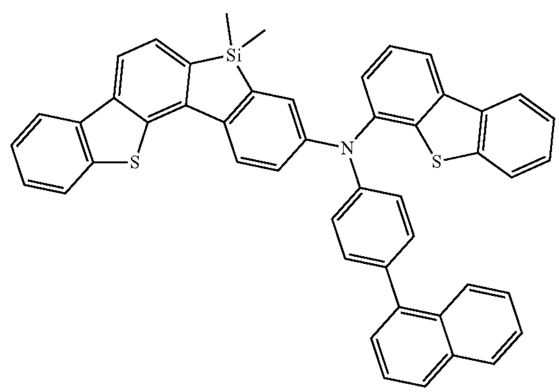

-continued
B-57
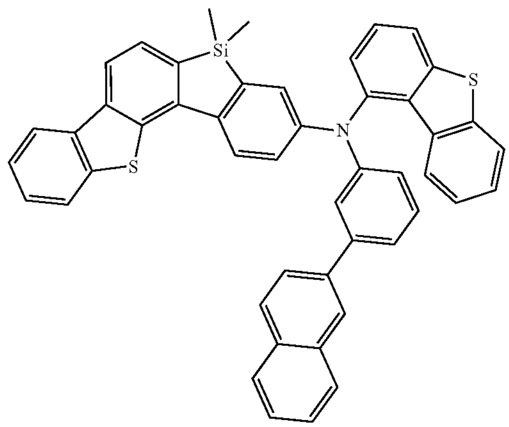
B-58
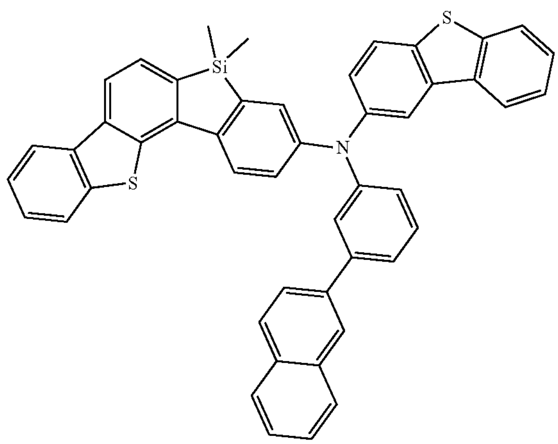
B-59
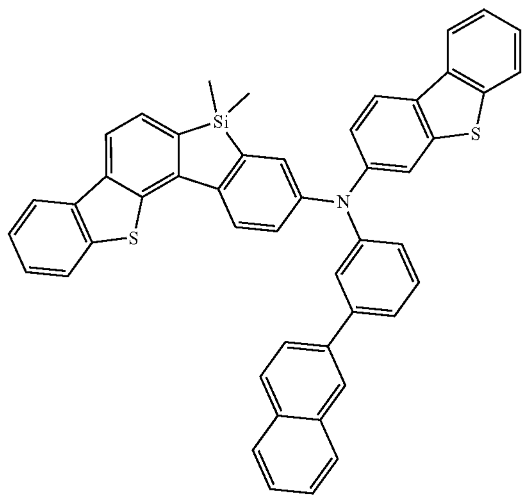
-continued
B-60
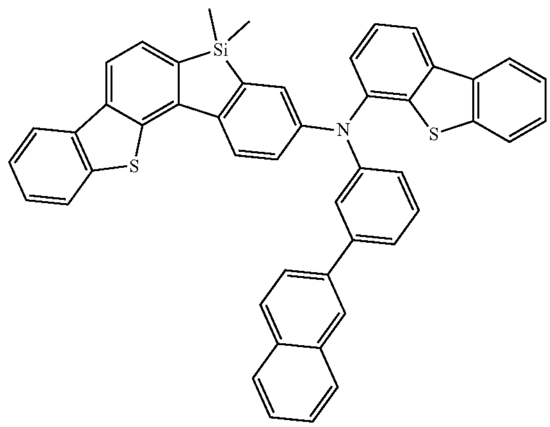
B-61
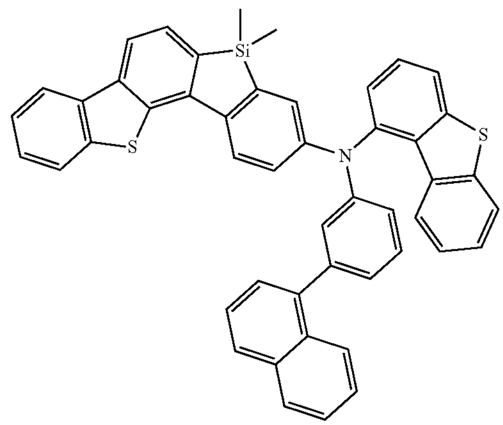
B-62
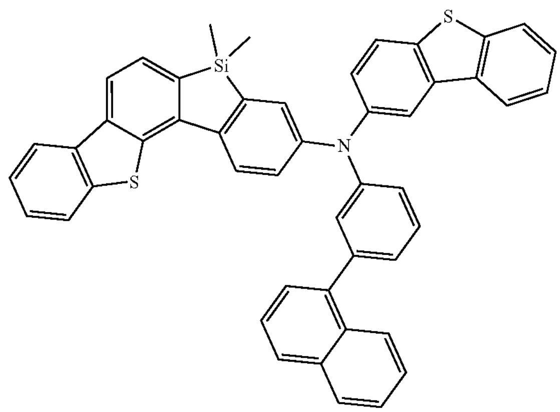

-continued
B-63
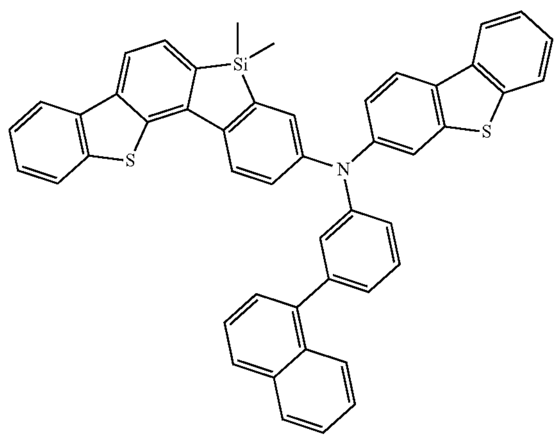
B-64
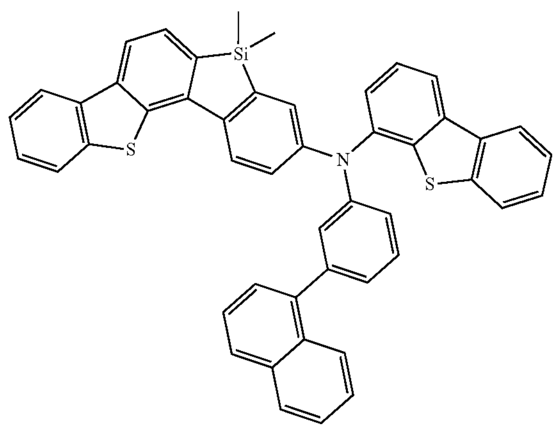
B-65
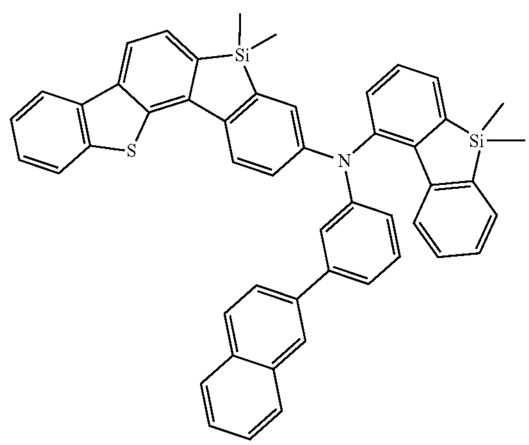
-continued
B-66
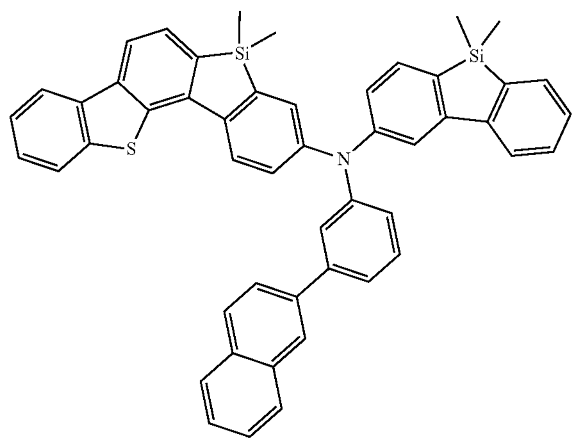
B-67
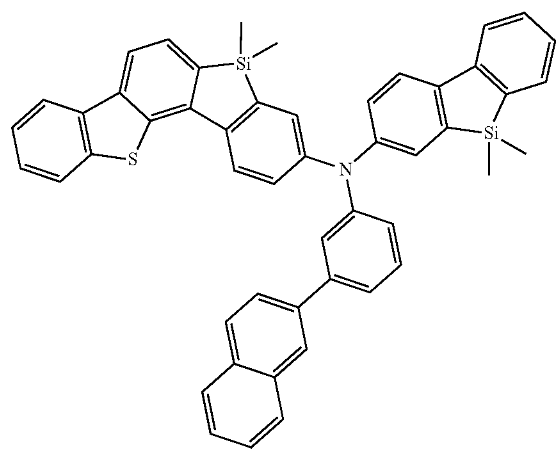
B-68
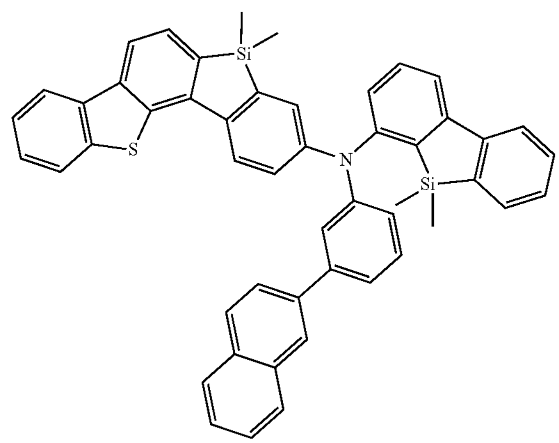

-continued
B-69
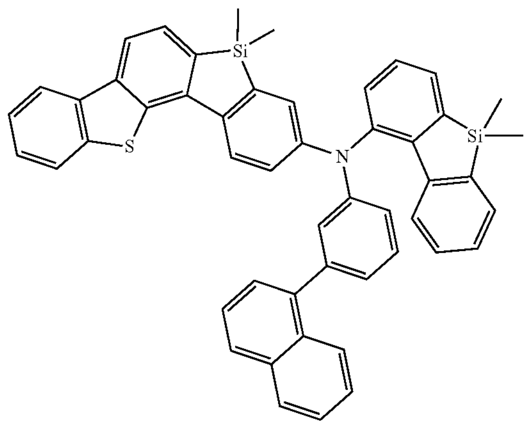
B-70
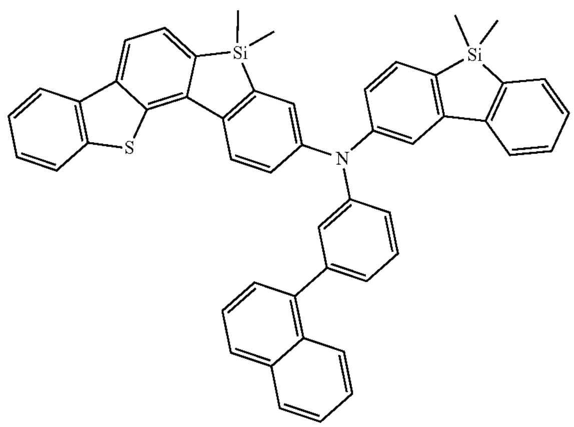
B-71
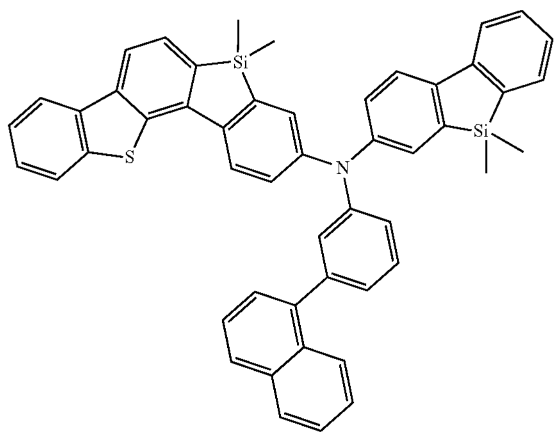
-continued
B-72
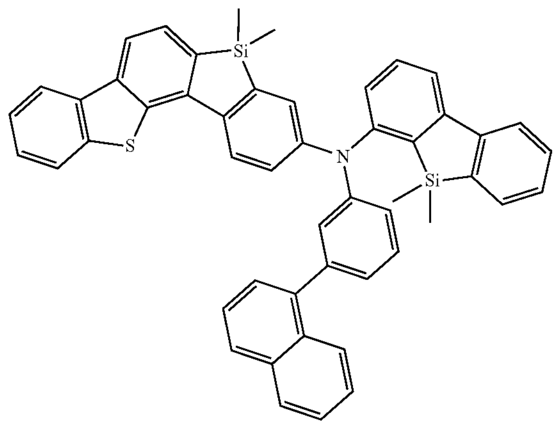
B-73
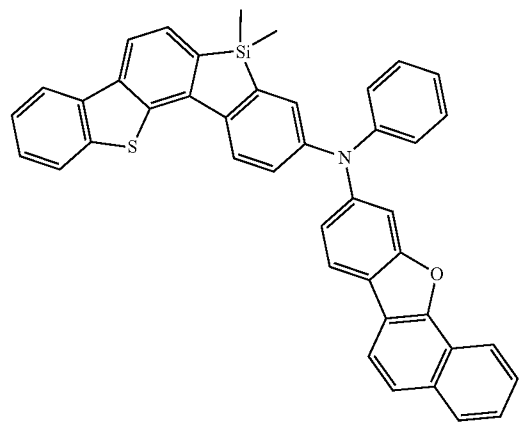
B-74
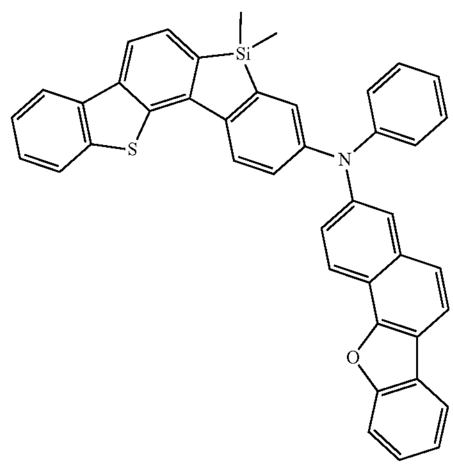

-continued
B-75
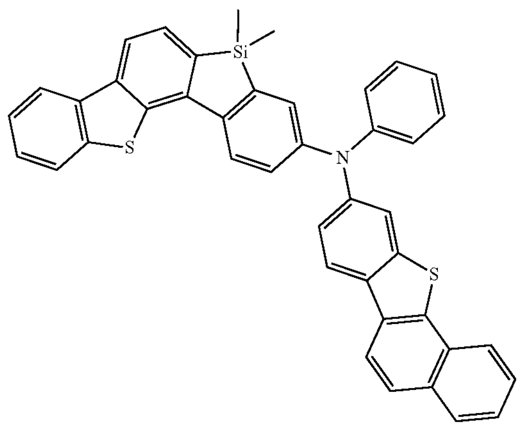
B-76
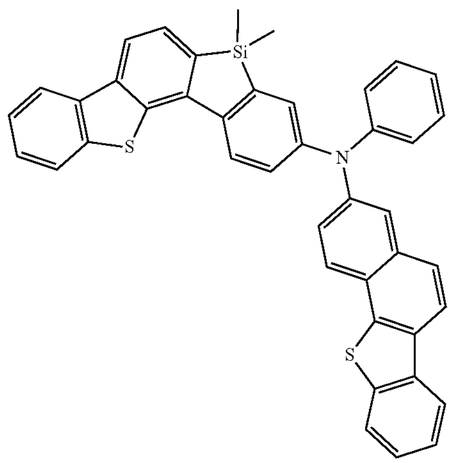
B-77
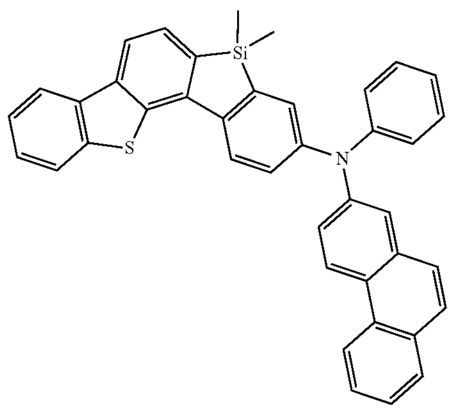
B-78
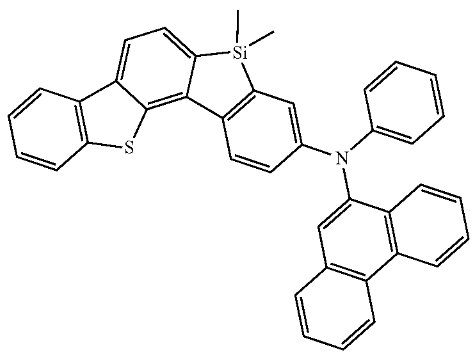
-continued
B-79
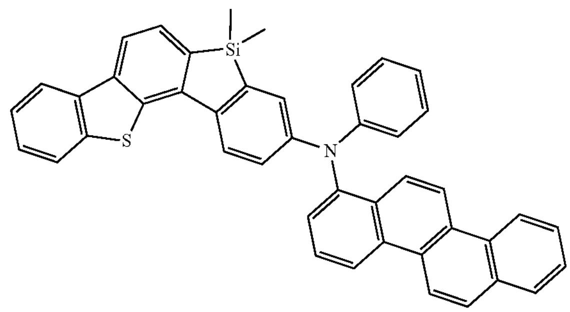
B-80
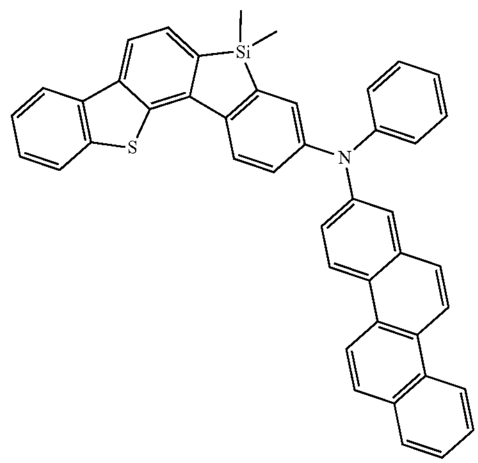
B-81
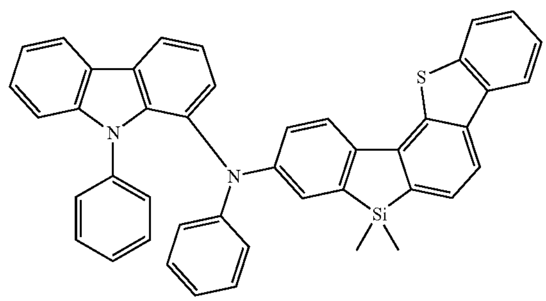
B-82
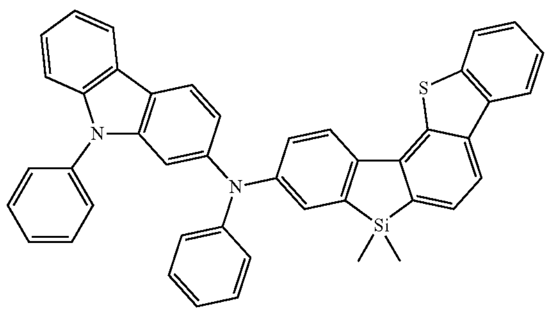

-continued
B-83
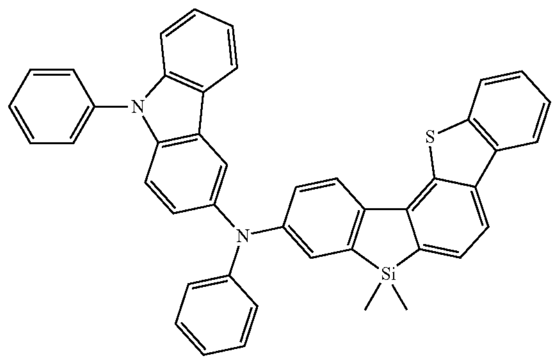
B-84
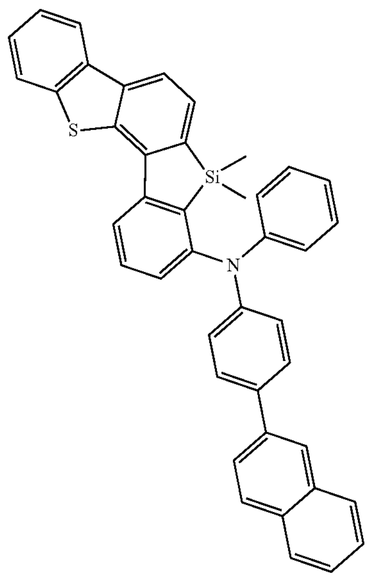
B-85
-continued
B-86
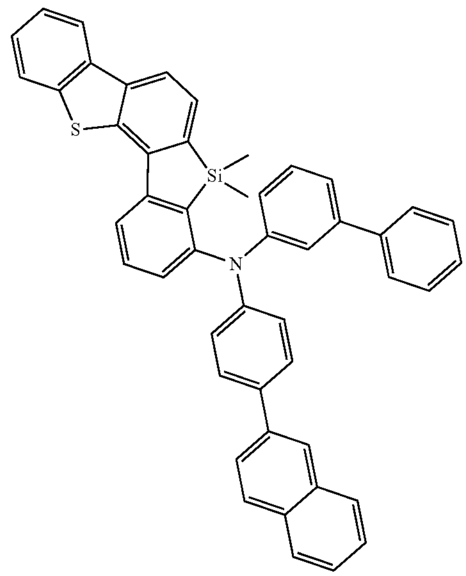
B-87
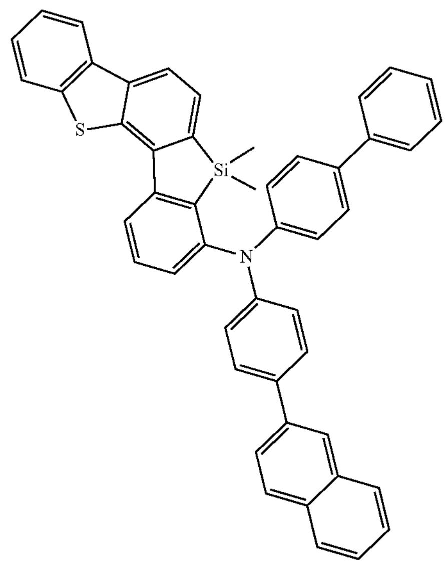
B-88
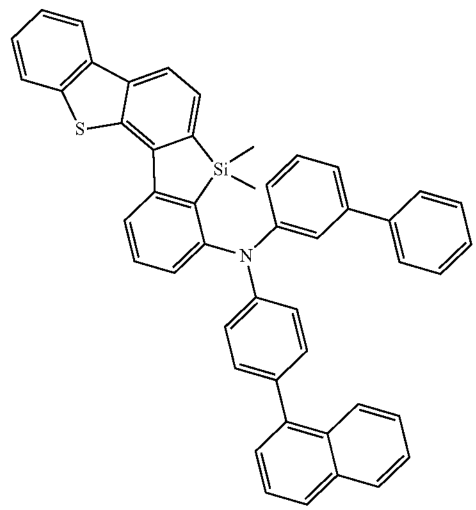

-continued
B-89
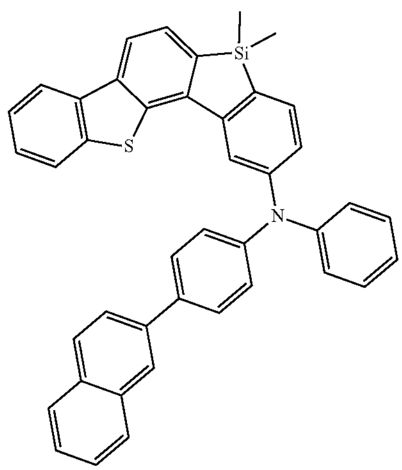
B-89
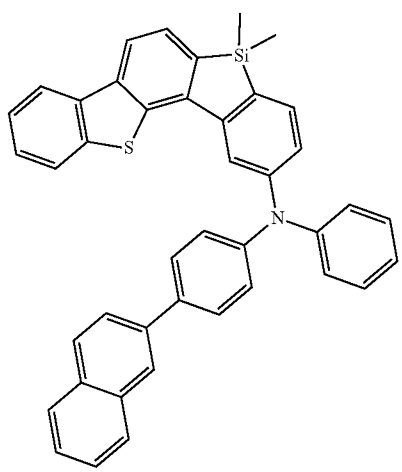
B-90
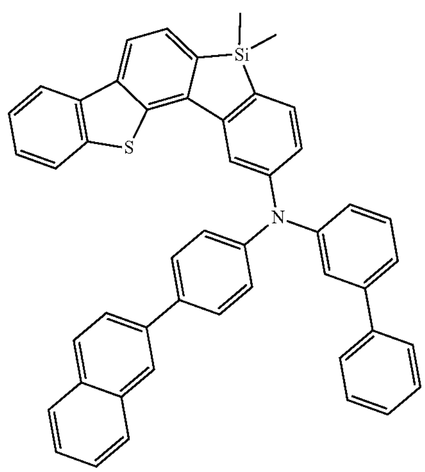
-continued
B-91
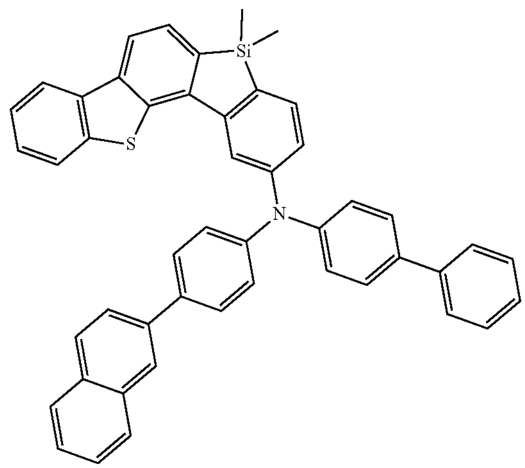
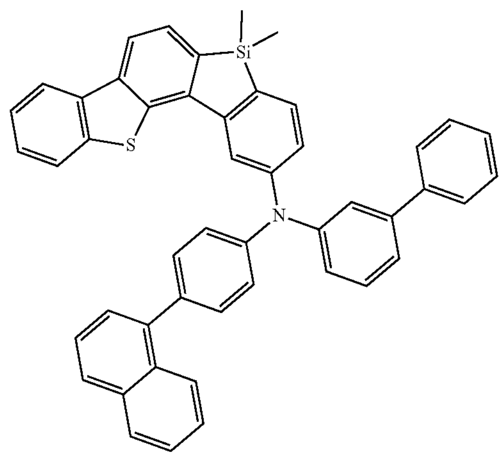
B-93
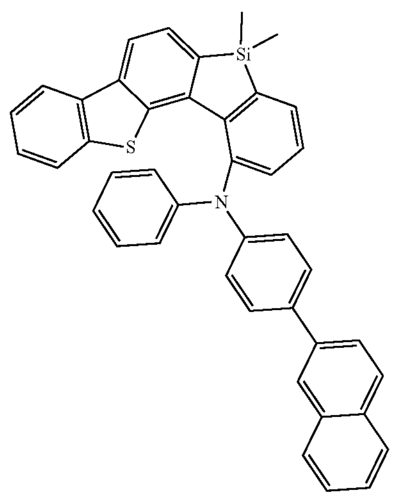

-continued
B-94
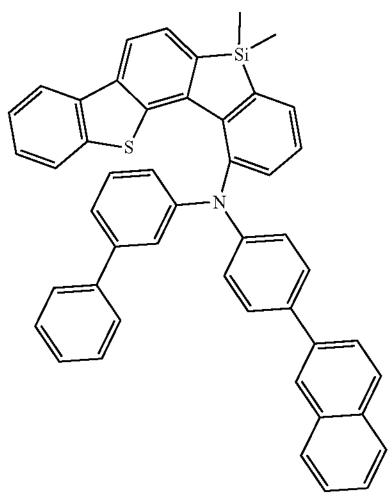
B-95
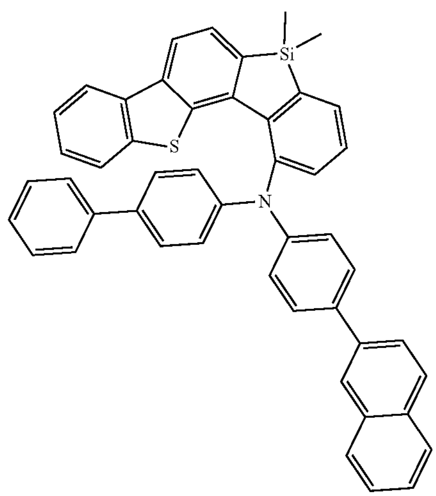
B-96
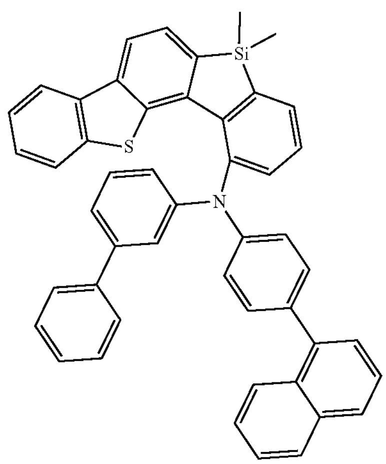
-continued
B-97
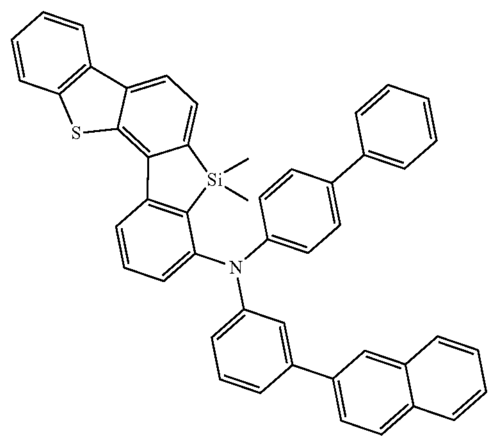
B-98
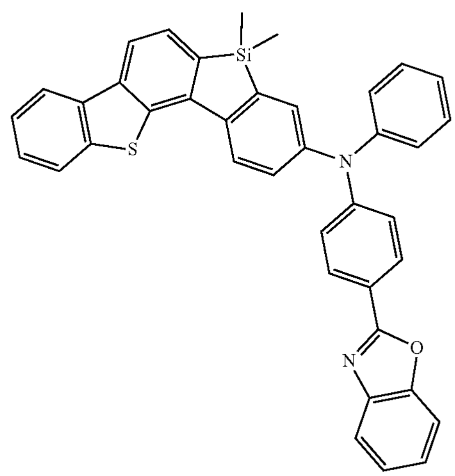
B-99
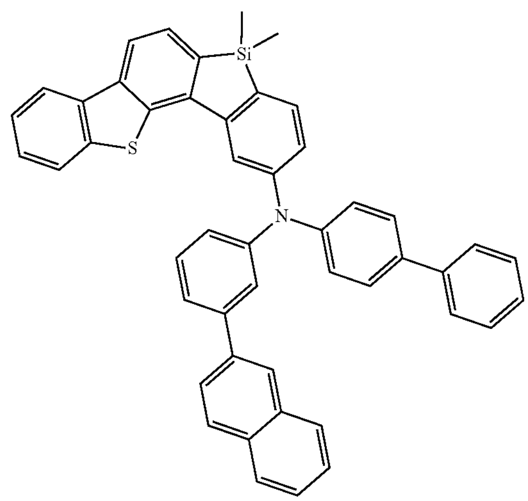

-continued
B-100
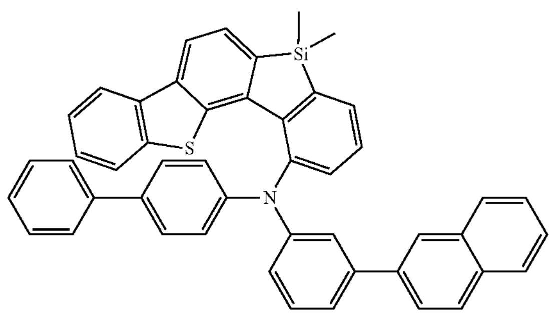
B-101
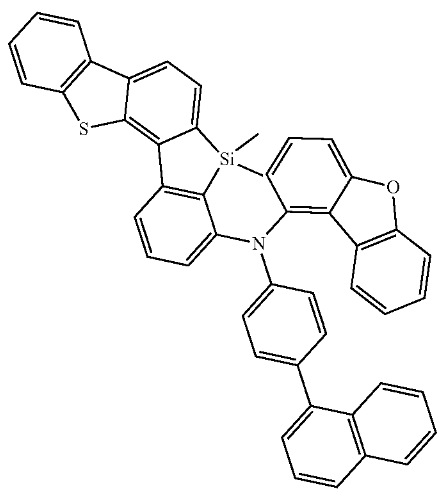
B-102
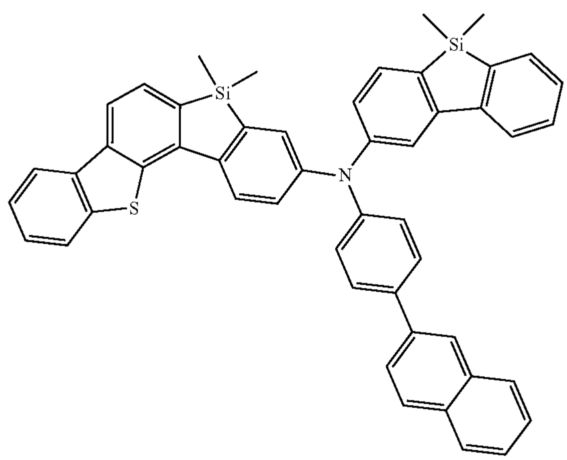
-continued
B-103
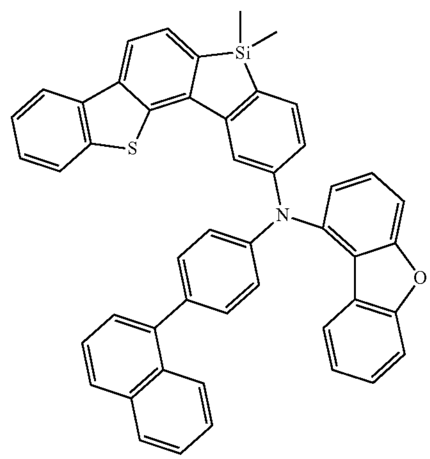
B-104
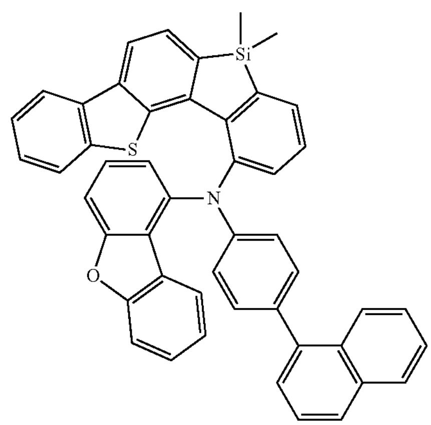
B-105
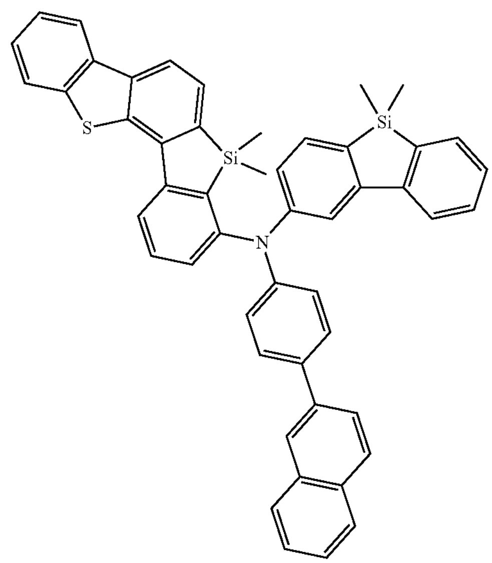

-continued

B-106

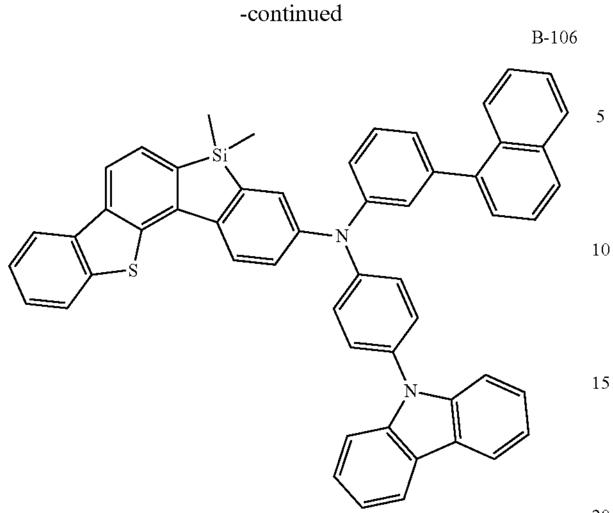

B-107

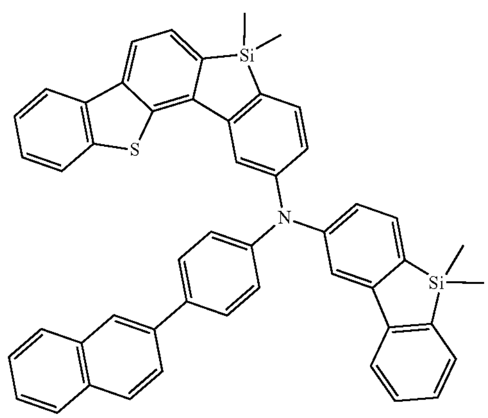

B-108

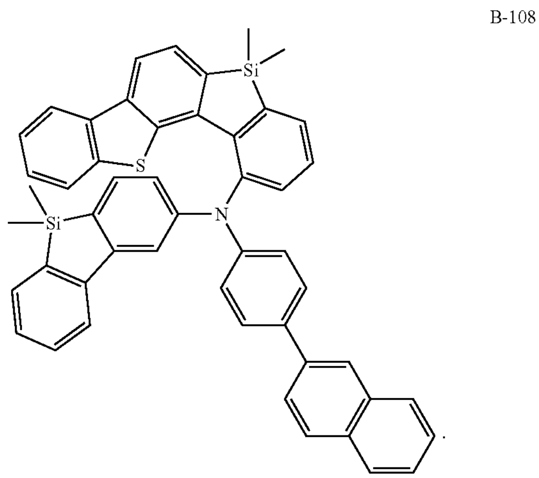 [SMILES: C[Si]1(C)c2ccccc2-c2cc(N(c3ccc(-c4ccc5ccccc5c4)cc3)c3cccc4c3-c3c(ccc5c3sc3ccccc35)[Si]4(C)C)ccc21]

A composition for an organic optoelectronic device according to another embodiment includes a first compound for an organic optoelectronic device, and a second compound for an organic optoelectronic device, wherein the first compound for an organic optoelectronic device may be the aforementioned compound for an organic optoelectronic device and the second compound for an organic optoelectronic device may be represented by Chemical Formula 2.

[Chemical Formula 2]

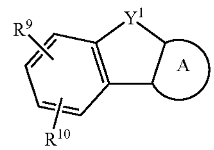

In Chemical Formula 2, $Y^1$ is O, S, N-$L^a$-$R^a$, $CR^bR^c$, or $SiR^dR^e$, $L^a$ is a single bond, or a substituted or unsubstituted C6 to C12 arylene group, $R^a$ is a substituted or unsubstituted C6 to C20 aryl group, or a substituted or unsubstituted C2 to C30 heterocyclic group, $R^b$, $R^c$, $R^d$ and $R^e$ are independently a substituted or unsubstituted C1 to C30 alkyl group, or a substituted or unsubstituted C6 to C30 aryl group, $R^9$ and $R^{10}$ are independently hydrogen, deuterium, a substituted or unsubstituted C6 to C20 aryl group, or a substituted or unsubstituted C2 to C30 heterocyclic group, and A is any one selected from the rings of Group I,

[Group I]

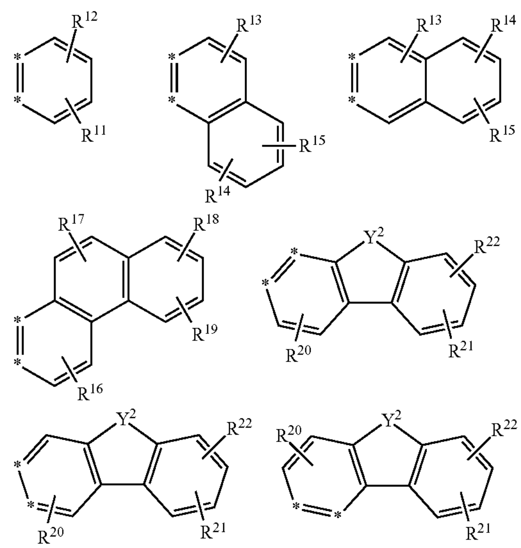

wherein, in Group I,

* is a linking point, $Y^2$ is O or S, $R^{11}$ to $R^{22}$ are independently hydrogen, deuterium, a substituted or unsubstituted C6 to C20 aryl group, or a substituted or unsubstituted C2 to C30 heterocyclic group, and at least one of $R^a$ and $R^9$ to $R^{22}$ is a group represented by Chemical Formula a,

[Chemical Formula a]

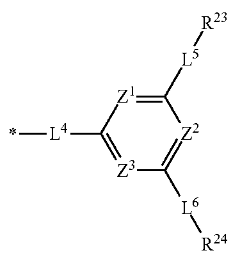

wherein, in Chemical Formula a, $Z^1$ to $Z^3$ are independently N or $CR^f$, $R^f$ is hydrogen, deuterium, a substituted or unsubstituted C1 to C30 alkyl group, or a substituted or unsubstituted C6 to C30 aryl group, at least two of $Z^1$ to $Z^3$ are N, $L^4$ to $L^6$ are independently a single bond, a substituted or unsubstituted C6 to C20 arylene group, or a substituted or unsubstituted C2 to C20 heterocyclic group, $R^{23}$ and $R^{24}$ are independently a substituted or unsubstituted C6 to C30 aryl group, or a substituted or unsubstituted C2 to C30 heterocyclic group, and

* is a linking point.

The second compound for an organic optoelectronic device may be used in a light emitting layer together with the first compound for an organic optoelectronic device to increase charge mobility and stability, thereby improving luminous efficiency and lie-span characteristics.

For example, Chemical Formula 2 may be represented by one of Chemical Formula 2-I to Chemical Formula 2-X.

[Chemical Formula 2-I]

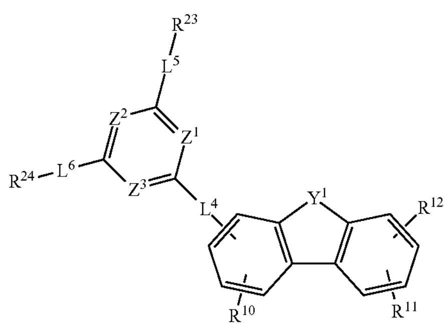

[Chemical Formula 2-II]

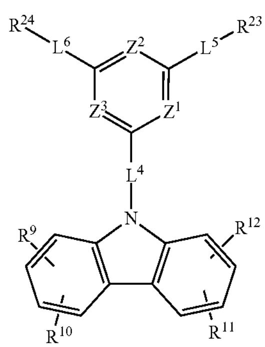

-continued

[Chemical Formula 2-III]

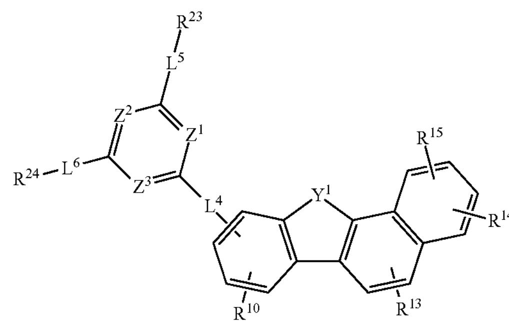

[Chemical Formula 2-IV]

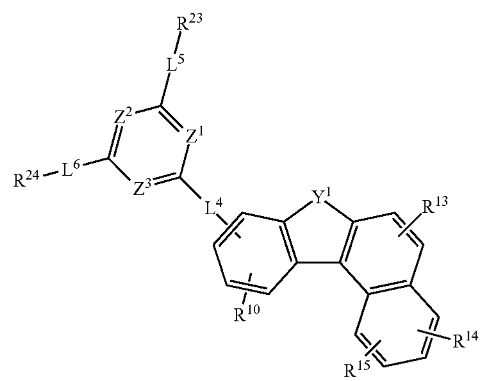

[Chemical Formula 2-V]

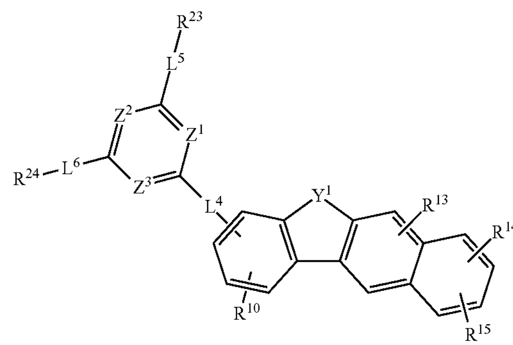

[Chemical Formula 2-VI]

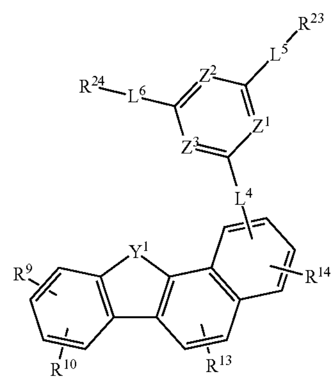

-continued

[Chemical Formula 2-VII]

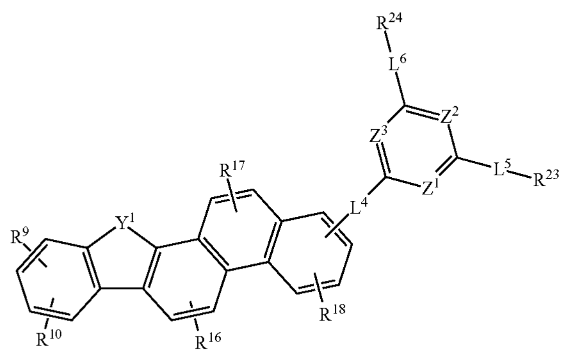

[Chemical Formula 2-VIII]

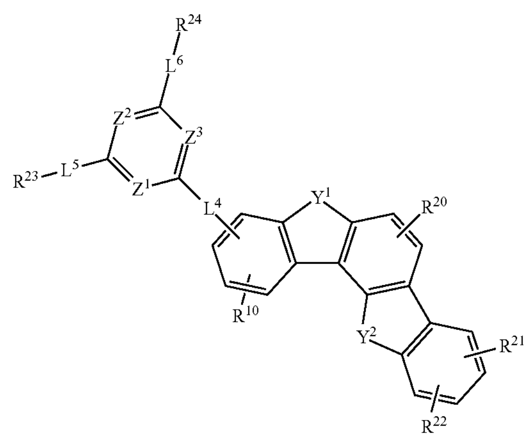

[Chemical Formula IX]

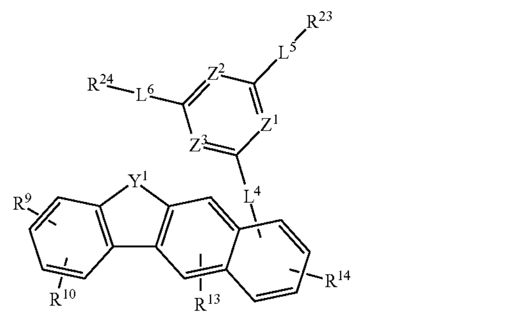

[Chemical Formula X]

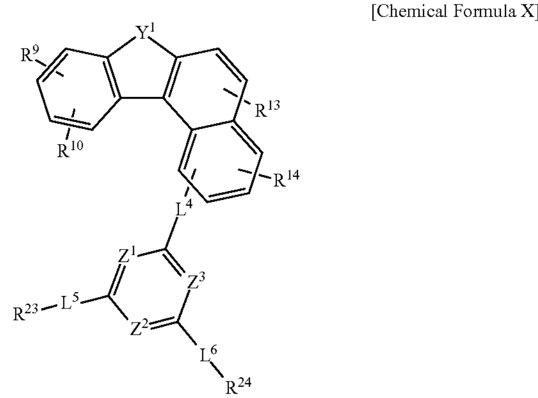

In Chemical Formula 2-I to Chemical Formula 2-X, $Y^1$, $Y^2$, $R^9$ to $R^{18}$, $R^{20}$ to $R^{24}$, $L^4$ to $L^6$, and $Z^1$ to $Z^3$ are the same as described above.

As a specific example, Chemical Formula 2-I may be represented by Chemical Formula 2-Ia or Chemical Formula 2-Ib.

[Chemical Formula 2-Ia]

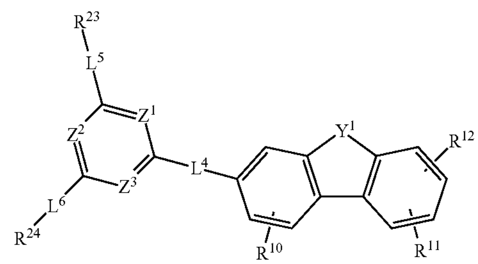

[Chemical Formula 2-Ib]

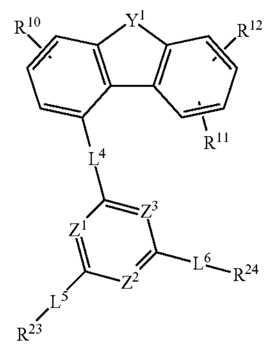

As a specific example, Chemical Formula 2-III may be represented by Chemical Formula 2-IIIa.

[Chemical Formula 2-IIIa]

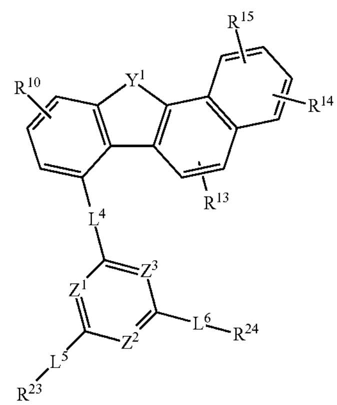

As a specific example, Chemical Formula 2-IV may be represented by Chemical Formula 2-IVa.

[Chemical Formula 2-IVa]

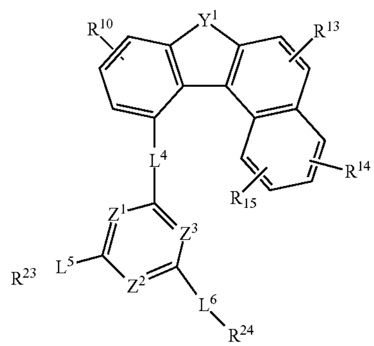

As a specific example, Chemical Formula 2-V may be represented by Chemical Formula 2-Va.

[Chemical Formula 2-Va]

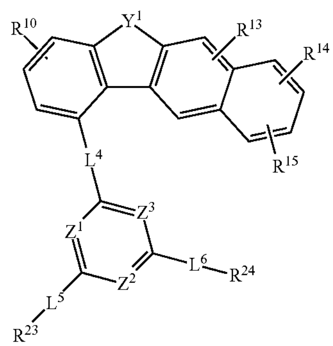

As a specific example, Chemical Formula 2-VI may be represented by Chemical Formula 2-VIa or Chemical Formula 2-VIb.

[Chemical Formula 2-VIa]

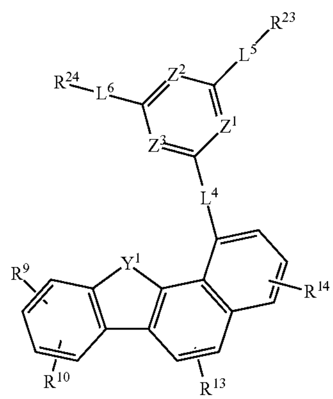

-continued

[Chemical Formula 2-VIb]

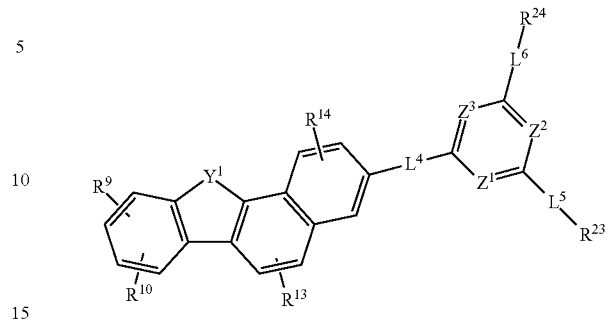

As a specific example, Chemical Formula 2-VII may be represented by Chemical Formula 2-Vila.

[Chemical Formula 2-VIIa]

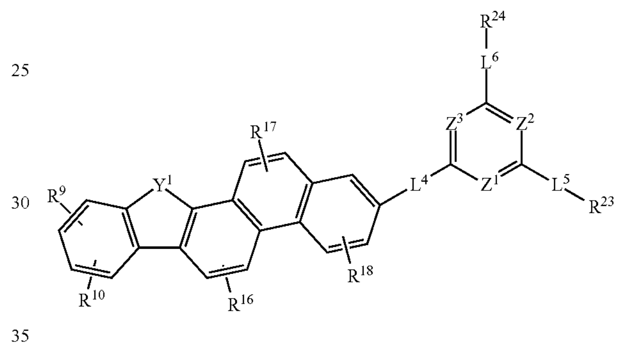

As a specific example, Chemical Formula 2-VIII may be represented by Chemical Formula 2-VIIIa or Chemical Formula 2-VIIIb.

[Chemical Formula 2-VIIIa]

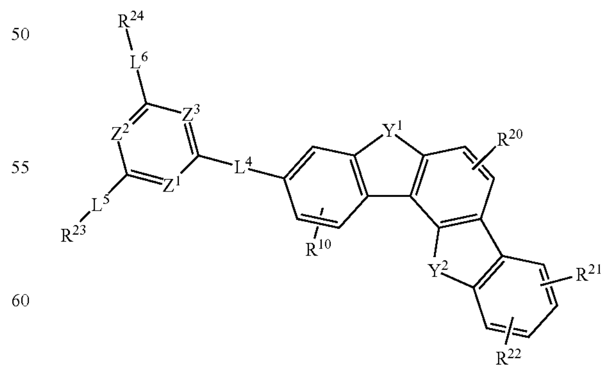

-continued

[Chemical Formula 2-VIIIb]

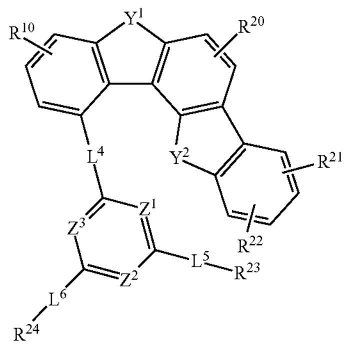

In the above chemical formulas, each substituent is as described above.

As a more specific example, the second compound for an organic optoelectronic device may be represented by one of Chemical Formula 2-I, Chemical Formula 2-III, and Chemical Formula 2-VI.

For example, the second compound for an organic optoelectronic device may be represented by one of Chemical Formula 2-Ia, Chemical Formula 2-IIa, Chemical Formula 2-VIa, and Chemical Formula 2-VIb.

In an example embodiment, in Chemical Formula 2-Ia, Chemical Formula 2-IIIa, Chemical Formula 2-VIa, and Chemical Formula 2-VIb, $Y^1$ may be O or S, $R^9$ to $R^{15}$ may independently be hydrogen, deuterium, or a substituted or unsubstituted C6 to C12 aryl group, $L^4$ to $L^6$ may independently be a single bond, or a substituted or unsubstituted C6 to C12 arylene group, and $R^{23}$ and $R^{24}$ may independently be a substituted or unsubstituted phenyl group, a substituted or unsubstituted biphenyl group, or a substituted or unsubstituted naphthyl group.

For example, the second compound for an organic optoelectronic device may be one selected from compounds listed of Group 2, but is not limited thereto.

[Group 2]

C-1

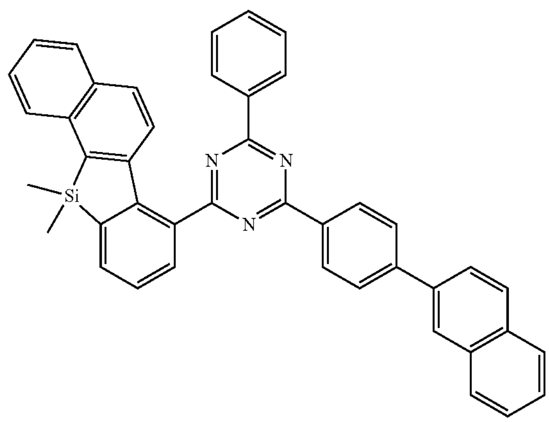

-continued

C-2

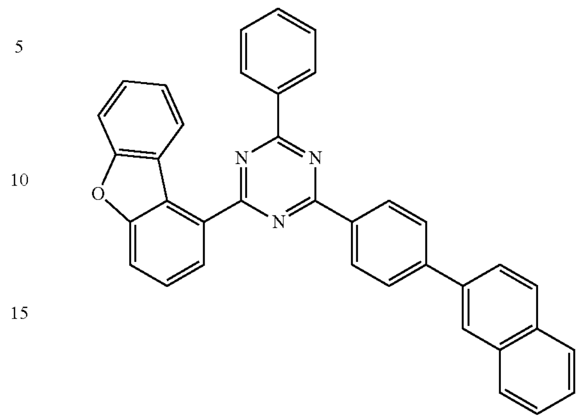

C-3

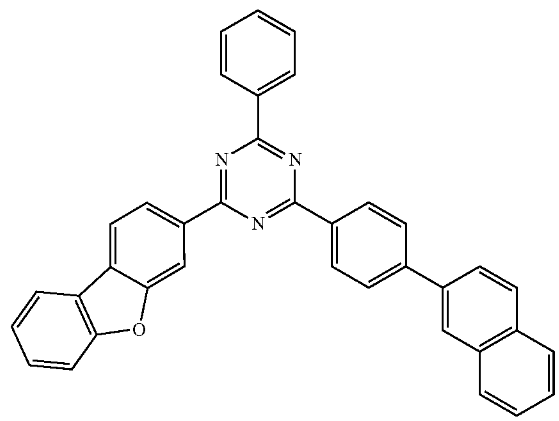

C-4

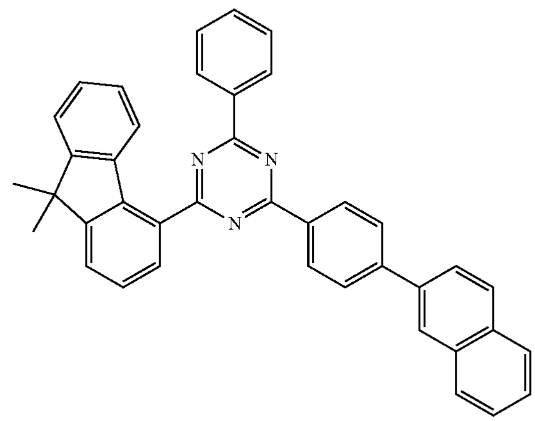

-continued
C-5
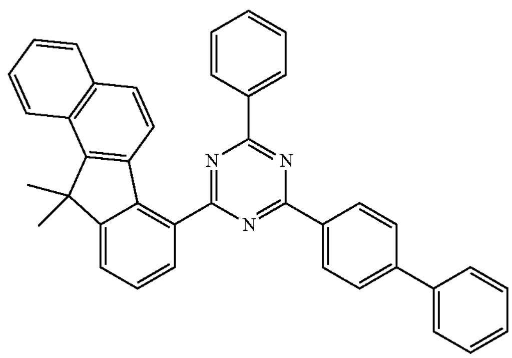
C-6
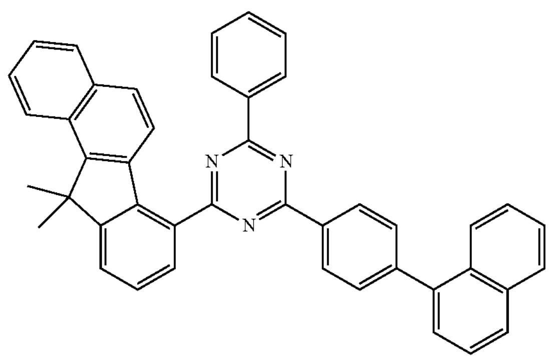
C-7
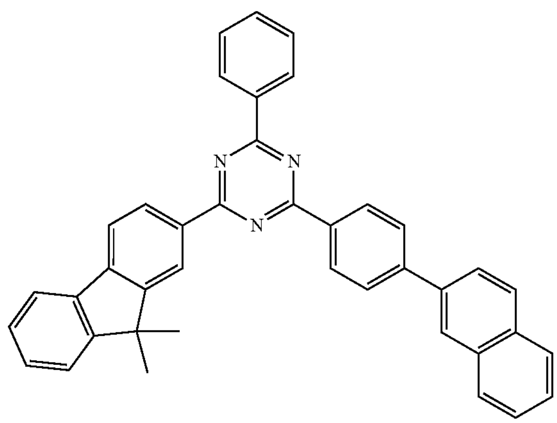
C-8
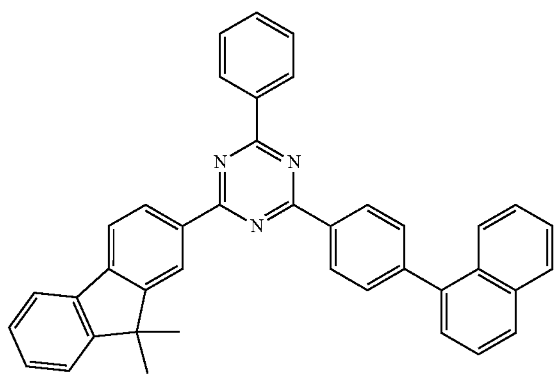
-continued
C-9
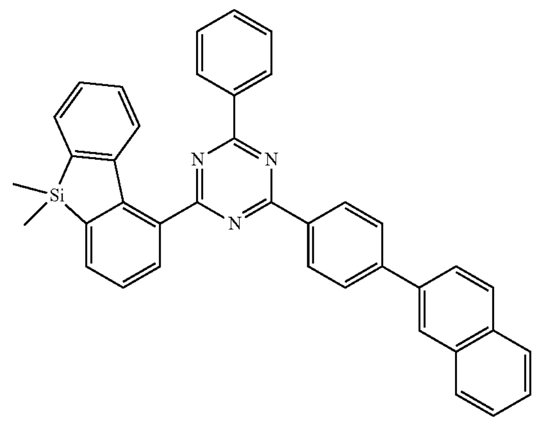
C-10
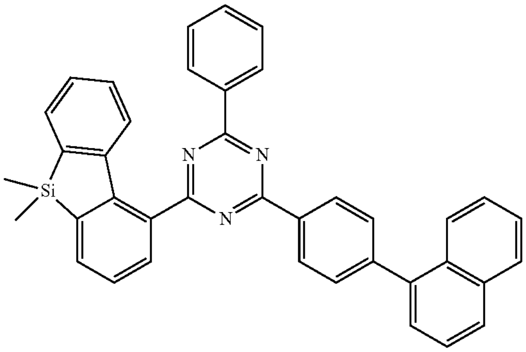
C-11
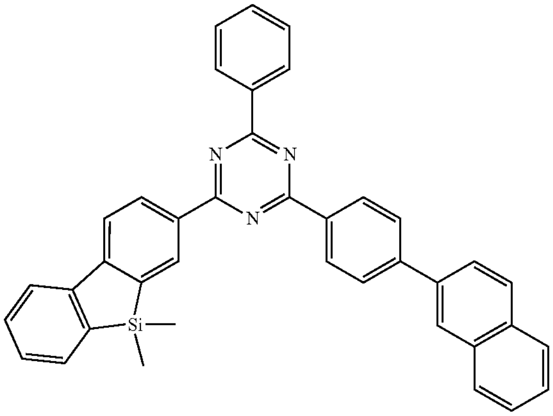
C-12
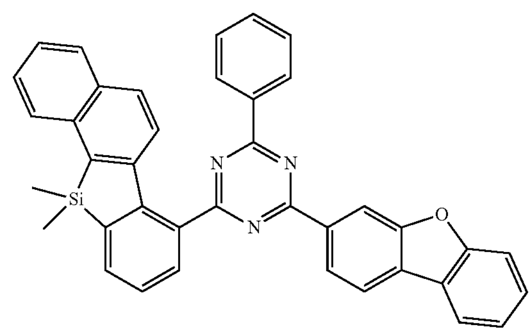

-continued
C-13
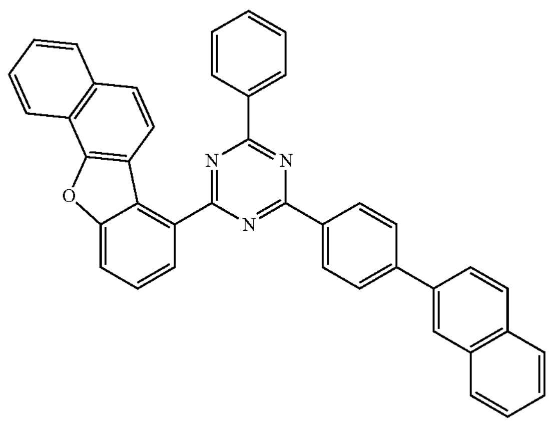
C-14
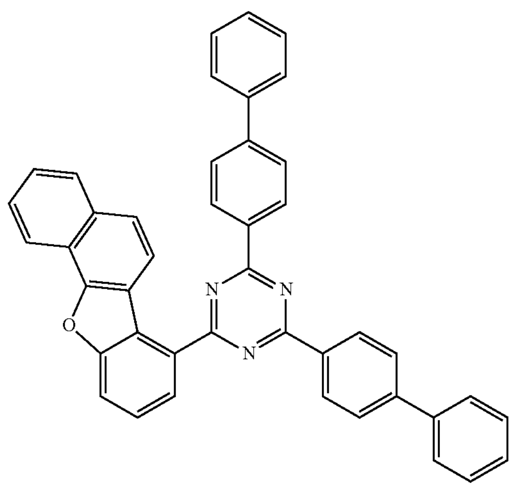
C-15
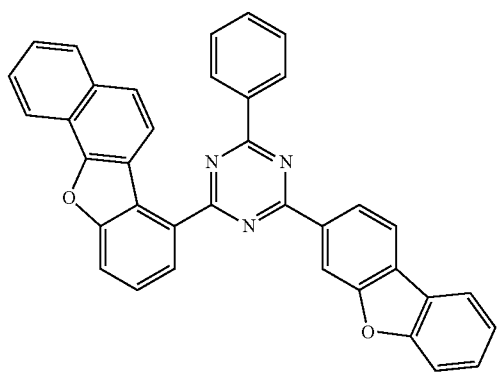
-continued
C-16
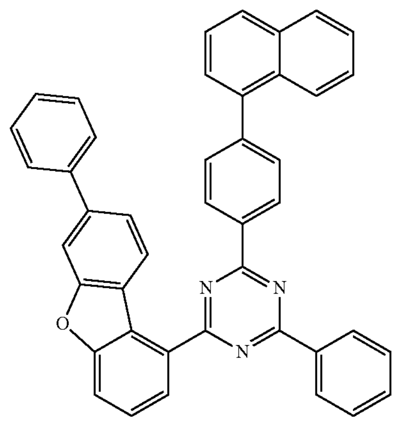
C-17
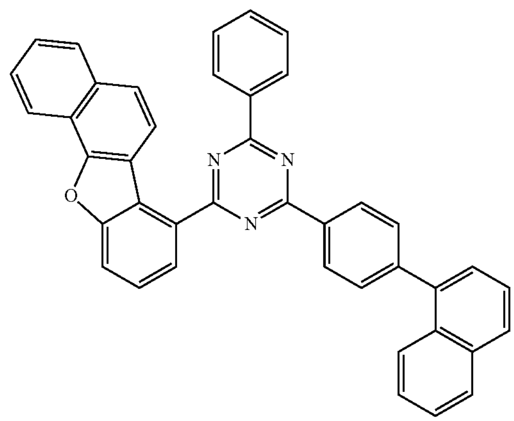
C-18
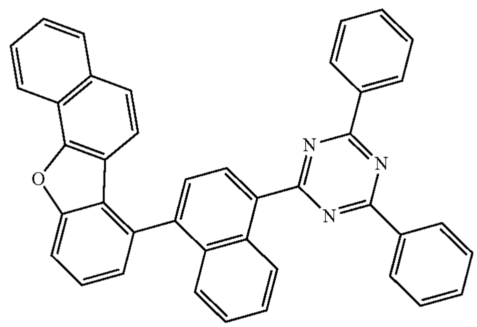
C-19
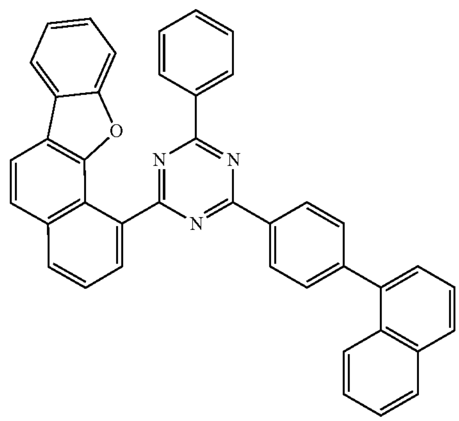

C-20
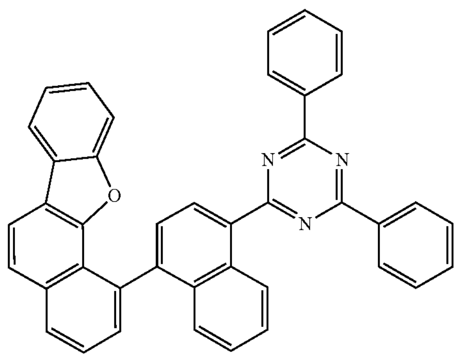
C-21
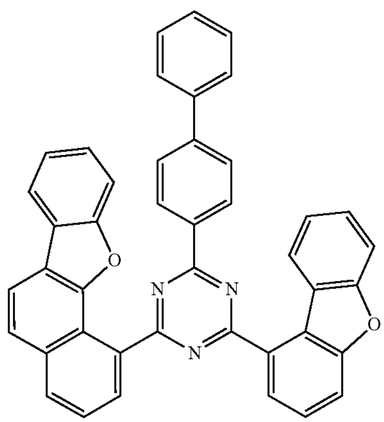
C-22
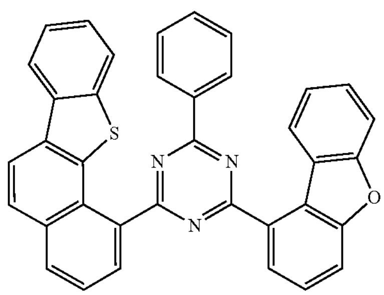
C-23
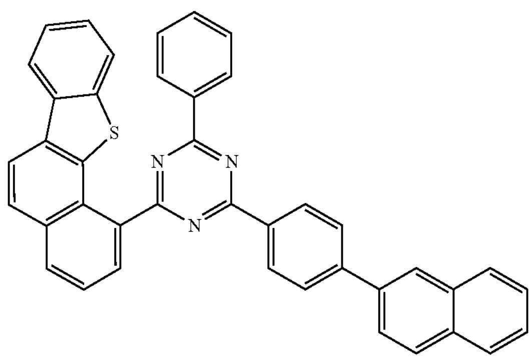
C-24
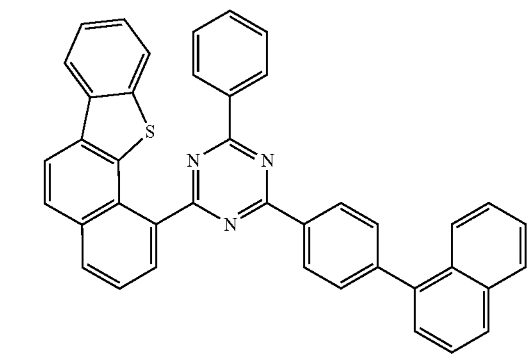
C-25
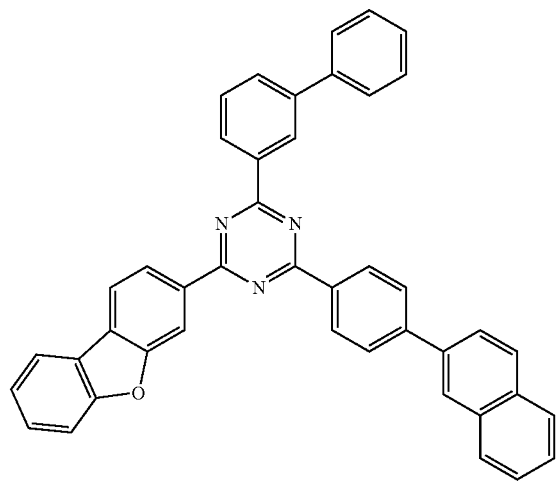
C-26
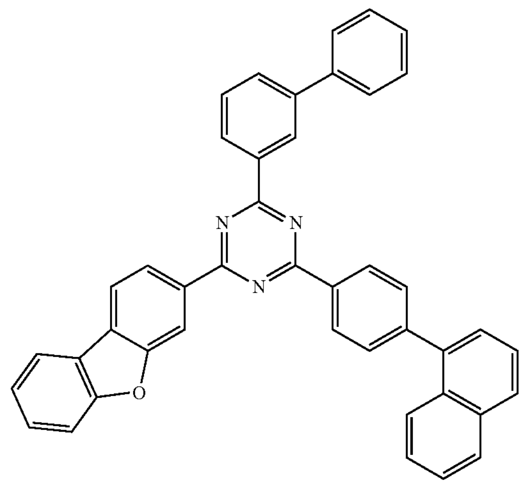

-continued
C-27
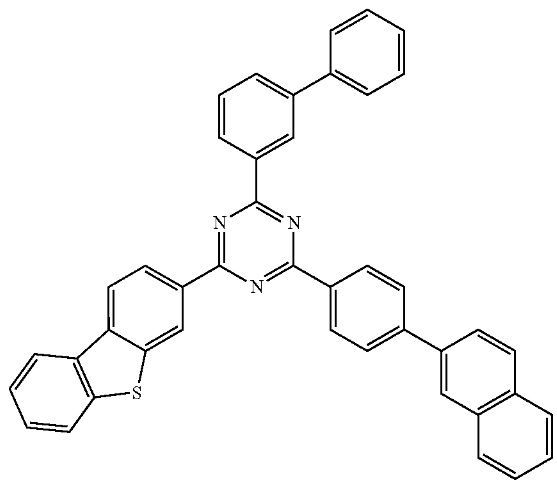
C-28
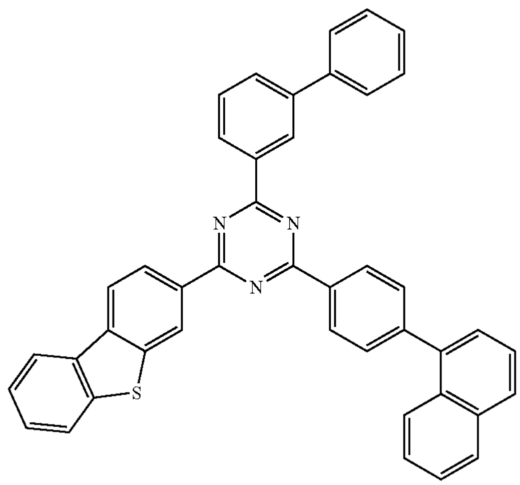
C-29
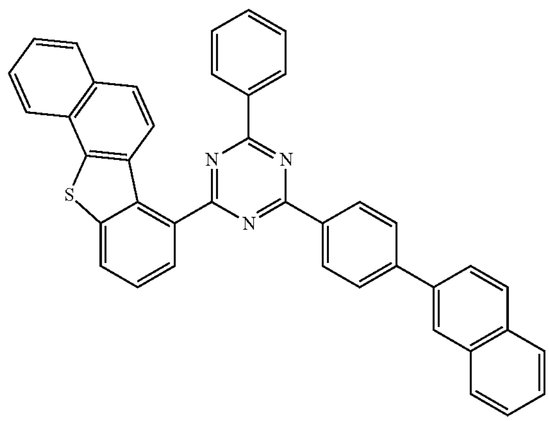
-continued
C-30
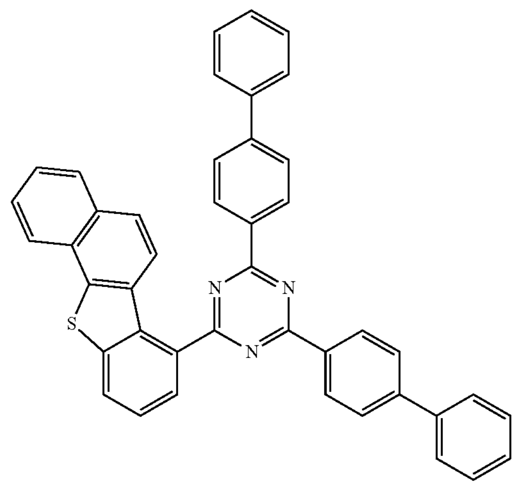
C-31
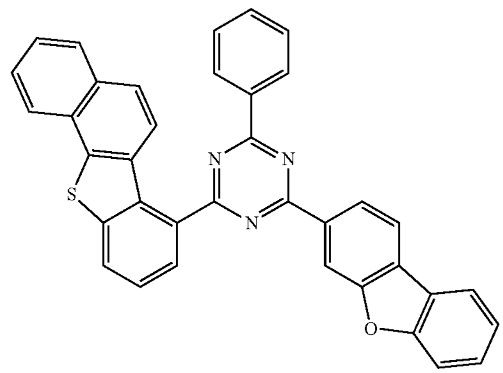
C-32
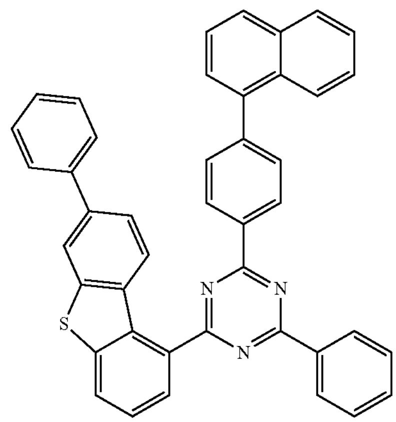

-continued
C-33
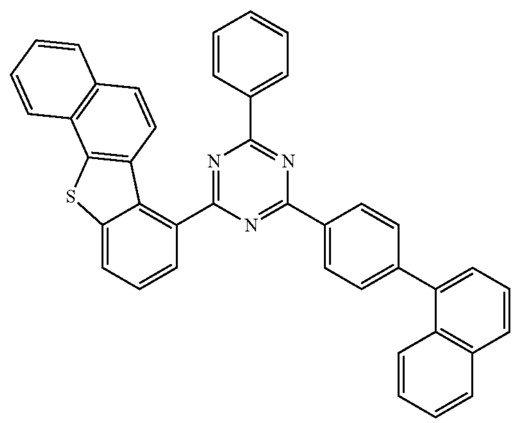
C-34
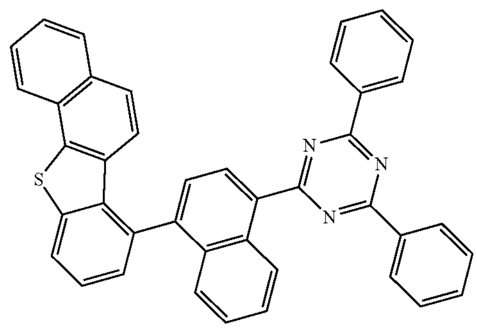
C-35
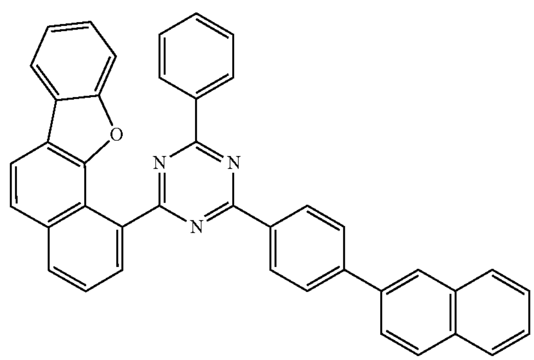
C-36
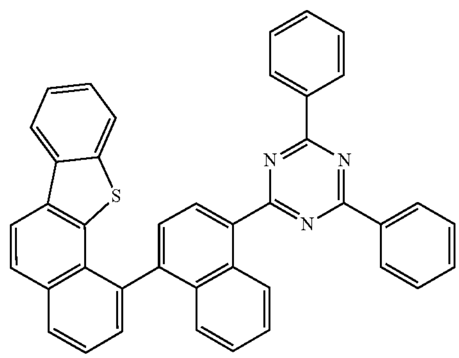
-continued
C-37
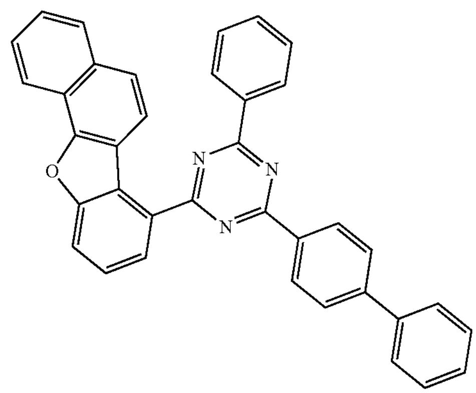
C-38
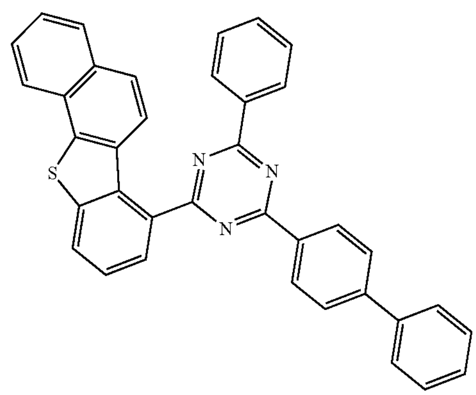
C-39
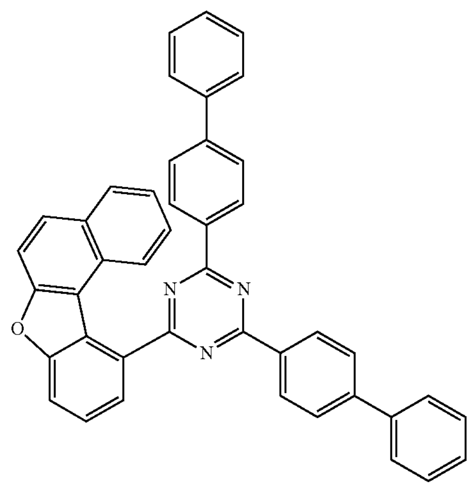
C-40
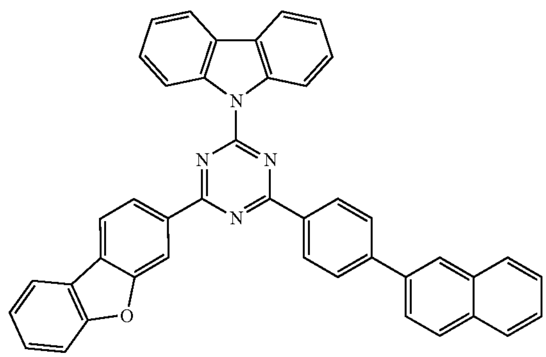

-continued
C-41
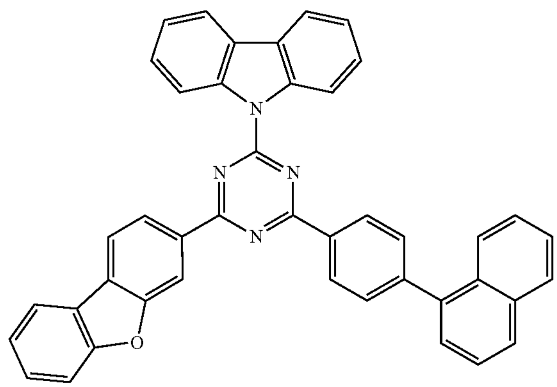
C-42
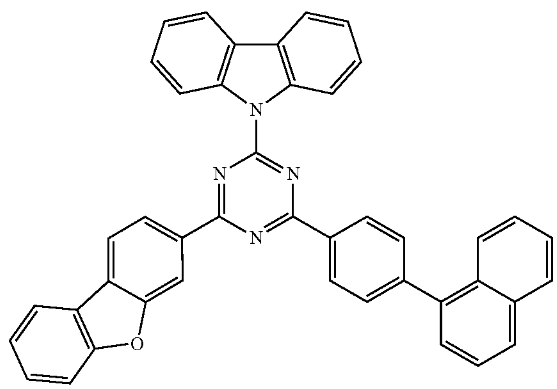
C-43
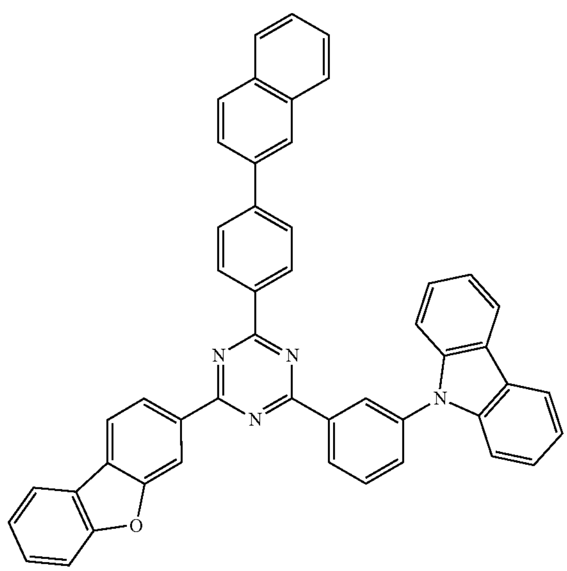
-continued
C-44
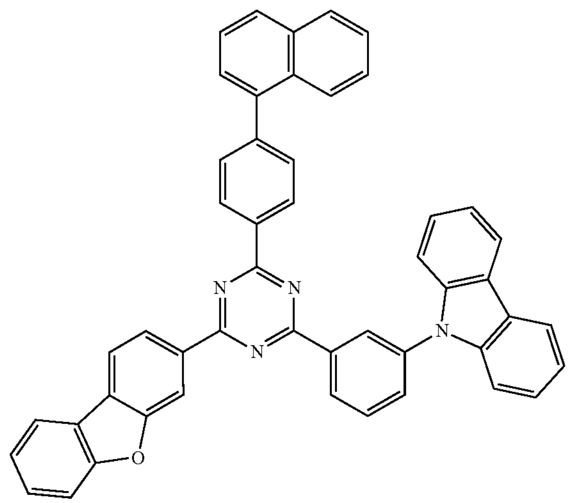
C-45
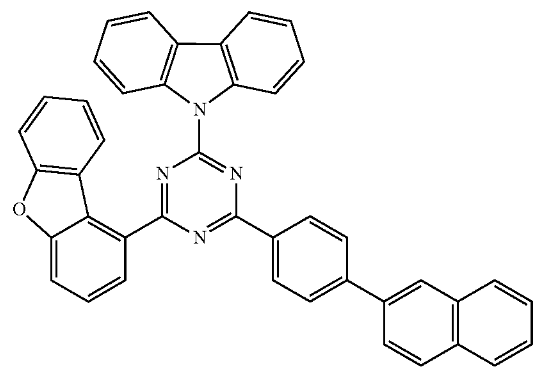
C-46
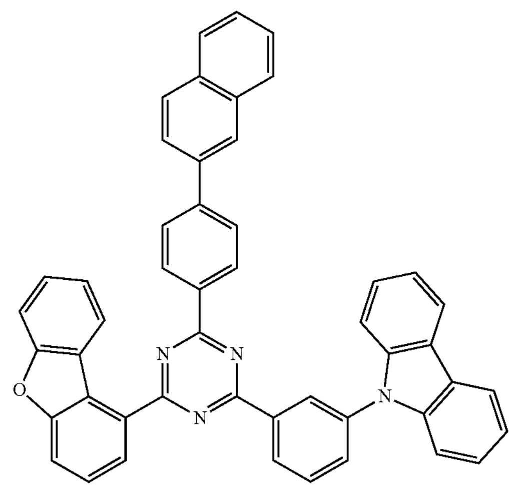

-continued
C-47
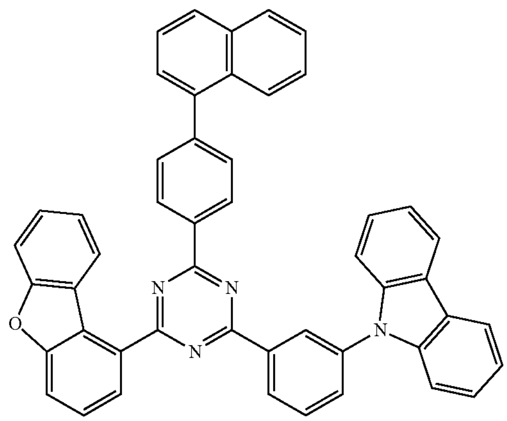
C-48
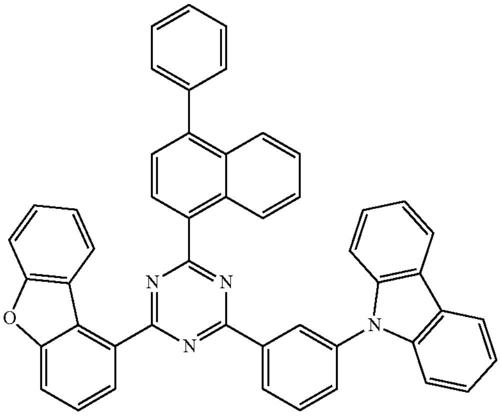
C-49
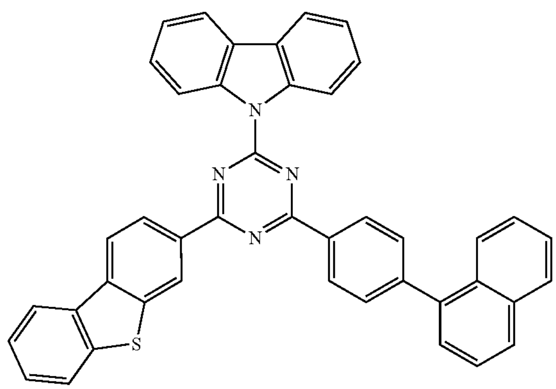
-continued
C-50
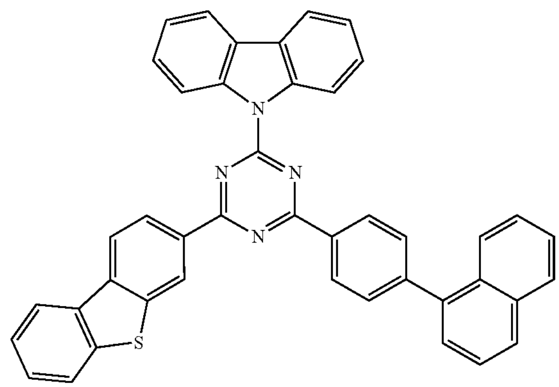
C-51
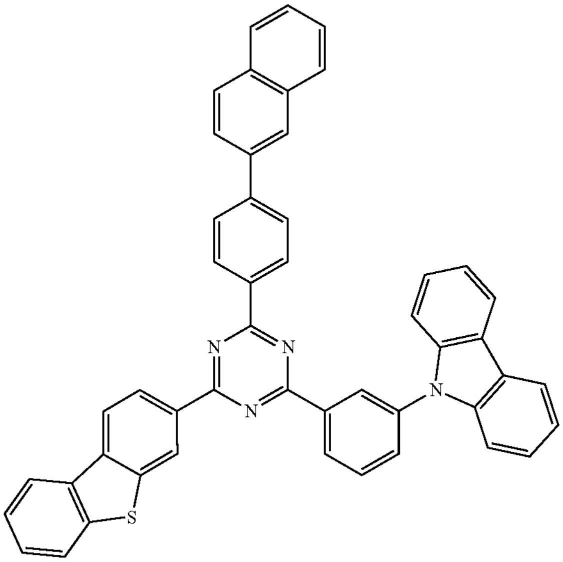
C-52
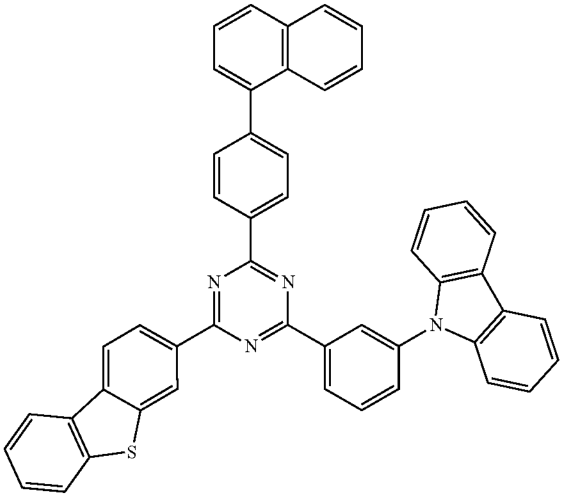

-continued
C-53
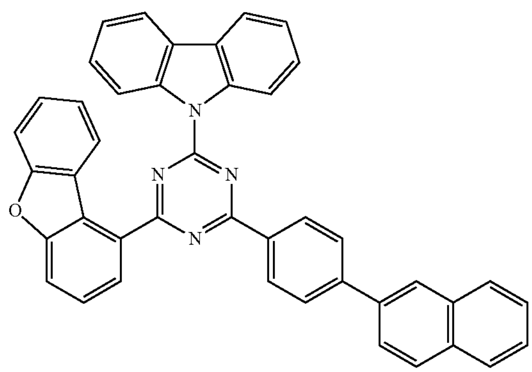
C-54
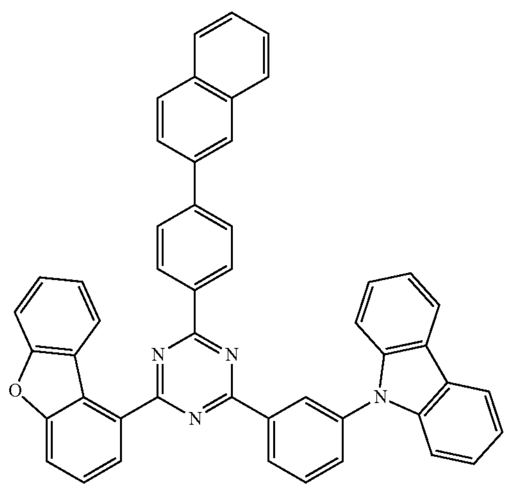
C-55
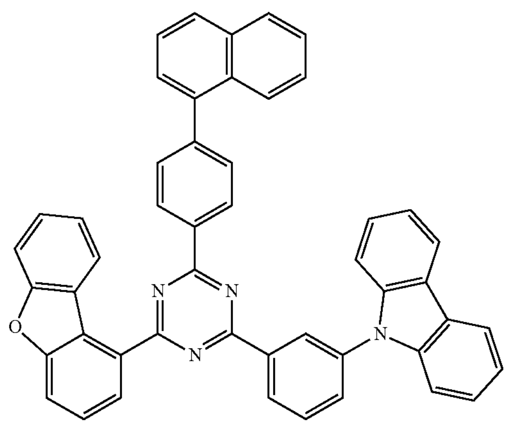
-continued
C-56
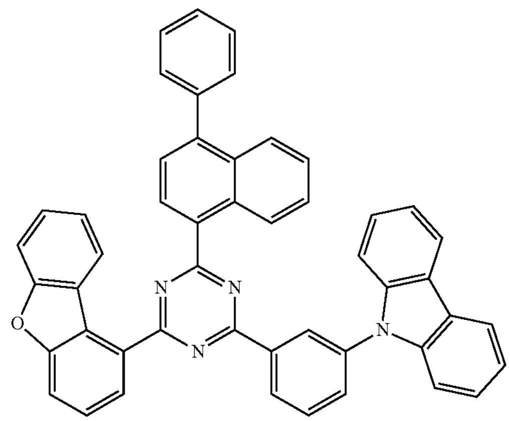
C-57
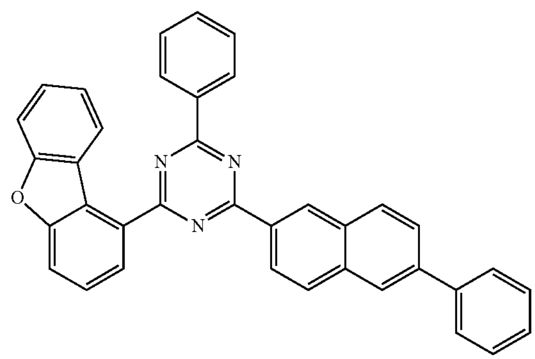
C-58
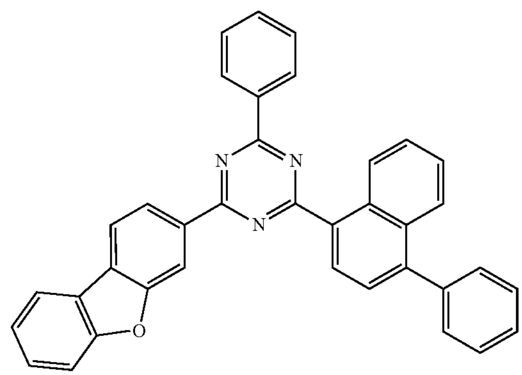
C-59
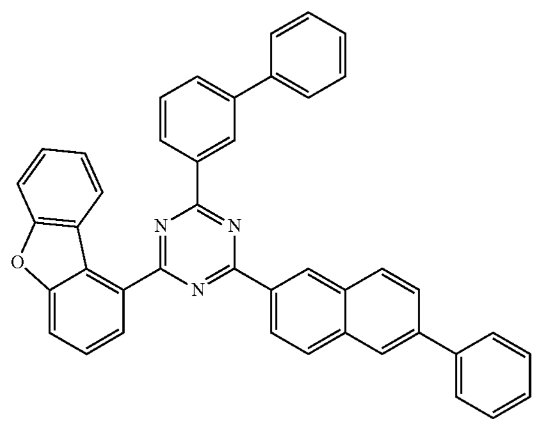

-continued
C-60
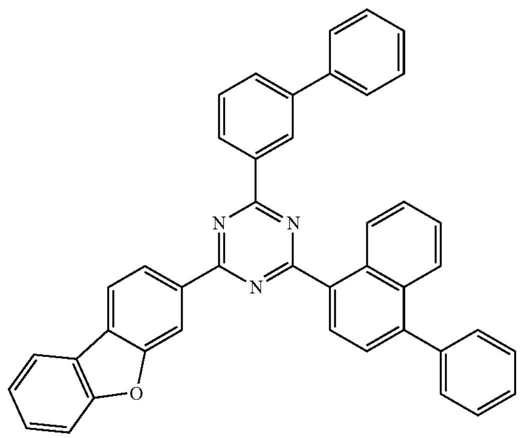
C-61
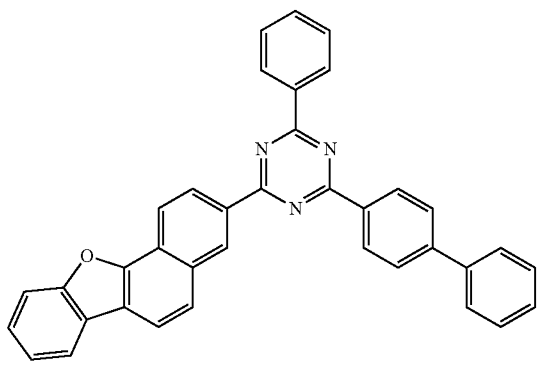
C-62
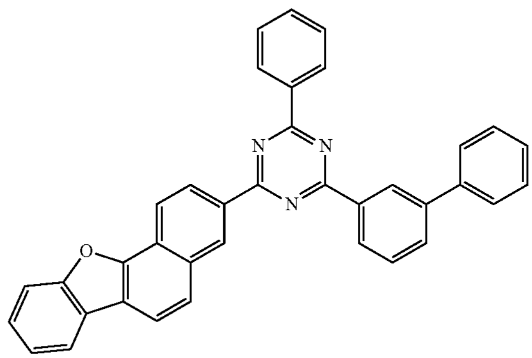
C-63
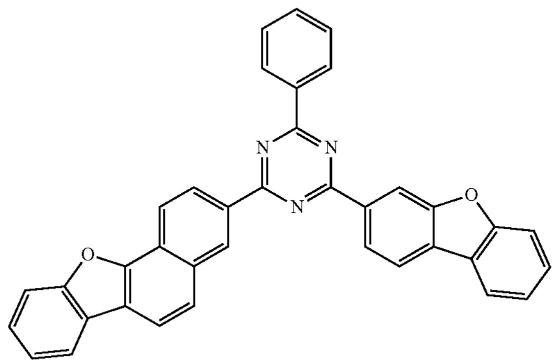
-continued
C-64
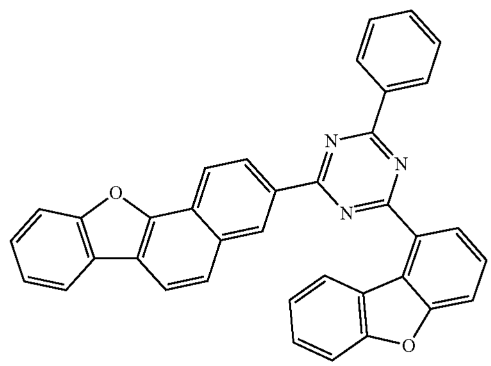
C-65
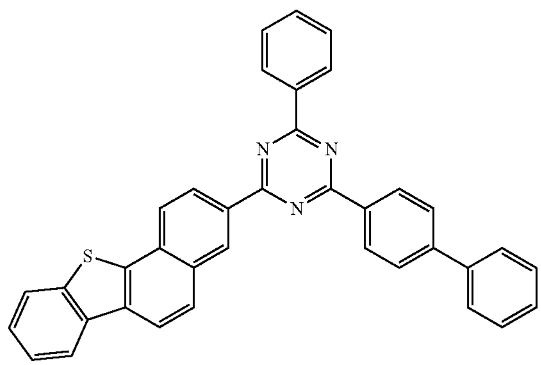
C-66
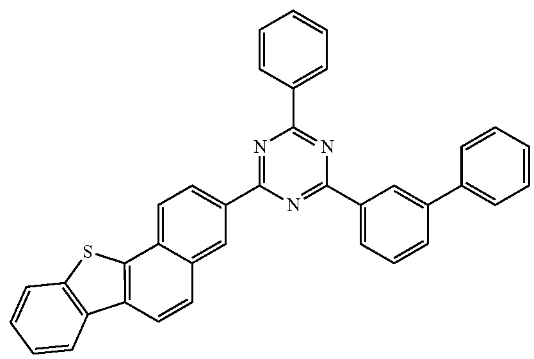
C-67
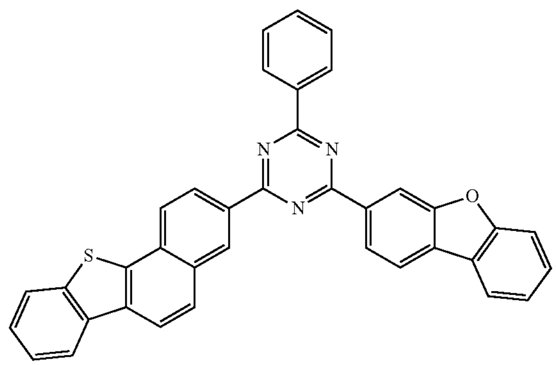

-continued
C-68
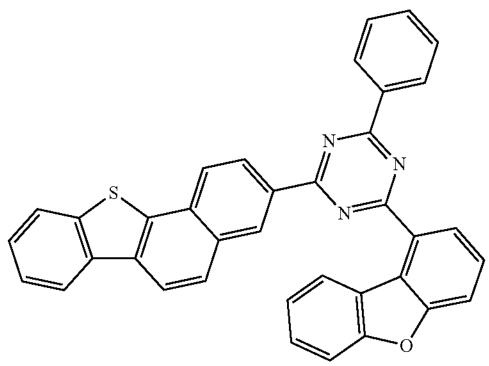
C-69
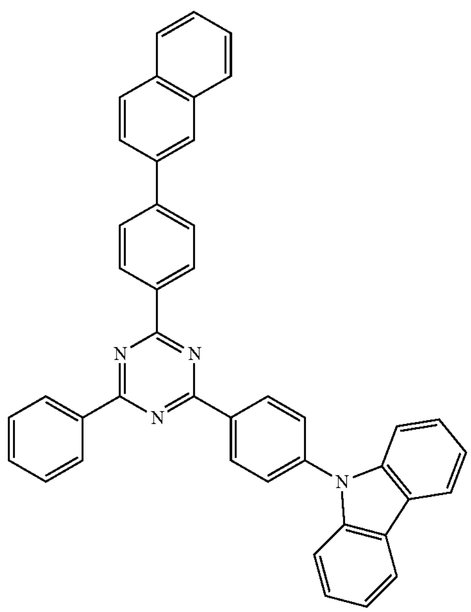
C-70
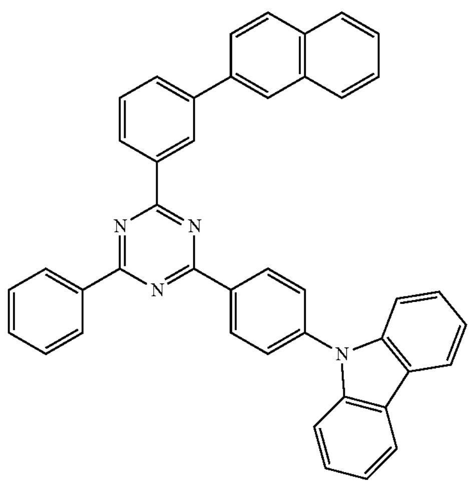
-continued
C-71
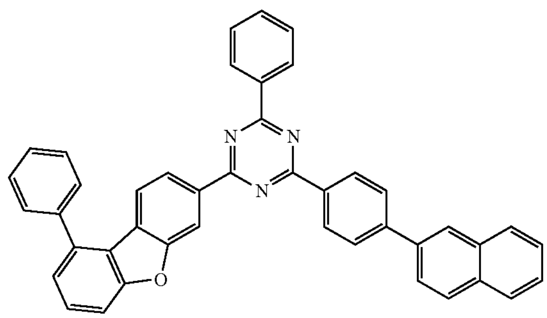
C-72
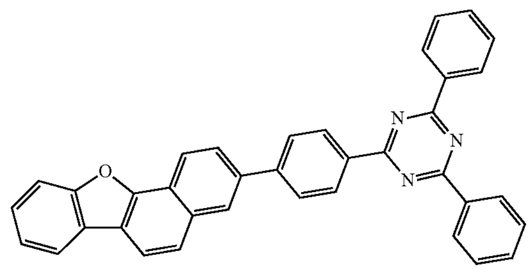
C-73
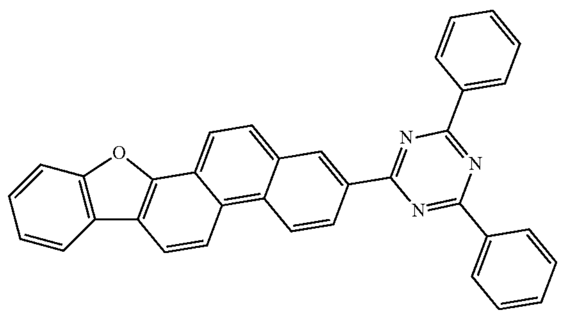
C-74
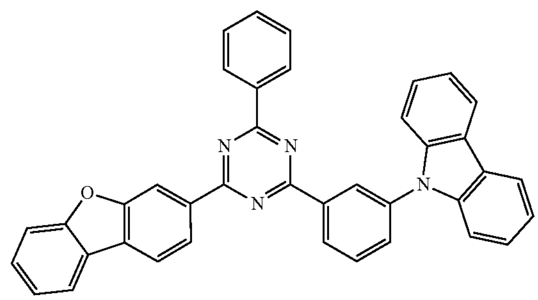

-continued
C-75
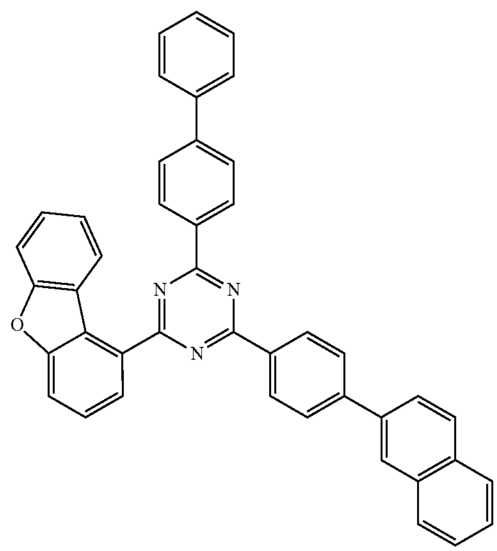
C-76
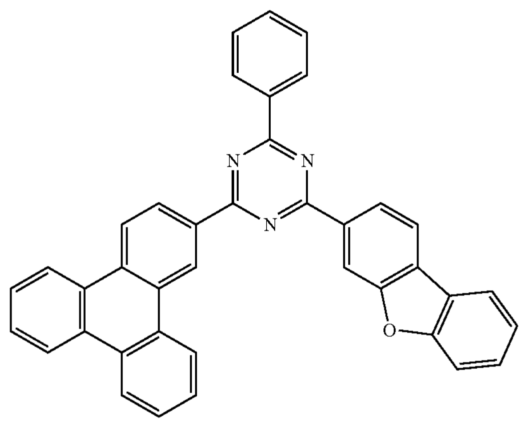
C-77
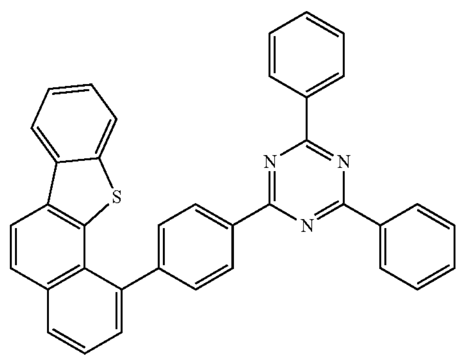
-continued
C-78
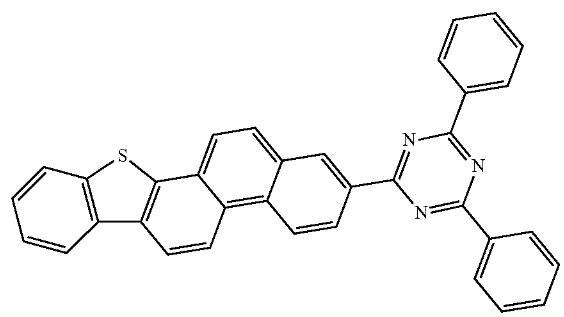
C-79
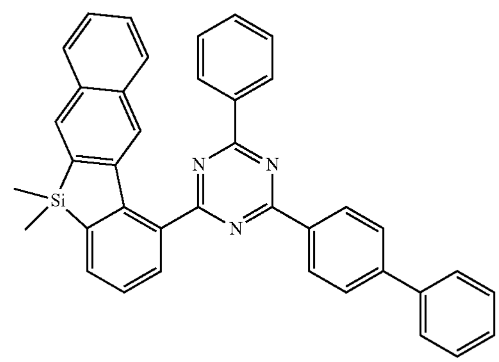
C-80
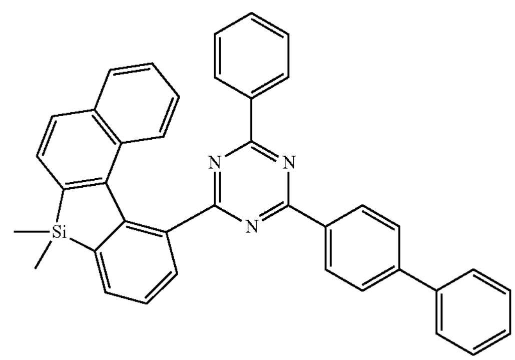
C-81
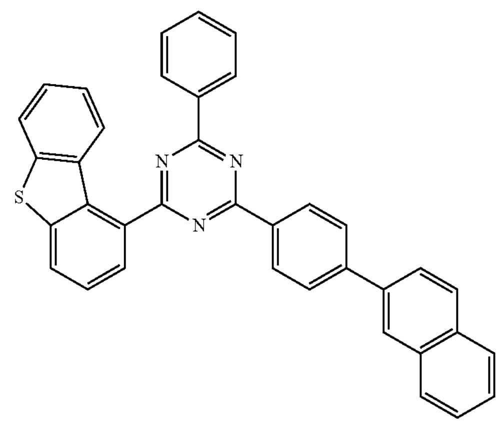

-continued
C-82
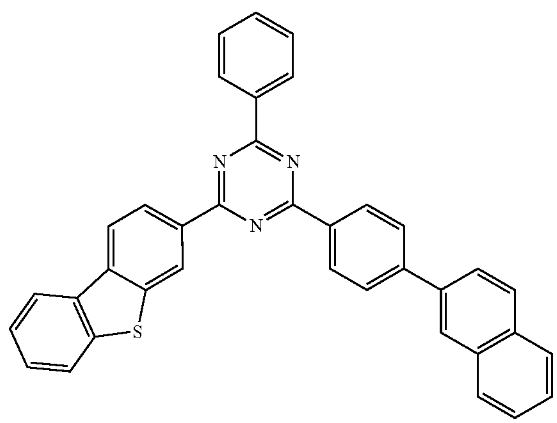
C-83
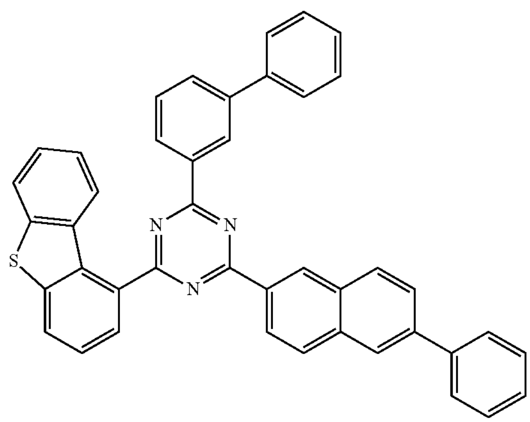
C-84
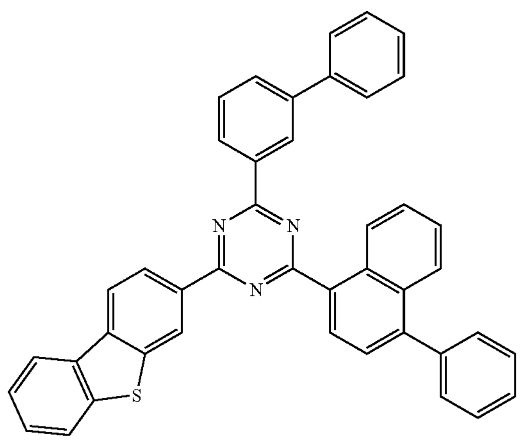
-continued
C-85
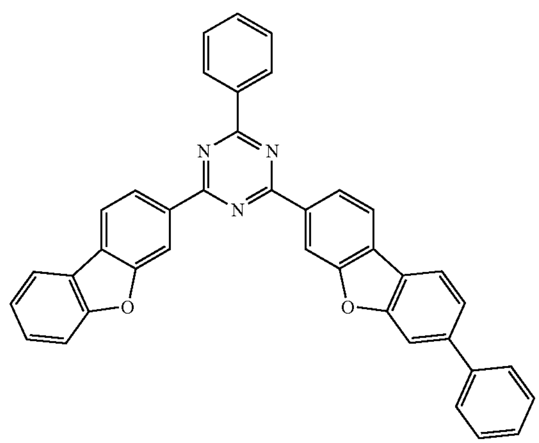
C-86
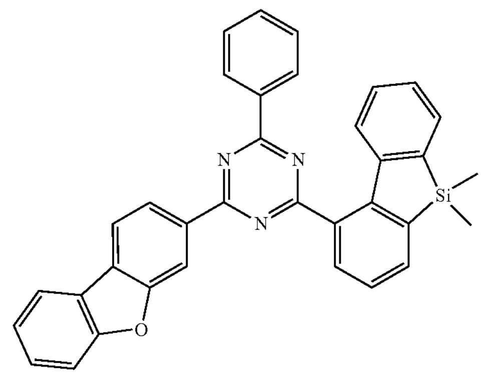
C-87
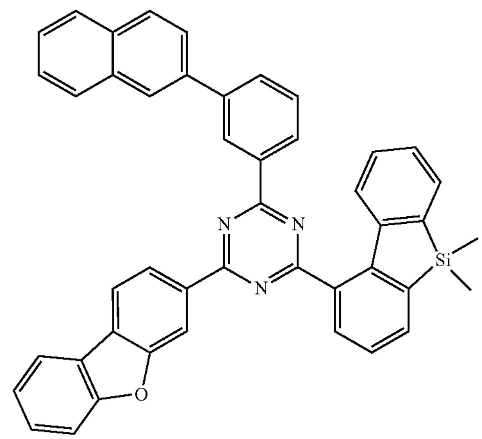

-continued
C-88
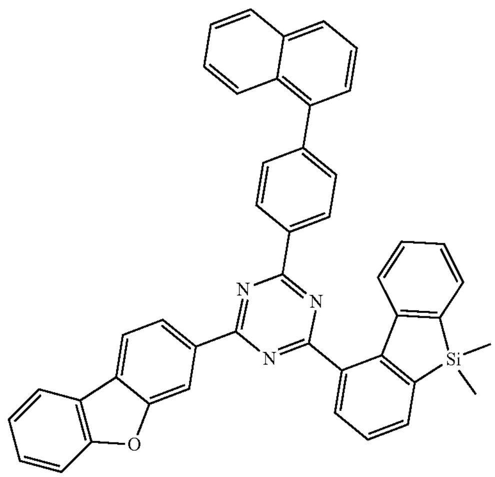
C-89
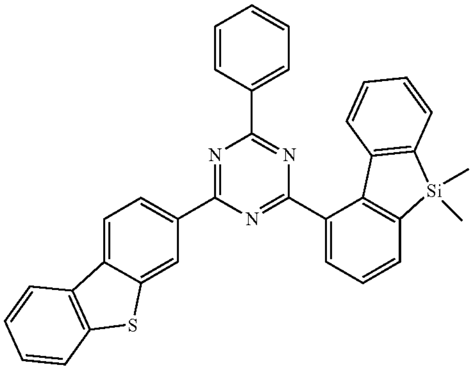
C-90
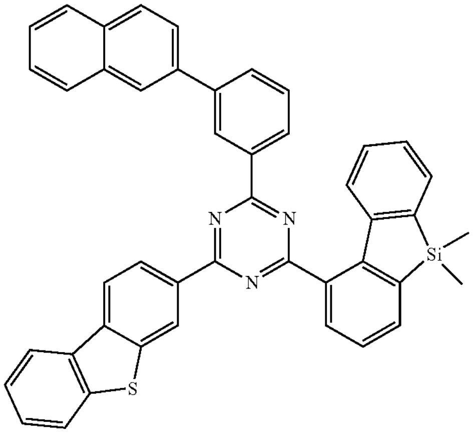
-continued
C-91
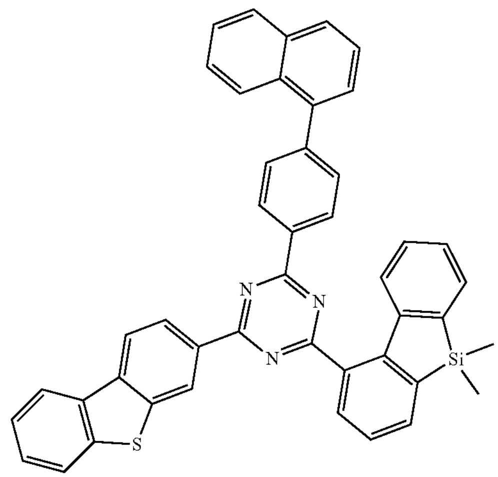
C-92
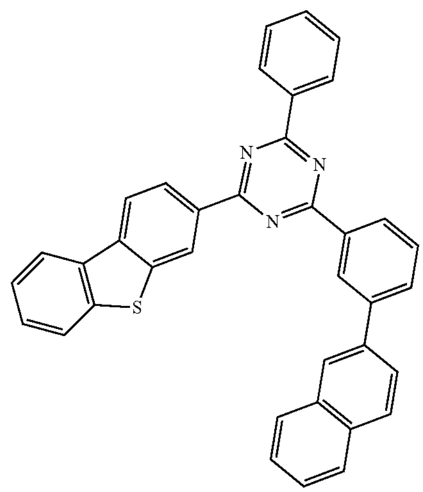
C-93
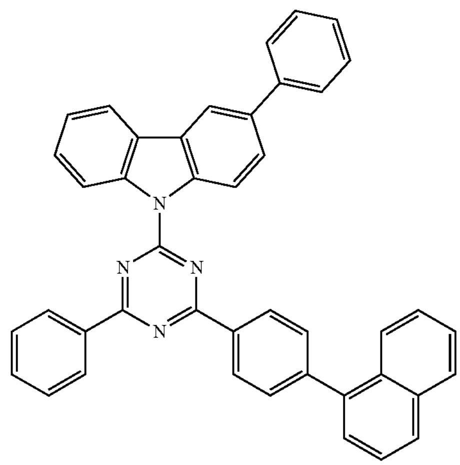

-continued
C-94
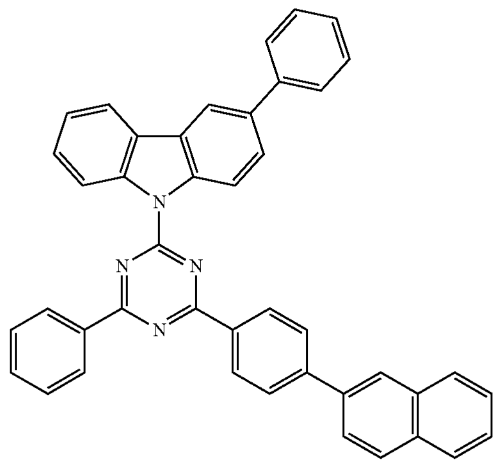
C-95
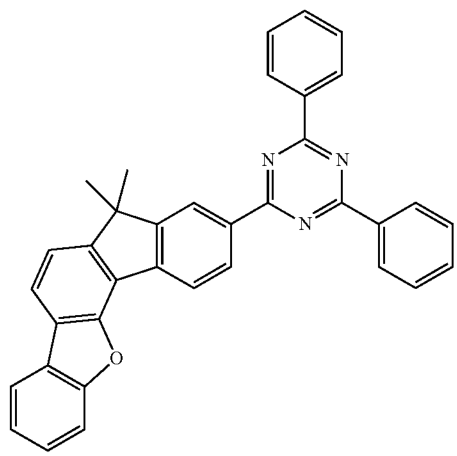
C-96
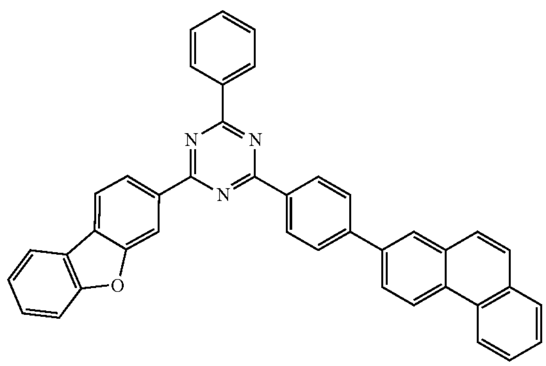
-continued
C-97
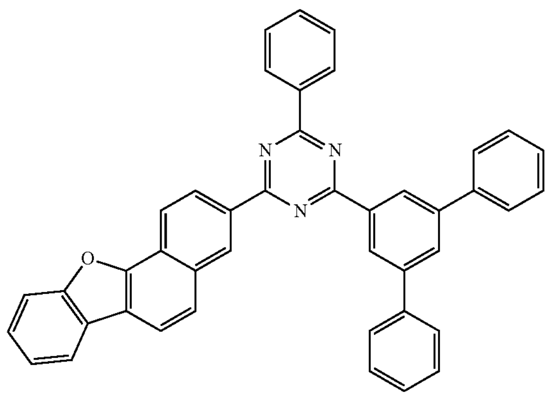
C-98
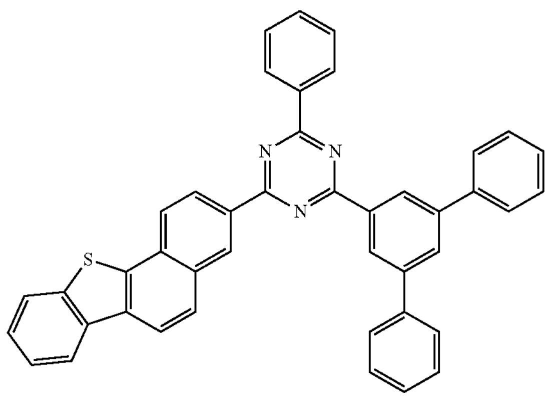
C-99
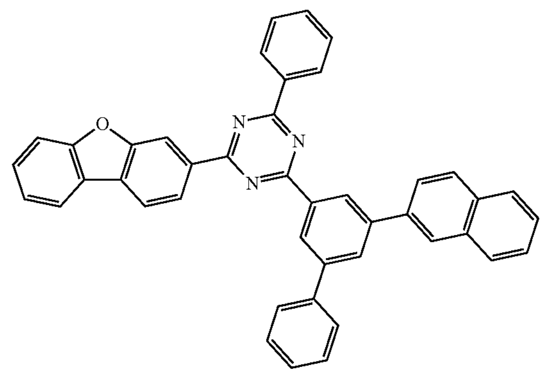
C-100
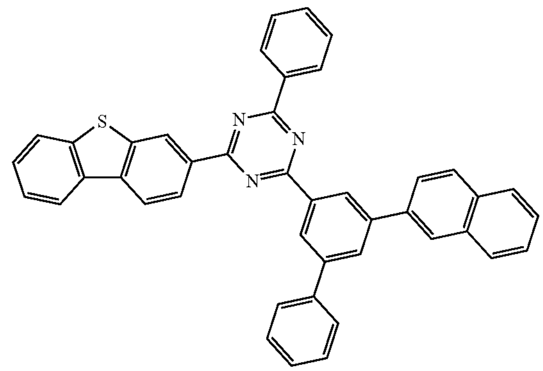

C-101
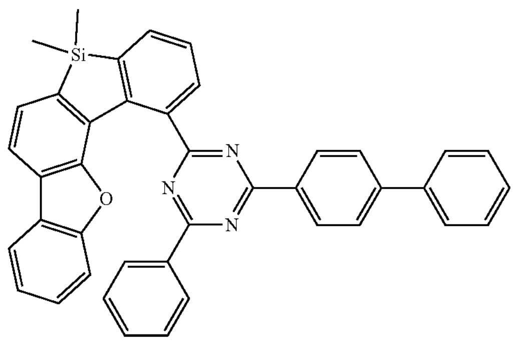
C-102
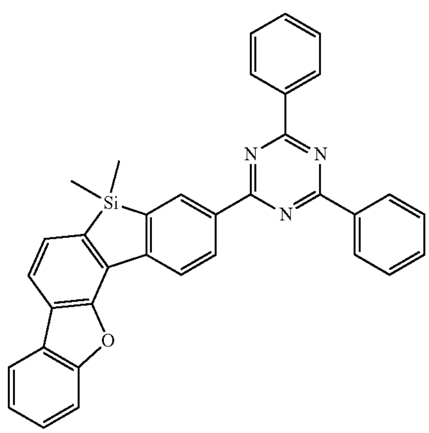
C-103
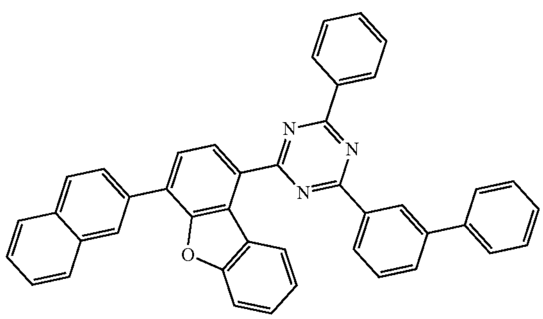
C-104
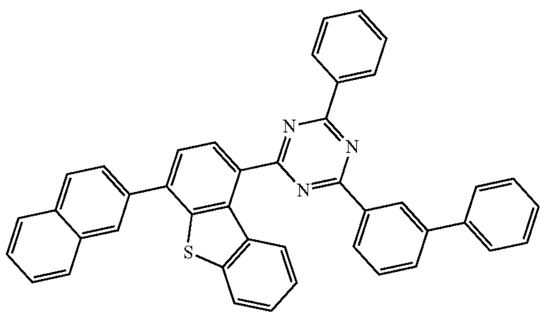
C-105
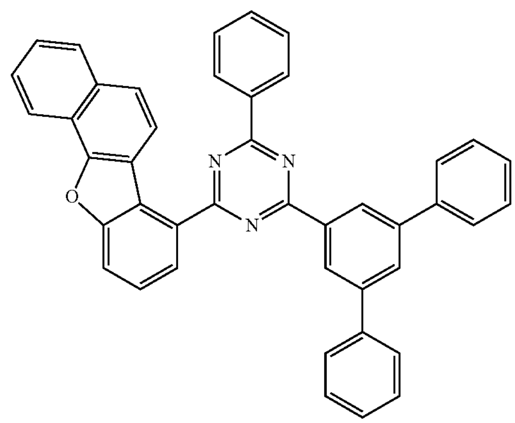
C-106
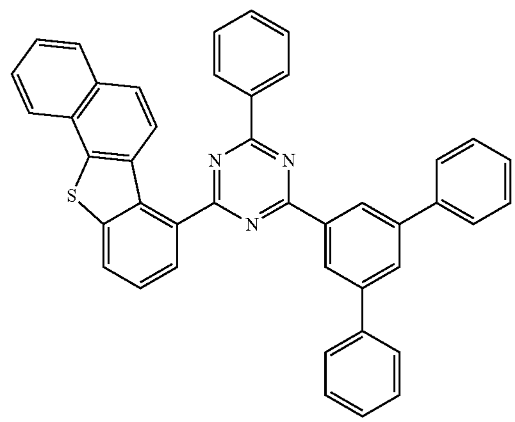
C-107
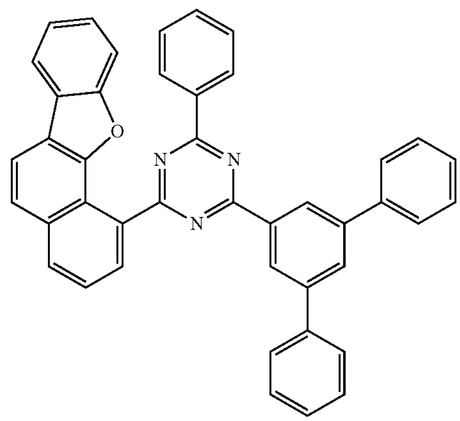

-continued

C-108

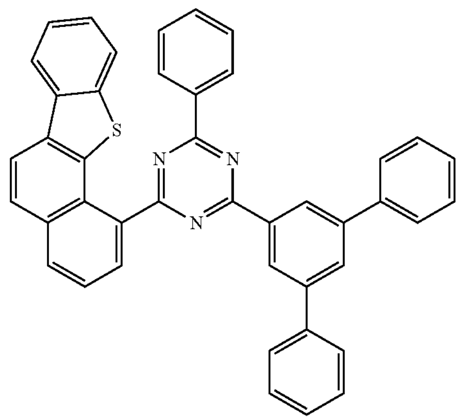

As a more specific example, the compound for an organic optoelectronic device according to the present invention may be represented by Chemical Formula 1-2, and in Chemical Formula 1-2, X may be 0 or S, $L^1$ may be a single bond, $L^2$ and $L^3$ may independently be a single bond, a substituted or unsubstituted phenylene group, $R^1$ and $R^2$ may independently be a methyl group, $R^3$ and $R^4$ may independently be a substituted or unsubstituted phenyl group, a substituted or unsubstituted biphenyl group, a substituted or unsubstituted naphthyl group, a substituted or unsubstituted dibenzofuranyl group, a substituted or unsubstituted dibenzothiophenyl group, a substituted or unsubstituted benzonaphthofuranyl group, or a substituted or unsubstituted benzonaphthothiophenyl group, and $R^5$ to $R^8$ may independently be hydrogen.

In addition to the aforementioned compound for an organic optoelectronic device, one or more compounds may be further included.

For example, it may be a composition including the aforementioned first compound for an organic optoelectronic device and compound for a second organic optoelectronic device.

The first compound for an organic optoelectronic device and the compound for a second organic optoelectronic device may be included in a weight ratio of 1:99 to 99:1. Within the above range, bipolar characteristics may be implemented by adjusting an appropriate weight ratio using the hole transport capability of the first compound for an organic optoelectronic device and the electron transport capability of the second compound for an organic optoelectronic device and thus efficiency and life-span may be improved. Within the above range, for example, they may be included in a weight ratio of about 10:90 to 90:10, about 20:80 to 80:20, for example about 20:80 to about 70:30, about 20:80 to about 60:40, and about 20:80 to about 50:50. As a specific example, it may be included in a weight ratio of 30:70, 40:60 or 50:50.

For example, a dopant may be further included.

The dopant may be, for example, a phosphorescent dopant, such as a red, green, or blue phosphorescent dopant, and may be, for example, a red phosphorescent dopant.

The dopant is a material mixed with the compound or composition for an organic optoelectronic device in a small amount to cause light emission and may be generally a material such as a metal complex that emits light by multiple excitation into a triplet or more. The dopant may be, for example an inorganic, organic, or organic-inorganic compound, and one or more types thereof may be used.

Examples of the dopant may be a phosphorescent dopant and examples of the phosphorescent dopant may be an organic metal compound including Ir, Pt, Os, Ti, Zr, Hf, Eu, Tb, Tm, Fe, Co, Ni, Ru, Rh, Pd, or a combination thereof. The phosphorescent dopant may be, for example, a compound represented by Chemical Formula Z, but is not limited thereto.

$L^7MX^1$ [Chemical Formula Z]

In Chemical Formula Z, M is a metal, $L^7$ and $X^1$ are the same as or different from each other, and are ligands forming a complex compound with M.

The M may be, for example, Ir, Pt, Os, Ti, Zr, Hf, Eu, Tb, Tm, Fe, Co, Ni, Ru, Rh, Pd, or a combination thereof, and $L^7$ and $X^1$ may be, for example, a bidentate ligand.

The aforementioned compound for an organic optoelectronic device and composition for an organic optoelectronic device may be formed by a dry film formation method such as chemical vapor deposition (CVD).

Hereinafter, an organic optoelectronic device including the aforementioned compound for an organic optoelectronic device is described.

The organic optoelectronic device may be any device to convert electrical energy into photoenergy and vice versa without particular limitation, and may be, for example an organic photoelectric device, an organic light emitting diode, an organic solar cell, and an organic photoconductor drum.

Herein, an organic light emitting diode as one example of an organic optoelectronic device is described referring to drawings.

FIGS. 1 and 2 are cross-sectional views showing organic light emitting diodes according to embodiments.

Referring to FIG. 1, an organic light emitting diode 100 according to an embodiment includes an anode 120 and a cathode 110 facing each other and an organic layer 105 between the anode 120 and cathode 110.

The anode 120 may be made of a conductor having a large work function to help hole injection, and may be for example a metal, a metal oxide and/or a conductive polymer. The anode 120 may be, for example a metal such as nickel, platinum, vanadium, chromium, copper, zinc, gold, and the like or an alloy thereof; a metal oxide such as zinc oxide, indium oxide, indium tin oxide (ITO), indium zinc oxide (IZO), and the like; a combination of a metal and an oxide such as ZnO and Al or $SnO_2$ and Sb; a conductive polymer such as poly(3-methylthiophene), poly(3,4-(ethylene-1,2-dioxy)thiophene) (PEDOT), polypyrrole, and polyaniline, but is not limited thereto.

The cathode 110 may be made of a conductor having a small work function to help electron injection, and may be for example a metal, a metal oxide and/or a conductive polymer. The cathode 110 may be for example a metal such as magnesium, calcium, sodium, potassium, titanium, indium, yttrium, lithium, gadolinium, aluminum silver, tin, lead, cesium, barium, and the like, or an alloy thereof; a multi-layer structure material such as LiF/Al, $LiO_2$/Al, LiF/Ca, LiF/Al, and $BaF_2$/Ca, but is not limited thereto.

The organic layer 105 may include the aforementioned compound for an organic optoelectronic device.

The organic layer 105 may include a light emitting layer 130 and the light emitting layer 130 may include the aforementioned compound for an organic optoelectronic device.

The composition for an organic optoelectronic device further including the dopant may be, for example, a red light emitting composition.

The light emitting layer 130 may include, for example, the aforementioned compound for an organic optoelectronic device.

The organic layer may further include an auxiliary layer in addition to the light emitting layer.

The auxiliary layer may be, for example, a hole auxiliary layer 140.

Referring to FIG. 2, an organic light emitting diode 200 further includes a hole auxiliary layer 140 in addition to the light emitting layer 130. The hole auxiliary layer 140 further increases hole injection and/or hole mobility and blocks electrons between the anode 120 and the light emitting layer 130.

The hole auxiliary layer 140 may include for example at least one of compounds of Group E.

Specifically, the hole auxiliary layer 140 may include a hole transport layer between the anode 120 and the light emitting layer 130 and a hole transport auxiliary layer between the light emitting layer 130 and the hole transport layer, and at least one of compounds of Group E may be included in the hole transport auxiliary layer.

[Group E]

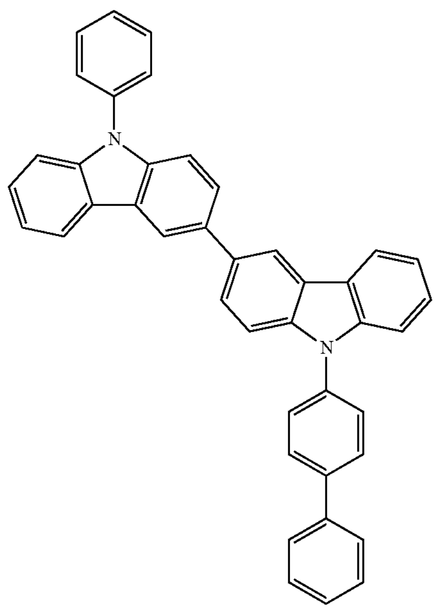

-continued

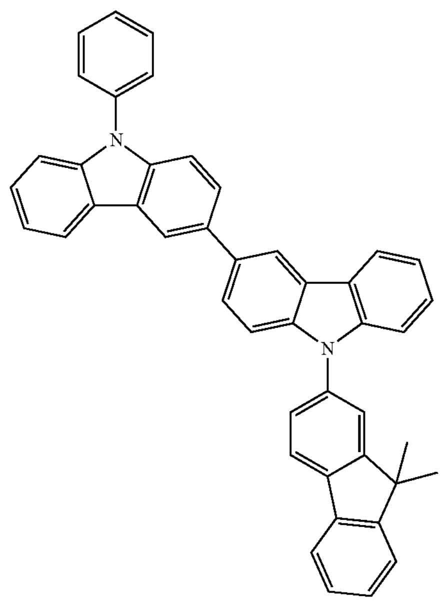

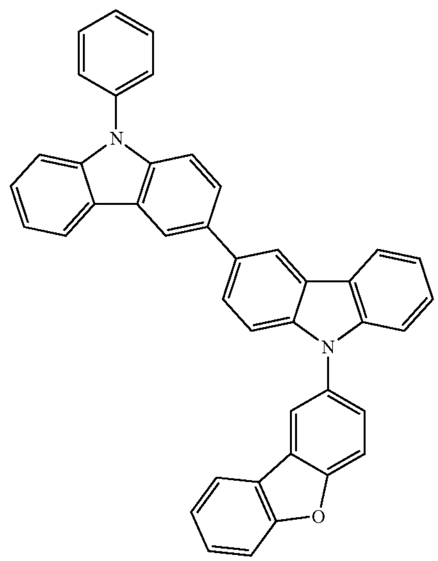

-continued
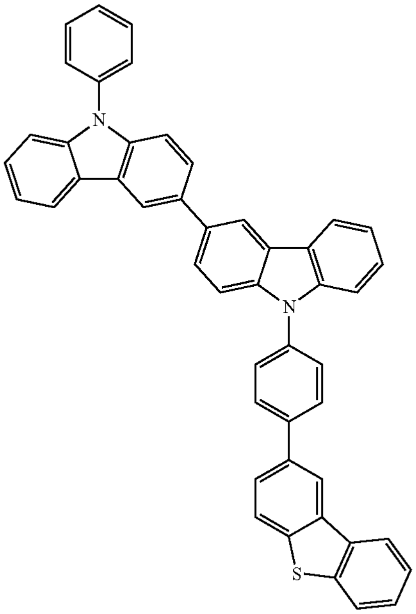
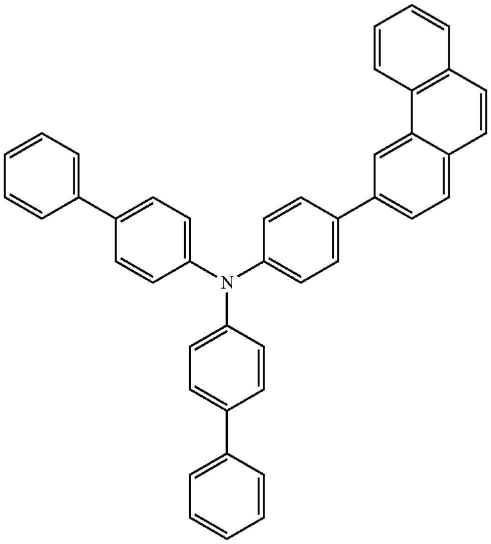
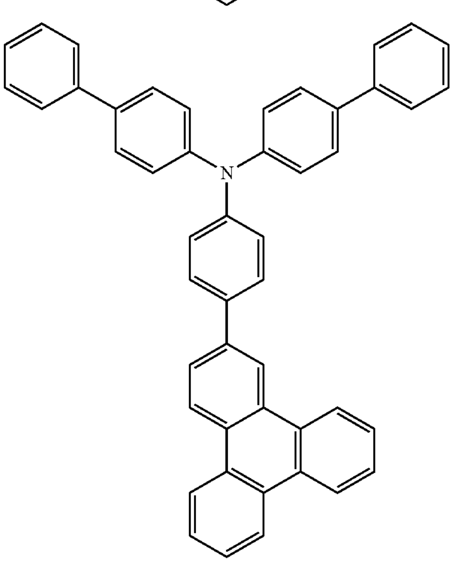
-continued
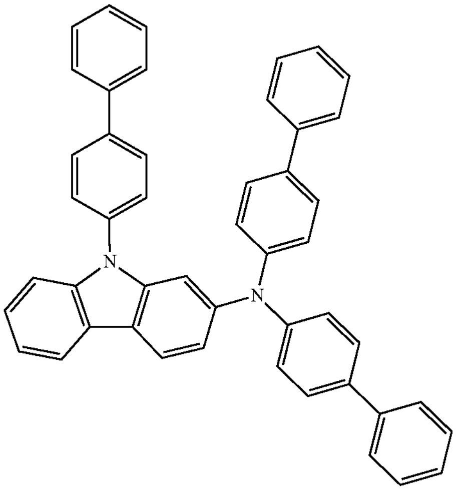
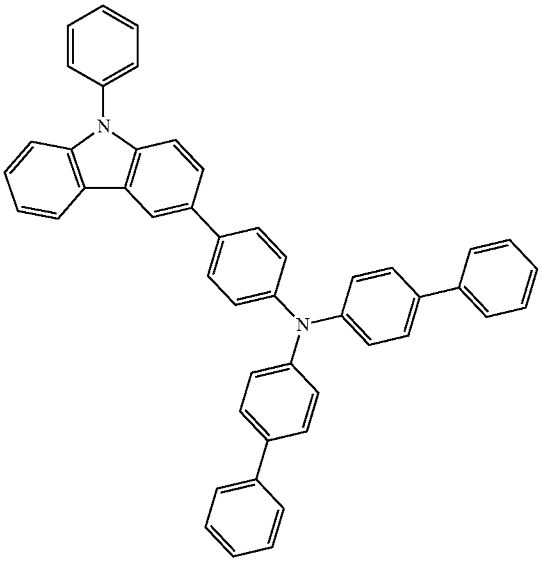
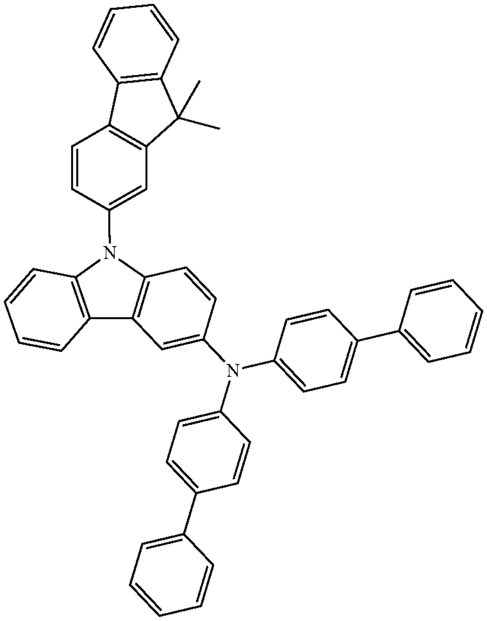

-continued
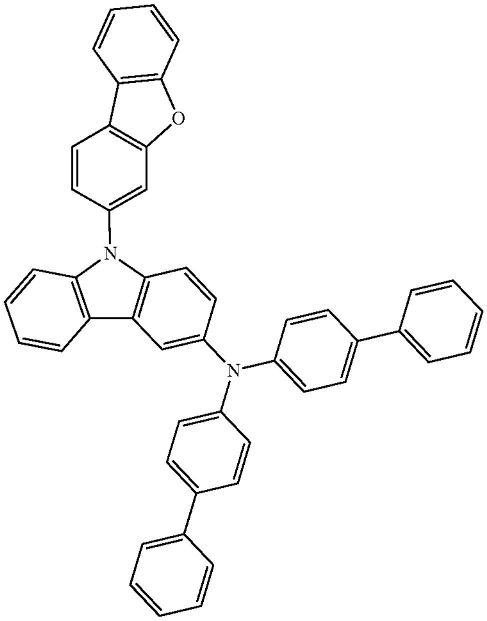
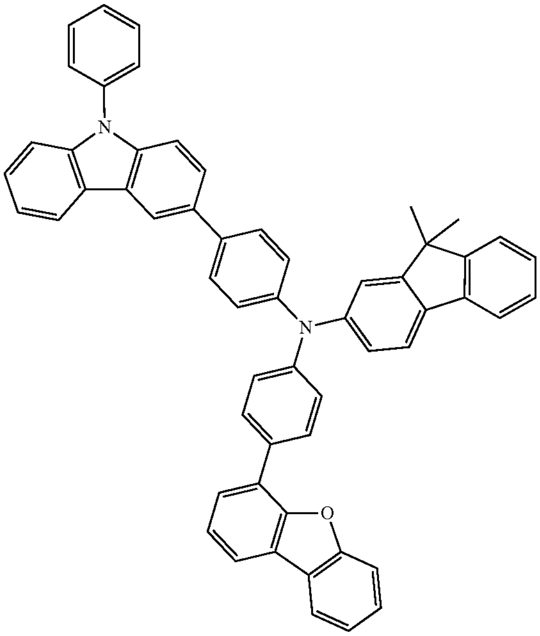
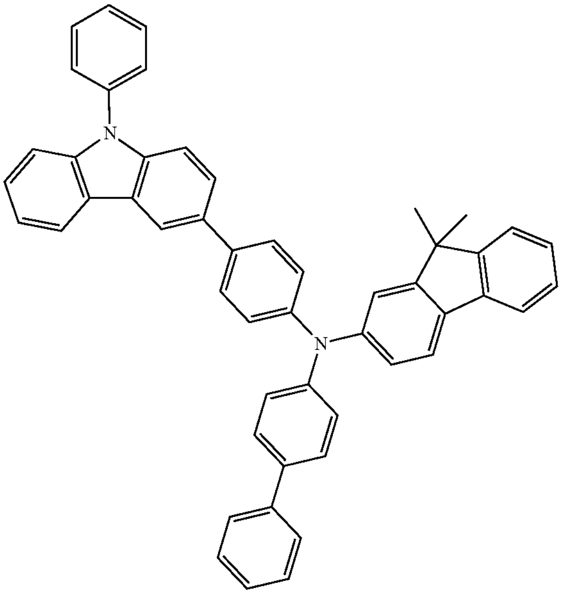
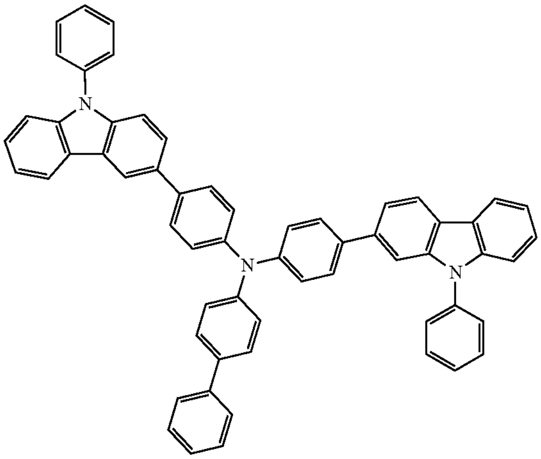
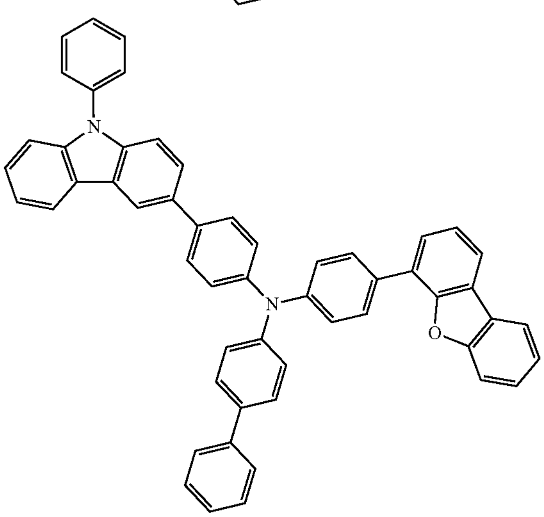
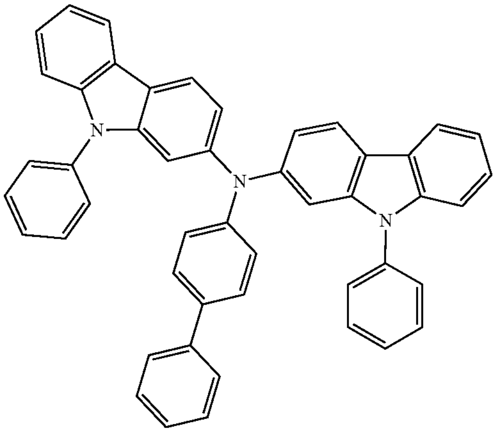

-continued
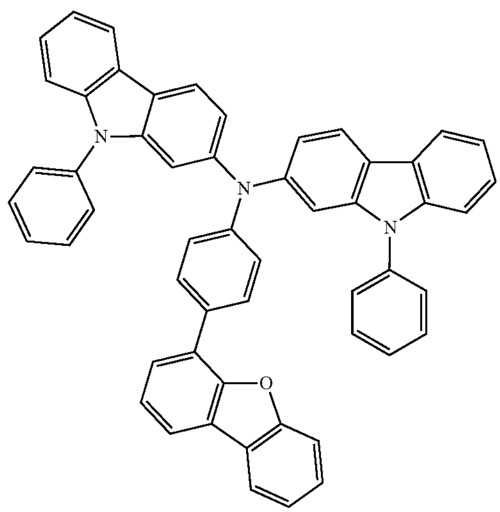
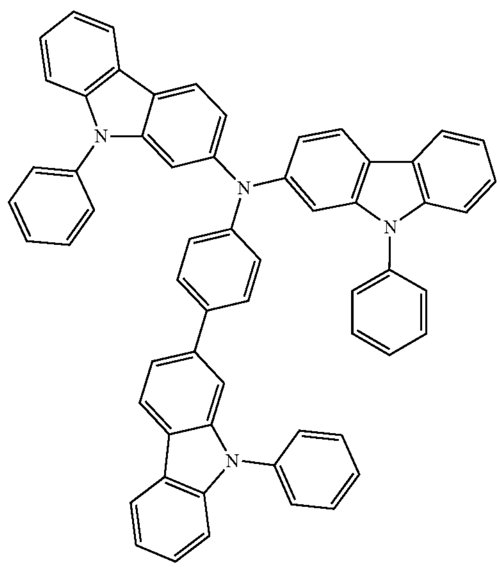
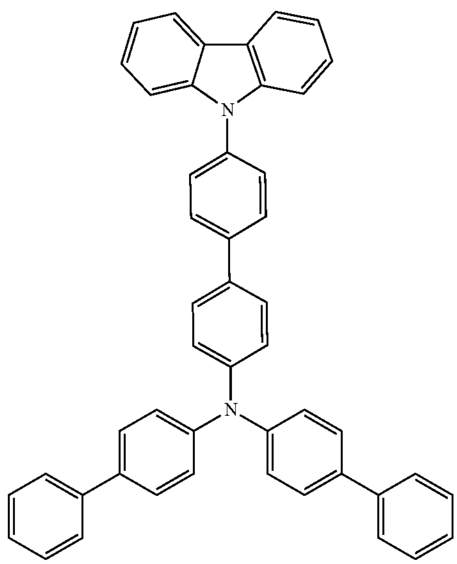
-continued
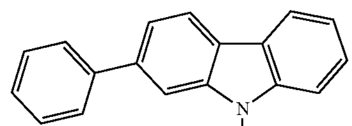
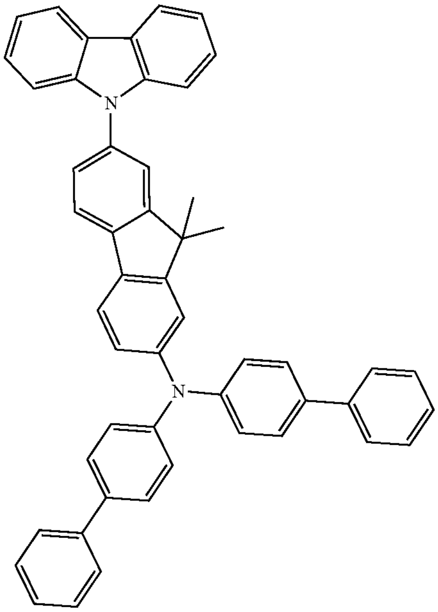
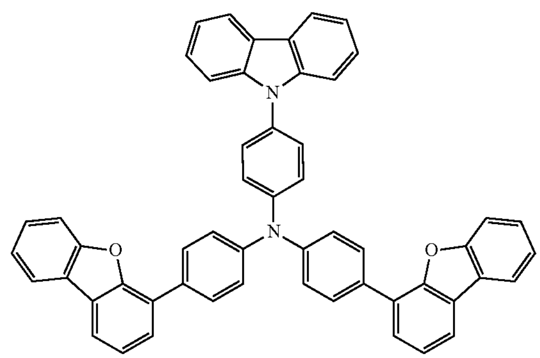

-continued
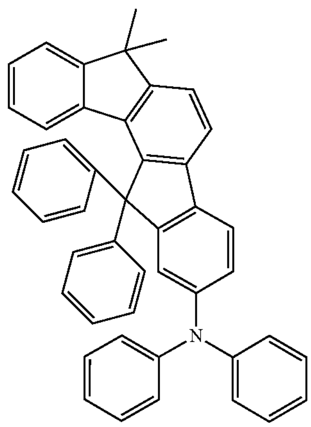
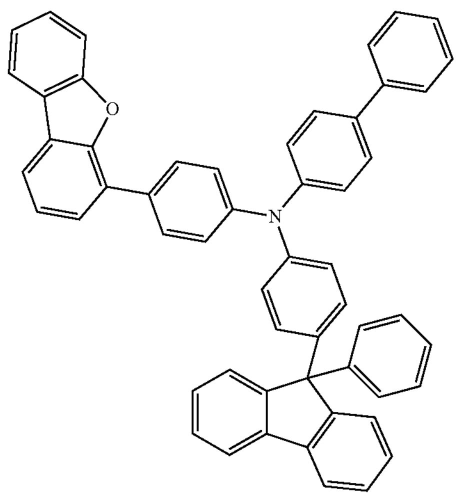
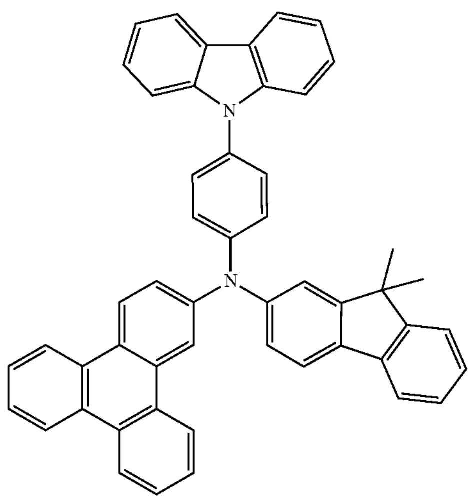
-continued
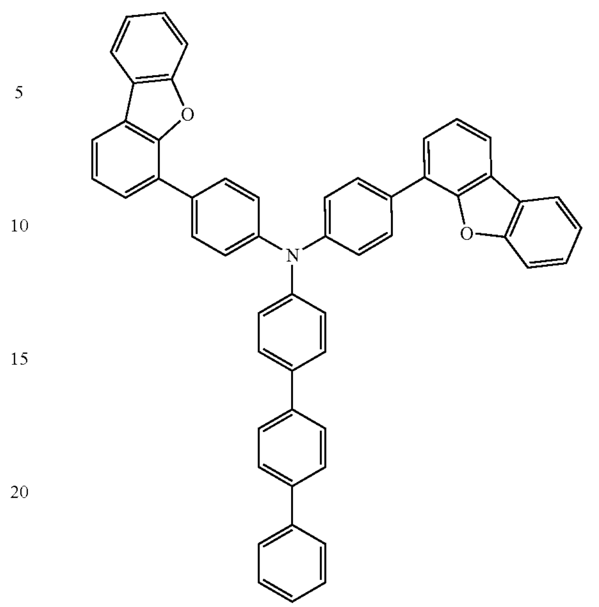
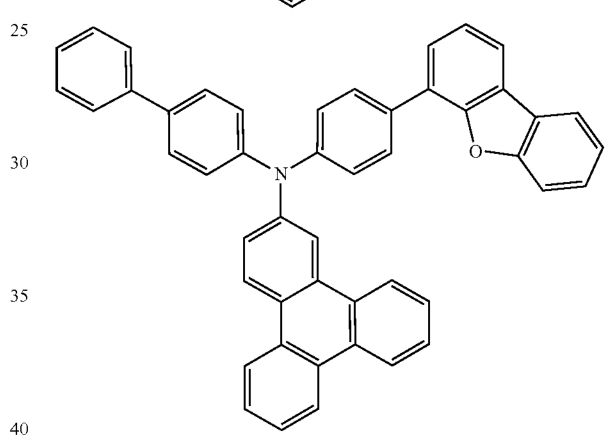
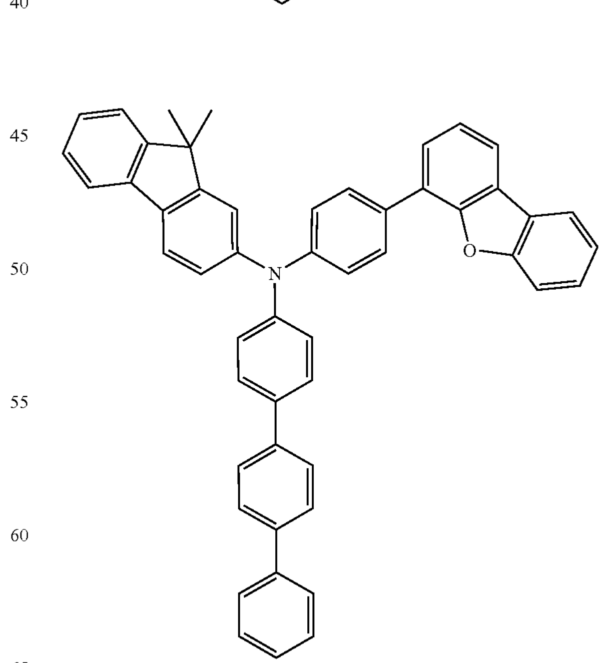

-continued
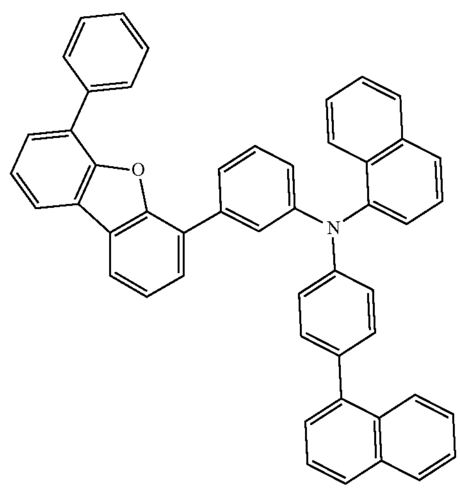
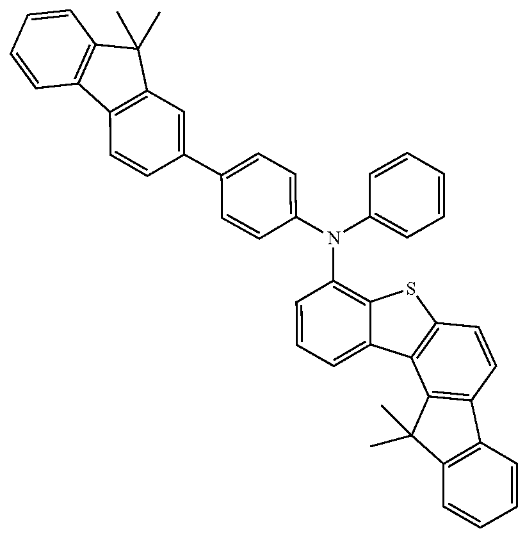
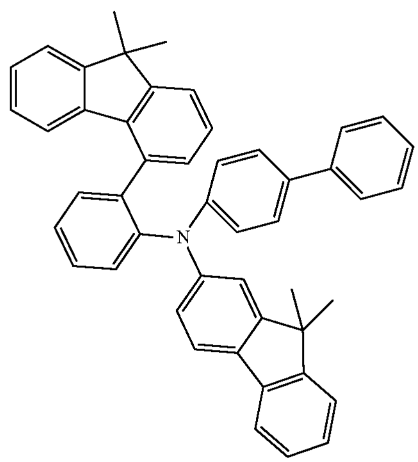
-continued
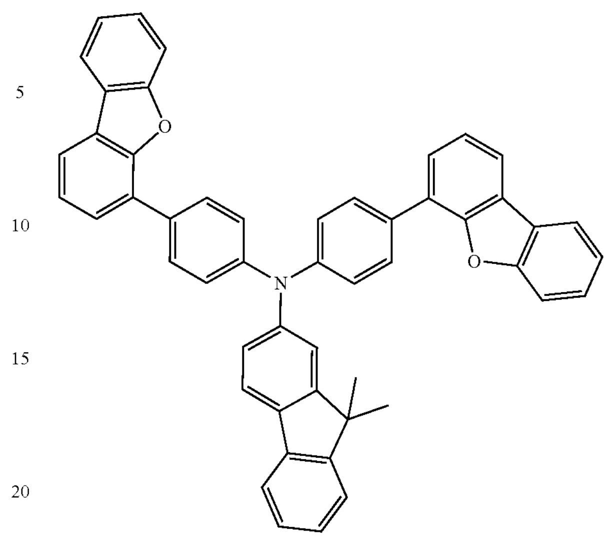
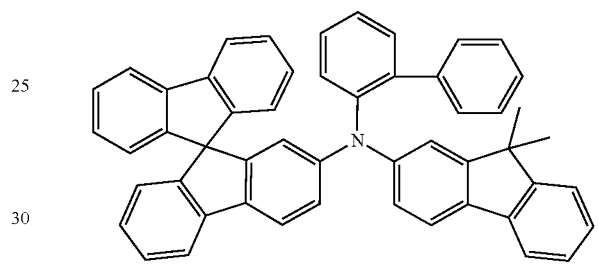
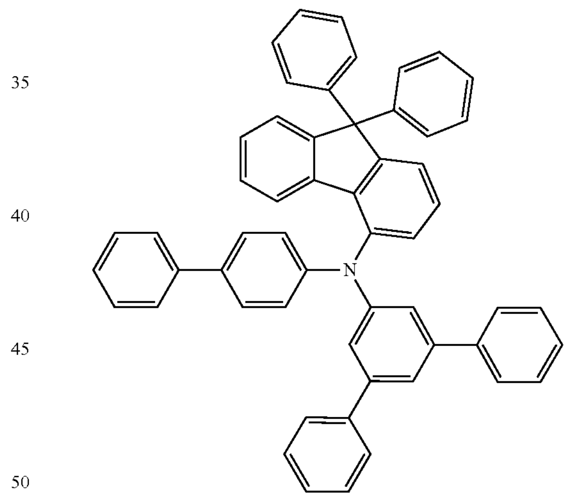
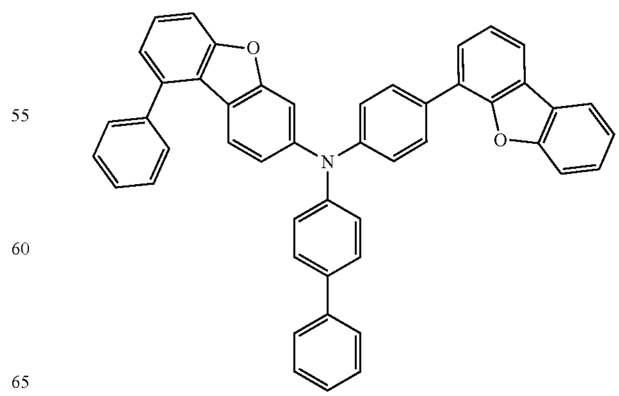

-continued
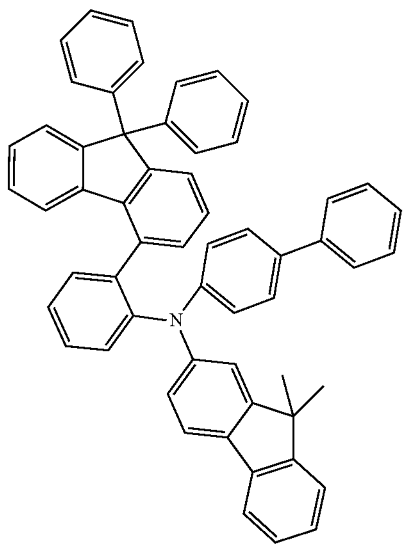
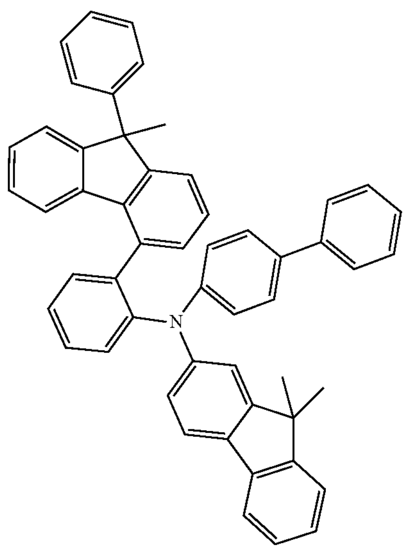
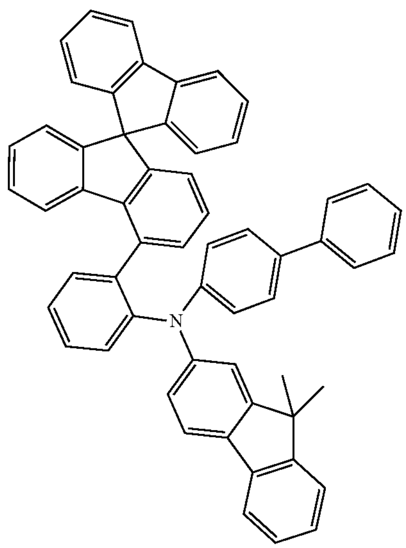
-continued
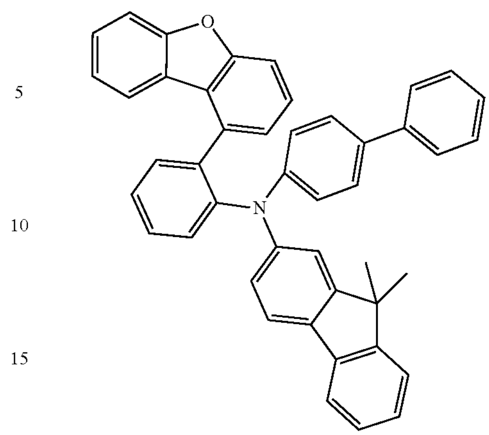
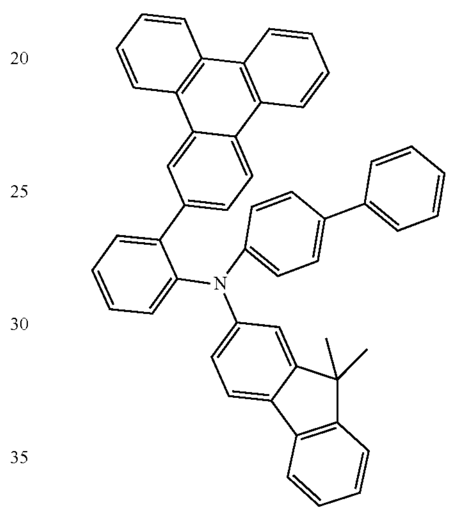
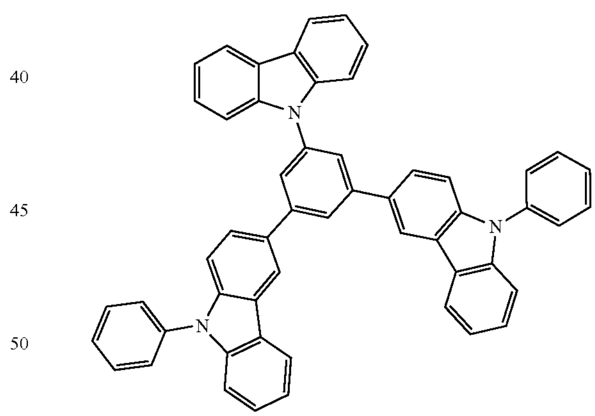
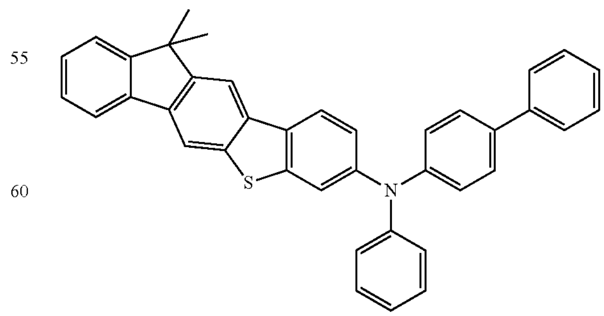

-continued
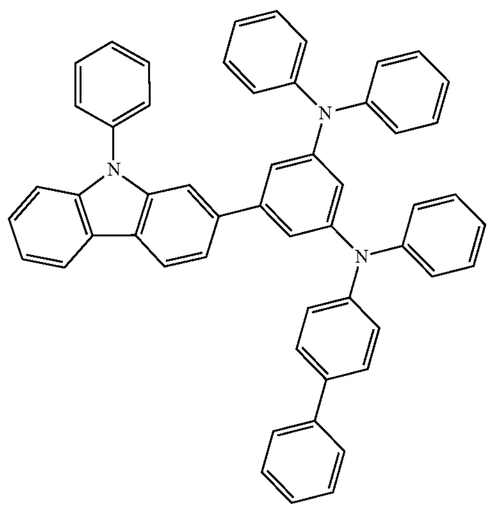
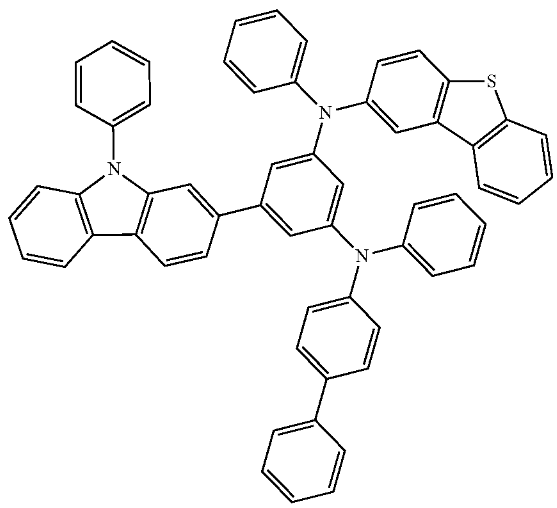
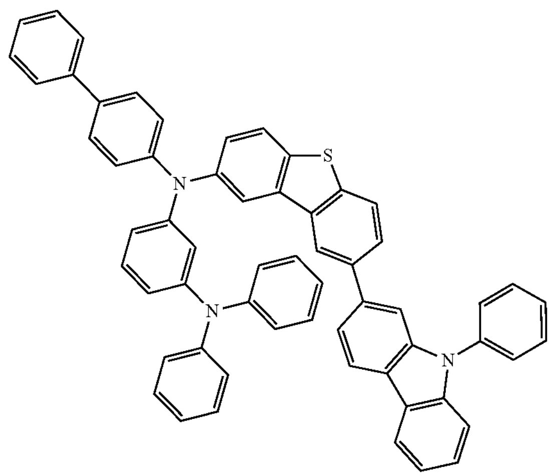
-continued
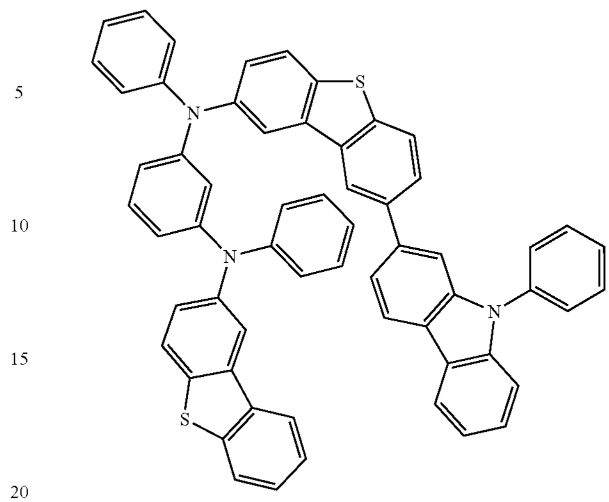
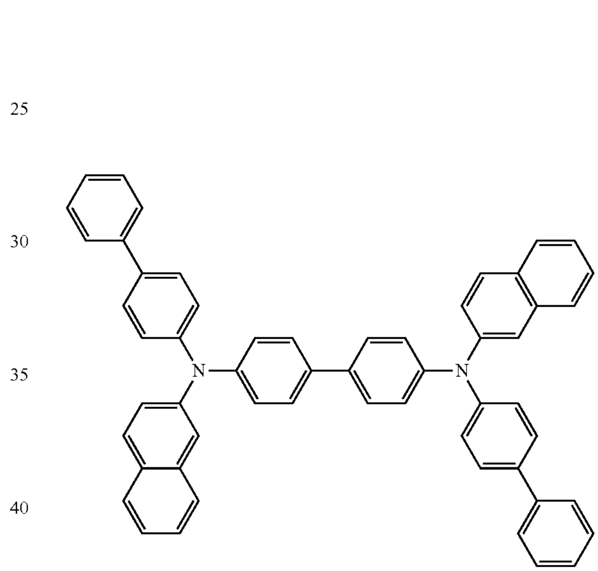
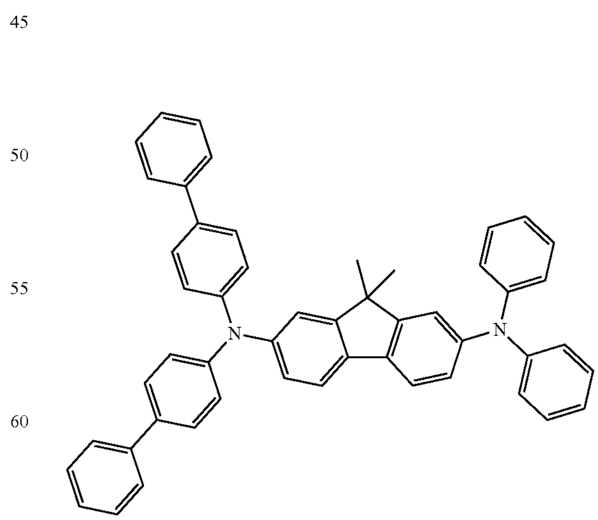

-continued
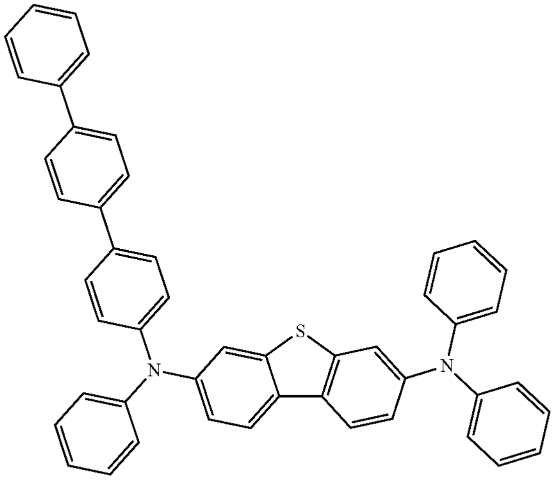
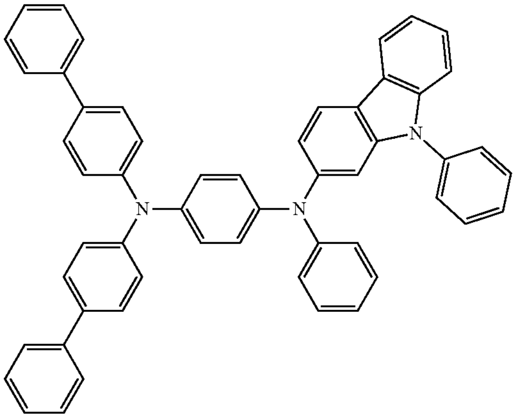
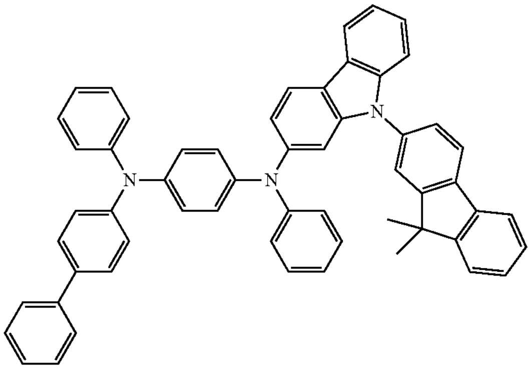
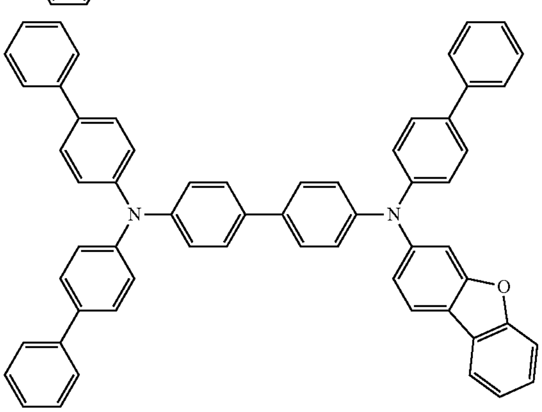
-continued
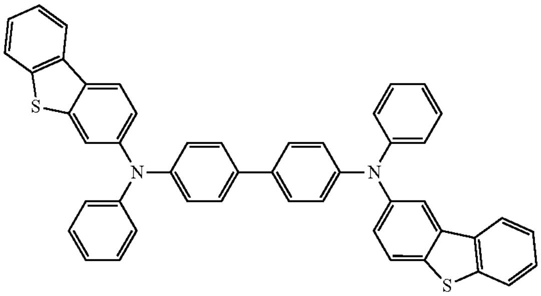
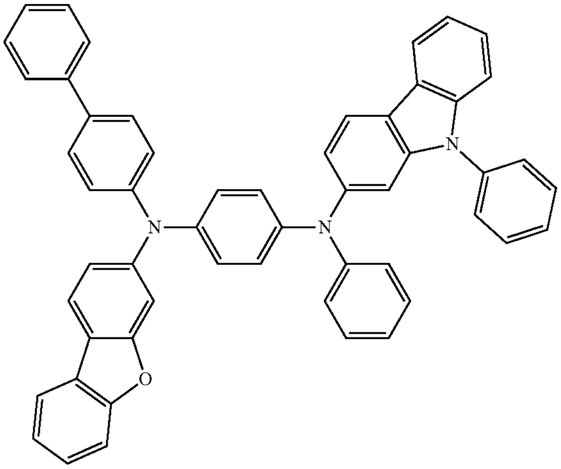
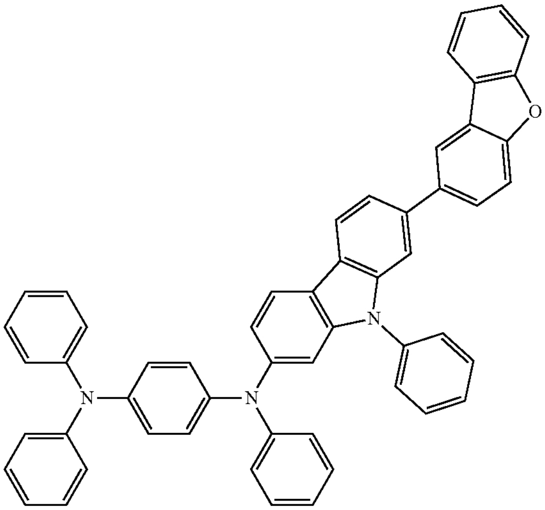

-continued
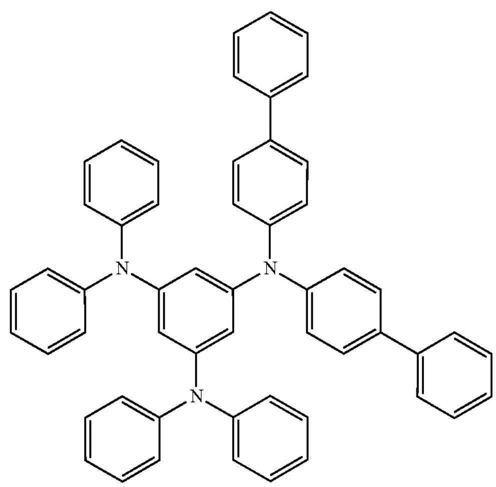
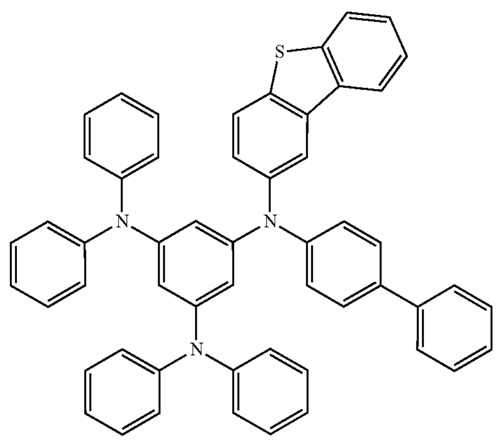
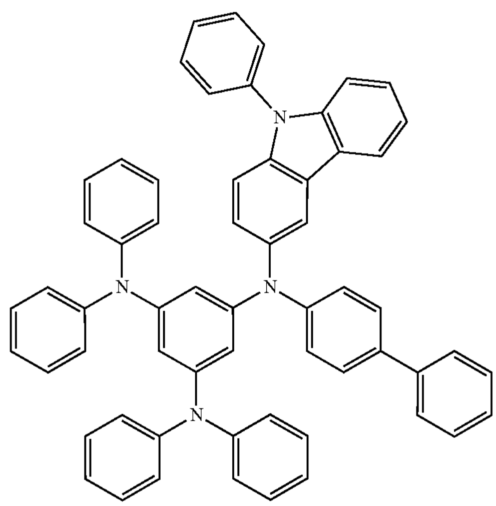
-continued
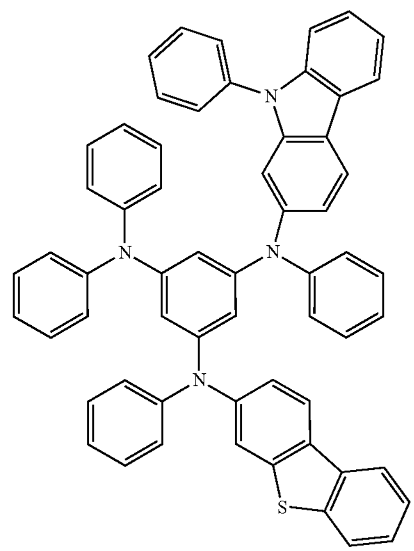
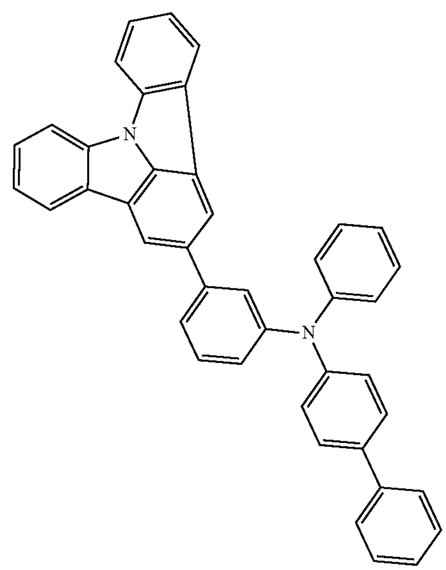
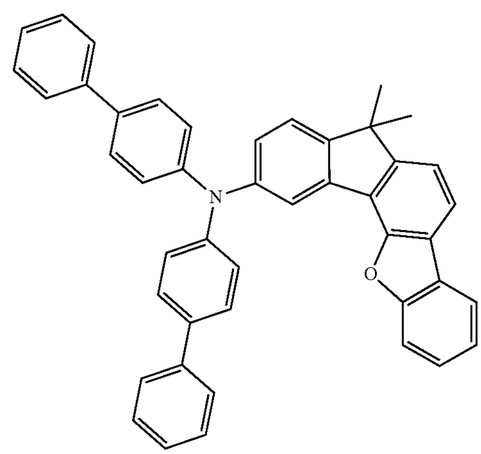

-continued
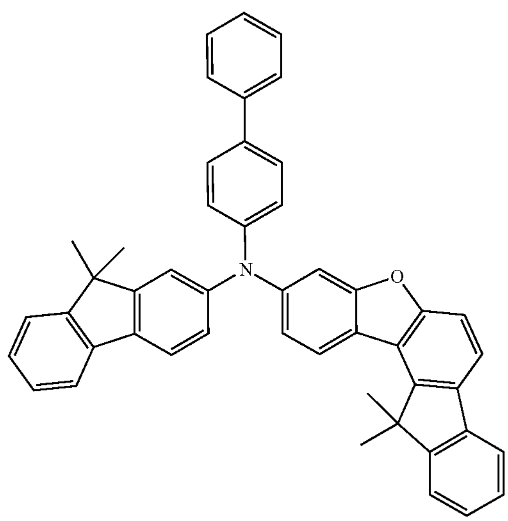
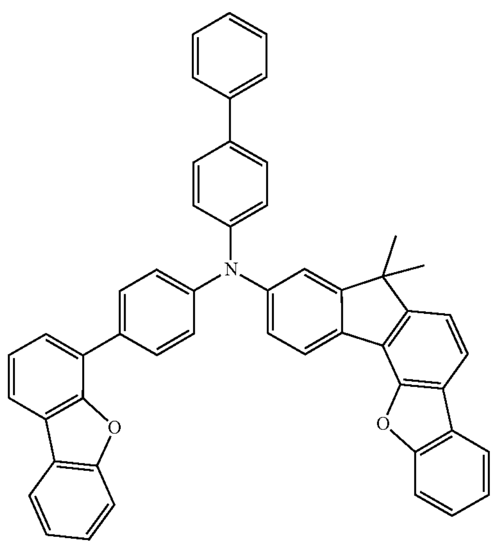
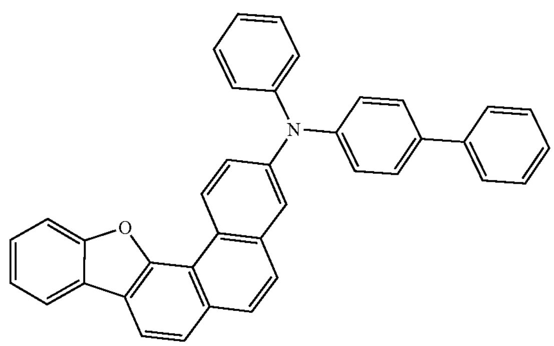
-continued
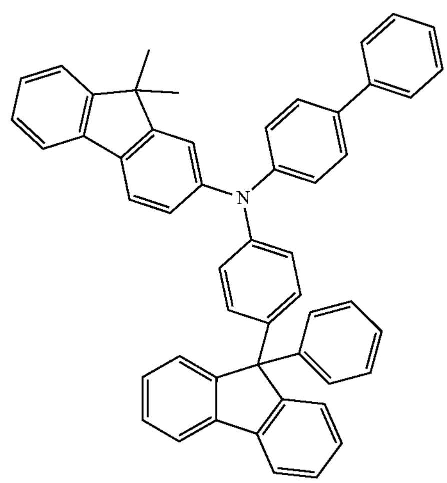
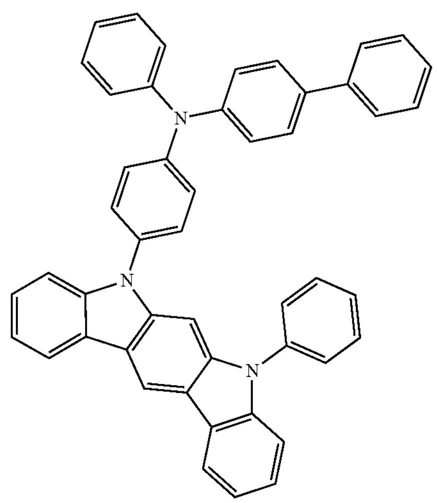
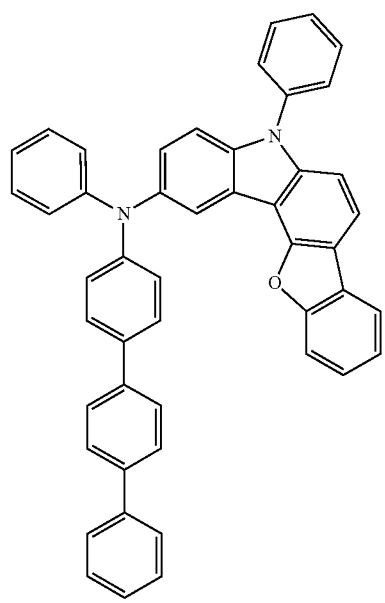

-continued

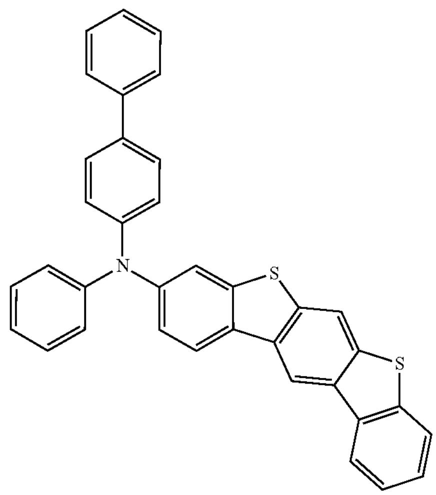

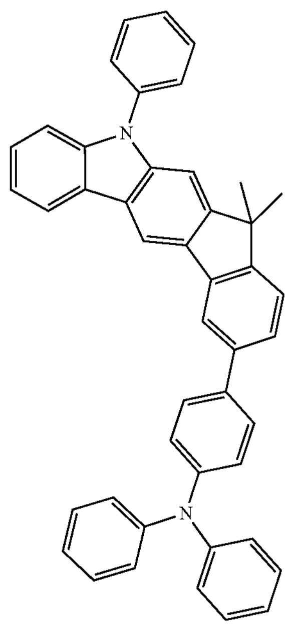

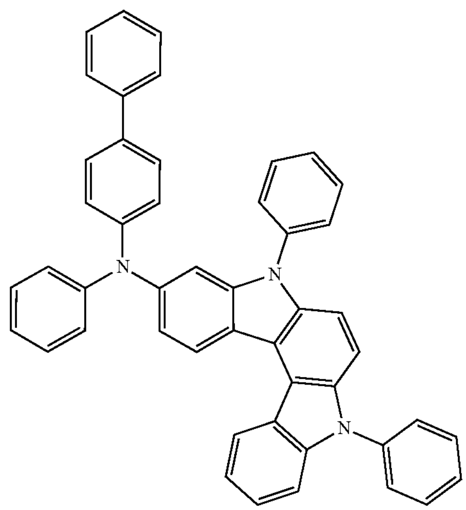

-continued

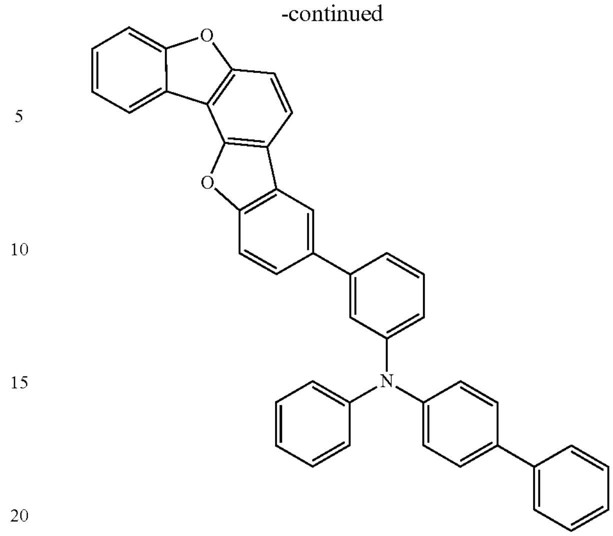

In the hole transport auxiliary layer, known compounds disclosed in U.S. Pat. No. 5,061,569A, JP1993-009471A, WO1995-009147A1, JP1995-126615A, JP1998-095973A, and the like and compounds similar thereto may be used in addition to the aforementioned compound.

In an embodiment, in FIG. 1 or 2, an organic light emitting diode may further include an electron transport layer, an electron injection layer, or a hole injection layer as the organic layer 105.

The organic light emitting diodes 100 and 200 may be manufactured by forming an anode or a cathode on a substrate, forming an organic layer using a dry film formation method such as a vacuum deposition method (evaporation), sputtering, plasma plating, and ion plating, and forming a cathode or an anode thereon.

The organic light emitting diode may be applied to an organic light emitting display device.

MODE FOR INVENTION

Hereinafter, the embodiments are illustrated in more detail with reference to examples. However, these examples are exemplary, and the present scope is not limited thereto.

Hereinafter, starting materials and reactants used in examples and synthesis examples were purchased from Sigma-Aldrich Co. Ltd., TCI Inc., Tokyo chemical industry or P&H tech as far as there in no particular comment or were synthesized by known methods.

Preparation of Compounds for Organic Optoelectronic Device

Compounds presented as more specific examples of the compound of the present invention were synthesized through the following steps.

Synthesis Example 1: Synthesis of Compound A-1

[Reaction Scheme 1]

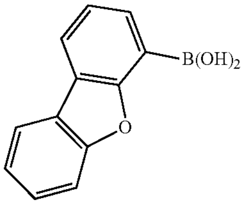

+

Int-1

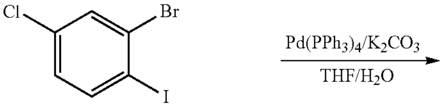

Int-2

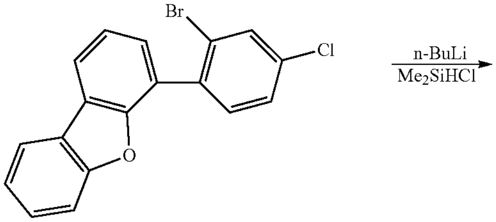

Int-3

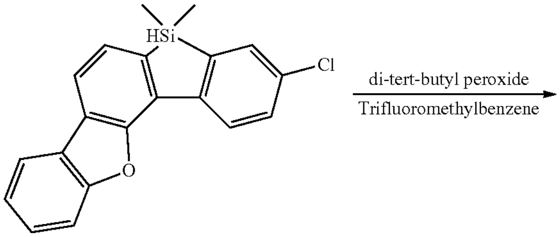

Int-4

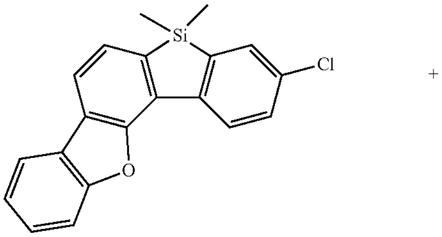

+

Int-5

-continued

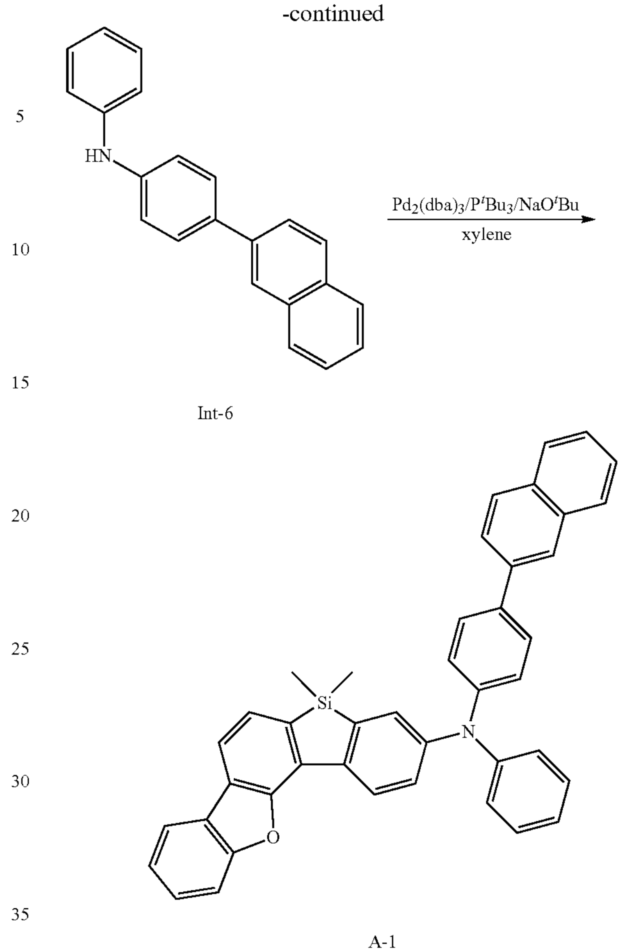

Int-6

A-1

1st Step: Synthesis of Int-3

Int-2 (100 g, 275.33 mmol) was dissolved in 1.0 L of tetrahydrofuran (THF), and Int-1 (62.79 g, 275.33 mmol) and tetrakis(triphenylphosphine) palladium (9.54 g, 8.26 mmol) were added thereto and then, stirred. Subsequently, potassium carbonate (95.13 g, 688.34 mmol) saturated in 500 ml of water was added thereto and then, heated and refluxed at 80° C. for 12 hours. When a reaction was complete, water was added to the reaction solution, and the mixture was extracted with ethyl acetate (EA), treated with anhydrous magnesium sulfate to remove moisture, filtered, and concentrated under a reduced pressure. The obtained residue was separated and purified through flash column chromatography to obtain 71.88 g (73%) of Int-3.

2nd Step: Synthesis of Int-4

Int-3 (71.88 g 192.35 mmol) was dissolved in 670 mL of tetrahydrofuran (THF), and then, an internal temperature thereof was decreased to −78° C. n-BuLi (104.5 g, 261.24 mmol) was slowly added thereto in a dropwise fashion, while the internal temperature was maintained at −78° C., and then, stirred at the temperature for 1 hour.

Subsequently, chlorodimethylsilane (30.64 ml, 281.39 mmol) was added thereto and then, slowly added thereto in a dropwise fashion at −78° C. and then, stirred at room temperature for 12 hours. When a reaction was complete, water was added to the reaction solution, and the mixture was extracted with ethyl acetate (EA), treated with anhydrous magnesium sulfate to remove moisture, filtered under a reduced pressure, and concentrated. The obtained residue was separated and purified through flash column chromatography to obtain 33.86 g (50%) of Int-4.

3rd Step: Synthesis of Int-5

Int-4 (33.80 g, 100.33 mmol) was dissolved in 300 mL of trifluoromethylbenzene, and di-tert-butyl peroxide (56.42 g, 300.99 mmol) was slowly added thereto in a dropwise fashion. The mixture was heated and refluxed at an internal temperature of 120° C. for 48 hours. When a reaction was complete, the reaction solution was cooled down to room temperature, and 200 ml of water was added thereto and then, stirred for 1 hour. The resultant was extracted with ethyl acetate (EA), treated with anhydrous magnesium sulfate to remove moisture therefrom, filtered under a reduced pressure, and concentrated. The obtained residue was separated and purified through flash column chromatography to obtain 20.16 g (60%) of Int-5.

4th Step: Synthesis of Compound A-1

2.82 g (8.42 mmol) of Int-5, 2.62 g (8.42 mmol) of Int-6, 2.42 g (25.26 mmol) of sodium t-butoxide, and 0.34 g (0.84 mmol) of tri-tert-butylphosphine were dissolved in 50 ml of xylene, and 0.38 g (0.42 mmol) of $Pd_2(dba)_3$ was added thereto and then, refluxed and stirred under a nitrogen atmosphere for 12 hours. When a reaction was complete, after extraction with xylene and distilled water, an organic layer therefrom was dried with anhydrous magnesium sulfate and filtered, and a filtrate therefrom was concentrated under a reduced pressure. A product therefrom was purified with n-hexane/dichloromethane (a volume ratio of 2:1) through silica gel column chromatography to obtain 3.7 g (Yield: 74%) of Compound A-1.

calcd. C42H31NOSi: C, 84.95; H, 5.26; N, 2.36; O, 2.69; Si, 4.73 found: C, 84.95; H, 5.26; N, 2.36; O, 2.69; Si, 4.73.

Synthesis Example 2: Synthesis of Compound B-1

[Reaction Scheme 2]

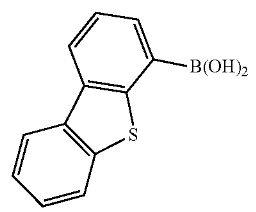

+

Int-7

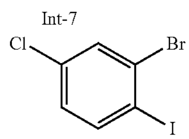

Int-2

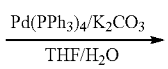

-continued

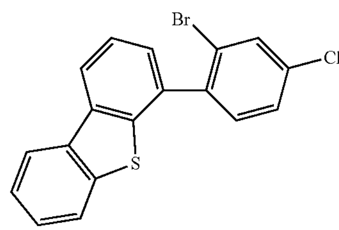

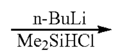

Int-8

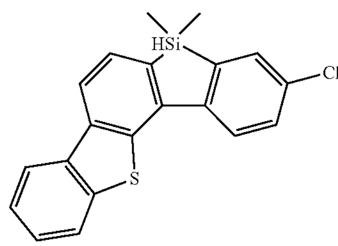

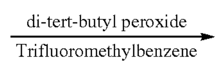

Int-9

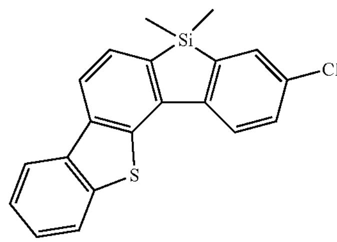

+

Int-10

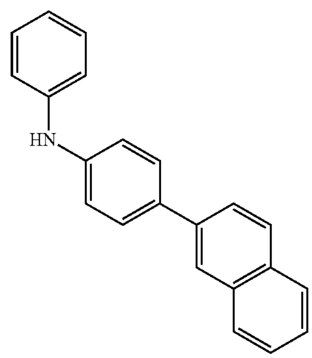

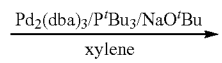

Int-6

-continued

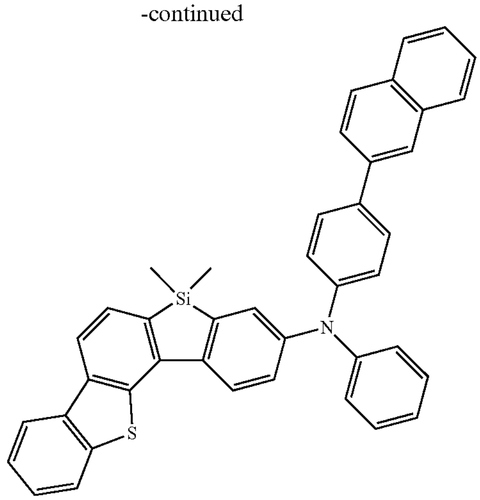

B-1

Compound B-1 was synthesized according to the same method as Synthesis Example 1 except that Int-7 was used instead of the Int-1 as shown in Reaction Scheme 2.

calcd. C42H31NSSi: C, 82.72; H, 5.12; N, 2.30; S, 5.26; Si, 4.61; found: C, 82.71; H, 5.12; N, 2.30; S, 5.26; Si, 4.61.

Synthesis Examples 3 to 19

Each compound was synthesized according to the same method as Synthesis Example 1 or 2 except that Int A of Table 1 was used instead of Int-5 of Synthesis Example 1 or 2, and Int B of Table 1 was used instead of Int-6.

TABLE 1

| Synthesis Examples | Int A | Int B | Final product | Amount (yield) | Property data of final product |
|---|---|---|---|---|---|
| Synthesis Example 3 | Int-5 | 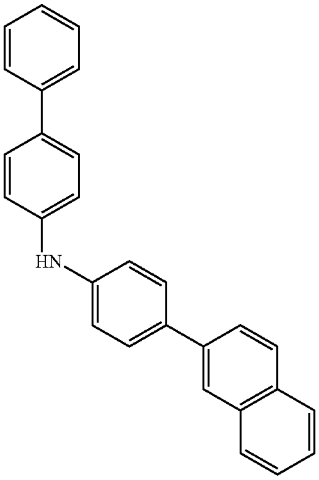 Int-11 | Compound A-2 | 4.48 g (67%) | calcd. C48H35NOSi: C, 86.06; H, 5.27; N, 2.09; O, 2.39; Si, 4.19 found: C, 86.06; H, 5.27; N, 2.09; O, 2.39; Si, 4.19 |
| Synthesis Example 4 | Int-5 | 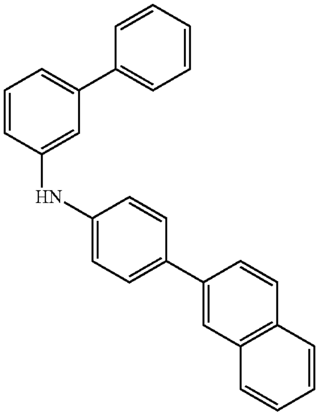 Int-12 | Compound A-3 | 5.84 g (71%) | calcd. C48H35NOSi: C, 86.06; H, 5.27; N, 2.09; O, 2.39; Si, 4.19 found: C, 86.06; H, 5.26; N, 2.10; O, 2.39; Si, 4.19 |

TABLE 1-continued

| Synthesis Examples | Int A | Int B | Final product | Amount (yield) | Property data of final product |
|---|---|---|---|---|---|
| Synthesis Example 5 | Int-5 | 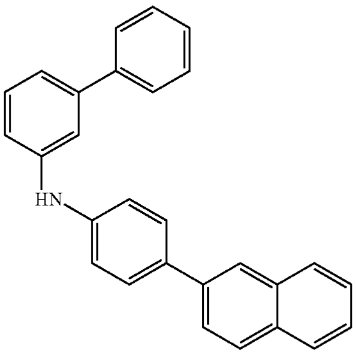 Int-13 | Compound A-7 | 6.11 g (73%) | calcd. C48H35NOSi: C, 86.06; H, 5.27; N, 2.09; O, 2.39; Si, 4.19 found: C, 86.06; H, 5.27; N, 2.09; O, 2.39; Si, 4.19 |
| Synthesis Example 6 | Int-5 | 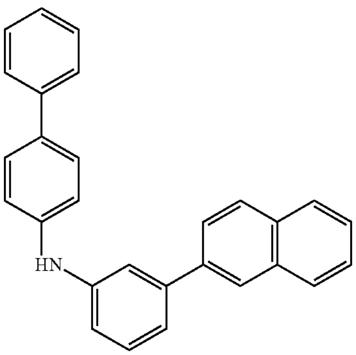 Int-14 | compound A-10 | 4.28 g (69%) | calcd. C48H35NOSi: C, 86.06; H, 5.27; N, 2.09; O, 2.39; Si, 4.19 found: C, 86.06; H, 5.27; N, 2.11; O, 2.38; Si, 4.19 |
| Synthesis Example 7 | Int-5 | 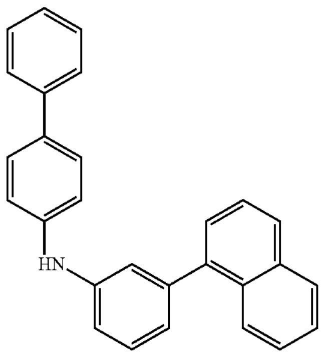 Int-15 | compound A-18 | 6.74 g (75%) | calcd. C48H35NOSi: C, 86.06; H, 5.27; N, 2.09; O, 2.39; Si, 4.19 found: C, 86.06; H, 5.27; N, 2.10; O, 2.38; Si, 4.19 |
| Synthesis Example 8 | Int-5 | 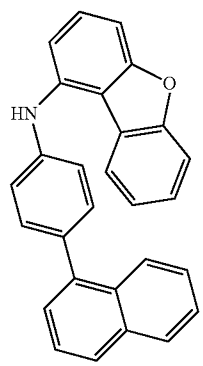 Int-16 | compound A-29 | 5.39 g (73%) | calcd. C48H33NO2Si: C, 84.30; H, 4.86; N, 2.05; O, 4.68; Si, 4.11 found: C, 84.30; H, 4.86; N, 2.05; O, 4.68; Si, 4.11 |

TABLE 1-continued

| Synthesis Examples | Int A | Int B | Final product | Amount (yield) | Property data of final product |
|---|---|---|---|---|---|
| Synthesis Example 9 | Int-5 | 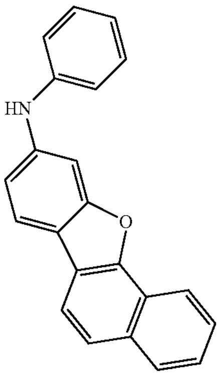 Int-17 | compound A-73 | 5.91 g (72%) | calcd. C42H29NO2Si: C, 83.00; H, 4.81; N, 2.30; O, 5.26; Si, 4.62 found: C, 83.00; H, 4.81; N, 2.30; O, 5.26; Si, 4.62 |
| Synthesis Example 10 | 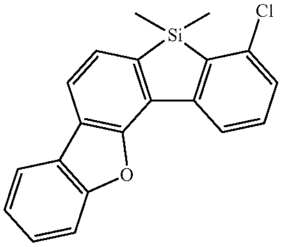 Int-18 | Int-6 | compound A-85 | 3.07 g (72%) | calcd. C42H31NOSi: C, 84.95; H, 5.26; N, 2.36; O, 2.69; Si, 4.73 found: C, 84.95; H, 5.26; N, 2.36; O, 2.69; Si, 4.73 |
| Synthesis Example 11 | 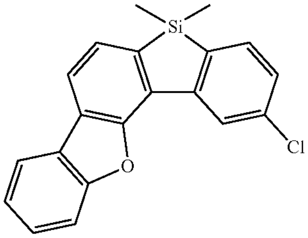 Int-19 | Int-6 | compound A-89 | 4.33 g (72%) | calcd. C42H31NOSi: C, 84.95; H, 5.26; N, 2.36; O, 2.69; Si, 4.73 found: C, 84.95; H, 5.26; N, 2.37; O, 2.69; Si, 4.72 |
| Synthesis Example 12 | 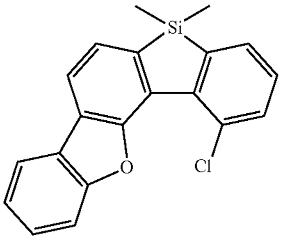 Int-20 | Int-6 | compound A-93 | 3.83 g (72%) | calcd. C42H31NOSi: C, 84.95; H, 5.26; N, 2.36; O, 2.69; Si, 4.73 found: C, 84.96; H, 5.26; N, 2.37; O, 2.68; Si, 4.72 |
| Synthesis Example 13 | Int-10 | Int-11 | Compound B-2 | 3.64 g (75%) | calcd. C48H35NSSi: C, 84.05; H, 5.14; N, 2.04; S, 4.67; Si, 4.09; found: C, 84.05; H, 5.13; N, 2.05; S, 4.67; Si, 4.09 |
| Synthesis Example 14 | Int-10 | Int-12 | Compound B-3 | 7.33 g (64%) | calcd. C48H35NSSi: C, 84.05; H, 5.14; N, 2.04; S, 4.67; Si, 4.09; |

TABLE 1-continued

| Synthesis Examples | Int A | Int B | Final product | Amount (yield) | Property data of final product |
|---|---|---|---|---|---|
| | | | | | found: C, 84.05; H, 5.14; N, 2.05; S, 4.67; Si, 4.08 |
| Synthesis Example 15 | Int-10 | Int-13 | Compound B-7 | 4.72 g (68%) | calcd. C48H35NSSi: C, 84.05; H, 5.14; N, 2.04; S, 4.67; Si, 4.09; found: C, 84.05; H, 5.14; N, 2.04; S, 4.67; Si, 4.09 |
| Synthesis Example 16 | Int-10 | Int-14 | Compound B-10 | 4.11 g (67%) | calcd. C48H35NSSi: C, 84.05; H, 5.14; N, 2.04; S, 4.67; Si, 4.09; found: C, 84.05; H, 5.14; N, 2.04; S, 4.67; Si, 4.09 |
| Synthesis Example 17 | Int-10 | Int-15 | Compound B-18 | 8.37 g (78%) | calcd. C48H35NSSi: C, 84.05; H, 5.14; N, 2.04; S, 4.67; Si, 4.09; found: C, 84.06; H, 5.14; N, 2.04; S, 4.66; Si, 4.09 |
| Synthesis Example 18 | Int-10 | Int-17 | Compound B-73 | 6.93 g (70%) | calcd. C42H29NOSSi: C, 80.86; H, 4.69; N, 2.25; O, 2.56; S, 5.14; Si, 4.50; found: C, 80.87; H, 4.69; N, 2.25; O, 2.56; S, 5.14; Si, 4.49 |
| Synthesis Example 19 | 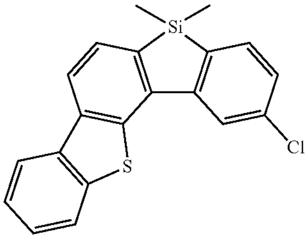 Int-21 | Int-6 | Compound B-89 | 3.22 g (67%) | calcd. C42H31NSSi: C, 82.72; H, 5.12; N, 2.30; S, 5.26; Si, 4.61; found: C, 82.72; H, 5.12; N, 2.30; S, 5.26; Si, 4.61 |

Comparative Synthesis Example 1: Preparation of Comparative Compound 1

[Reaction Scheme 3]

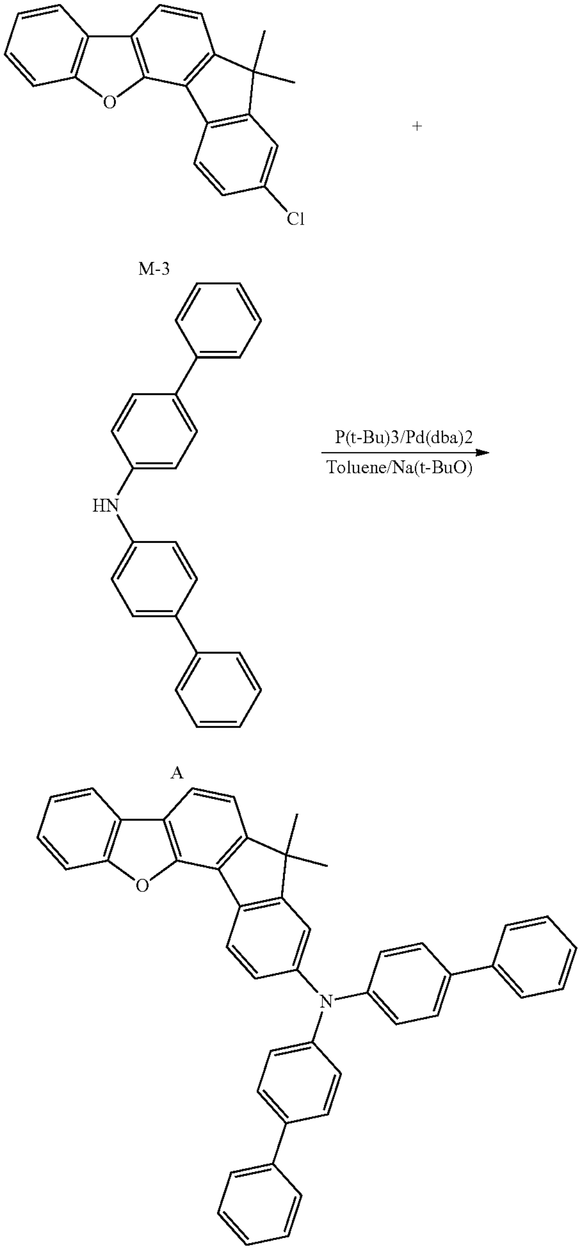

5.0 g (15.68 mmol) of Intermediate M-3, 5.04 g (15.68 mmol) of Intermediate A, 4.52 g (47.95 mmol) of sodium t-butoxide, and 0.1 g (0.47 mmol) of tri-tert-butylphosphine were dissolved in 200 ml toluene, and 0.27 g (0.47 mmol) of $Pd(dba)_2$ was added thereto and then, refluxed and stirred under a nitrogen atmosphere for 12 hours. When a reaction was complete, after extraction with toluene and distilled water, an organic layer therefrom was dried with anhydrous magnesium sulfate and filtered, and a filtrate therefrom was concentrated under a reduced pressure. A product therefrom was purified with n-hexane/dichloromethane (a volume ratio of 2:1) through silica gel column chromatography to obtain 7.8 g (Yield: 82.3%) of Comparative Compound 1 as a white solid.

calcd. C45H33NO: C, 89.52; H, 5.51; N, 2.32; O, 2.65; found: C, 89.53; H, 5.50; N, 2.32; O, 2.65.

Comparative Synthesis Example 2: Preparation of Comparative Compound 2

[Reaction Scheme 4]

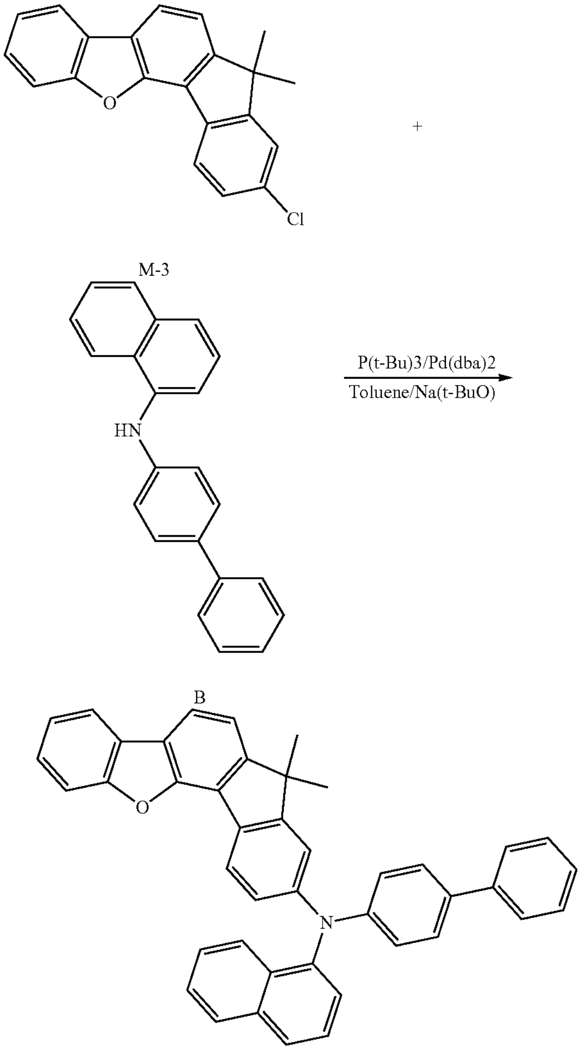

5.0 g (15.68 mmol) of Intermediate M-3, 4.63 g (15.68 mmol) of Intermediate B, 4.52 g (47.95 mmol) of sodium t-butoxide, and 0.1 g (0.47 mmol) of tri-tert-butylphosphine were dissolved in 200 ml of toluene, and 0.27 g (0.47 mmol) of $Pd(dba)_2$ was added thereto and then, refluxed and stirred under a nitrogen atmosphere for 12 hours. When a reaction was complete, after extraction with toluene and distilled water, an organic layer therefrom was dried with anhydrous magnesium sulfate and filtered, and a filtrate therefrom was concentrated under a reduced pressure. A product therefrom was purified with normal hexane/dichloromethane (a volume ratio of 2:1) through silica gel column chromatography to obtain 7.3 g (Yield: 80.5%) of Comparative Compound 2 as a white solid.

calcd. C43H31NO: C, 89.40; H, 5.41; N, 2.42; O, 2.77; found: C, 89.40; H, 5.41; N, 2.42; O, 2.77.

Synthesis Example 20: Synthesis of Compound C-3

[Reaction Scheme 5]

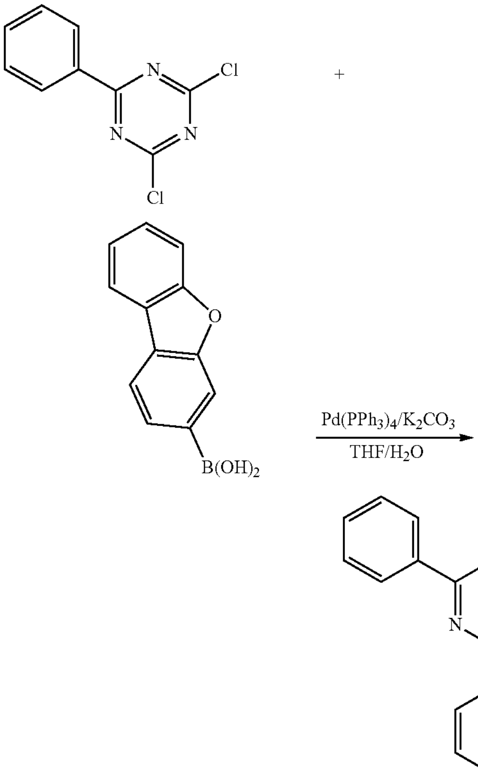

Int-22

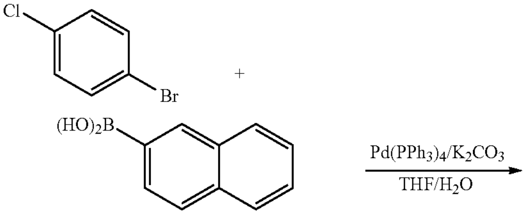

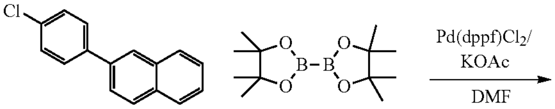

Int-23

-continued

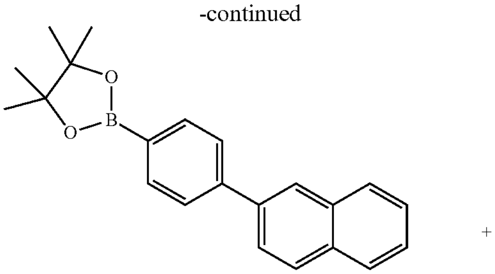

Int-24

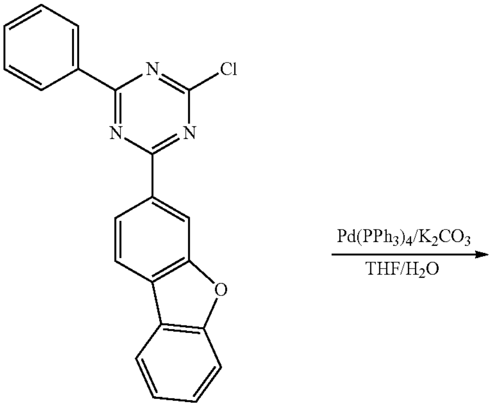

Int-22

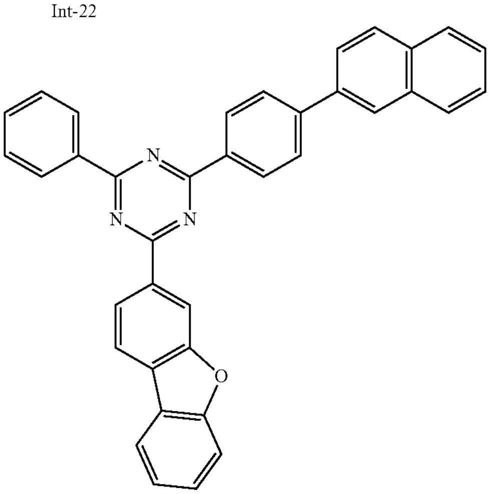

C-3

1st Step: Synthesis of Int-22

In a round-bottomed flask, 22.6 g (100 mmol) of 2,4-dichloro-6-phenyl-1,3,5-triazine was added to 200 mL of tetrahydrofuran and 100 mL of distilled water, and 0.9 equivalent of dibenzofuran-3-boronic acid (CAS No.: 395087-89-5), 0.03 equivalent of tetrakistriphenylphosphine palladium, and 2 equivalent of potassium carbonate were added thereto and then, heated and refluxed under a nitrogen atmosphere. After 6 hours, the reaction solution was cooled down, after removing an aqueous layer, an organic layer therefrom was dried under a reduced pressure. The obtained solid was washed with water and hexane, and a solid therefrom was recrystallized with 200 mL of toluene to obtain 21.4 g (Yield: 60%) of Int-22.

2nd Step: Synthesis of Int-23

In a round-bottomed flask, 50.0 g (261.16 mmol) of 1-bromo-4-chloro-benzene, 44.9 g (261.16 mmol) of 2-naphthalene boronic acid, 9.1 g (7.83 mmol) of tetrakis-triphenylphosphine palladium, and 71.2 g (522.33 mmol) of potassium carbonate were dissolved in 1000 mL of tetrahydrofuran and 500 mL of distilled water and then, heated and refluxed under a nitrogen atmosphere. After 6 hours, the reaction solution was cooled down, after removing an aqueous layer, an organic layer therefrom was dried under a reduced pressure. The obtained solid was washed with water and hexane and then, recrystallized with 200 mL of toluene to obtain 55.0 g (Yield: 88%) of Int-23.

3rd Step: Synthesis of Int-24

In a round-bottomed flask, 100.0 g (418.92 mmol) of Int-23 was dissolved in 1000 mL of DMF, and 17.1 g (20.95 mmol) of dichlorodiphenylphosphinoferrocene palladium, 127.7 g (502.70 mmol) of bispinacolato diboron, and 123.3 g (1256.76 mmol) of potassium acetate were added thereto and then, heated and refluxed under a nitrogen atmosphere for 12 hours. The reaction solution was cooled down and then, added in a dropwise fashion to 2 L of water to recover a solid. The obtained solid was dissolved in boiling toluene and filtered through silica gel, and a filtrate therefrom was concentrated. The concentrated solid was stirred with a small amount of hexane, and a solid therein was filtered to obtain 28.5 g (Yield: 70%) of Int-24.

4th Step: Synthesis of Compound C-3

In a round-bottomed flask, 10.0 g (27.95 mmol) of Int-24, 11.1 g (33.54 mmol) of Int-22, 1.0 g (0.84 mmol) of tetrakistriphenylphosphine palladium, and 7.7 g (55.90 mmol) of potassium carbonate were dissolved in 150 mL of tetrahydrofuran and 75 mL of distilled water and then, heated and refluxed under a nitrogen atmosphere. After 12 hours, the reaction solution was cooled down, after removing an aqueous layer, an organic layer therefrom was dried under a reduced pressure. The obtained solid was washed with water and methanol then, recrystallized with 200 mL of toluene to obtain 13.4 g (Yield: 91%) of Compound C-3.

calcd. C37H23N3O: C, 84.55; H, 4.41; N, 7.99; O, 3.04; found: C, 84.55; H, 4.41; N, 8.00; O, 3.03.

Synthesis Example 21: Synthesis of Compound C-71

[Reaction Scheme 6]

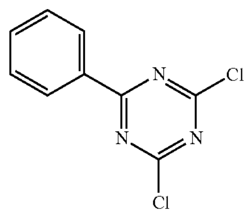

+

-continued

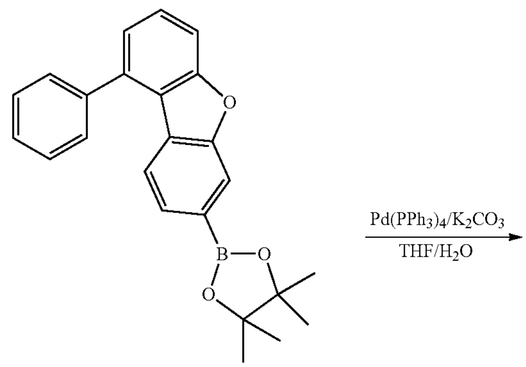

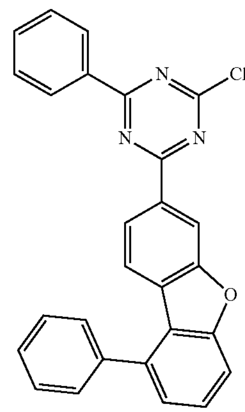

+

Int-25

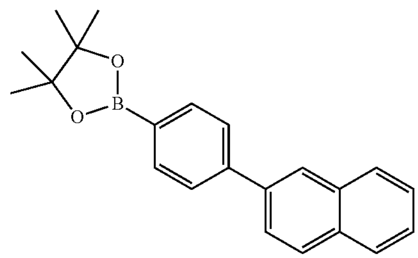

$Pd(PPh_3)_4/$
$K_2CO_3$
$THF/H_2O$

Int-24

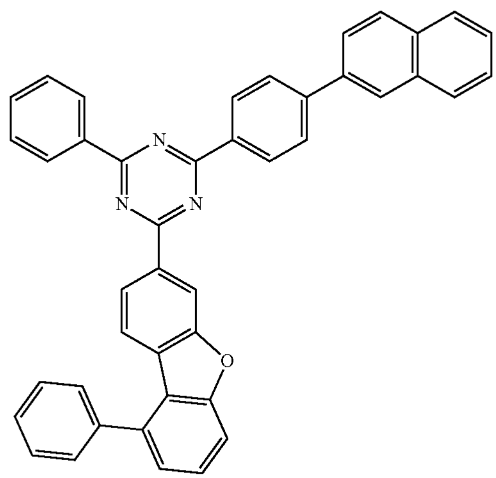

C-71

1st Step: Synthesis of Int-25

Int-25 was synthesized according to the same method as the method of Int-22 of Synthesis Example 20 by using 2,4-dichloro-6-phenyl-1,3,5-triazine and 1-phenyl-7-(4,4,5,5-tetramethyl-[1,3,2]dioxaborolan-2-yl)-dibenzofuran in each amount of 1.0 equivalent.

2nd Step: Synthesis of Compound C-71

Compound C-71 was synthesized according to the same method as the 4th step of Synthesis Example 20 except that Int-25 and Int-24 were used in each amount of 1.0 equivalent.

calcd. C43H27N3O: C, 85.83; H, 4.52; N, 6.98; O, 2.66; found: C, 85.83; H, 4.52; N, 6.98; O, 2.66.

Synthesis Example 22: Synthesis of Compound C-61

[Reaction Scheme 7]

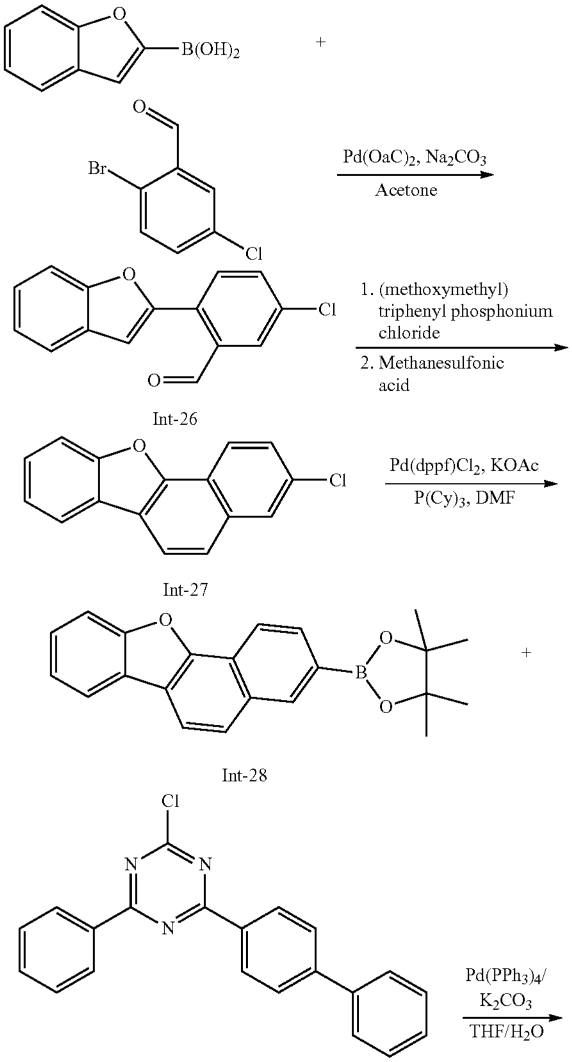

-continued

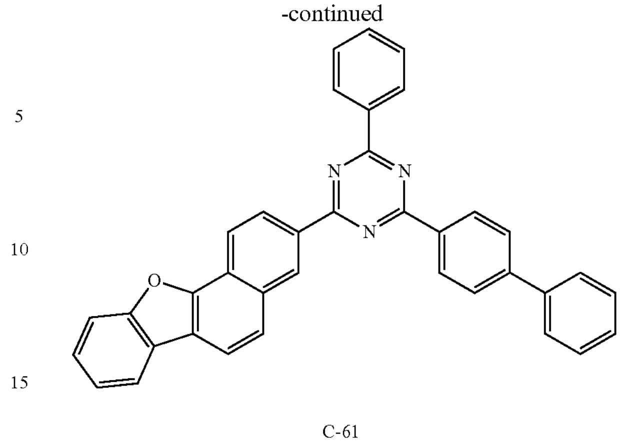

C-61

1st Step: Synthesis of Int-26

In a round-bottomed flask, 21.95 g (135.53 mmol) of 2-benzofuranylboronic acid, 26.77 g (121.98 mmol) of 2-bromo-5-chlorobenzaldehyde, 2.74 g (12.20 mmol) of $Pd(OAc)_2$, and 25.86 g (243.96 mmol) of $Na_2CO_3$ were suspended in 200 ml of acetone/220 ml of distilled water for 12 hours at room temperature. When a reaction was complete, the resultant was concentrated, and an organic layer obtained therefrom through extraction with methylene chloride was silica gel-columned to obtain 21.4 g (Yield: 68%) of Int-26.

2nd Step: Synthesis of Int-27

20.4 g (79.47 mmol) of Int-26 and 29.97 g (87.42 mmol) of (methoxymethyl)triphenyl phosphonium chloride were suspended in 400 ml of THF, and 10.70 g (95.37 mmol) of potassium tert-butoxide was added thereto and then, stirred at room temperature for 12 hours. When a reaction was complete, 400 ml of distilled water was added thereto for extraction, an organic layer therefrom was concentrated and reextracted with methylene chloride, magnesium sulfate was added thereto and then, stirred for 30 minutes, and a filtrate therefrom was concentrated. Then, 100 ml of methylene chloride was added again to the concentrated filtrate, and 10 ml of methane sulfonic acid was added thereto and then, stirred for 1 hour.

When a reaction was complete, a solid produced therefrom was filtered and dried with distilled water and methyl alcohol to obtain 21.4 g (Yield: 65%) of Int-27.

3rd Step: Synthesis of Int-28

12.55 g (49.66 mmol) of Int-27, 2.43 g (2.98 mmol) of $Pd(dppf)Cl_2$, 15.13 g (59.60 mmol) of bis(pinacolato)diboron, 14.62 g (148.99 mmol) of KOAc, and 3.34 g (11.92 mmol) of $P(Cy)_3$ were suspended in 200 ml of DMF and then, refluxed and stirred for 12 hours. When a reaction was complete, 200 ml of distilled water was added thereto, and a solid produced therein was filtered, and an organic layer extracted with methylene chloride was columned with hexane:EA=4:1 (v/v) to obtain 13 g (Yield: 76%) of Int-28.

4th Step: Synthesis of Compound C-61

Compound C-61 was synthesized according to the same method as the 4th step of Synthesis Example 20 by using Int-28 and Int-29 in each amount of 1.0 equivalent.

calcd. C37H23N3O: C, 84.55; H, 4.41; N, 7.99; O, 3.04; found: C, 84.55; H, 4.41; N, 7.99; O, 3.04.

Synthesis Example 23: Synthesis of Compound C-17

[Reaction Scheme 8]

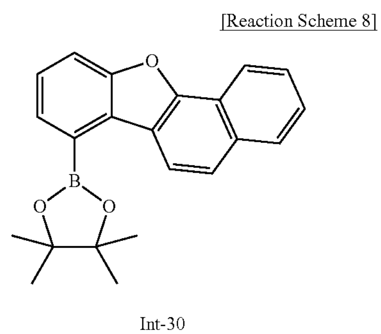

+

Int-30

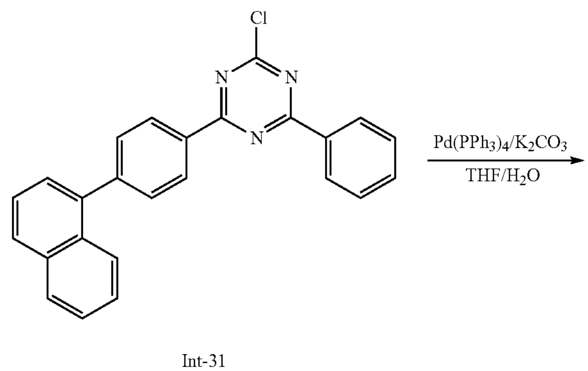

Int-31

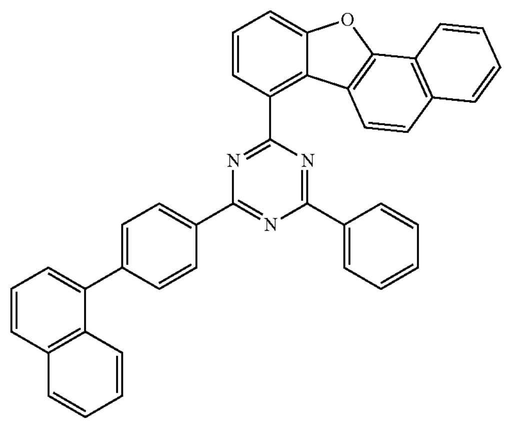

C-17

Compound C-17 was synthesized according to the same method as the 4$^{th}$ step of Synthesis Example 20 by using Int-30 and Int-31 in each amount of 1.0 equivalent.

calcd. C41H25N3O: C, 85.54; H, 4.38; N, 7.30; O, 2.78; found: C, 85.53; H, 4.38; N, 7.30; O, 2.77.

Synthesis Example 24: Synthesis of Compound C-37

[Reaction Scheme 9]

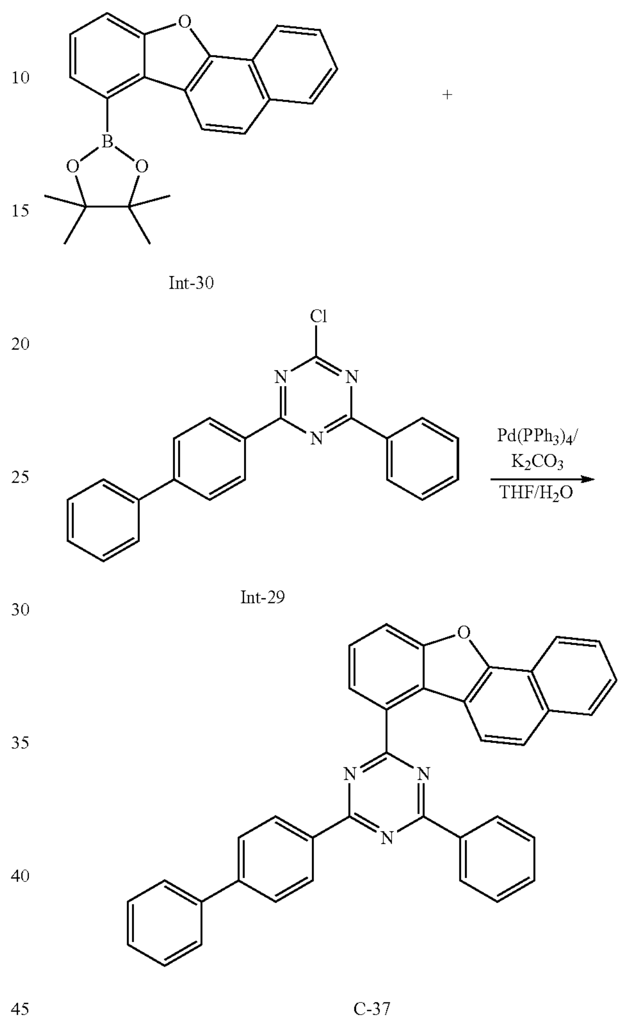

+

Int-30

Int-29

C-37

Compound C-37 was synthesized according to the same method as the 4$^{th}$ step of Synthesis Example 20 by using Int-30 and Int-29 in each amount of 1.0 equivalent.

calcd. C37H23N3O: C, 84.55; H, 4.41; N, 7.99; O, 3.04; found: C, 84.57; H, 4.40; N, 7.99; O, 3.03.

Synthesis Examples 25 to 27

Each compound was synthesized according to the same method as the 4$^{th}$ step of Synthesis Example 20 except that Int C of Table 2 was used instead of Int-28 of Synthesis Example 22, and Int D of Table 2 was used instead of Int-29.

TABLE 2

| Synthesis Examples | Int C | Int D | Final product | Amount (yield) | Property data of final product |
|---|---|---|---|---|---|
| Synthesis Example 25 | 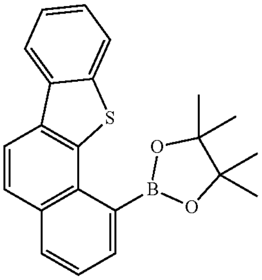 Int-32 | 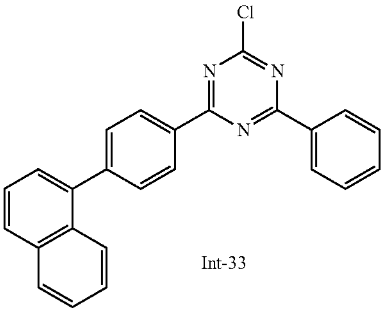 Int-33 Int-31 | Compound C-24 | 8.33 g (74%) | calcd. C41H25N3S: C, 83.22; H, 4.26; N, 7.10; S, 5.42 found: C, 83.22; H, 4.26; N, 7.10; S, 5.42 |
| Synthesis Example 26 | 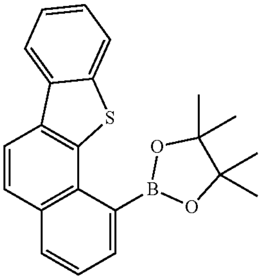 Int-32 | 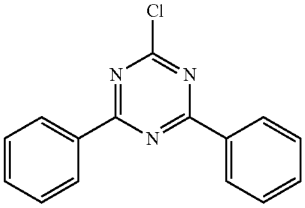 Int-34 | Compound C-77 | 6.29 g (71%) | calcd. C37H23N3S: C, 82.04; H, 4.28; N, 7.76; S, 5.92 found: C, 82.04; H, 4.28; N, 7.76; S, 5.92 |
| Synthesis Example 27 | 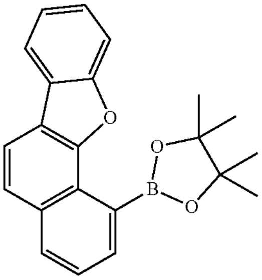 Int-33 | 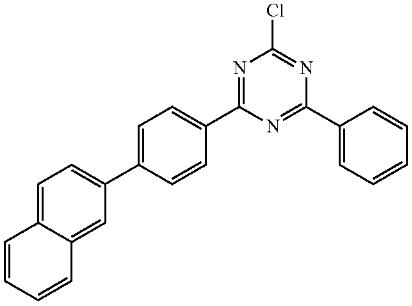 Int-35 | Compound C-35 | 7.67 g (71%) | calcd. C41H25N3O: C, 85.54; H, 4.38; N, 7.30; O, 2.78 found: C, 85.55; H, 4.38; N, 7.29; O, 2.7 |

Manufacture of Organic Light Emitting Diode: Single Host

Example 1

The glass substrate coated with ITO (Indium tin oxide) was washed with distilled water and ultrasonic waves. After washing with the distilled water, the glass substrate was washed with a solvent such as isopropyl alcohol, acetone, methanol, and the like ultrasonically and dried and then, moved to a plasma cleaner, cleaned by using oxygen plasma for 10 minutes, and moved to a vacuum depositor. This obtained ITO transparent electrode was used as an anode, Compound A doped with 1% NDP-9 (available from Novaled) was vacuum-deposited on the ITO substrate to form a 1400 Å-thick hole transport layer, and Compound B was deposited to be 600 Å-thick on the hole transport layer to form a hole transport auxiliary layer. On the hole transport auxiliary layer, 400 Å-thick light emitting layer was formed by using Compound A-1 obtained in Synthesis Example 1 as a host and 2 wt % of [Ir(piq)$_2$acac] as a dopant by a vacuum-deposition. Subsequently, Compound C was deposited at a thickness of 50 Å on the light emitting layer to form an electron transport auxiliary layer, and Compound D and LiQ were simultaneously vacuum-deposited in a weight ratio of 1:1 to form a 300 Å-thick electron transport layer. On the electron transport layer, Liq and Al were sequentially vacuum-deposited to be 15 Å-thick and 1200 Å-thick, manufacturing an organic light emitting diode.

ITO/Compound A (1% NDP-9 doping, 1400 Å)/Compound B (600 Å)/EML [Compound A-1: [Ir(piq)$_2$acac] (2 wt %) (400 Å)/Compound C (50 Å)/Compound D: Liq (300 Å)/LiQ (15 Å)/Al (1200 Å).

Compound A: N-(biphenyl-4-yl)-9,9-dimethyl-N-(4-(9-phenyl-9H-carbazol-3-yl)phenyl)-9H-fluoren-2-amine Compound B: N,N-di([1,1'-biphenyl]-4-yl)-7,7-dimethyl-7H-fluoreno[4,3-b]benzofuran-10-amine Compound C: 2-(3-(3-(9,9-dimethyl-9H-fluoren-2-yl)phenyl)phenyl)-4,6-diphenyl-1,3,5-triazine Compound D: 8-(4-(4,6-di(naphthalen-2-yl)-1,3,5-triazin-2-yl)phenyl)quinoline Examples 2 to 19, Comparative Examples 1 and 2

Diodes of Examples 2 to 19 and Comparative Examples 1 and 2 were respectively manufactured according to the same method as Example 1 except that the host was changed as shown in Table 3.

Manufacture of Organic Light Emitting Diode: Mixed Host

Example 20

The glass substrate coated with ITO (Indium tin oxide) was washed with distilled water and ultrasonic waves. After washing with the distilled water, the glass substrate was washed with a solvent such as isopropyl alcohol, acetone, methanol, and the like ultrasonically and dried and then, moved to a plasma cleaner, cleaned by using oxygen plasma for 10 minutes, and moved to a vacuum depositor. This obtained ITO transparent electrode was used as an anode, Compound A doped with 1% NDP-9 (available from Novaled) was vacuum-deposited on the ITO substrate to form a 1400 Å-thick hole transport layer, and Compound B was deposited to be 600 Å-thick on the hole transport layer to form a hole transport auxiliary layer. On the hole transport auxiliary layer, 400 Å-thick light emitting layer was formed by using Compound A-1 obtained in Synthesis Example 1 and Compound C-17 obtained in Synthesis Example 23 simultaneously as a host and 2 wt % of [$Ir(piq)_2acac$] as a dopant by a vacuum-deposition. Herein, Compound A-1 and Compound C-17 were used in a weight ratio of 5:5. Subsequently, Compound C was deposited at a thickness of 50 Å on the light emitting layer to form an electron transport auxiliary layer, and Compound D and LiQ were simultaneously vacuum-deposited in a weight ratio of 1:1 to form a 300 Å-thick electron transport layer. On the electron transport layer, Liq and Al were sequentially vacuum-deposited to be 15 Å-thick and 1200 Å-thick, manufacturing an organic light emitting diode.

ITO/Compound A (1% NDP-9 doping, 1400 Å)/Compound B (600 Å)/EML [98 wt % of mixture Compound A-1 and Compound C-17 were mixed in a weight ratio of 5:5, and 2 wt % of $Ir(piq)_2acac$] (400 Å)/Compound C (50 Å)/Compound D: Liq (300 Å)/LiQ (15 Å)/Al (1200 Å).

Compound A: N-(biphenyl-4-yl)-9,9-dimethyl-N-(4-(9-phenyl-9H-carbazol-3-yl)phenyl)-9H-fluoren-2-amine Compound B: N,N-di([1,1'-biphenyl]-4-yl)-7,7-dimethyl-7H-fluoreno[4,3-b]benzofuran-10-amine Compound C: 2-(3-(3-(9,9-dimethyl-9H-fluoren-2-yl)phenyl)phenyl)-4,6-diphenyl-1,3,5-triazine Compound D: 8-(4-(4,6-di(naphthalen-2-yl)-1,3,5-triazin-2-yl)phenyl)quinoline Examples 21 to 42, Comparative Examples 3 and 4

Diodes of Examples 21 to 42, Comparative Examples 3 and 4 were respectively manufactured according to the same method as Example 1 except that the host was changed as shown in Table 4.

Evaluation: Effect of Increasing Life-Span (1) Measurement of Current Density Change Depending on Voltage Change The obtained organic light emitting diodes were measured regarding a current value flowing in the unit device, while increasing the voltage from 0 V to 10 V using a current-voltage meter (Keithley 2400), and the measured current value was divided by area to provide the results.

(2) Measurement of Luminance Change Depending on Voltage Change

Luminance was measured by using a luminance meter (Minolta Cs-1000A), while the voltage of the organic light emitting diodes was increased from 0 V to 10 V.

(3) Measurement of Luminous Efficiency

The luminous efficiency (cd/A) of the same current density (10 $mA/cm^2$) was calculated using the luminance and current density measured from (1) and (2).

(4) Measurement of Life-Span

The results were obtained by measuring a time when current efficiency (cd/A) was decreased down to 90%, while luminance ($cd/m^2$) was maintained to be 5,000 $cd/m^2$.

(5) Measurement of Driving Voltage

A driving voltage of each diode was measured using a current-voltage meter (Keithley 2400) at 15 $mA/cm^2$.

(6) Calculation of T90 Life-Span Ratio (%)

Relative comparison values for each T90(h) value were calculated using T90(h) of Comparative Example 2 of Table 3 or Comparative Example 4 of Table 4 as reference values, and are shown in Tables 3 and 4.

(7) Calculation of Driving Voltage Ratio (%)

Relative comparison values for each driving voltage were calculated using the driving voltage of Comparative Example 2 of Table 3 or Comparative Example 4 of Table 4 as reference values, and shown in Tables 3 and 4.

(8) Calculation of Luminous Efficiency Ratio (%)

Relative comparison values for each luminous efficiency (cdA) were calculated using the luminous efficiency (cd/A) of Comparative Example 2 of Table 3 or Comparative Example 4 of Table 4 as reference values, and shown in Tables 3 and 4.

TABLE 3

| | Host | Driving voltage (V) | Luminous efficiency (cd/A) | T90 Life-span (h) |
|---|---|---|---|---|
| Example 1 | A-1 | 96% | 112% | 118% |
| Example 2 | A-2 | 93% | 114% | 120% |
| Example 3 | A-3 | 94% | 115% | 122% |
| Example 4 | A-7 | 93% | 115% | 125% |
| Example 5 | A-10 | 94% | 113% | 121% |
| Example 6 | A-18 | 92% | 114% | 123% |
| Example 7 | A-29 | 96% | 116% | 115% |
| Example 8 | A-73 | 93% | 117% | 124% |
| Example 9 | A-85 | 97% | 110% | 108% |
| Example 10 | A-89 | 94% | 112% | 113% |
| Example 11 | A-93 | 96% | 113% | 110% |
| Example 12 | B-1 | 97% | 112% | 117% |
| Example 13 | B-2 | 94% | 113% | 121% |
| Example 14 | B-3 | 94% | 114% | 123% |
| Example 15 | B-7 | 94% | 114% | 124% |
| Example 16 | B-10 | 94% | 113% | 120% |
| Example 17 | B-18 | 93% | 114% | 124% |
| Example 18 | B-73 | 94% | 118% | 125% |
| Example 19 | B-89 | 95% | 110% | 114% |
| Comparative Example 1 | Comparative Compound 1 | 104% | 95% | 93% |
| Comparative Example 2 | Comparative Compound 2 | 100% | 100% | 100% |

TABLE 4

| | First host | Second host | Driving voltage (V) | Luminous efficiency (cd/A) | T90 Life-span (h) |
|---|---|---|---|---|---|
| Example 20 | A-1 | C-17 | 94% | 113% | 130% |
| Example 21 | A-2 | | 92% | 114% | 133% |
| Example 22 | A-3 | | 93% | 115% | 134% |
| Example 23 | A-7 | | 93% | 118% | 136% |
| Example 24 | A-10 | | 92% | 114% | 138% |
| Example 25 | A-18 | | 93% | 117% | 140% |
| Example 26 | A-73 | | 93% | 117% | 138% |
| Example 27 | A-89 | | 95% | 110% | 125% |
| Example 28 | B-1 | | 95% | 112% | 132% |
| Example 29 | B-2 | | 93% | 113% | 135% |
| Example 30 | B-3 | | 93% | 115% | 134% |
| Example 31 | B-7 | | 94% | 116% | 134% |
| Example 32 | B-18 | | 93% | 114% | 137% |
| Example 33 | B-73 | | 93% | 115% | 135% |
| Example 34 | A-7 | C-24 | 92% | 117% | 130% |
| Example 35 | | C-37 | 93% | 118% | 133% |
| Example 36 | | C-77 | 92% | 115% | 134% |
| Example 37 | A-18 | C-3 | 94% | 115% | 138% |
| Example 38 | | C-24 | 93% | 116% | 132% |
| Example 39 | | C-35 | 93% | 119% | 137% |
| Example 40 | A-10 | C-24 | 92% | 114% | 136% |
| Example 41 | | C-35 | 91% | 117% | 140% |
| Example 42 | | C-37 | 93% | 115% | 138% |
| Comparative Example 3 | Comparative Compound 1 | C-17 | 99% | 85% | 68% |
| Comparative Example 4 | Comparative Compound 2 | | 100% | 100% | 100% |

Referring to Tables 3 and 4, the compound according to the present invention exhibited significantly improved driving voltage, efficiency, and lie-span compared with the comparative compounds.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

The invention claimed is:

1. A compound for an organic optoelectronic device, the compound being represented by one of Chemical Formula 1-2 to Chemical Formula 1-4:

[Chemical Formula 1-2]

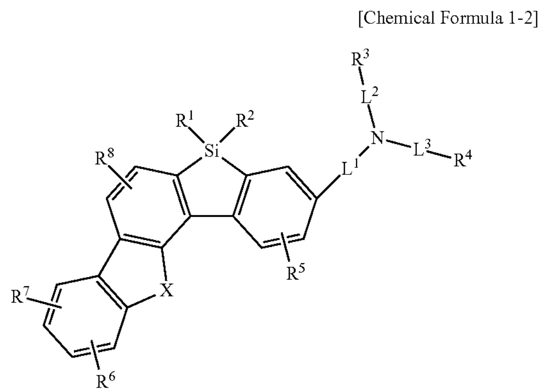

-continued

[Chemical Formula 1-3]

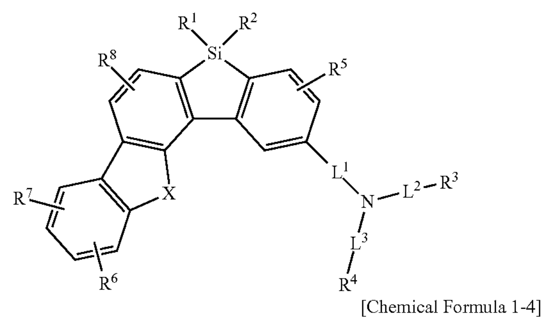

[Chemical Formula 1-4]

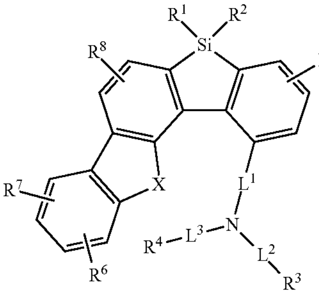

wherein, in Chemical Formula 1-2 to Chemical Formula 1-4,

X is O or S, $L^1$ to $L^3$ are independently a single bond, a substituted or unsubstituted C6 to C30 arylene group, or a substituted or unsubstituted C2 to C30 heterocyclic group, $R^1$ and $R^2$ are independently a substituted or unsubstituted C1 to C30 alkyl group, or a substituted or unsubstituted C6 to C30 aryl group, $R^3$ and $R^4$ are independently a substituted or unsubstituted C6 to C30 aryl group, or a substituted or unsubstituted C2 to C30 heterocyclic group, and $R^5$ to $R^8$ are independently hydrogen, deuterium, a substituted or unsubstituted C1 to C30 alkyl group, or a substituted or unsubstituted C6 to C30 aryl group.

2. The compound of claim 1, wherein:

$L^1$ is a single bond, and $L^2$ and $L^3$ are independently a single bond, a substituted or unsubstituted phenylene group, or a substituted or unsubstituted biphenylene group.

3. The compound of claim 1, wherein $R^1$ and $R^2$ are independently an unsubstituted methyl group, an unsubstituted ethyl group, a substituted or unsubstituted phenyl group, a substituted or unsubstituted naphthyl group, or a substituted or unsubstituted biphenyl group.

4. The compound of claim 1, wherein $R^3$ and $R^4$ are independently a substituted or unsubstituted phenyl group, a substituted or unsubstituted biphenyl group, a substituted or unsubstituted naphthyl group, a substituted or unsubstituted phenanthrenyl group, a substituted or unsubstituted chrysenyl group, a substituted or unsubstituted fluorenyl group, a substituted or unsubstituted carbazolyl group, a substituted or unsubstituted dibenzofuranyl group, a substituted or unsubstituted dibenzothiophenyl group, a substituted or unsubstituted dibenzosilolyl group, a substituted or unsubstituted benzonaphthofuranyl group, a substituted or unsubstituted benzonaphthothiophenyl group, or a substituted or unsubstituted benzoxazolyl group.

5. The compound of claim 4, wherein $R^3$ and $R^4$ are independently a substituted or unsubstituted phenyl group, a substituted or unsubstituted biphenyl group, a substituted or unsubstituted naphthyl group, a substituted or unsubstituted dibenzofuranyl group, a substituted or unsubstituted dibenzothiophenyl group, a substituted or unsubstituted benzonaphthofuranyl group, or a substituted or unsubstituted benzonaphthothiophenyl group.

6. The compound of claim 1, which is one of compounds of Group 1:

[Group 1]

A-1

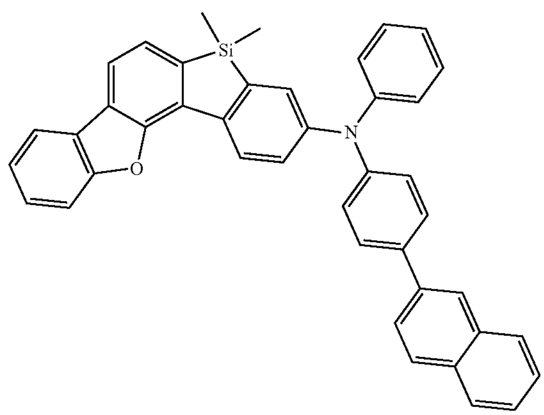

A-2

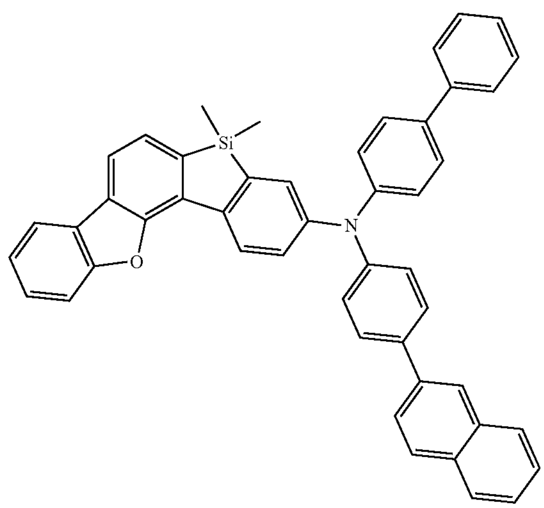

-continued

A-3

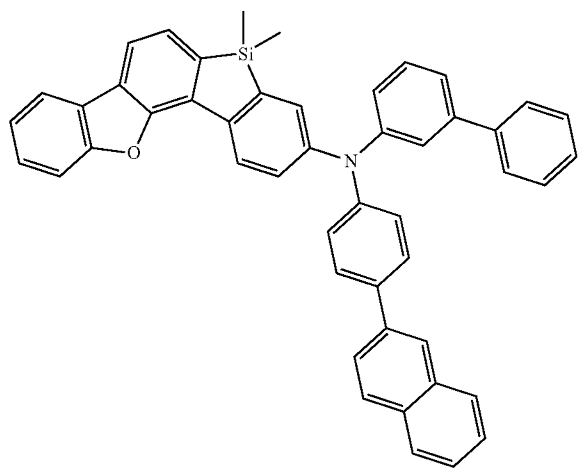

A-4

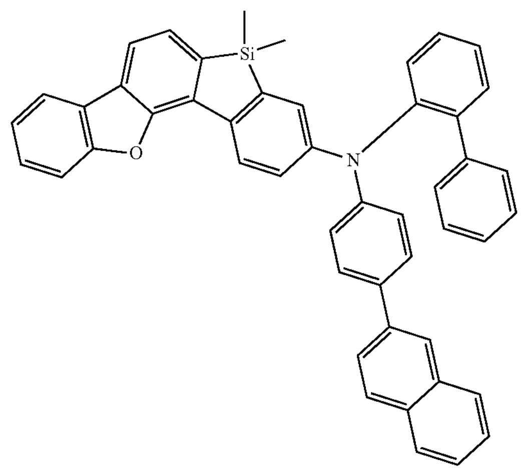

A-5

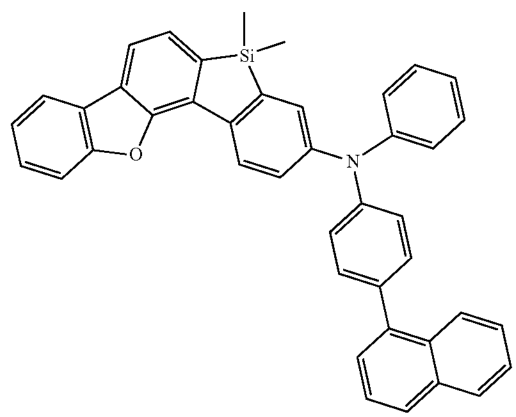

-continued
A-6
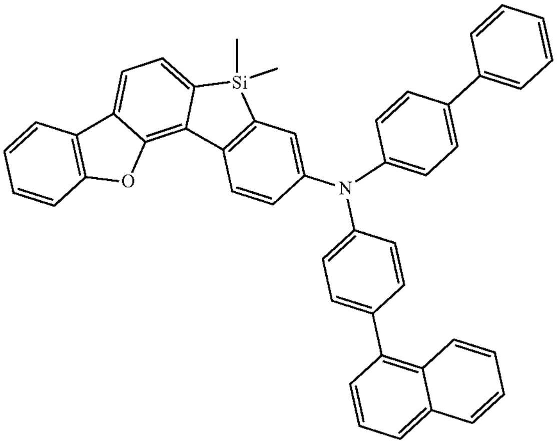
A-7
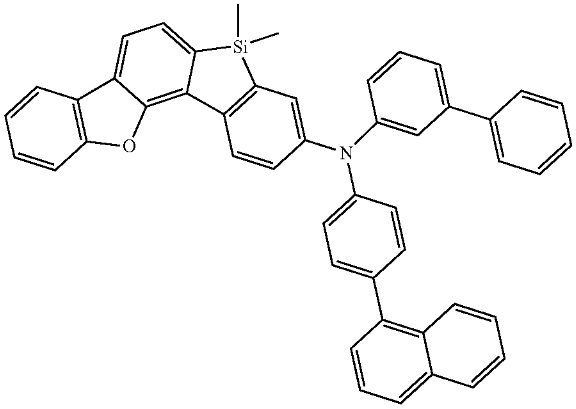
A-8
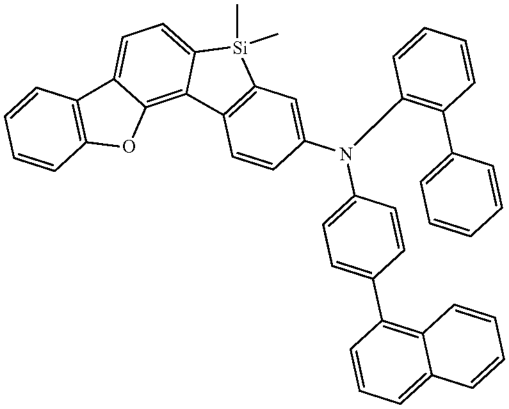
A-9
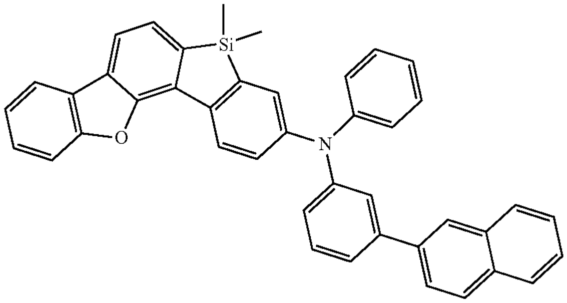
-continued
A-10
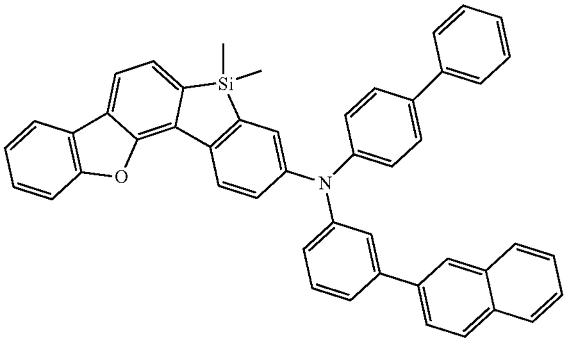
A-11
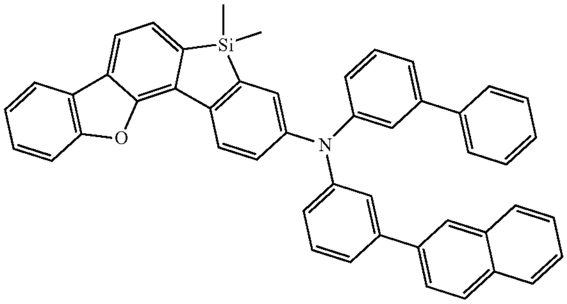
A-12
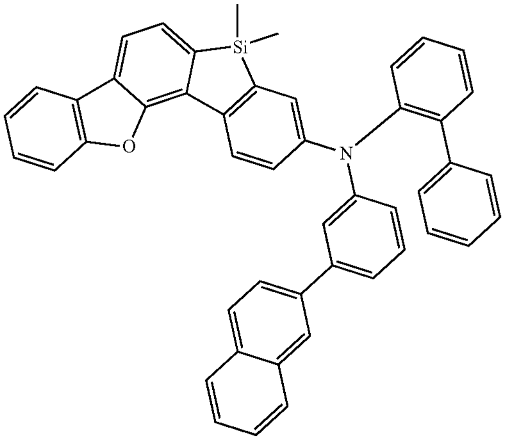
A-13
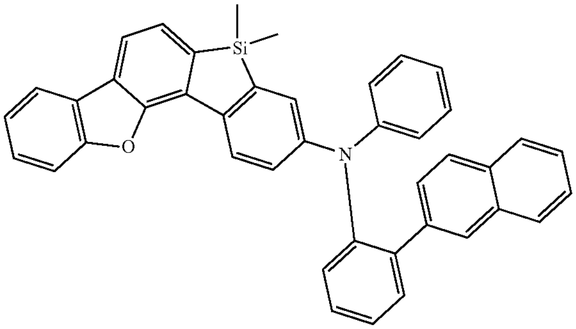

-continued
A-14
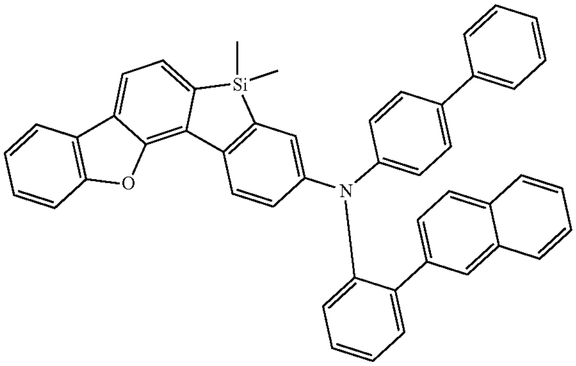
A-15
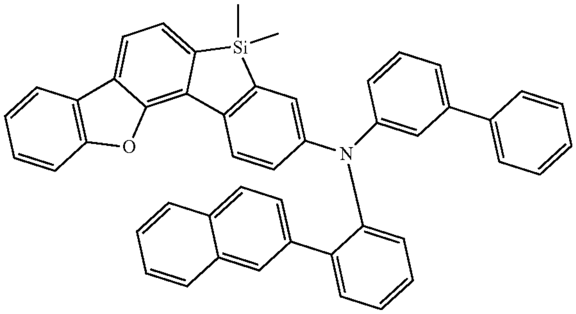
A-16
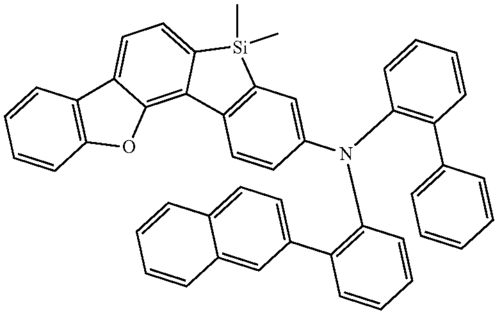
A-17
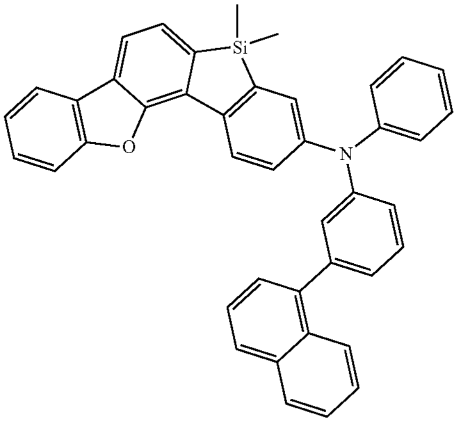
-continued
A-18
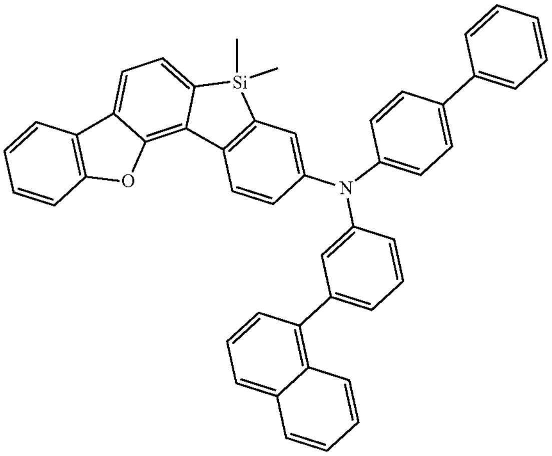
A-19
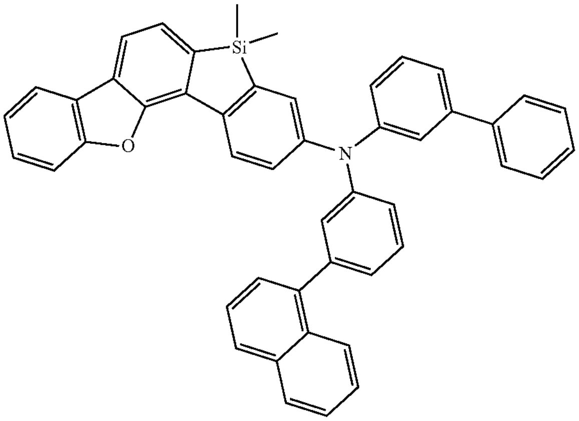
A-20
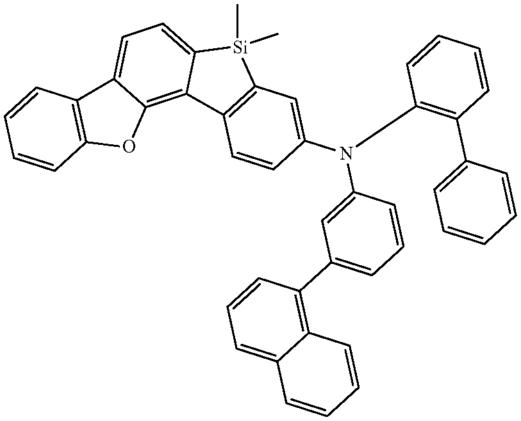

-continued
A-21
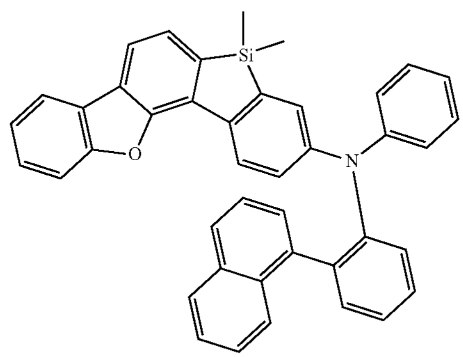
A-22
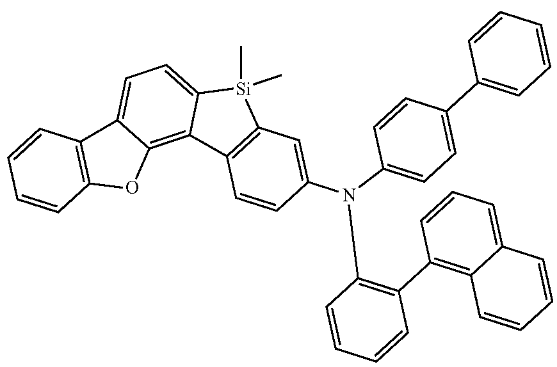
A-23
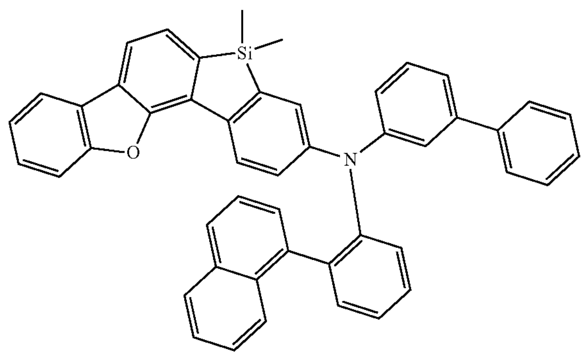
A-24
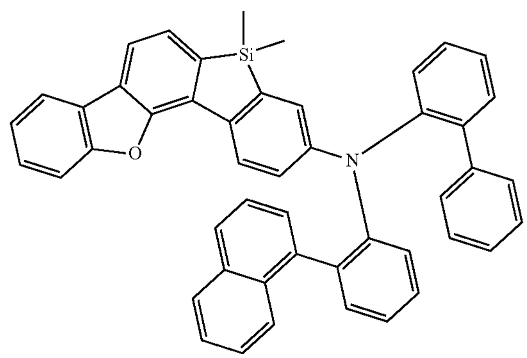
-continued
A-25
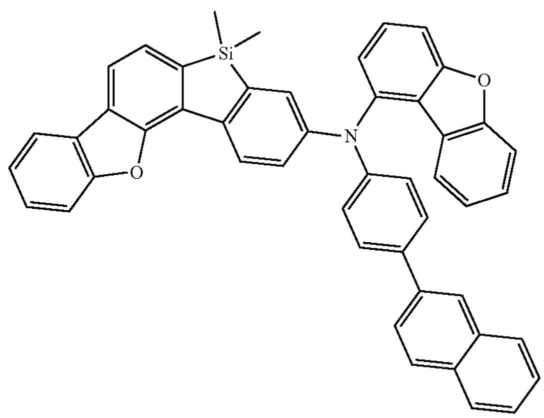
A-26
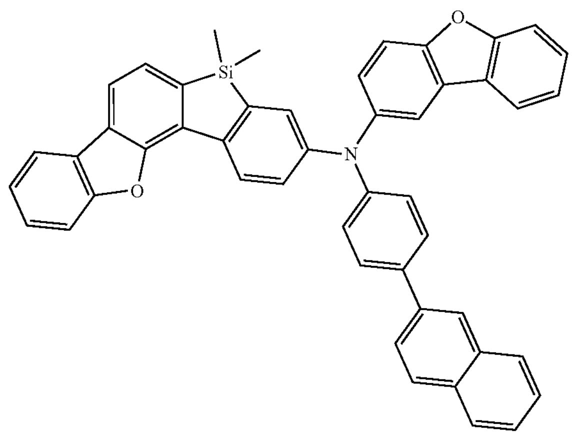
A-27
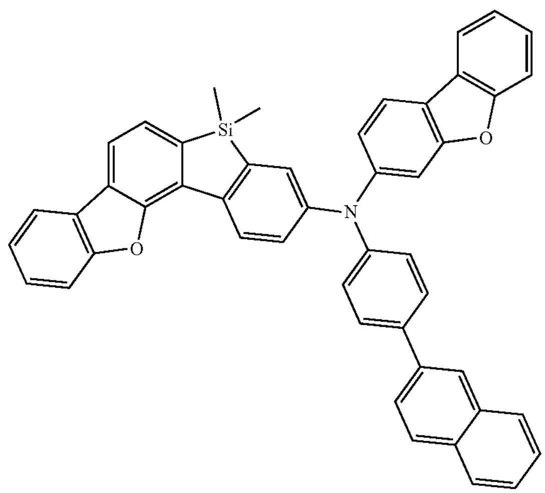

-continued
A-28
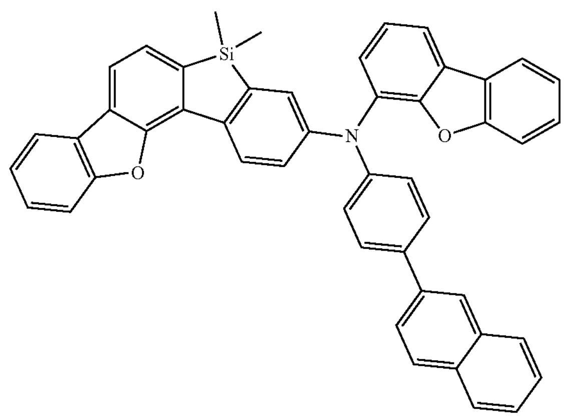
A-29
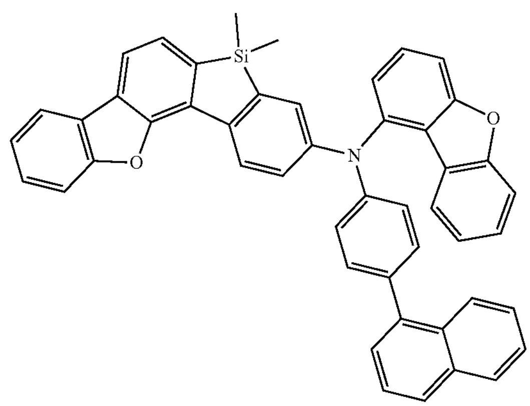
A-30
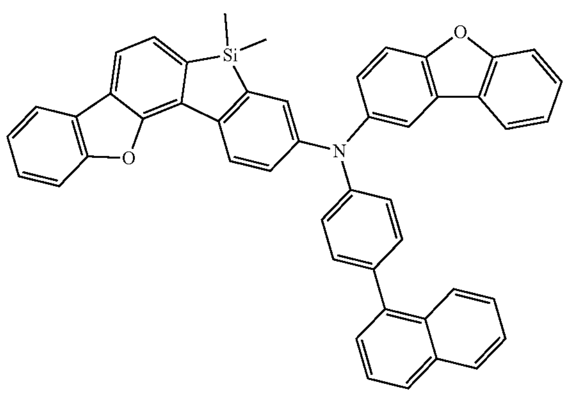
-continued
A-31
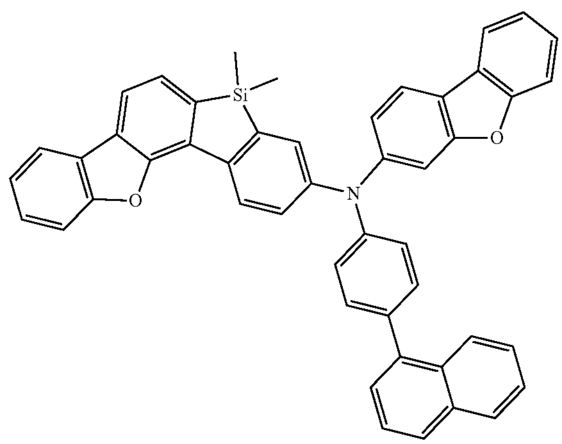
A-32
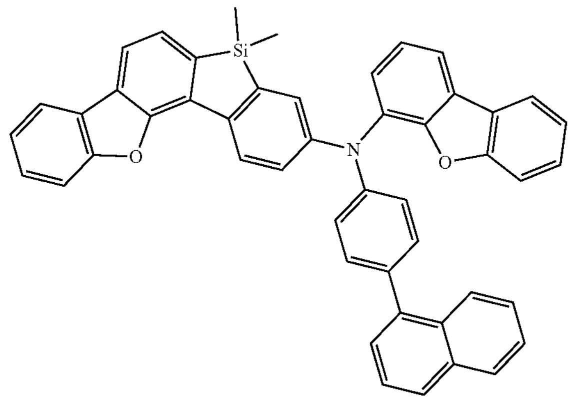
A-33
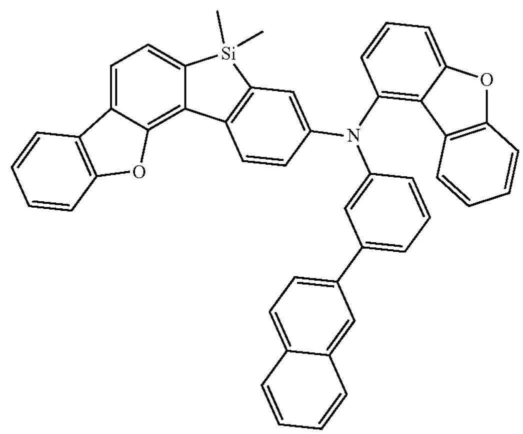

-continued
A-34
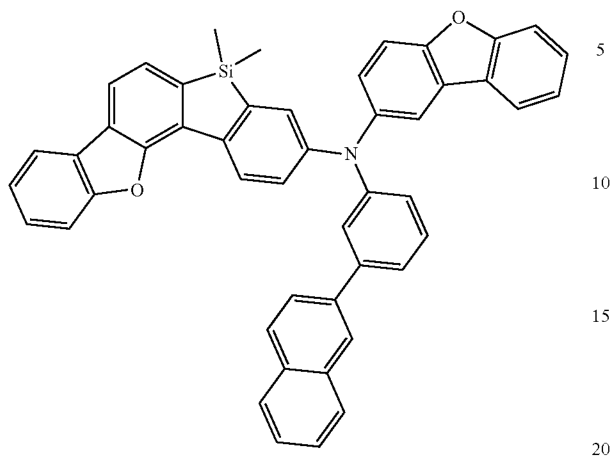
A-35
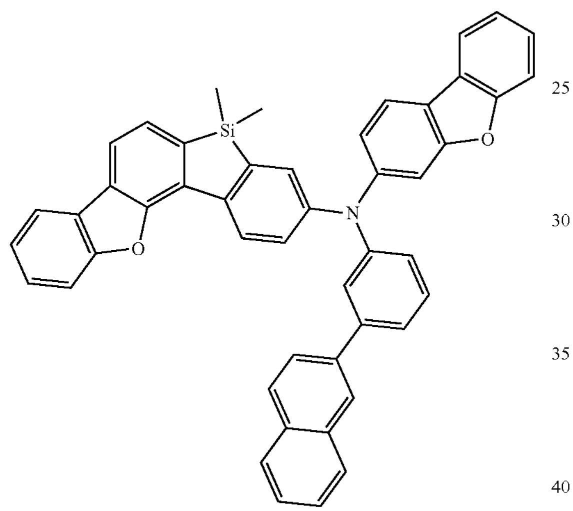
A-36
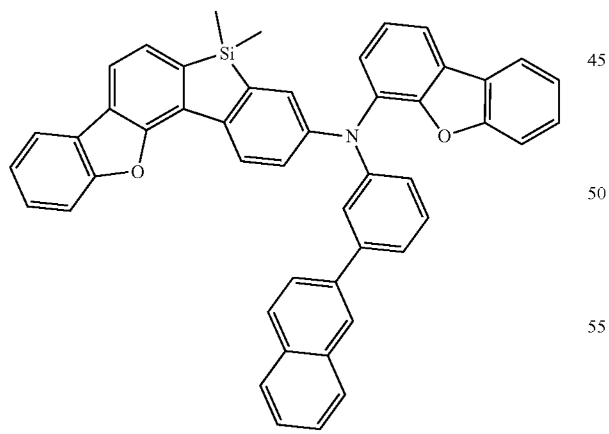
-continued
A-37
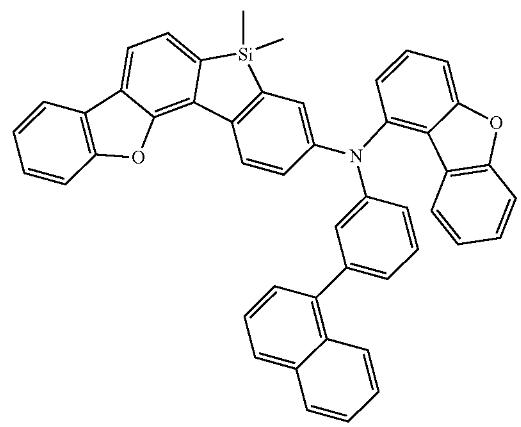
A-38
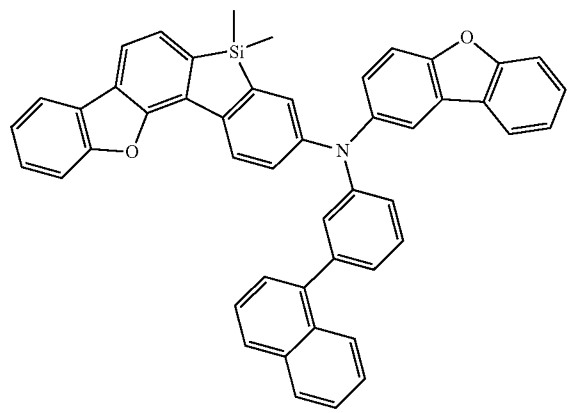
A-39
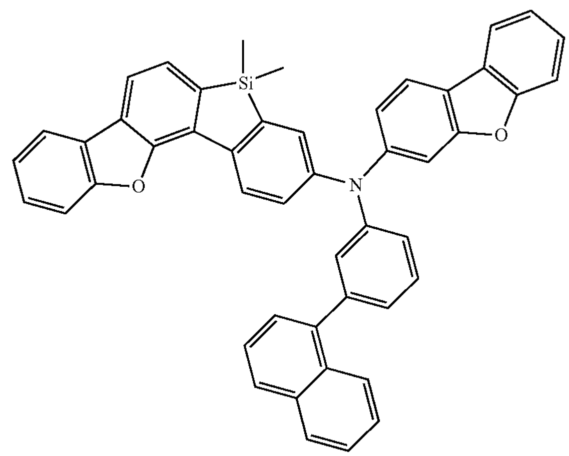

-continued
A-40
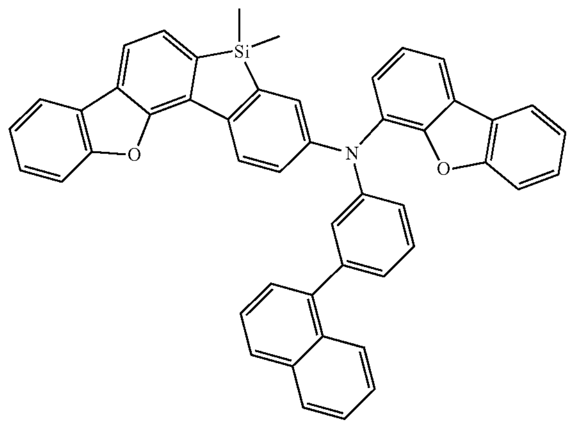
A-41
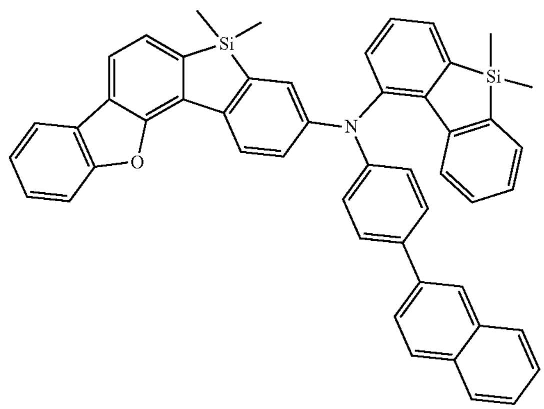
A-42
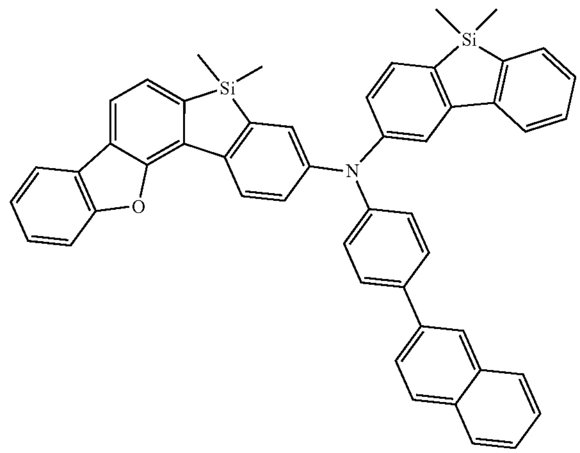
-continued
A-43
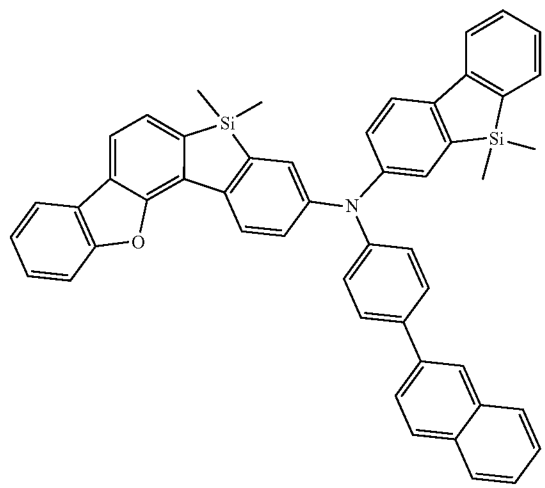
A-44
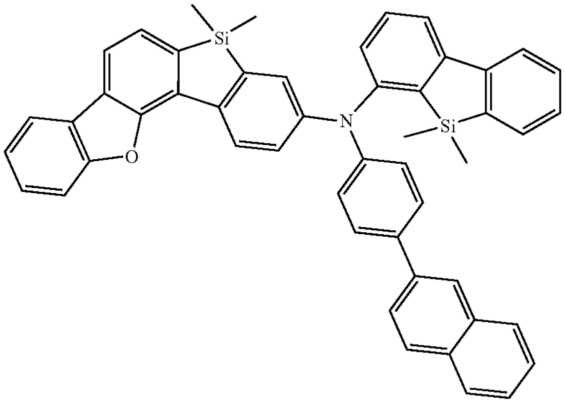
A-45
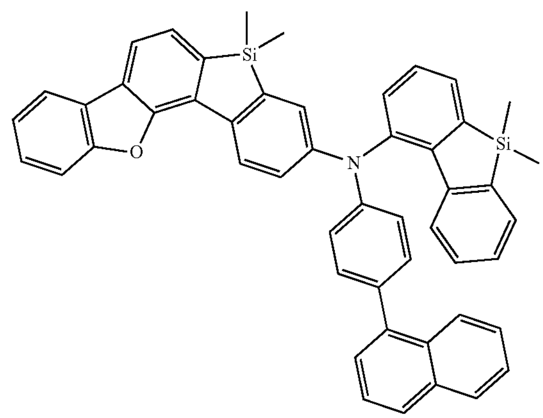

-continued
A-46
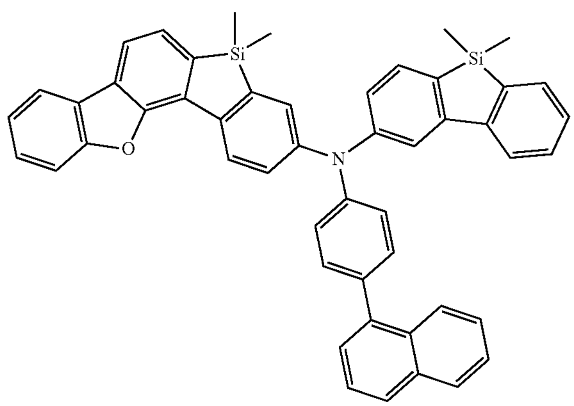
A-47
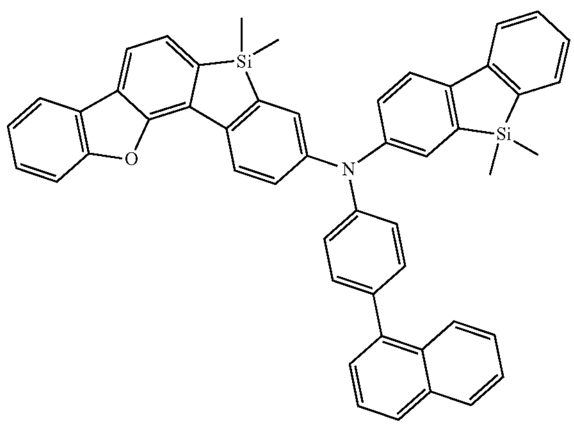
A-48
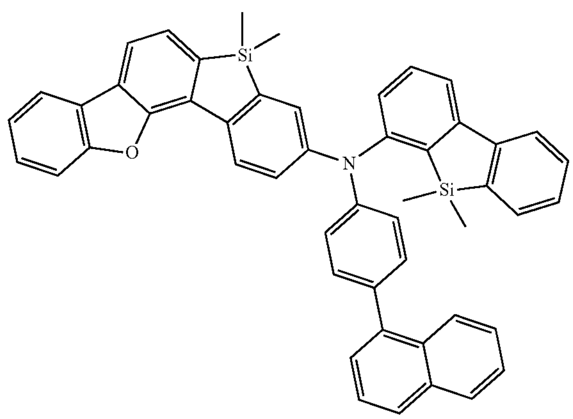
-continued
A-49
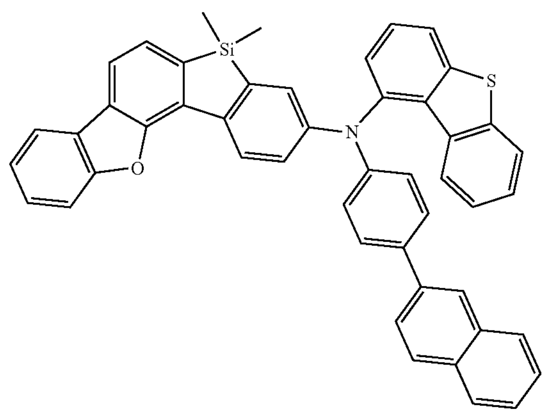
A-50
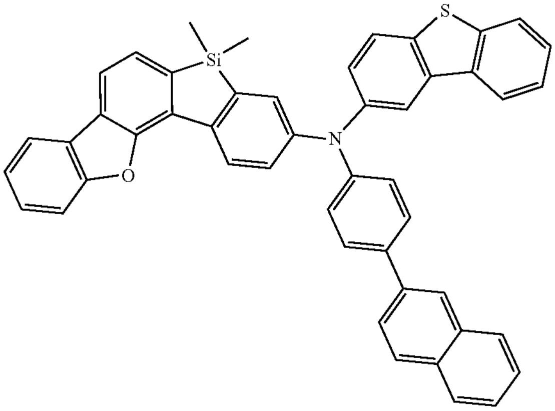
A-51
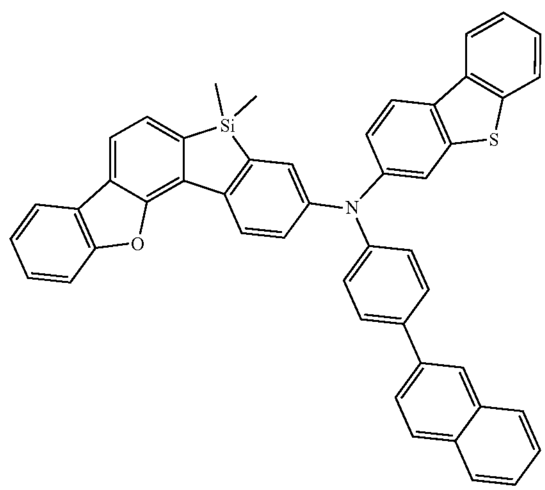

-continued
A-52
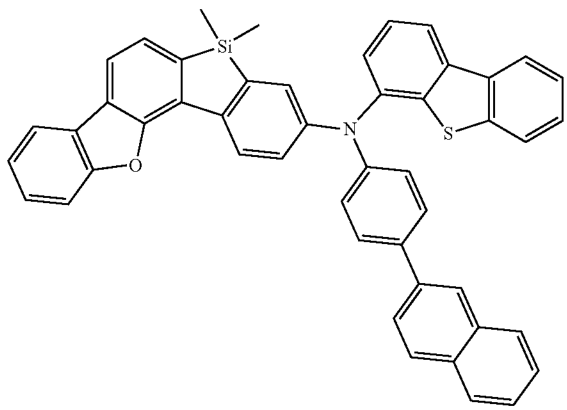
A-53
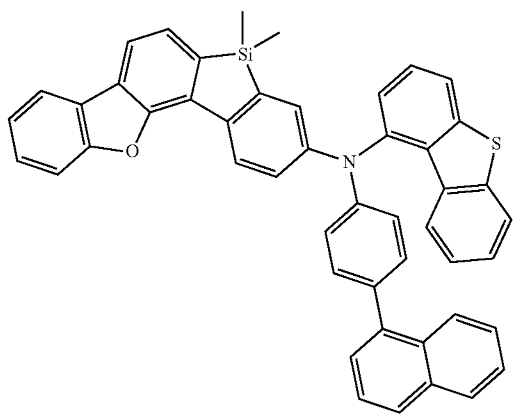
A-54
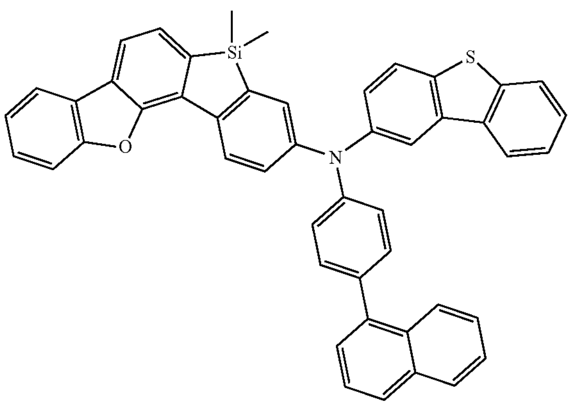
-continued
A-55
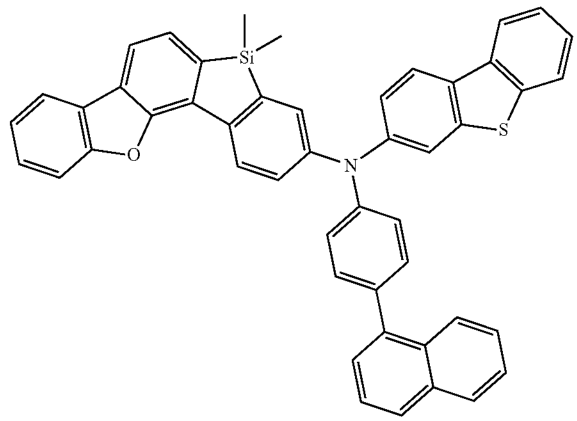
A-56
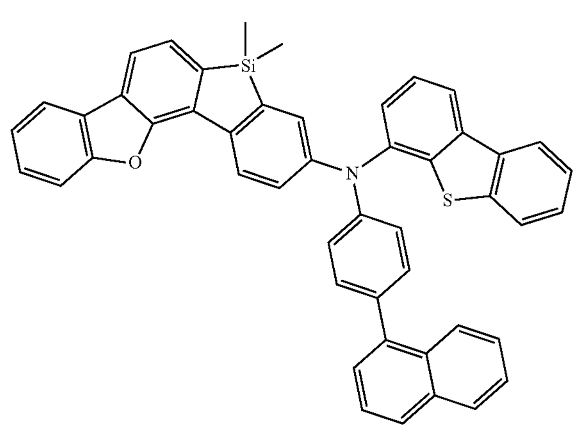
A-57
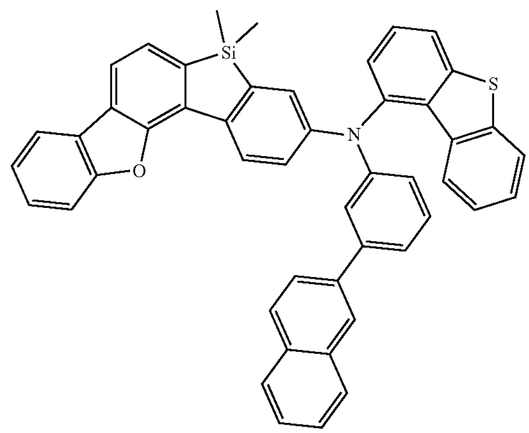

-continued
A-58
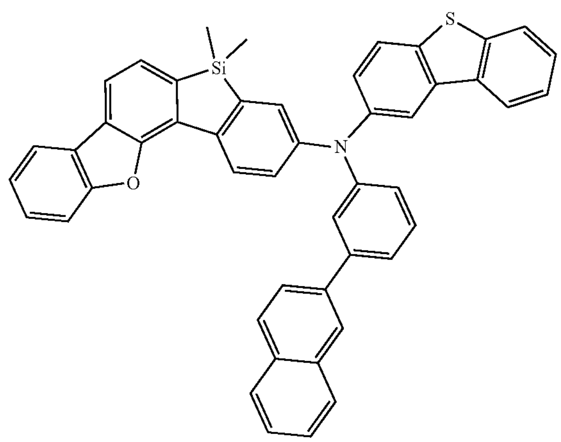
A-59
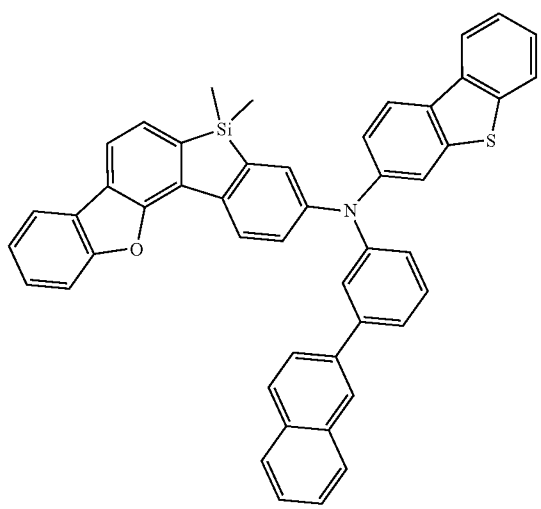
A-60
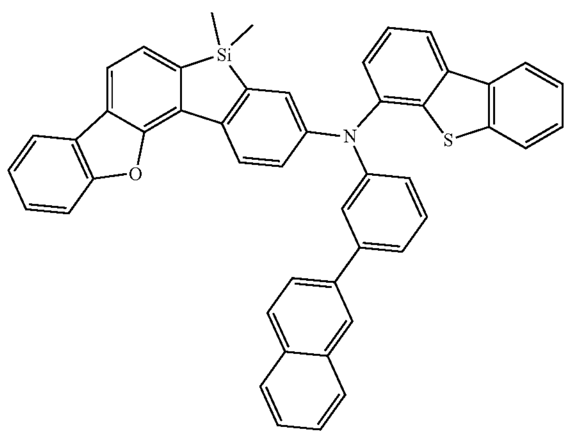
-continued
A-61
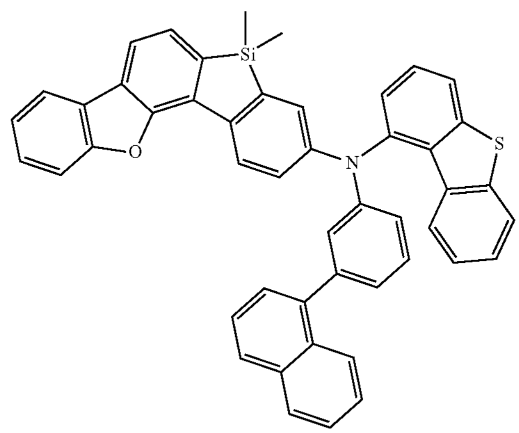
A-62
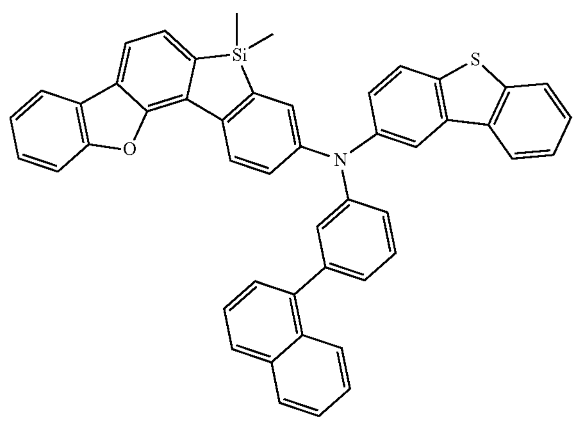
A-63
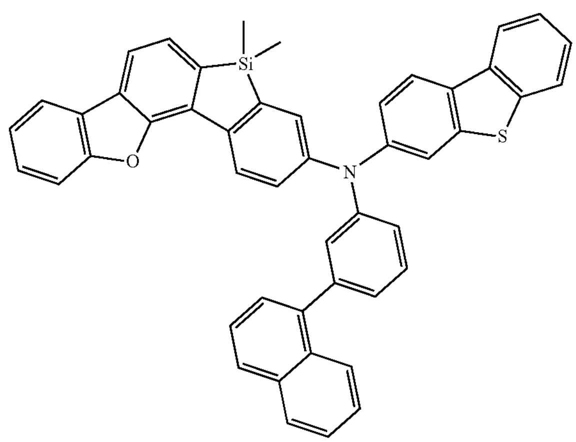

-continued
A-64
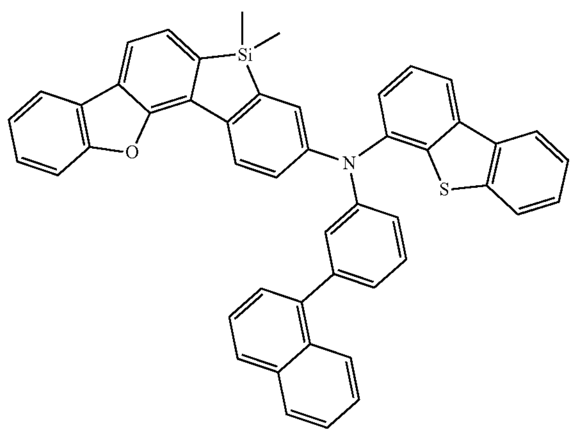
A-65
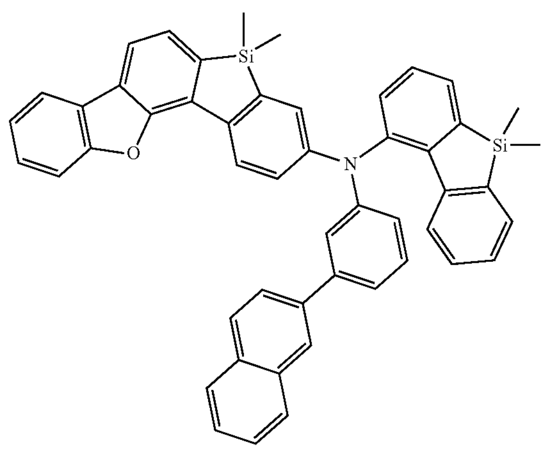
A-66
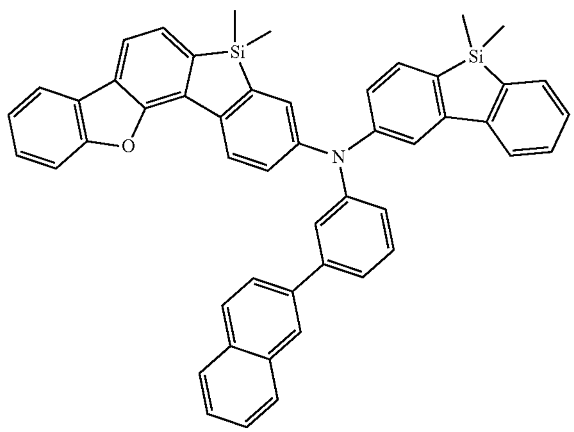
-continued
A-67
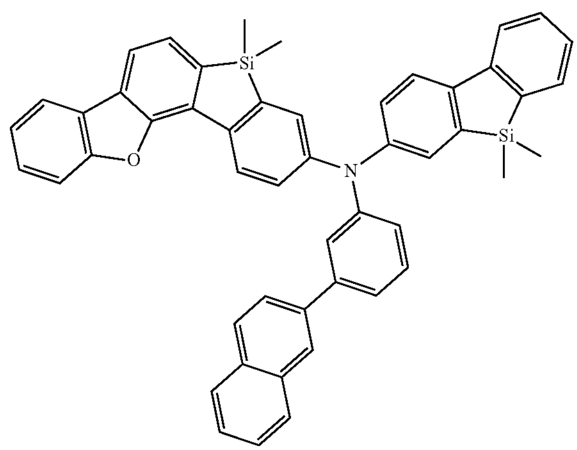
A-68
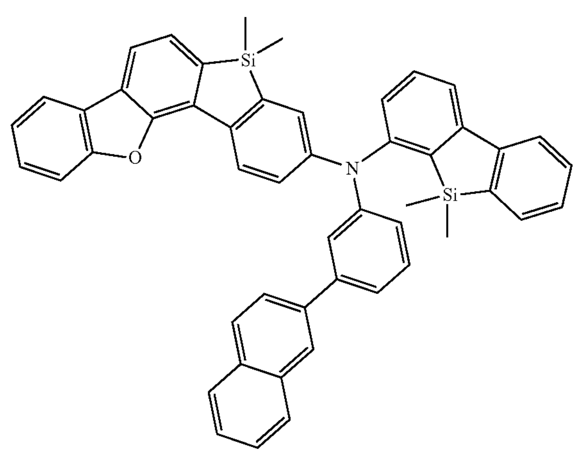
A-69
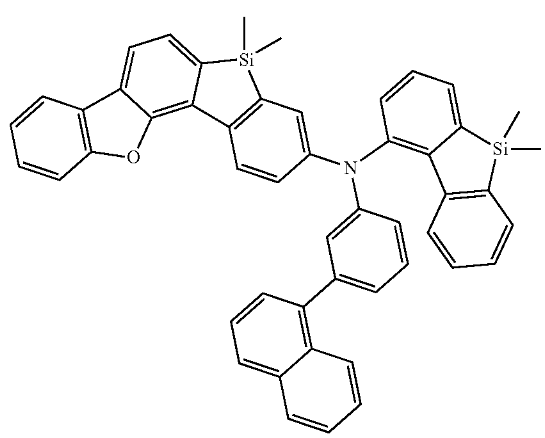

-continued
A-70
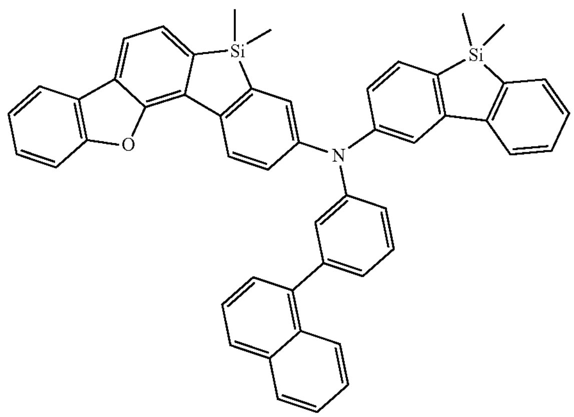
A-71
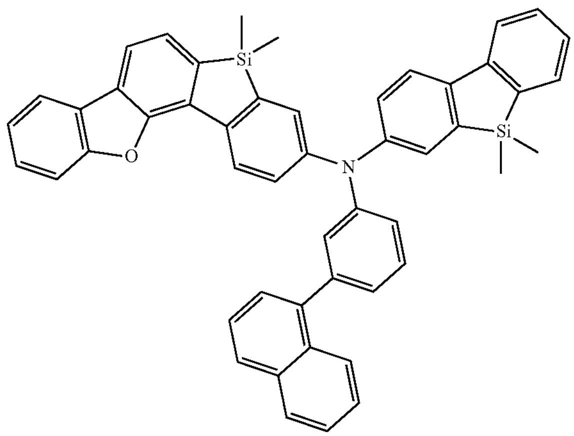
A-72
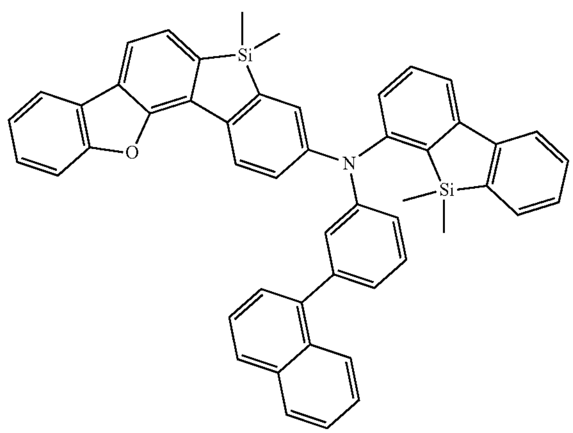
-continued
A-73
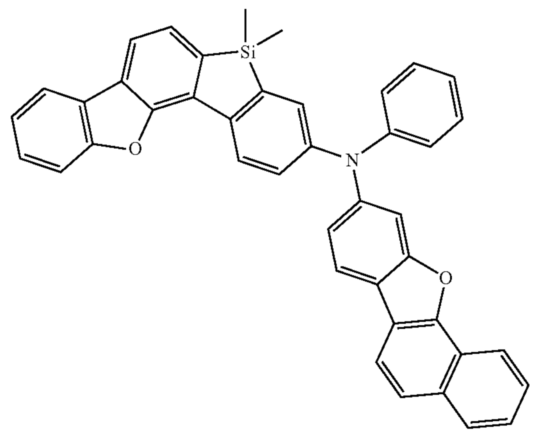
A-74
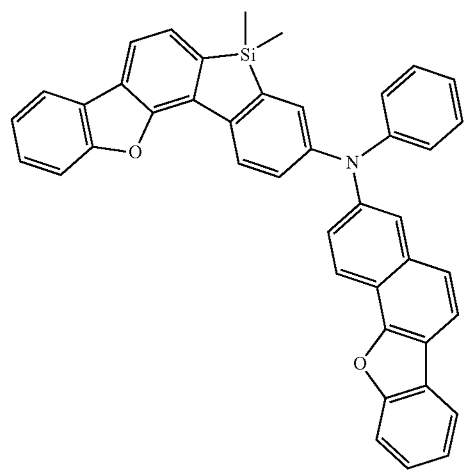
A-75
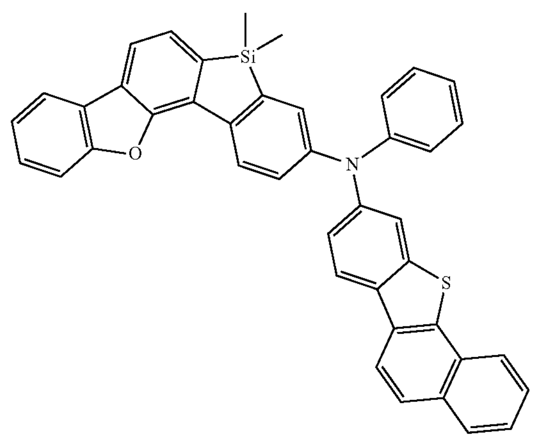

-continued
A-76
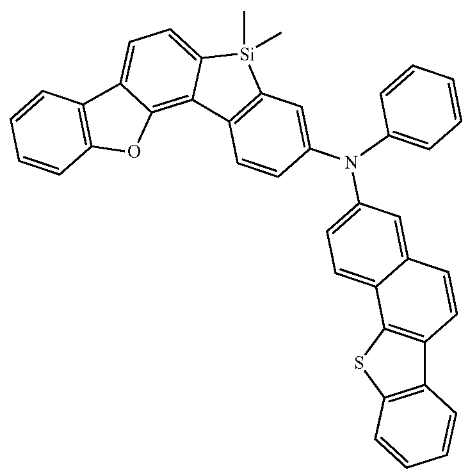
A-77
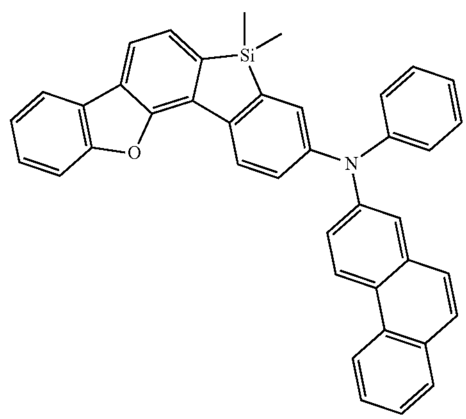
A-78
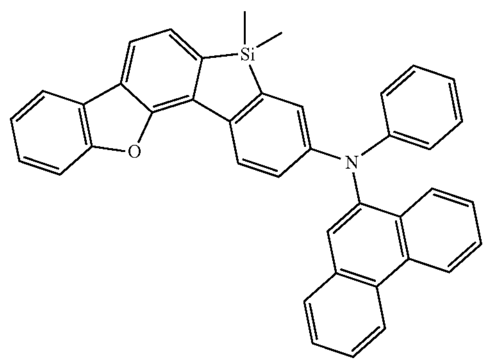
A-79
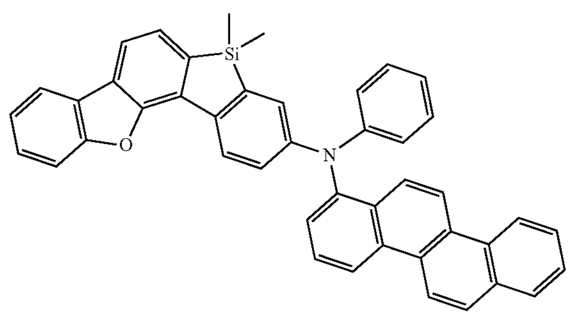
-continued
A-80
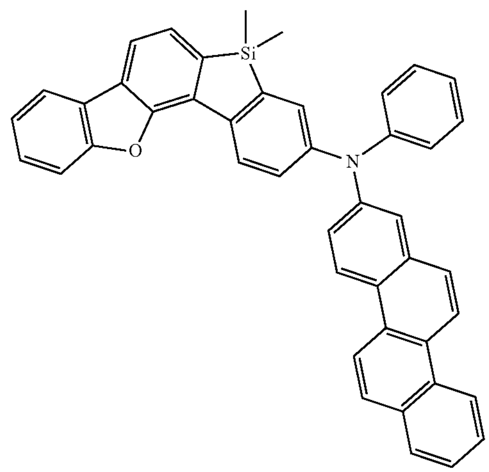
A-81
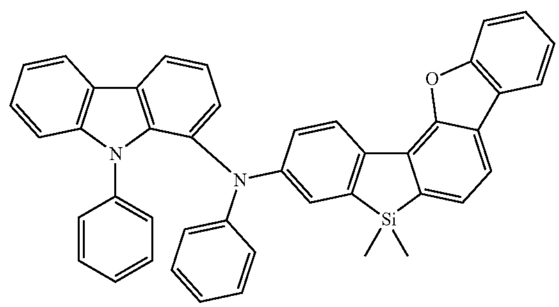
A-82
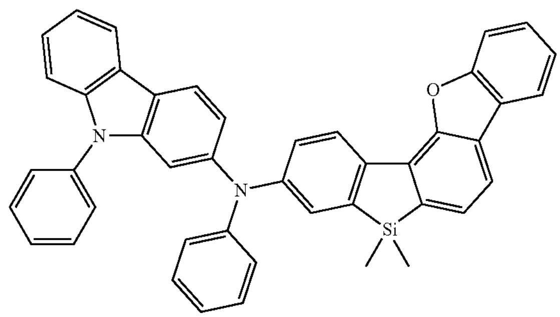
A-83
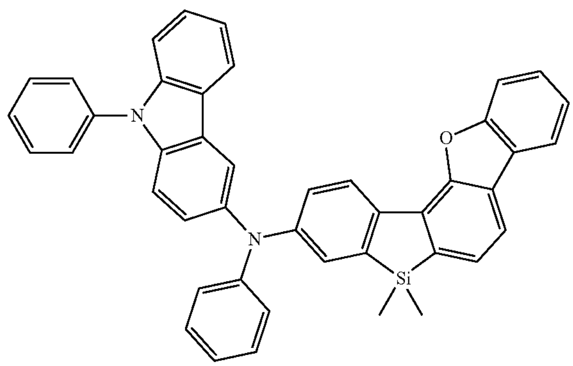

-continued
A-84
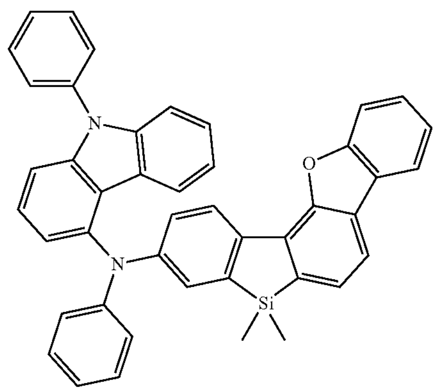
A-89
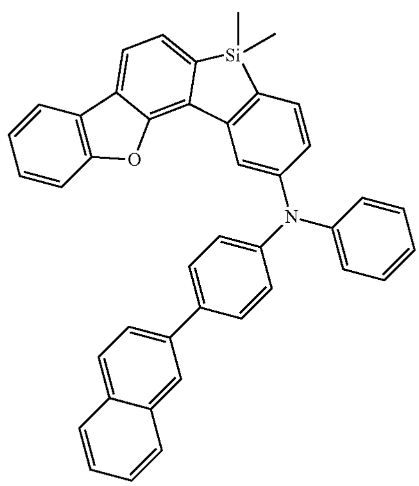
A-90
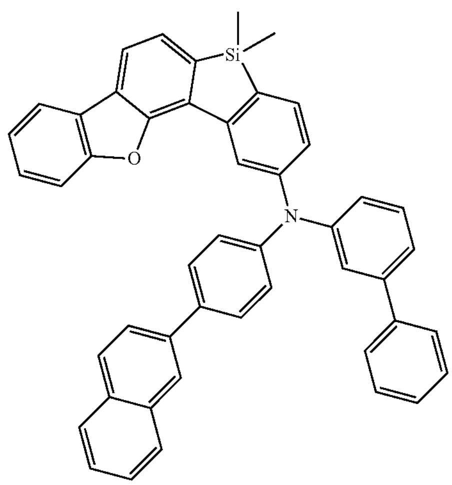
-continued
A-91
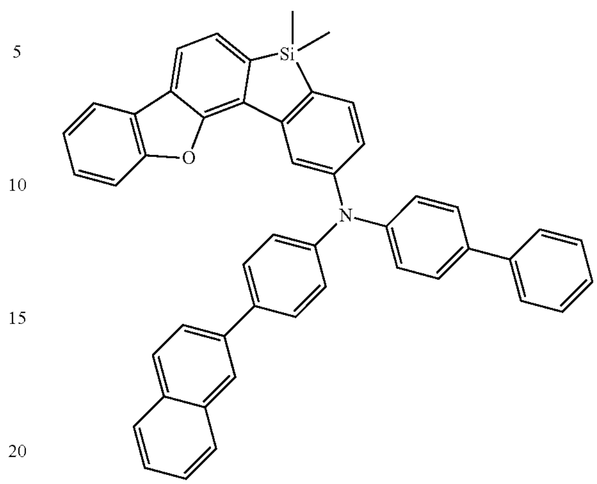
A-92
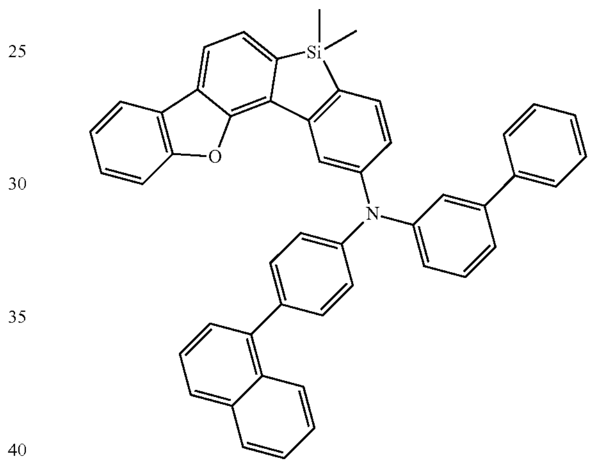
A-93
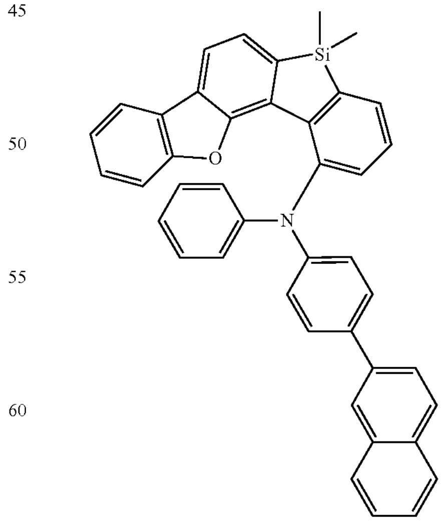

-continued
A-94
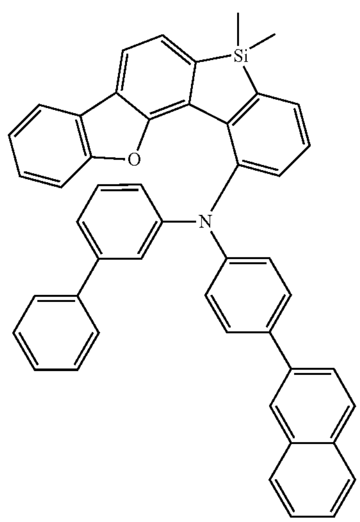
A-95
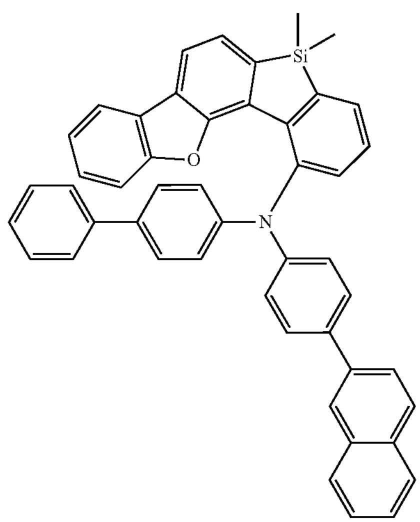
A-96
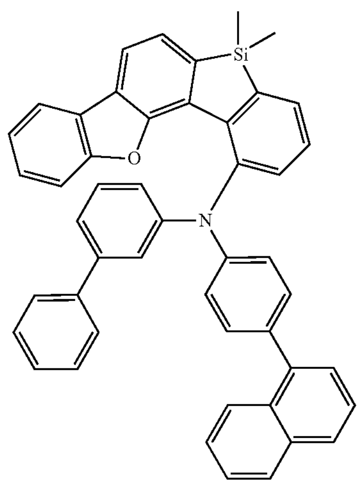
-continued
A-98
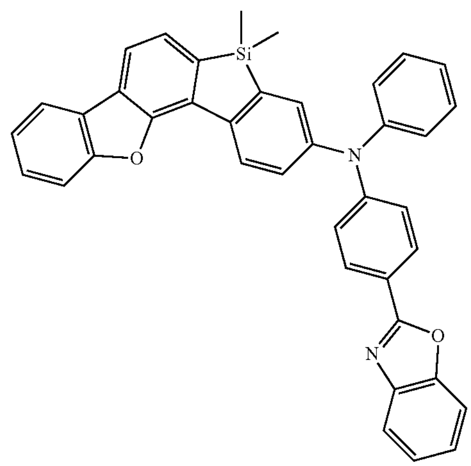
A-99
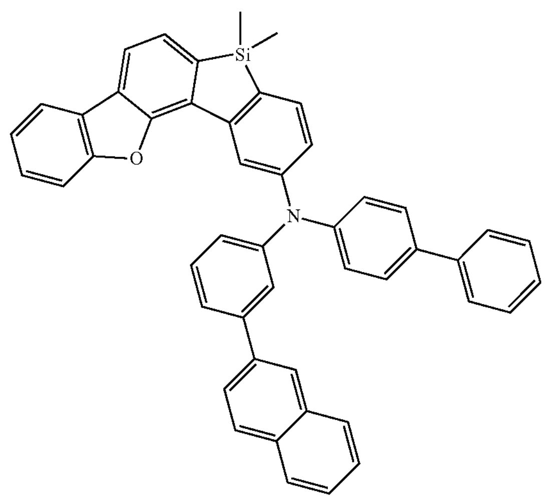
A-100
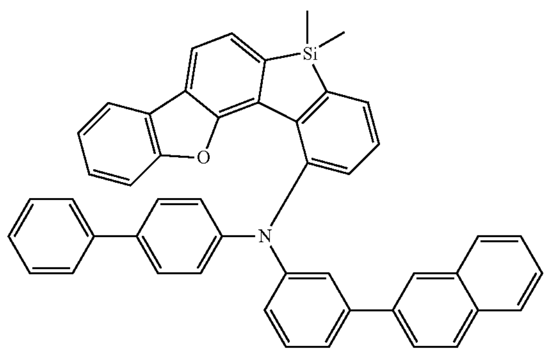

-continued
A-102
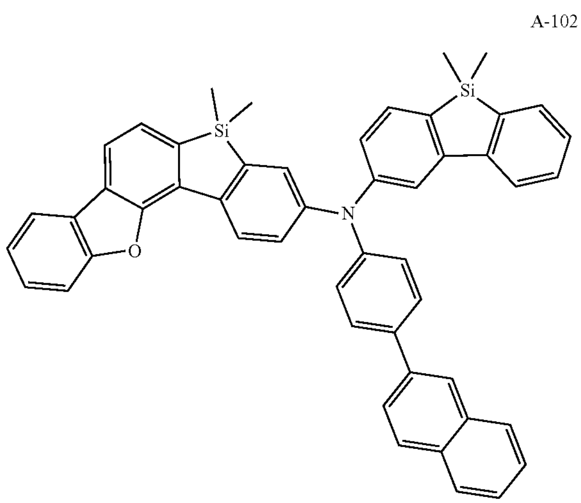
A-103
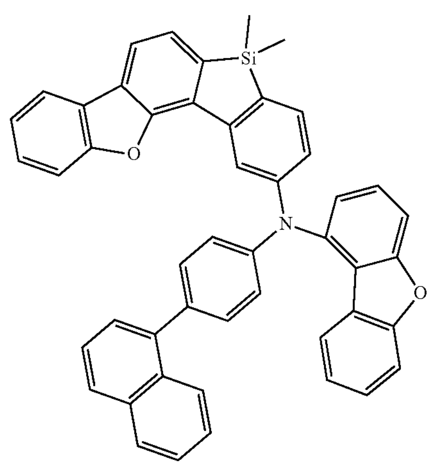
A-104
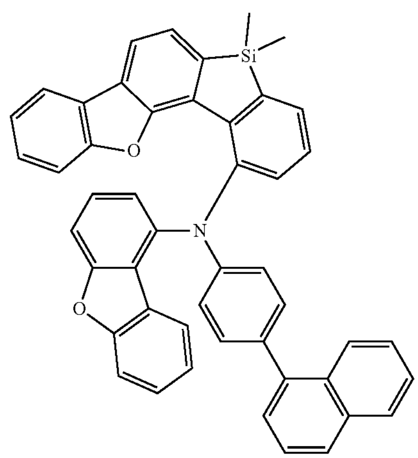
A-106
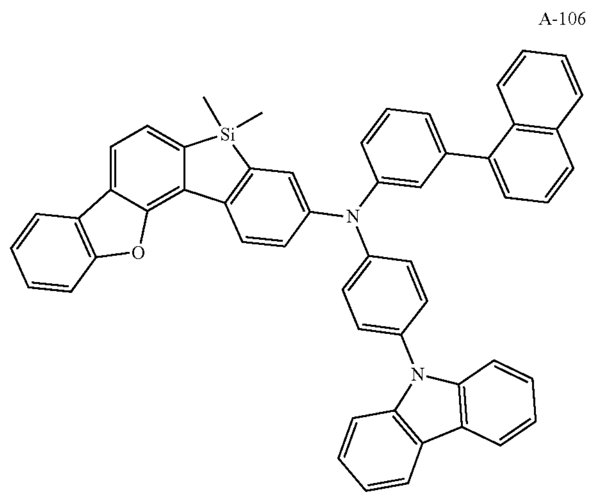
A-107
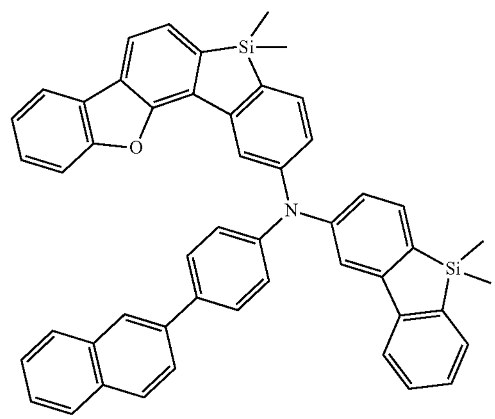
A-108
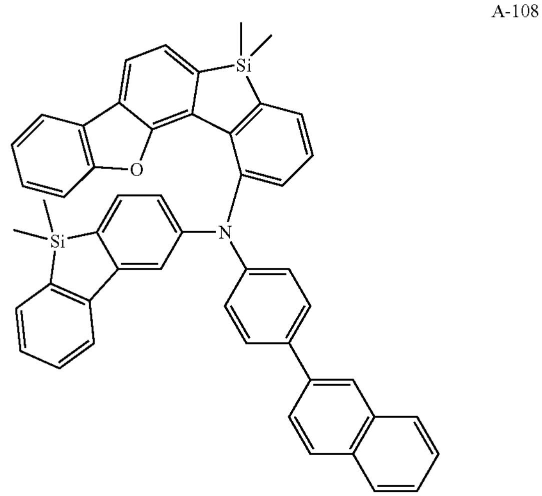

B-1
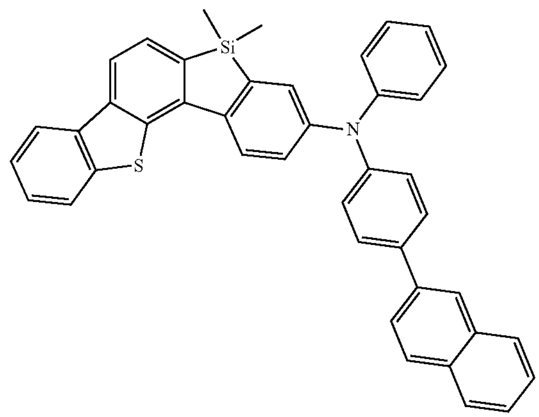
B-2
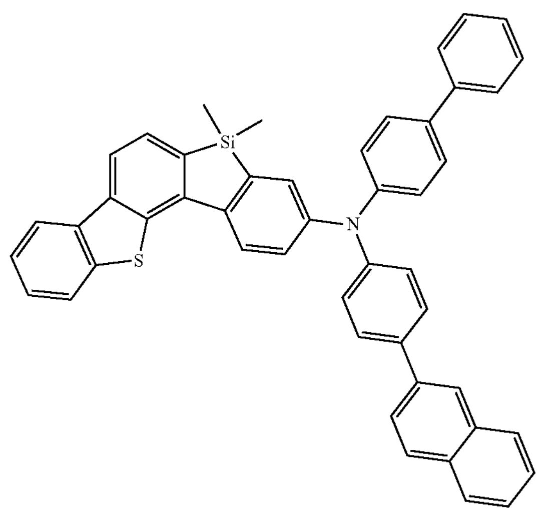
B-3
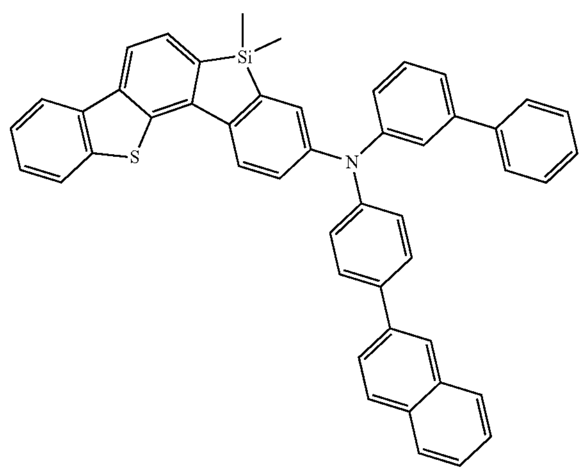
B-4
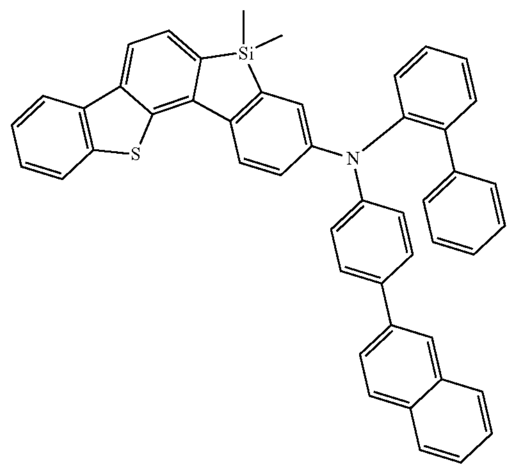
B-5
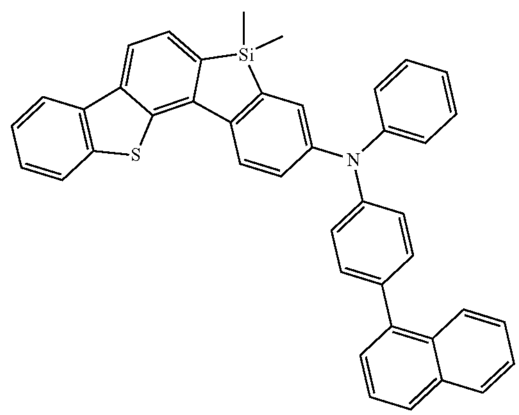
B-6
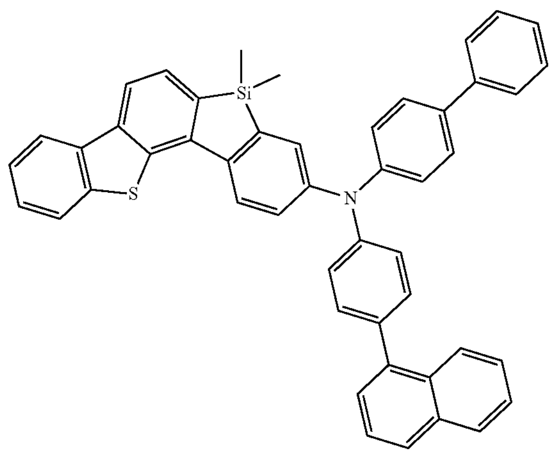

-continued
B-7
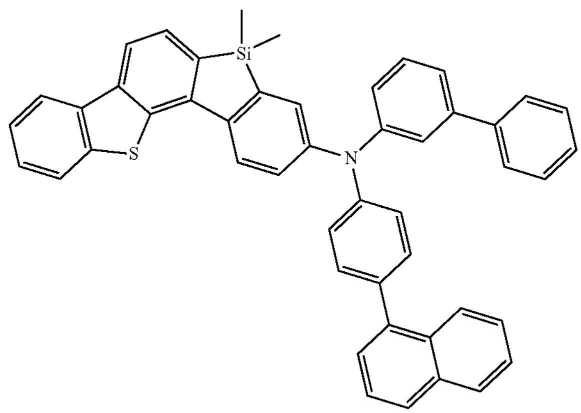
B-8
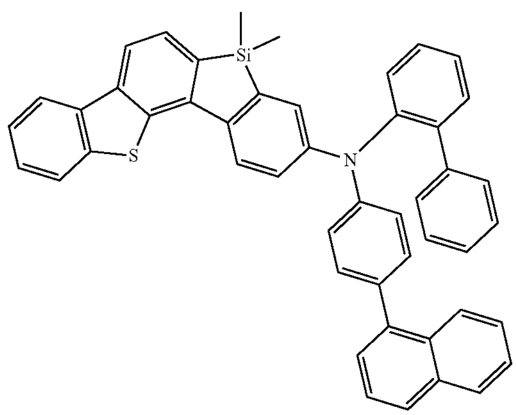
B-9
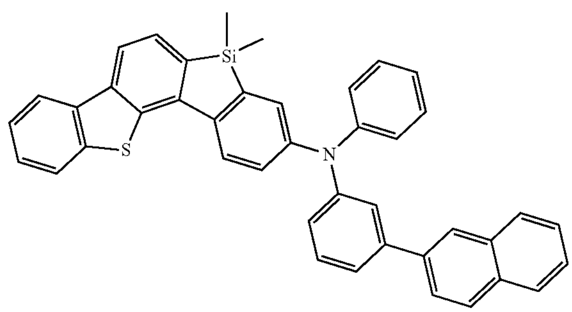
B-10
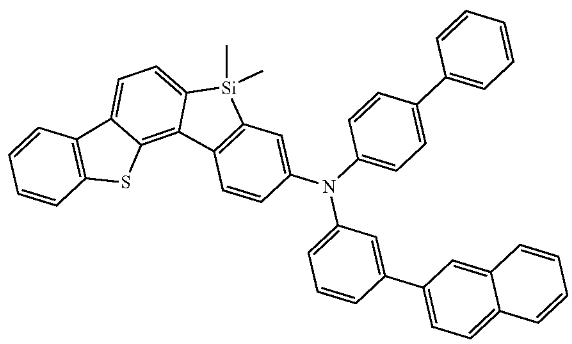
-continued
B-11
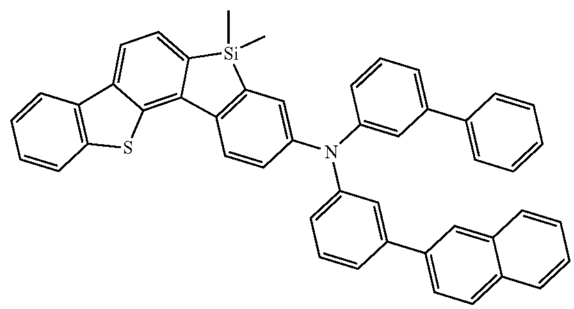
B-12
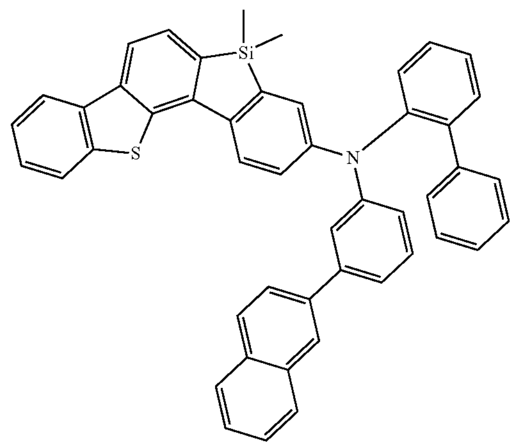
B-13
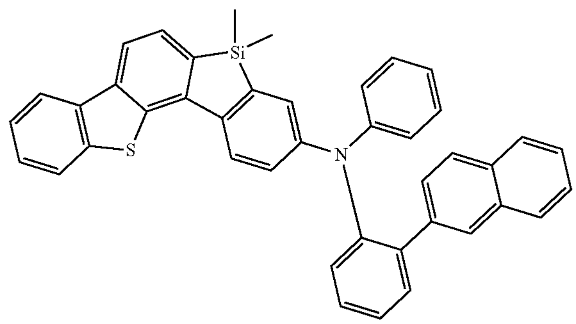
B-14
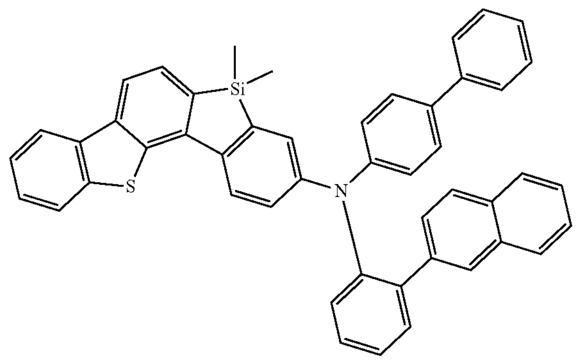

-continued
B-15
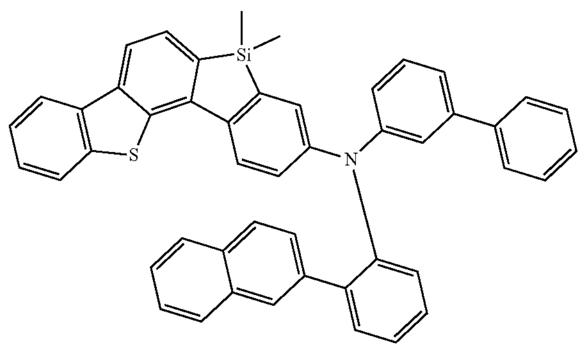
B-16
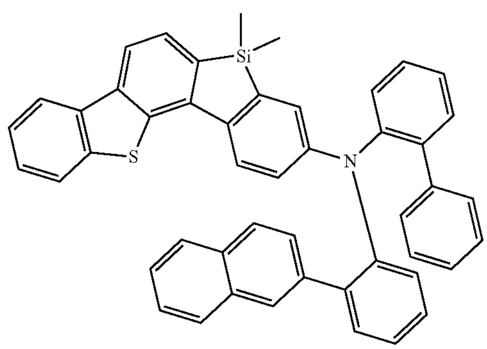
B-17
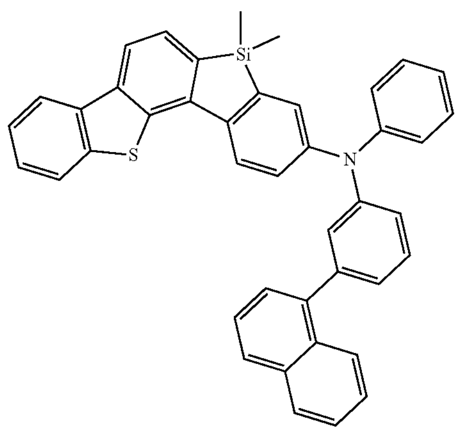
B-18
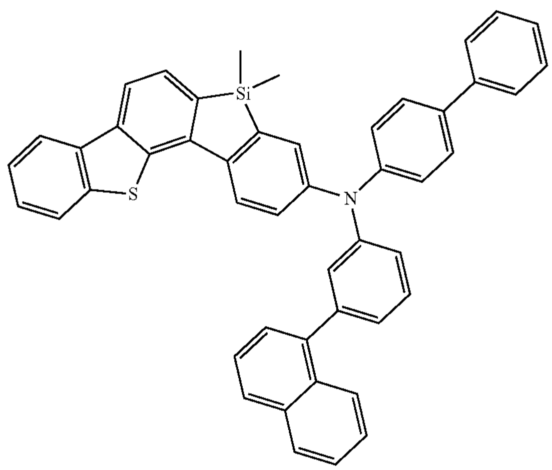
-continued
B-19
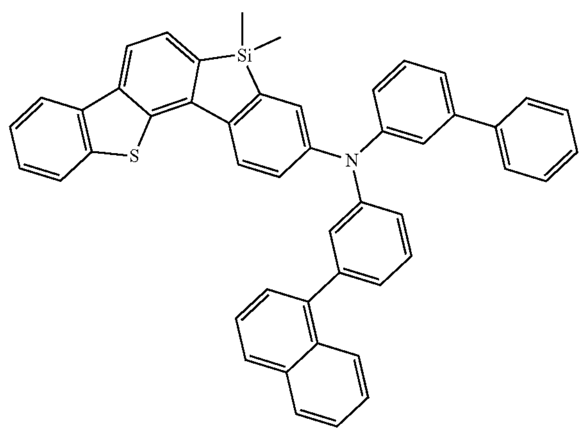
B-20
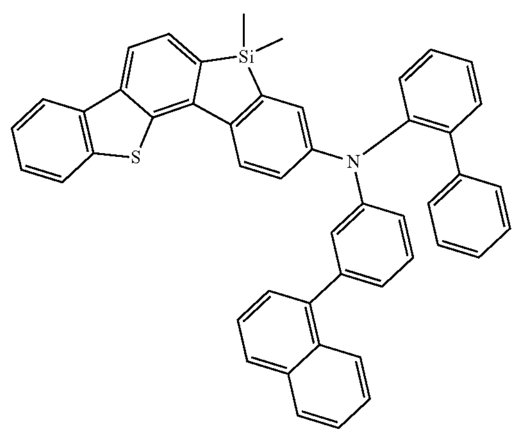
B-21
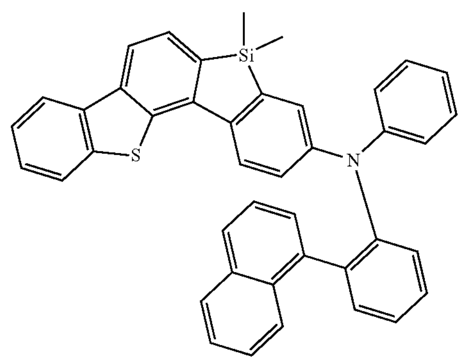
B-22
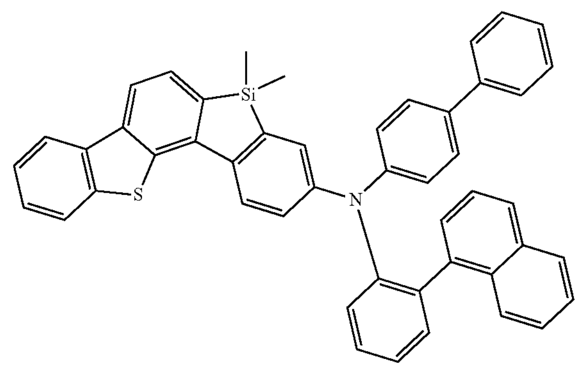

-continued
B-23
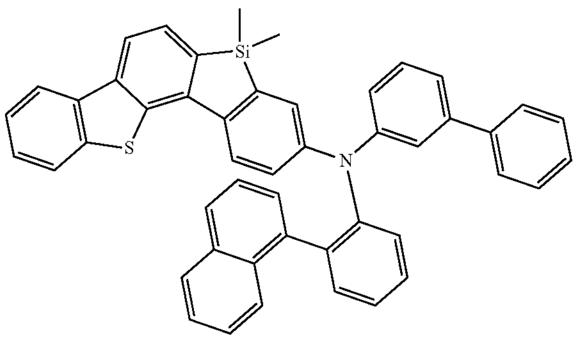
B-24
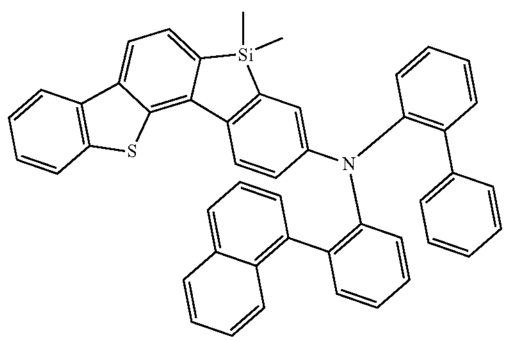
B-25
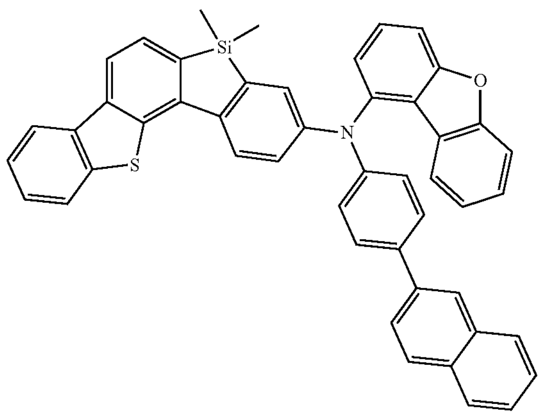
B-26
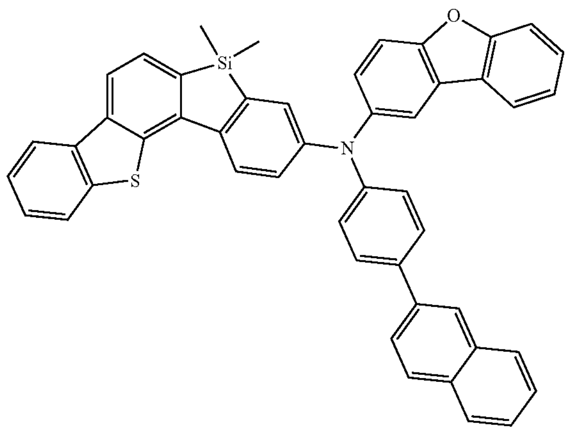
-continued
B-27
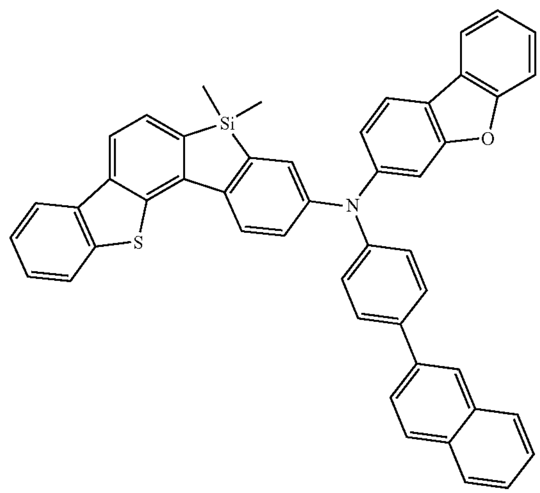
B-28
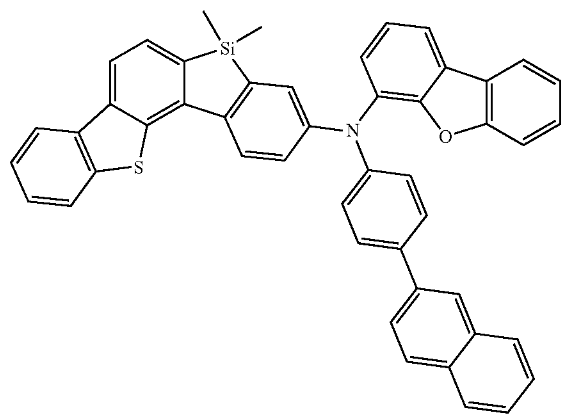
B-29
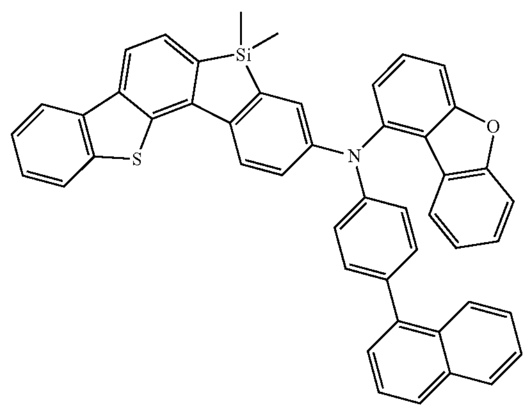

-continued
B-30
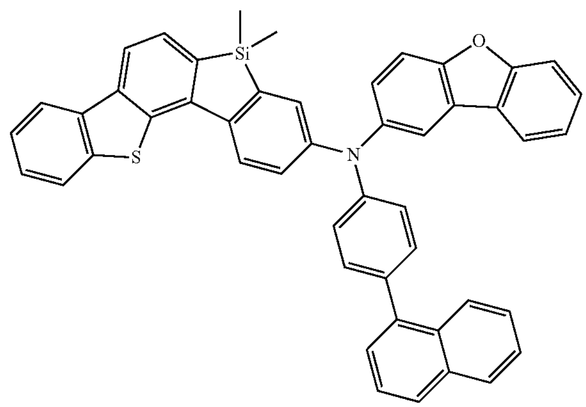
B-31
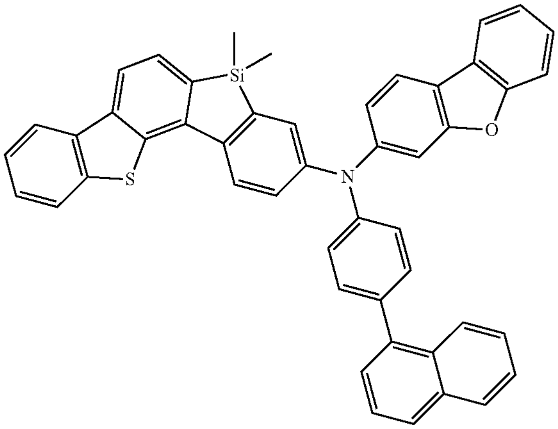
B-32
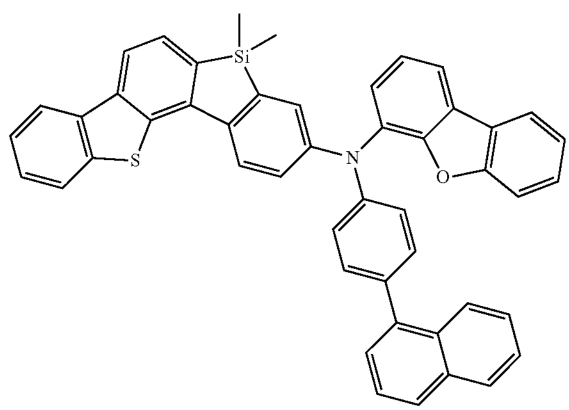
-continued
B-33
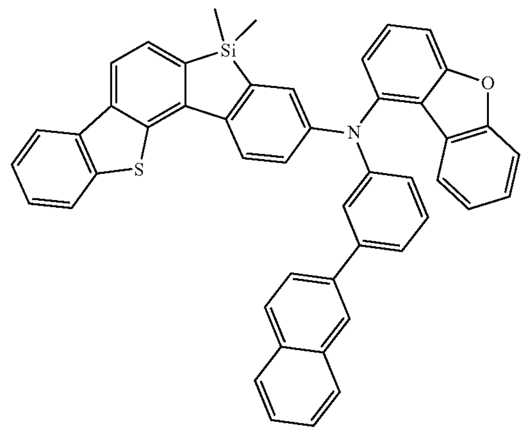
B-34
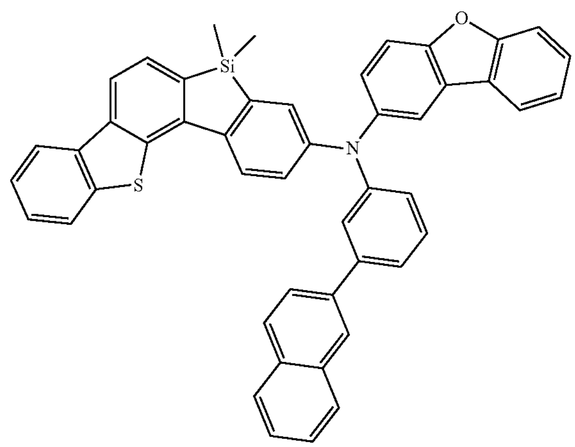
B-35
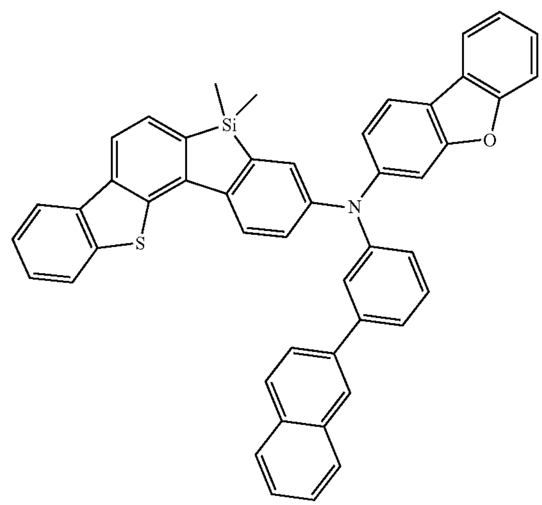

-continued
B-36
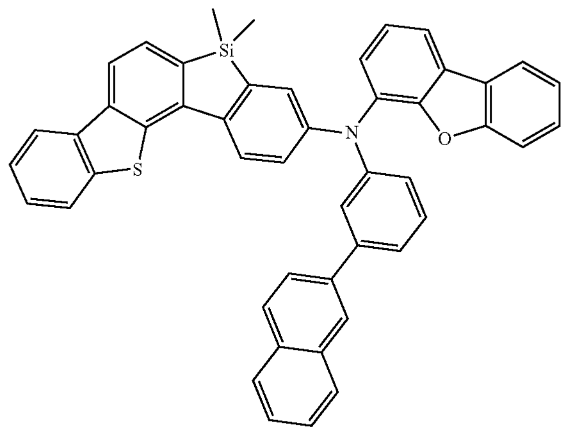
B-37
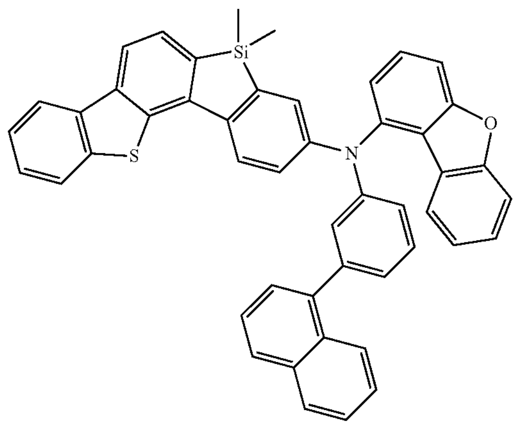
B-38
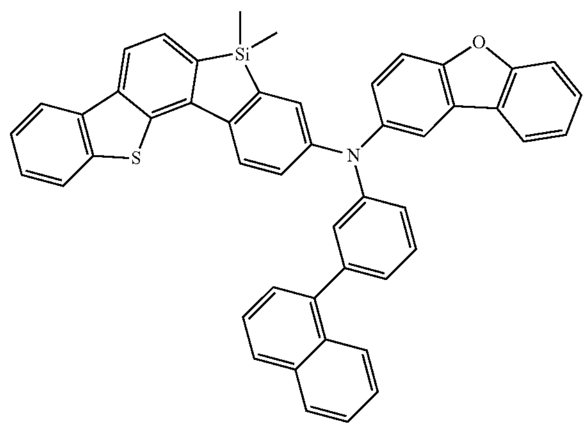
-continued
B-39
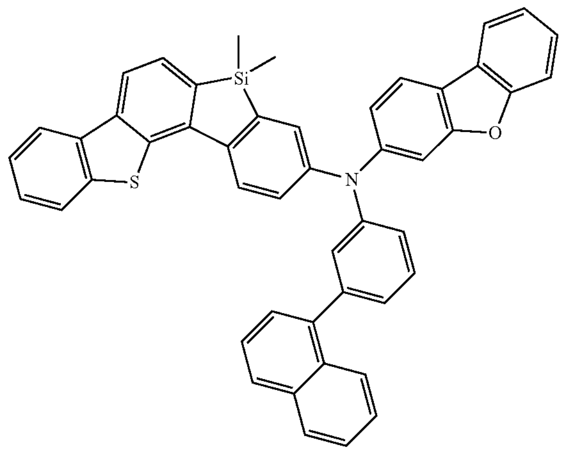
B-40
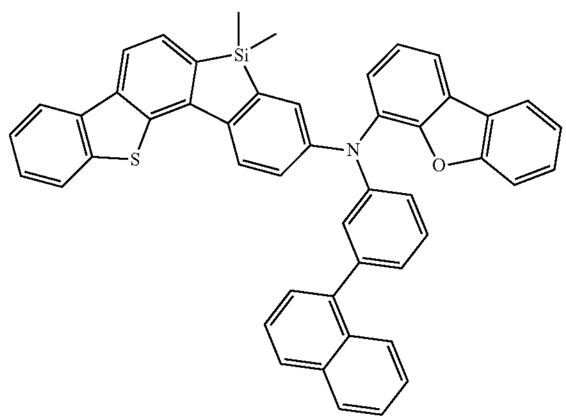
B-41
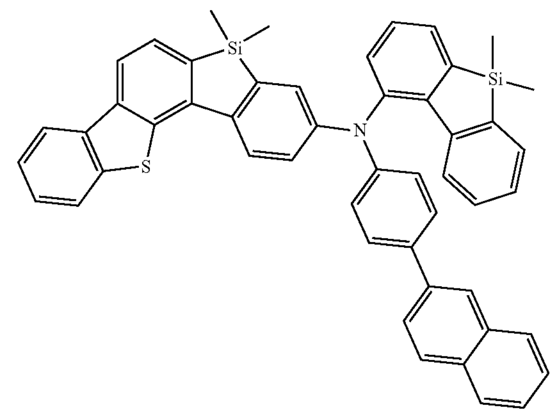

-continued
B-42
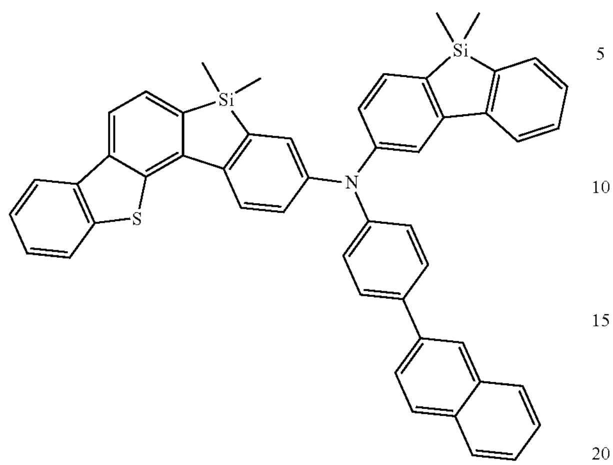
B-43
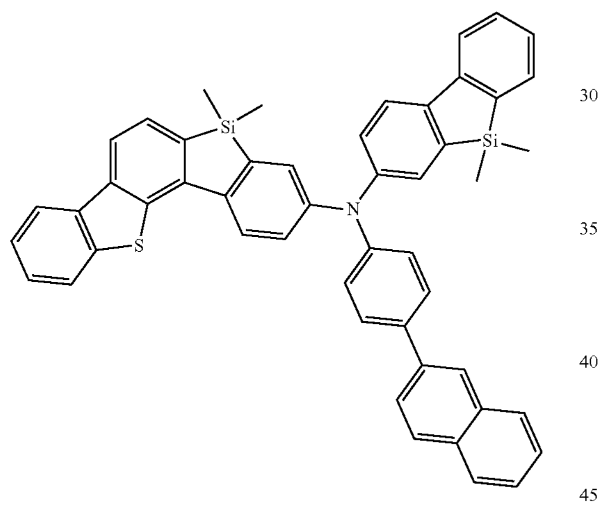
B-44
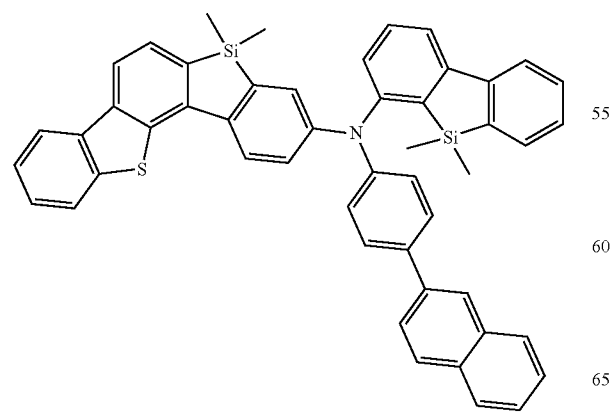
-continued
B-45
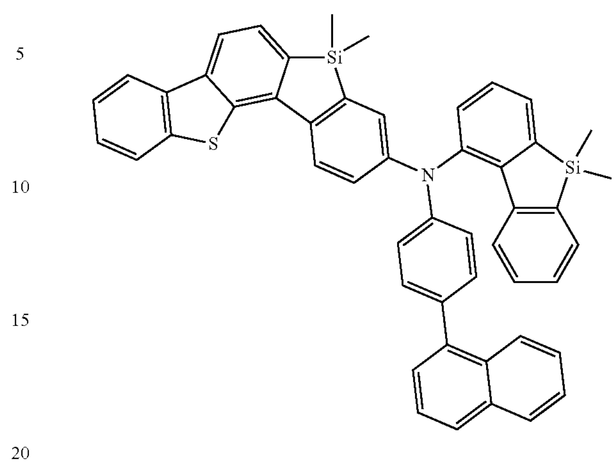
B-46
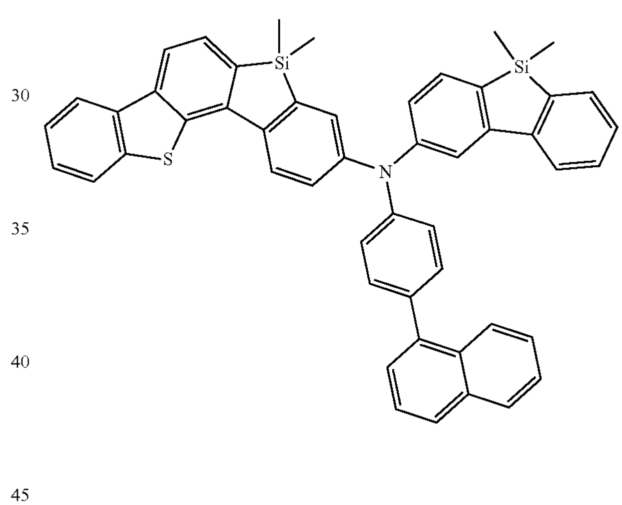
B-47
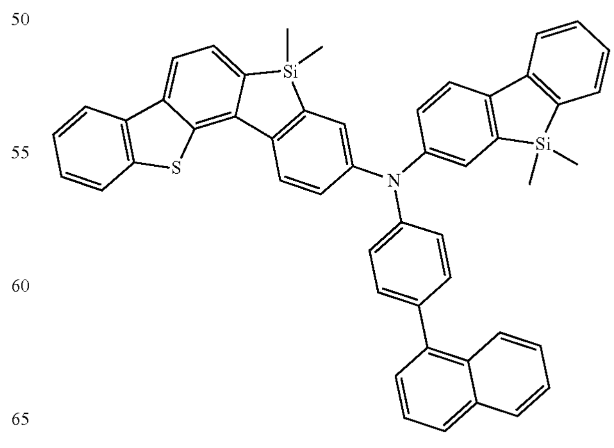

-continued
B-48
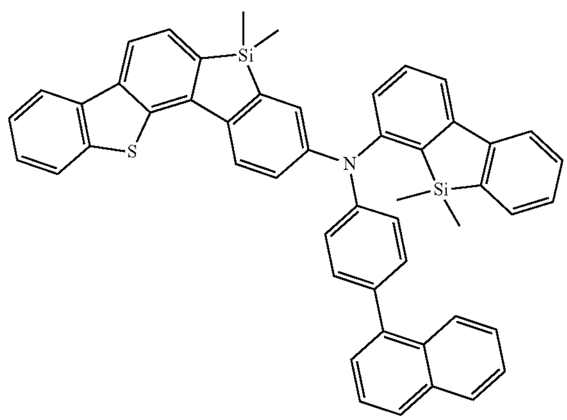
B-49
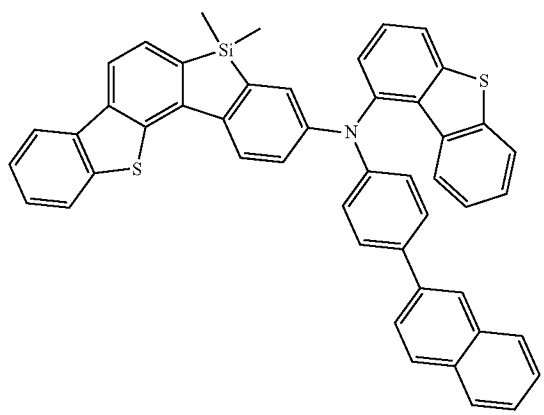
B-50
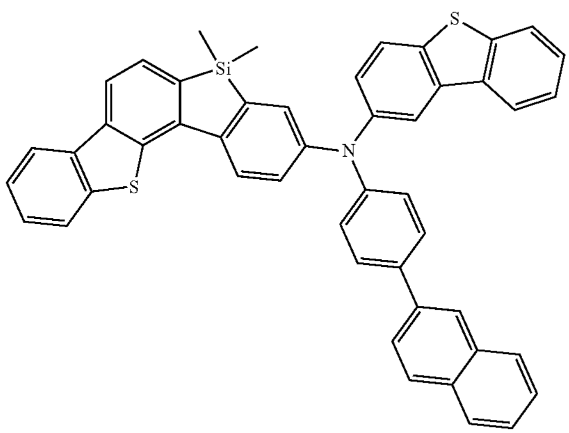
-continued
B-51
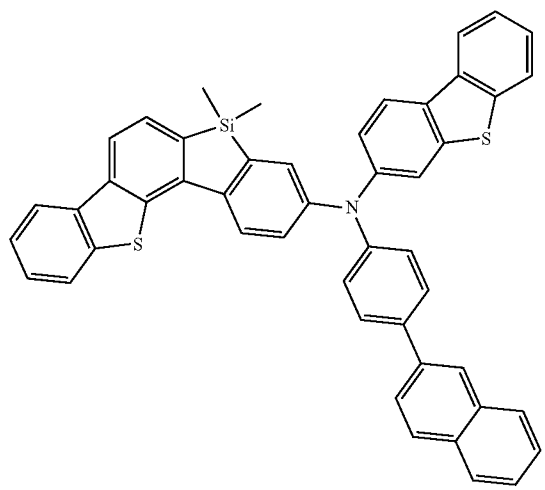
B-52
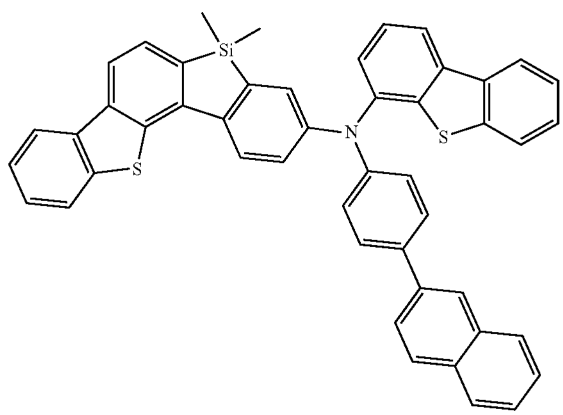
B-53
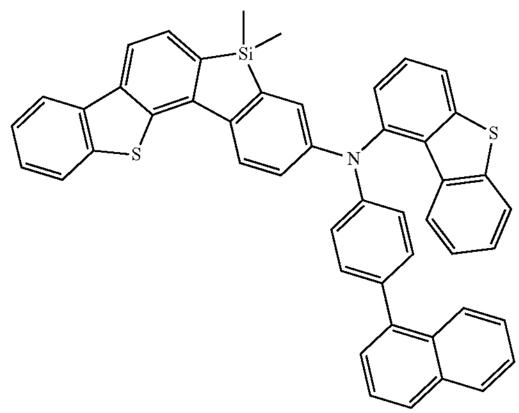

-continued
B-54
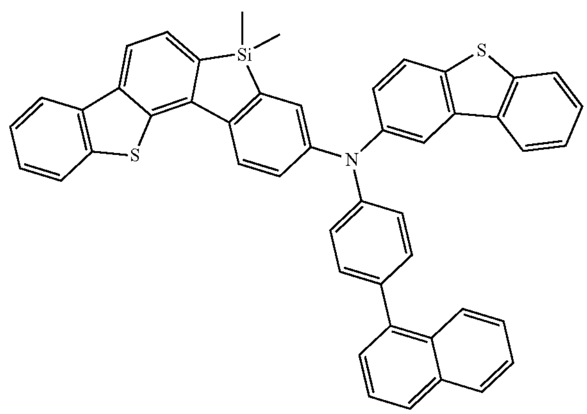
B-55
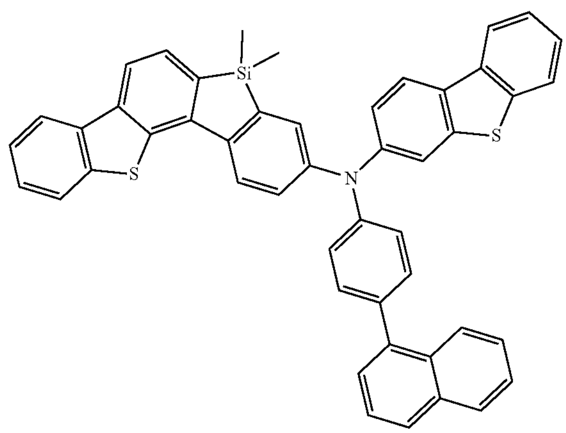
B-56
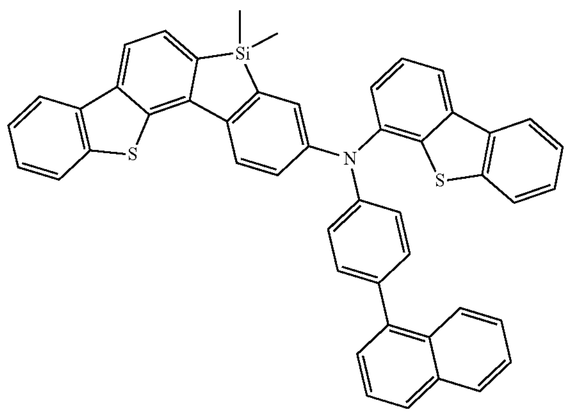
-continued
B-57
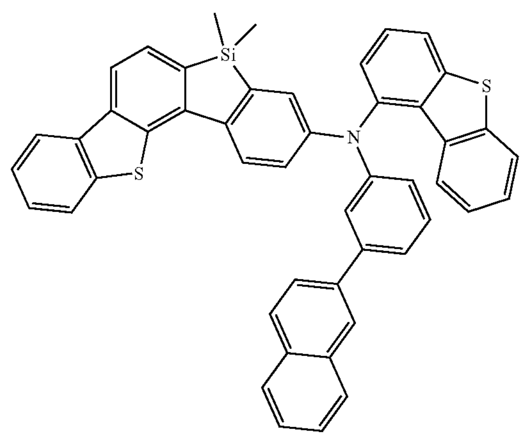
B-58
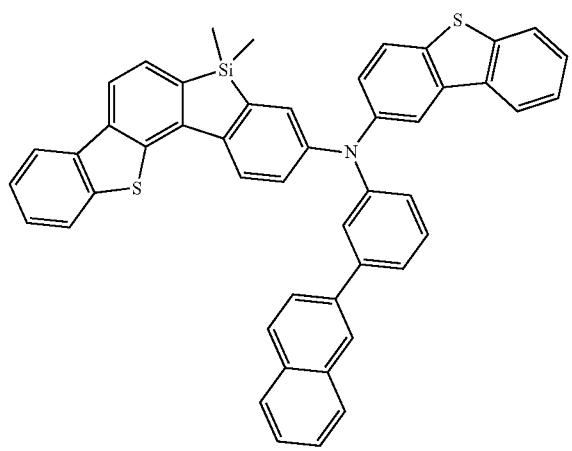
B-59
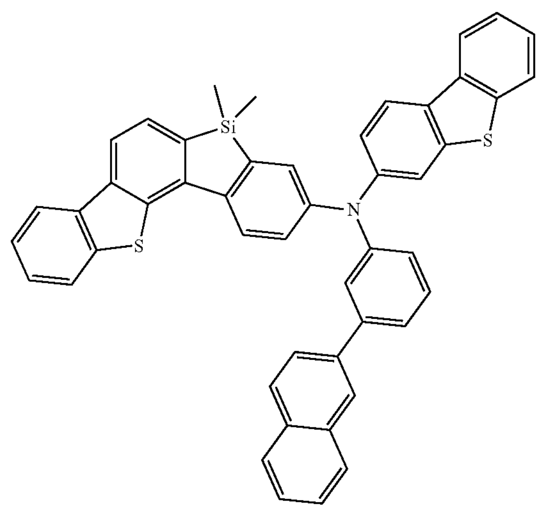

-continued
B-60
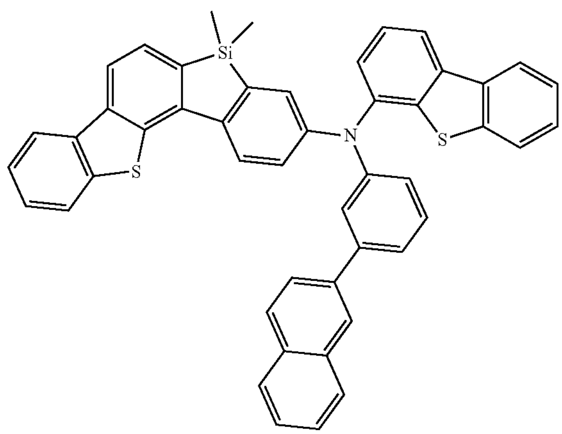
B-61
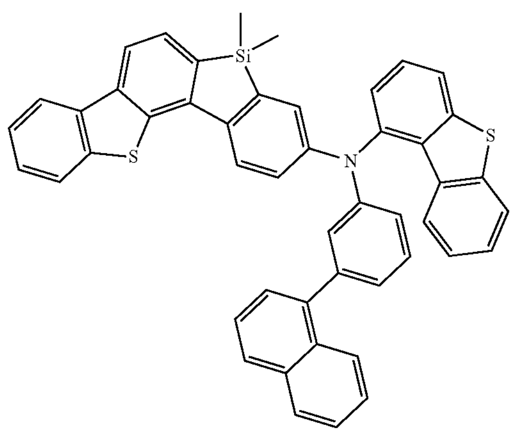
B-62
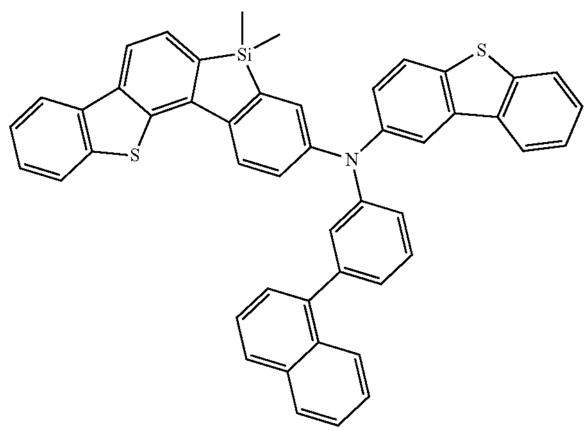
-continued
B-63
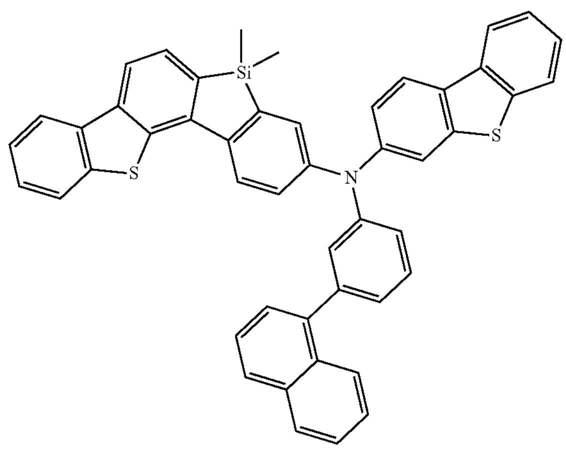
B-64
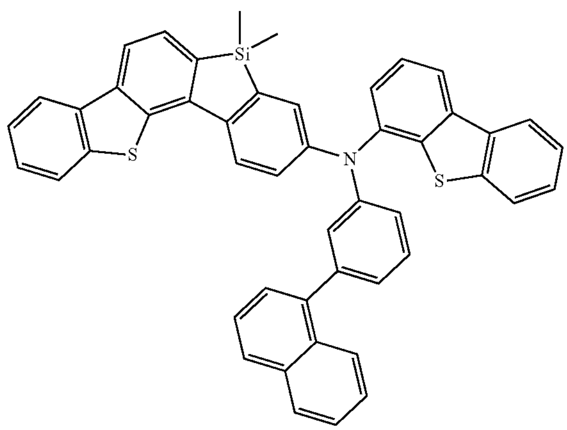
B-65
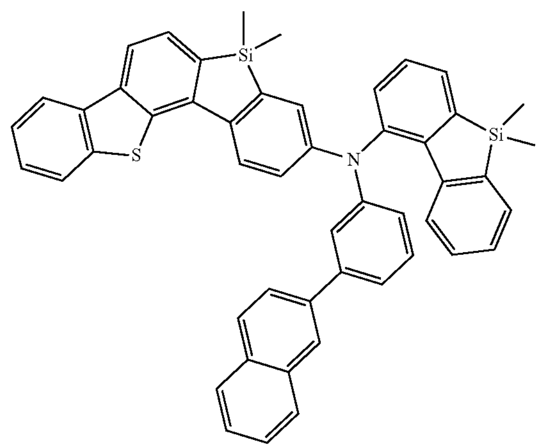

B-66
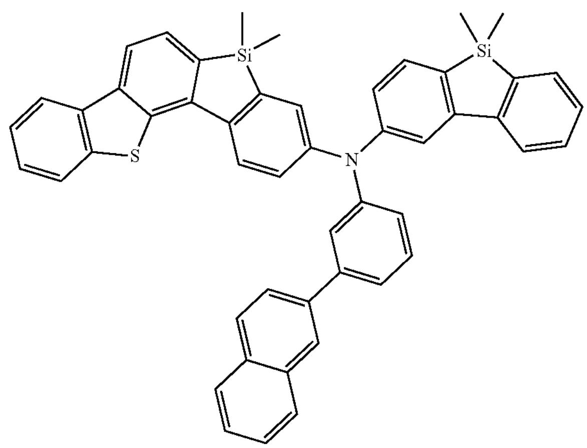
B-67
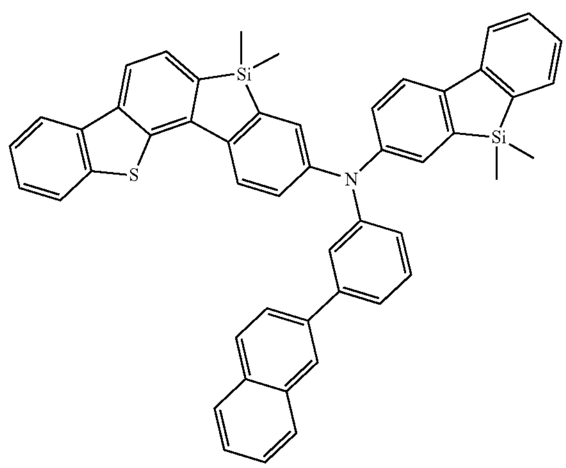
B-68
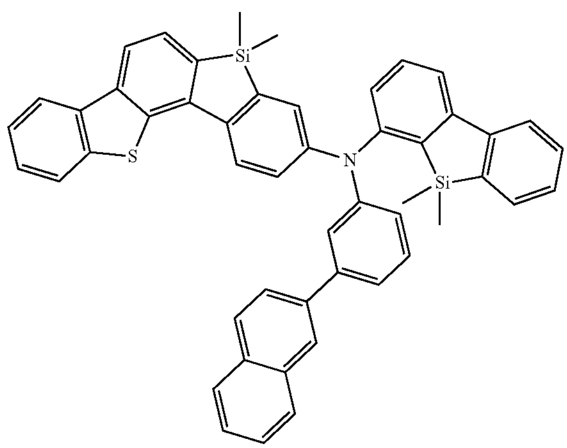
B-69
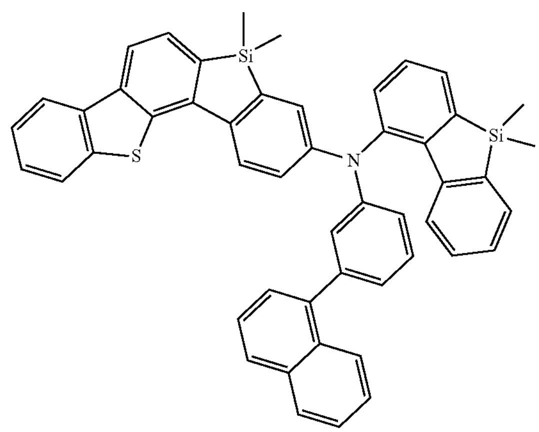
B-70
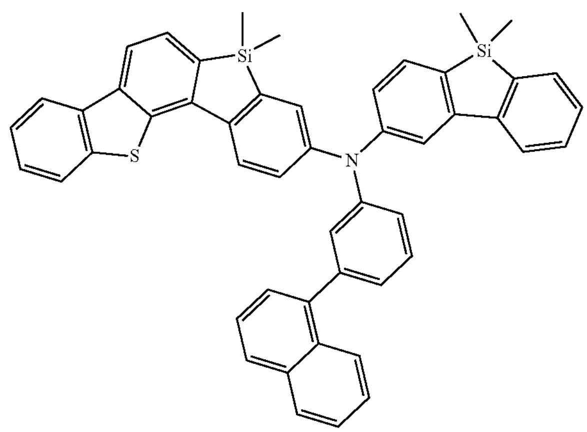
B-71
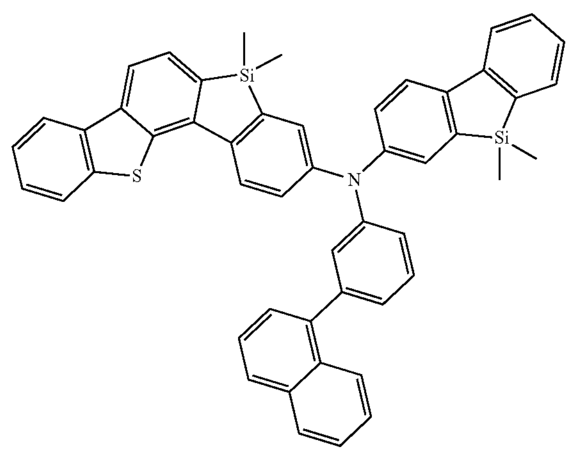

B-72
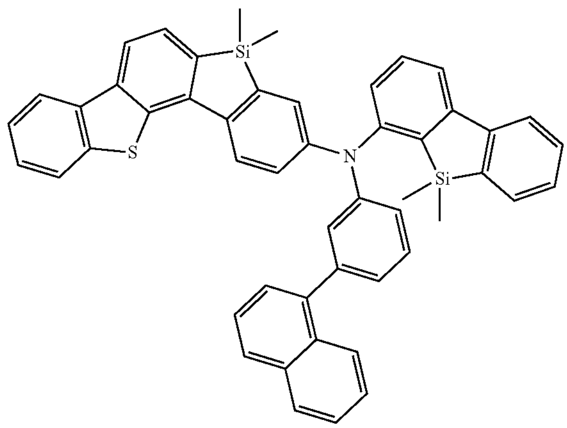
B-73
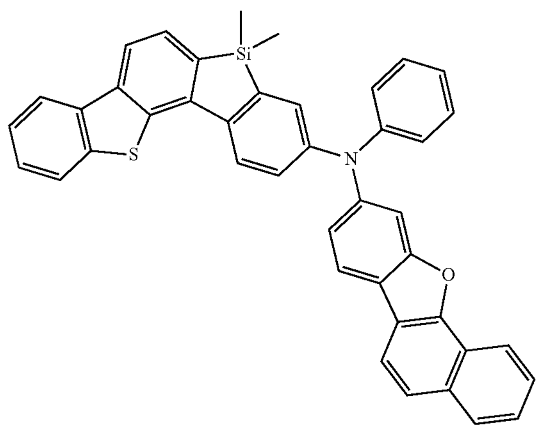
B-74
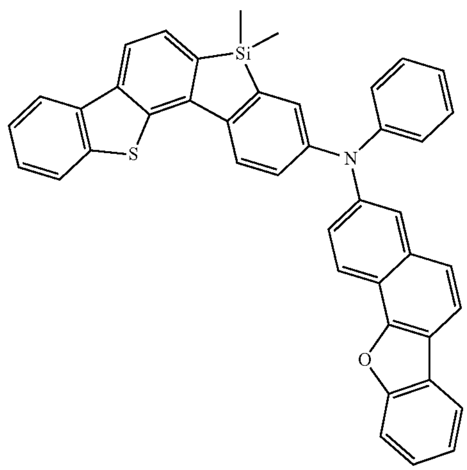
B-75
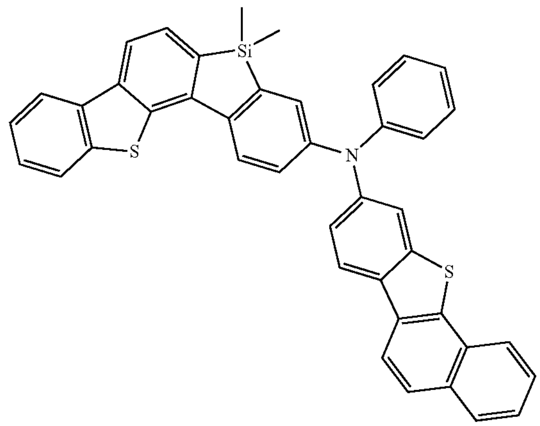
B-76
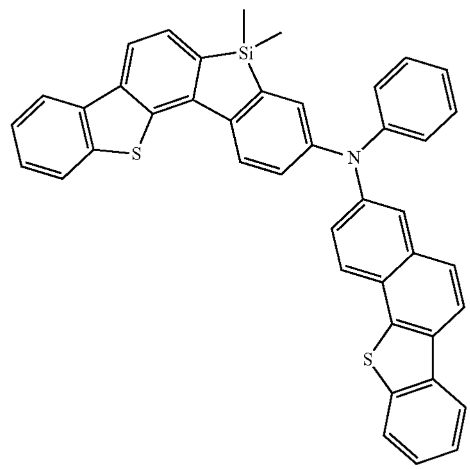
B-77
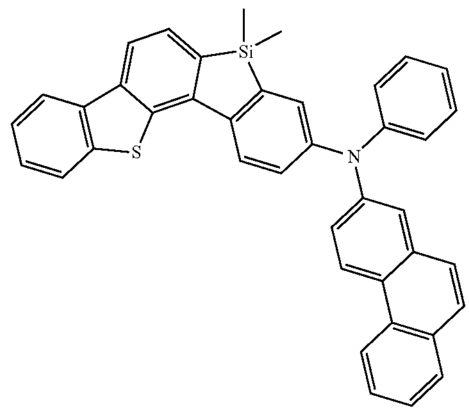

-continued
B-78
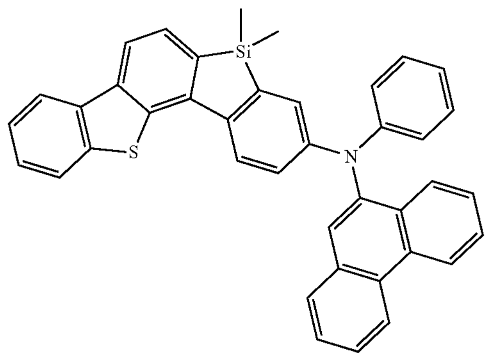
B-79
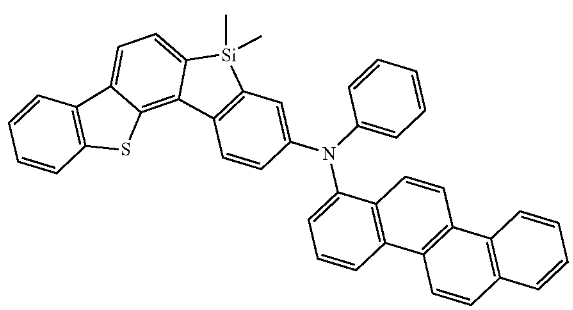
B-80
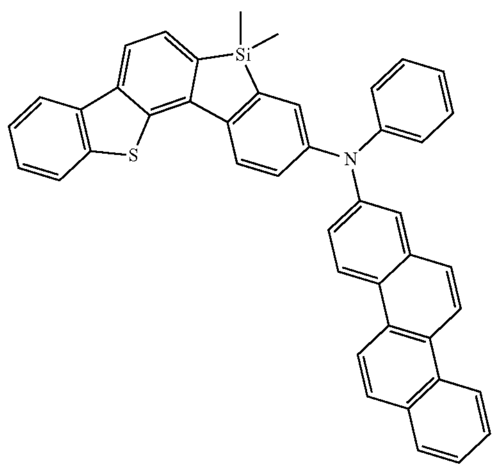
B-81
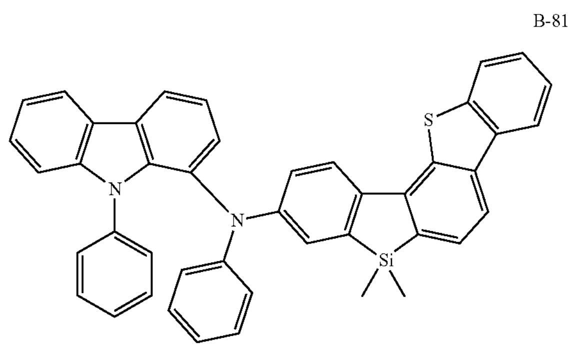
-continued
B-82
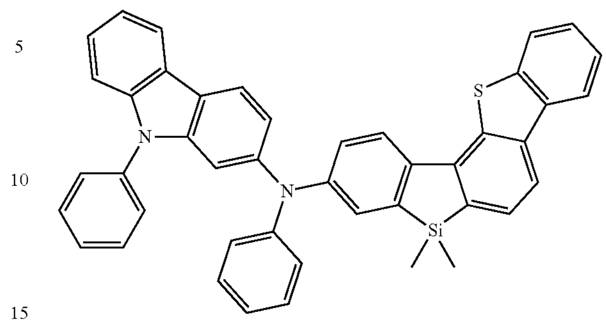
B-83
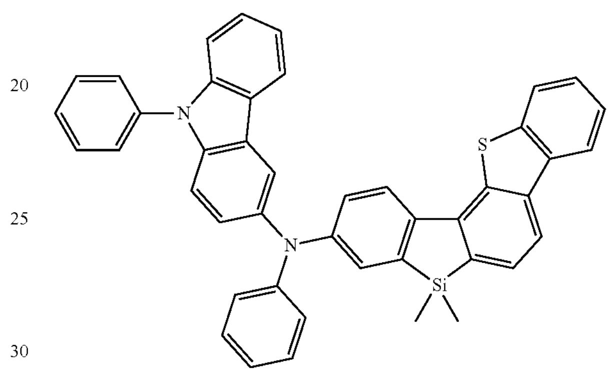
B-84
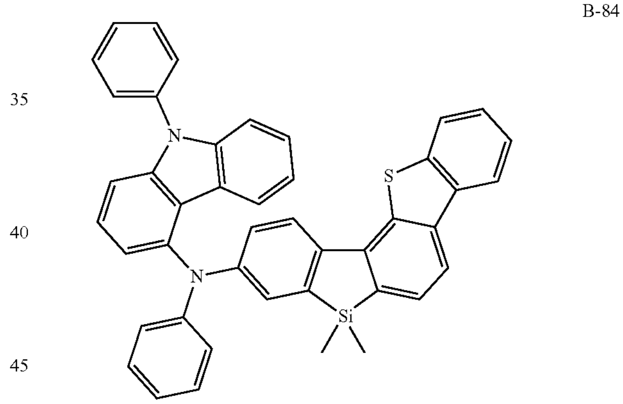
B-89
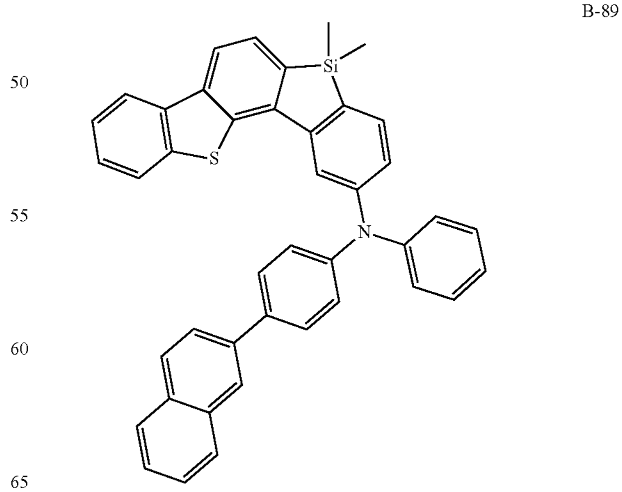

-continued
B-90
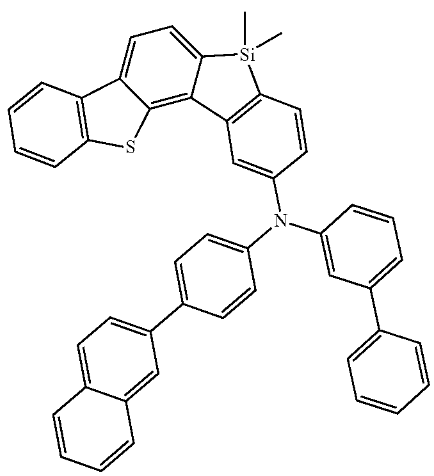
B-91
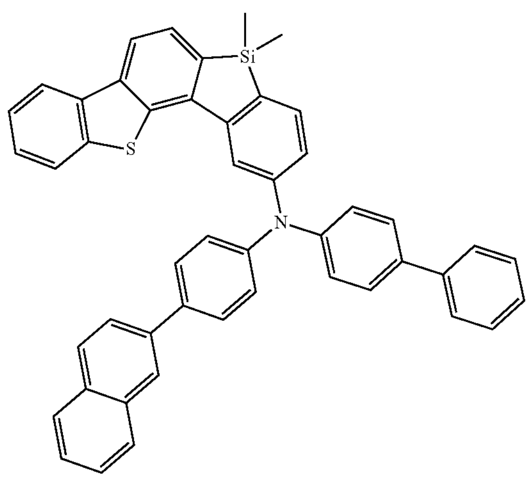
B-92
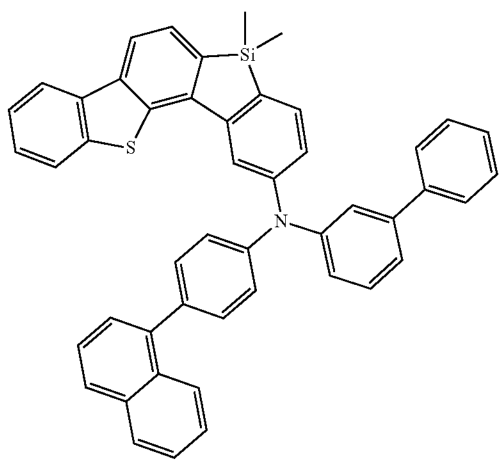
-continued
B-93
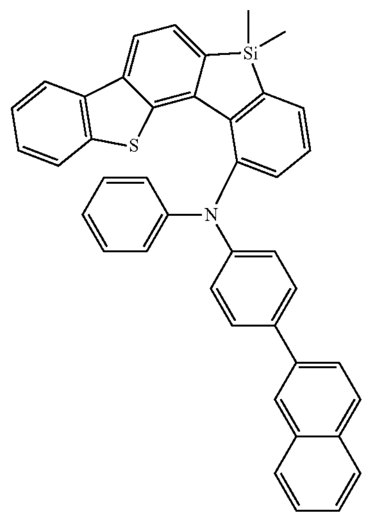
B-94
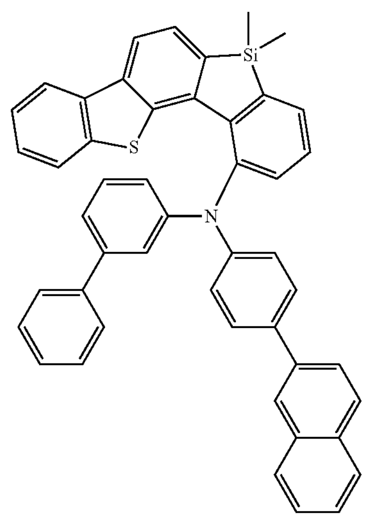
B-95
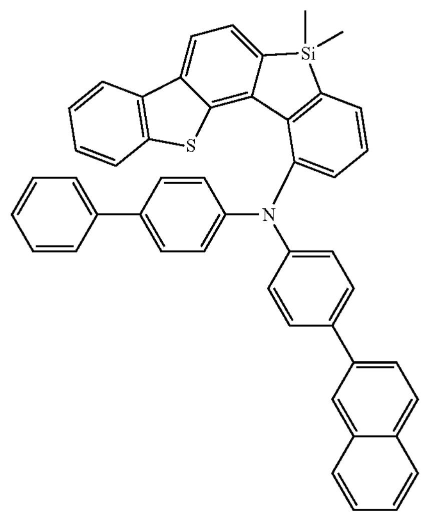

-continued
B-96
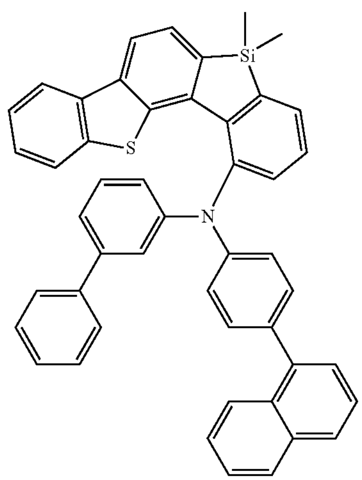
B-98
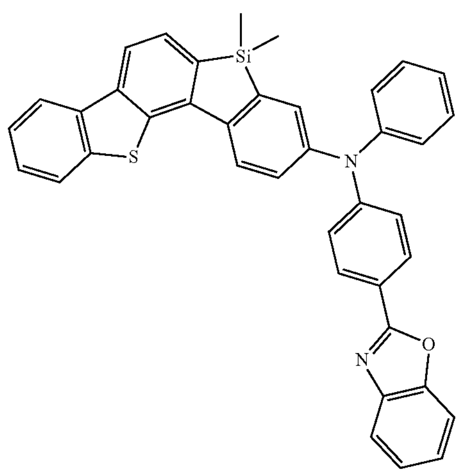
B-99
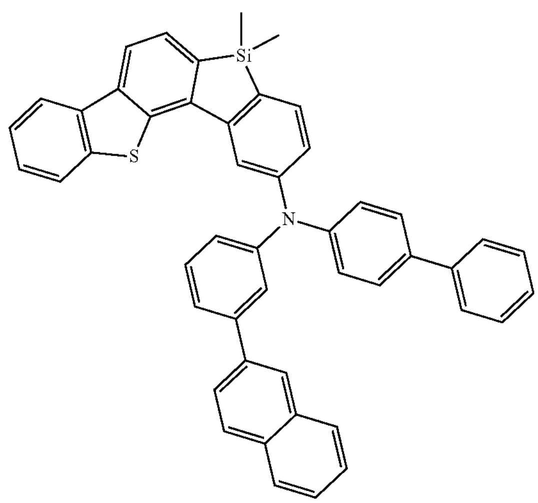
-continued
B-100
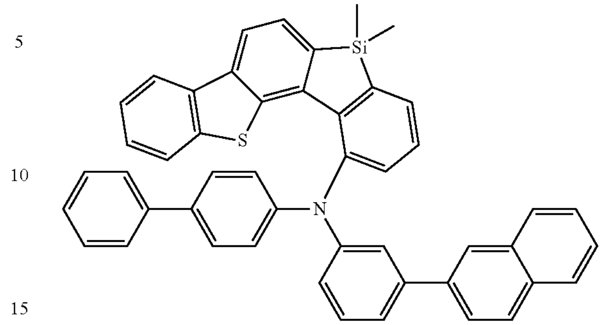
B-102
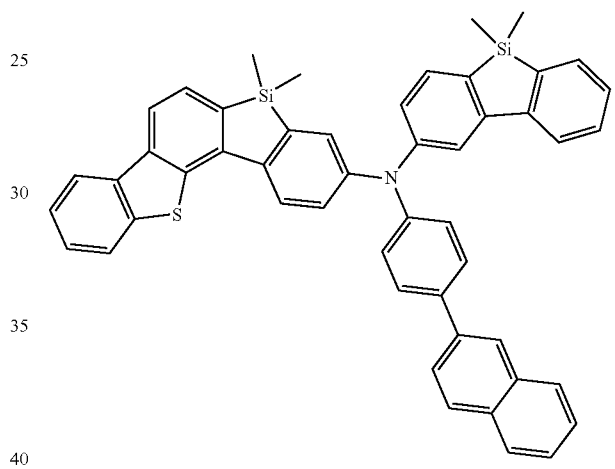
B-103
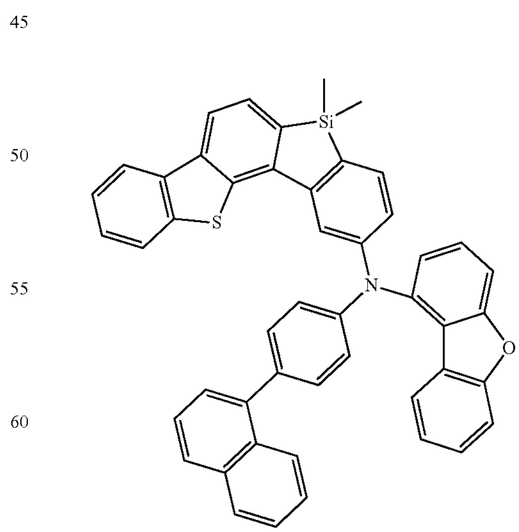

-continued

B-104

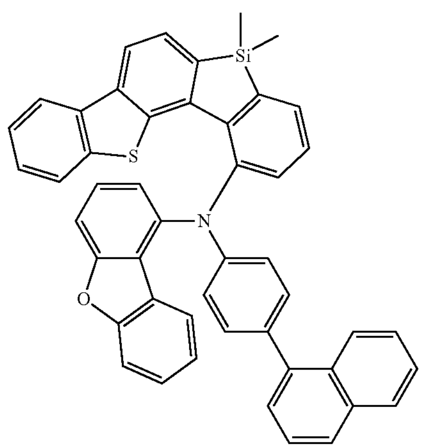

B-106

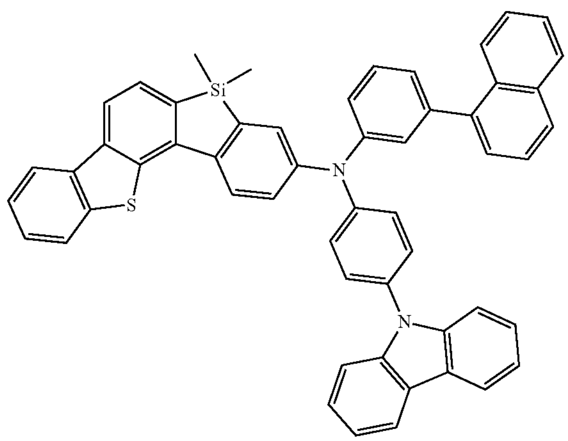

B-107

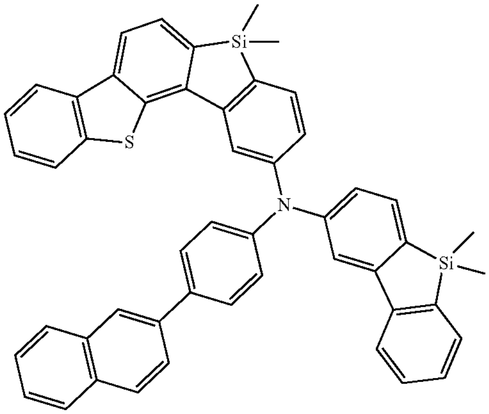

-continued

B-108

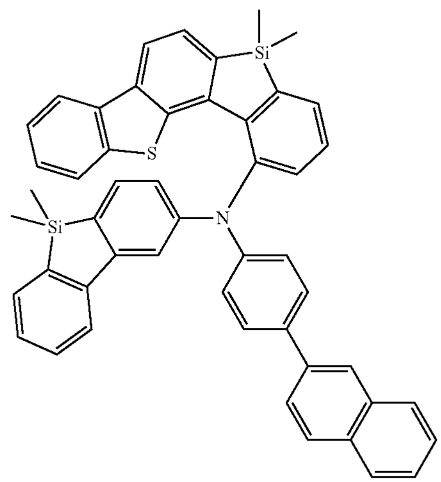

7. A composition for an organic optoelectronic device, comprising:

a first compound and a second compound, wherein:

the first compound is the compound of claim 1, and the second compound is represented by Chemical Formula 2:

[Chemical Formula 2]

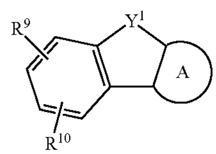

wherein, in Chemical Formula 2, $Y^1$ is O, S, N-$L^a$-$R^a$, $CR^bR^c$, or $SiR^dR^e$, $L^a$ is a single bond, or a substituted or unsubstituted C6 to C12 arylene group, $R^a$ is a substituted or unsubstituted C6 to C20 aryl group, or a substituted or unsubstituted C2 to C30 heterocyclic group, $R^b$, $R^c$, $R^d$, and $R^e$ are independently a substituted or unsubstituted C1 to C30 alkyl group, or a substituted or unsubstituted C6 to C30 aryl group, $R^9$ and $R^{10}$ are independently hydrogen, deuterium, a substituted or unsubstituted C6 to C20 aryl group, or a substituted or unsubstituted C2 to C30 heterocyclic group, and A is any one selected from the rings of Group I,

[Group I]

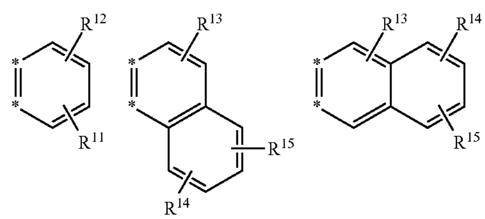

-continued

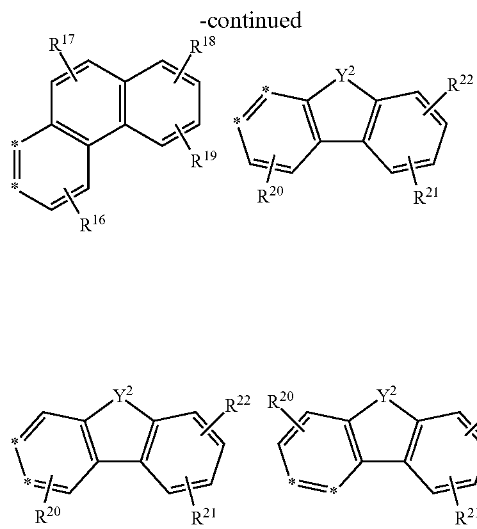

wherein, in Group I,

* is a linking point, $Y^2$ is O or S, $R^{11}$ to $R^{22}$ are independently hydrogen, deuterium, a substituted or unsubstituted C6 to C20 aryl group, or a substituted or unsubstituted C2 to C30 heterocyclic group, and at least one of $R^a$ and $R^9$ to $R^{22}$ is a group represented by Chemical Formula a,

[Chemical Formula a]

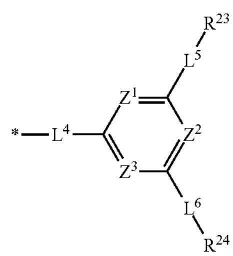

wherein, in Chemical Formula a, $Z^1$ to $Z^3$ are independently N or $CR^f$, $R^f$ is hydrogen, deuterium, a substituted or unsubstituted C1 to C30 alkyl group, or a substituted or unsubstituted C6 to C30 aryl group, at least two of $Z^1$ to $Z^3$ are N, $L^4$ to $L^6$ are independently a single bond, a substituted or unsubstituted C6 to C20 arylene group, or a substituted or unsubstituted C2 to C20 heterocyclic group, $R^{23}$ and $R^{24}$ are independently a substituted or unsubstituted C6 to C30 aryl group, or a substituted or unsubstituted C2 to C30 heterocyclic group, and

* is a linking point.

8. The composition of claim 7, wherein the second compound is represented by one of Chemical Formula 2-I, Chemical Formula 2-III, and Chemical Formula 2-VI:

[Chemical Formula 2-I]

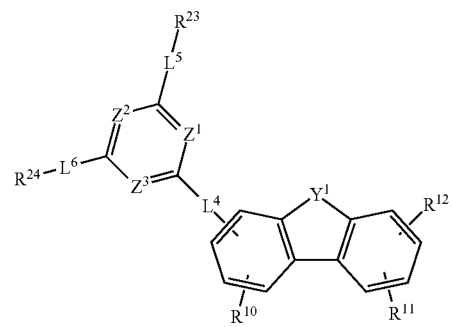

[Chemical Formula 2-III]

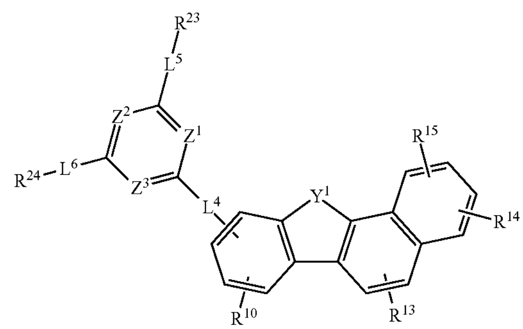

[Chemical Formula 2-VI]

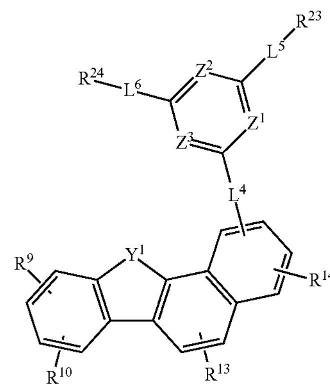

wherein, in Chemical Formula 2-I, Chemical Formula 2-III, and Chemical Formula 2-VI, $Y^1$, $R^9$ to $R^{15}$, $R^{23}$, $R^{24}$, $L^4$ to $L^6$, and $Z^1$ to $Z^3$ are defined the same as those of Chemical Formula 2.

9. The composition of claim 7, wherein the second compound is represented by one of Chemical Formula 2-Ia, Chemical Formula 2-IIIa, Chemical Formula 2-VIa, and Chemical Formula 2-VIb:

[Chemical Formula 2-Ia]

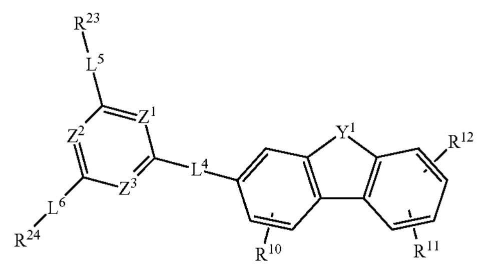

-continued

[Chemical Formula 2-IIIa]

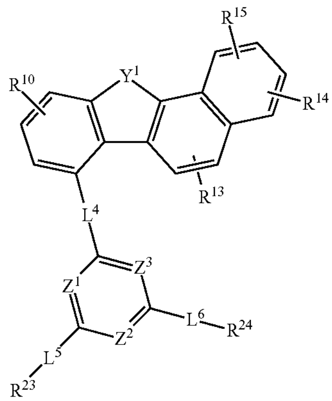

[chemical Formula 2-VIa]

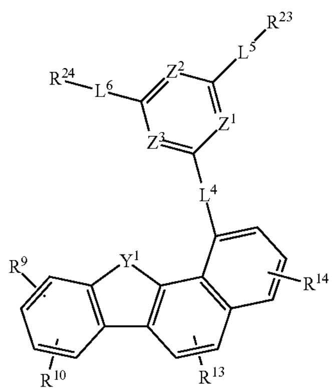

-continued

[Chemical Formula 2-VIb]

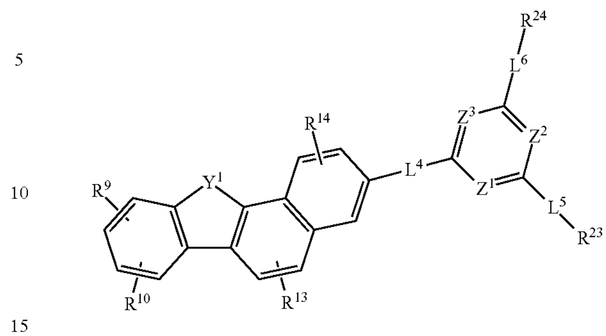

wherein, in Chemical Formula 2-Ia, Chemical Formula 2-IIIa, Chemical Formula 2-VIa, and Chemical Formula 2-VIb, $Y^1$, $R^9$ to $R^{15}$, $L^4$ to $L^6$, $R^{23}$, $R^{24}$, and $Z^1$ to $Z^3$ are defined the same as those of Chemical Formula 2.

10. An organic optoelectronic device, comprising:

an anode and a cathode facing each other, and at least one organic layer between the anode and the cathode, wherein the at least one organic layer includes the compound of claim 1.

11. The organic optoelectronic device of claim 10, wherein:

the at least one organic layer includes a light emitting layer, and the light emitting layer includes the compound.

12. A display device comprising the organic optoelectronic device of claim 10.

13. An organic optoelectronic device, comprising:

an anode and a cathode facing each other, and at least one organic layer between the anode and the cathode, wherein the at least one organic layer includes the composition of claim 7.

14. The organic optoelectronic device of claim 13, wherein:

the at least one organic layer includes a light emitting layer, and the light emitting layer includes the composition.

15. A display device comprising the organic optoelectronic device of claim 13.

* * * * *